(12) United States Patent
Kim

(10) Patent No.: US 11,456,374 B2
(45) Date of Patent: Sep. 27, 2022

(54) GERMANIUM-SILICON-TIN (GESISN) HETEROJUNCTION BIPOLAR TRANSISTOR DEVICES

(71) Applicant: Matthew H. Kim, Scottsdale, AZ (US)

(72) Inventor: Matthew H. Kim, Scottsdale, AZ (US)

( * ) Notice: Subject to any disclaimer, the term of this patent is extended or adjusted under 35 U.S.C. 154(b) by 66 days.

(21) Appl. No.: 16/424,457

(22) Filed: May 28, 2019

(65) Prior Publication Data

US 2019/0296131 A1    Sep. 26, 2019

Related U.S. Application Data

(63) Continuation-in-part of application No. 15/606,965, filed on May 26, 2017, now Pat. No. 10,505,026, (Continued)

(51) Int. Cl.
| | |
|---|---|
| *H01L 29/73* | (2006.01) |
| *H01L 29/08* | (2006.01) |
| *H01L 29/10* | (2006.01) |
| *H01L 29/12* | (2006.01) |
| *H01L 29/16* | (2006.01) |
| *H01L 29/20* | (2006.01) |

(Continued)

(52) U.S. Cl.
CPC ...... *H01L 29/7378* (2013.01); *H01L 29/0817* (2013.01); *H01L 29/0821* (2013.01); *H01L 29/1004* (2013.01); *H01L 29/122* (2013.01); *H01L 29/165* (2013.01); *H01L 29/2003* (2013.01); *H01L 29/267* (2013.01); *H01L 29/66242* (2013.01); *H01L 29/7371* (2013.01); *H01L 33/0004* (2013.01); *H01L 29/1008* (2013.01); *H01L 29/161* (2013.01); *H01L 29/66318* (2013.01); *H01L 29/737* (2013.01); *H01L 29/7373* (2013.01); *H01L 29/7375* (2013.01); *H01L 29/7376* (2013.01); *H01S 5/0202* (2013.01); *H01S 5/0218* (2013.01); *H01S 5/06203* (2013.01); *H01S 5/3412* (2013.01); *H01S 5/3427* (2013.01)

(58) Field of Classification Search
CPC ............. H01L 29/7378; H01L 29/0817; H01L 29/0821; H01L 29/1004; H01L 29/122; H01L 29/165; H01L 29/2003; H01L 29/264; H01L 29/66242; H01L 29/7371; H01L 33/0004; H01L 29/267; H01L 29/1008; H01L 29/737; H01L 29/7373; H01L 29/7375; H01L 29/7376; H01L 29/7278; H01L 29/66318; H01S 5/3412
See application file for complete search history.

(56) References Cited

U.S. PATENT DOCUMENTS

| | | | | |
|---|---|---|---|---|
| 3,725,145 A | * | 4/1973 | Maki ...................... | H01L 29/00 438/419 |
| 4,958,208 A | * | 9/1990 | Tanaka ................ | H01L 29/7371 257/12 |

(Continued)

FOREIGN PATENT DOCUMENTS

WO    WO-2010044978 A1 *    4/2010    ....... H01L 21/02381

*Primary Examiner* — Ida M Soward

(57) ABSTRACT

The methods of manufacture of GeSiSn heterojunction bipolar transistors, which include light emitting transistors and transistor lasers and photo-transistors and their related structures are described herein. Other embodiments are also disclosed herein.

15 Claims, 92 Drawing Sheets

Related U.S. Application Data which is a continuation of application No. 14/504,114, filed on Oct. 1, 2014, now Pat. No. 9,666,702, which is a continuation-in-part of application No. 14/217,022, filed on Mar. 17, 2014, now Pat. No. 9,437,772.

(60) Provisional application No. 62/677,180, filed on May 29, 2018, provisional application No. 61/885,434, filed on Oct. 1, 2013, provisional application No. 61/800,175, filed on Mar. 15, 2013.

(51) Int. Cl.

| | | |
|---|---|---|
| *H01L 29/26* | (2006.01) | |
| *H01L 29/66* | (2006.01) | |
| *H01L 33/00* | (2010.01) | |
| *H01S 5/34* | (2006.01) | |
| *H01L 29/737* | (2006.01) | |
| *H01L 29/267* | (2006.01) | |
| *H01L 29/165* | (2006.01) | |
| *H01S 5/062* | (2006.01) | |
| *H01S 5/02* | (2006.01) | |
| *H01L 29/161* | (2006.01) | |

(56) References Cited

U.S. PATENT DOCUMENTS

| | | | | |
|---|---|---|---|---|
| 5,126,278 A * | 6/1992 | Kodaira | ............ | H01L 21/26506 438/350 |
| 5,284,783 A * | 2/1994 | Ishikawa | ................ | H01L 21/22 117/105 |
| 5,371,389 A * | 12/1994 | Matsuno | ............. | H01L 29/1004 257/197 |
| 5,508,536 A * | 4/1996 | Twynam | ............. | H01L 29/7371 257/191 |
| 6,159,816 A * | 12/2000 | Hill | .................... | H01L 29/66318 257/E21.387 |
| 6,727,153 B2 * | 4/2004 | Chow | .................... | H01L 29/155 257/197 |
| 7,176,099 B2 * | 2/2007 | Murayama | ........... | H01L 29/0821 257/E51.04 |
| 8,029,905 B2 * | 10/2011 | Kouvetakis | ......... | C23C 16/0272 423/324 |
| 8,809,170 B2 * | 8/2014 | Bauer | ............... | H01L 29/66636 438/494 |
| 10,998,462 B2 * | 5/2021 | King | ................... | H01L 31/0745 |
| 2002/0190271 A1 * | 12/2002 | Hartmann | ........... | H01L 29/7378 257/E29.189 |
| 2005/0145884 A1 * | 7/2005 | Nogome | ............. | H01L 29/7371 257/197 |
| 2012/0090672 A1 * | 4/2012 | Lebby | ................. | H01L 31/1836 136/255 |
| 2012/0186641 A1 * | 7/2012 | Sharps | ................ | H01L 31/0735 136/265 |
| 2012/0240987 A1 * | 9/2012 | King | ................... | H01L 31/0687 136/255 |
| 2013/0122638 A1 * | 5/2013 | Jones-Albertus | ..... | H01L 31/078 438/74 |
| 2018/0351021 A1 * | 12/2018 | Fetzer | ............. | H01L 31/035236 |
| 2019/0013430 A1 * | 1/2019 | Jones-Albertus | ........................... | H01L 31/03048 |
| 2019/0378950 A1 * | 12/2019 | King | ............... | H01L 31/035227 |

* cited by examiner

Figure 1
NPN 0101
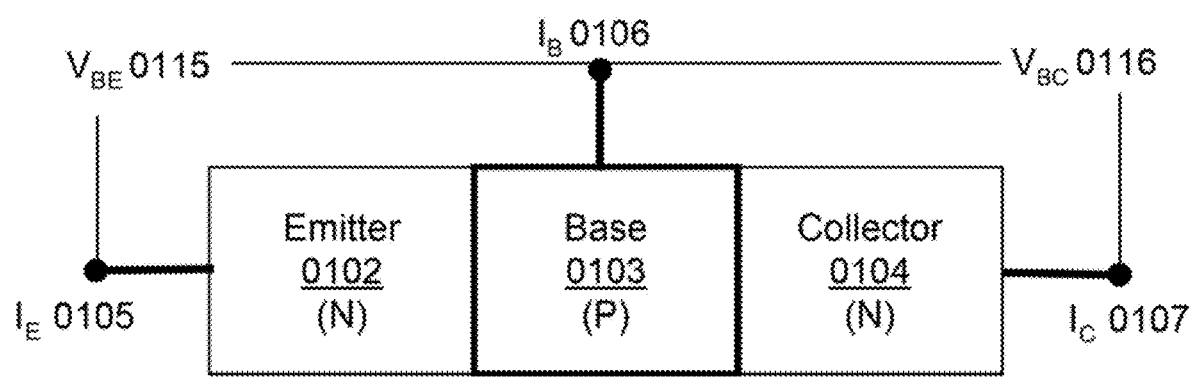
PNP 0108
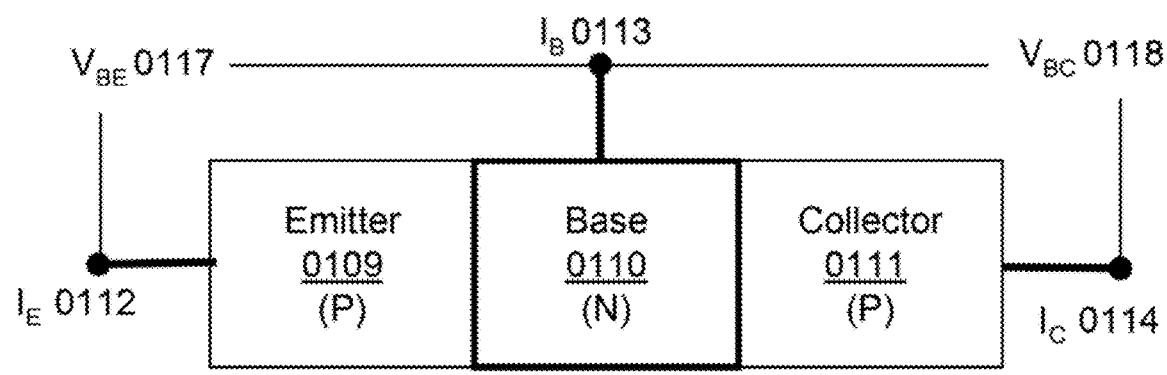

Figure 3
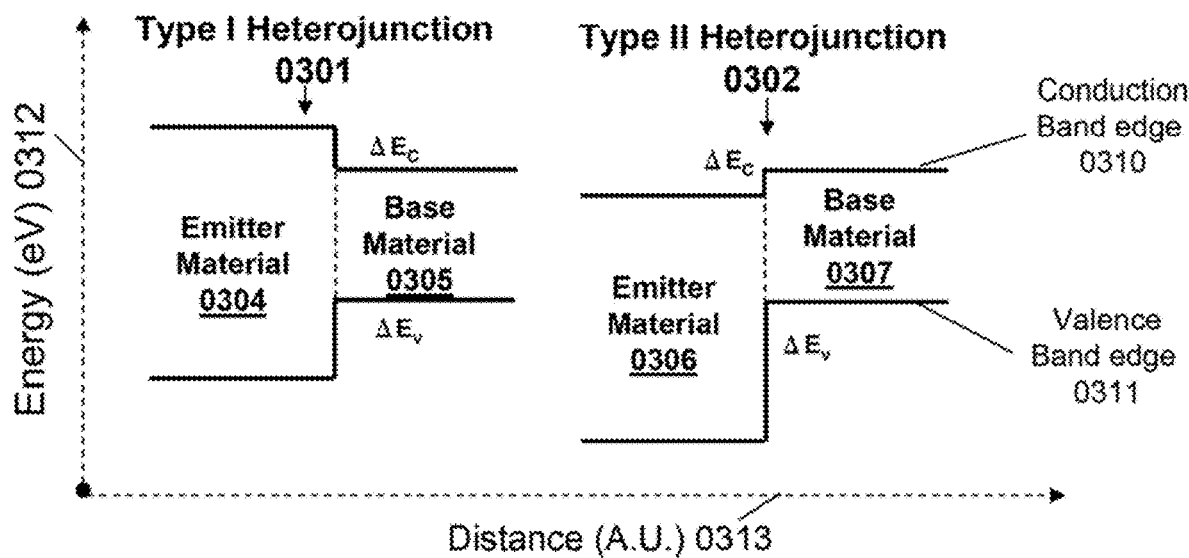
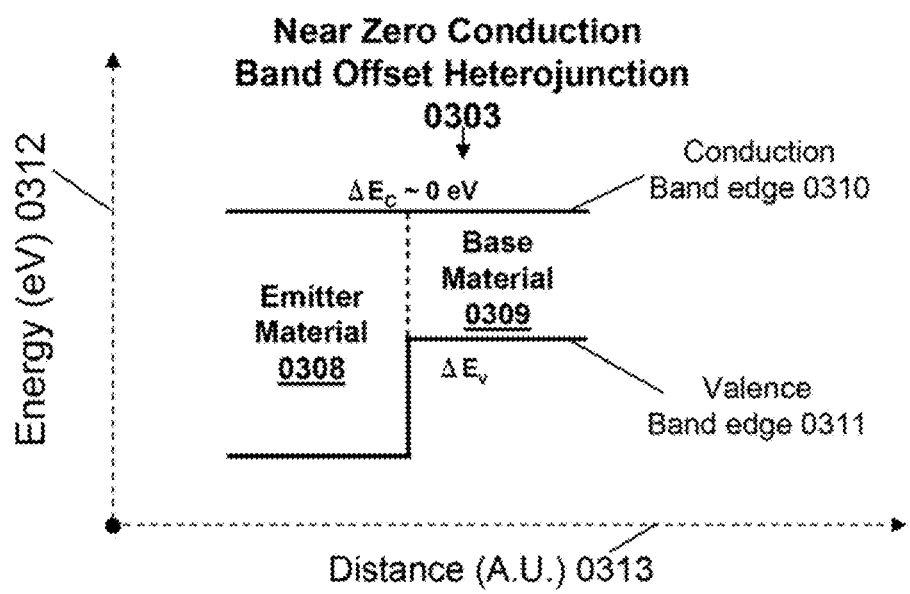

Figure 4
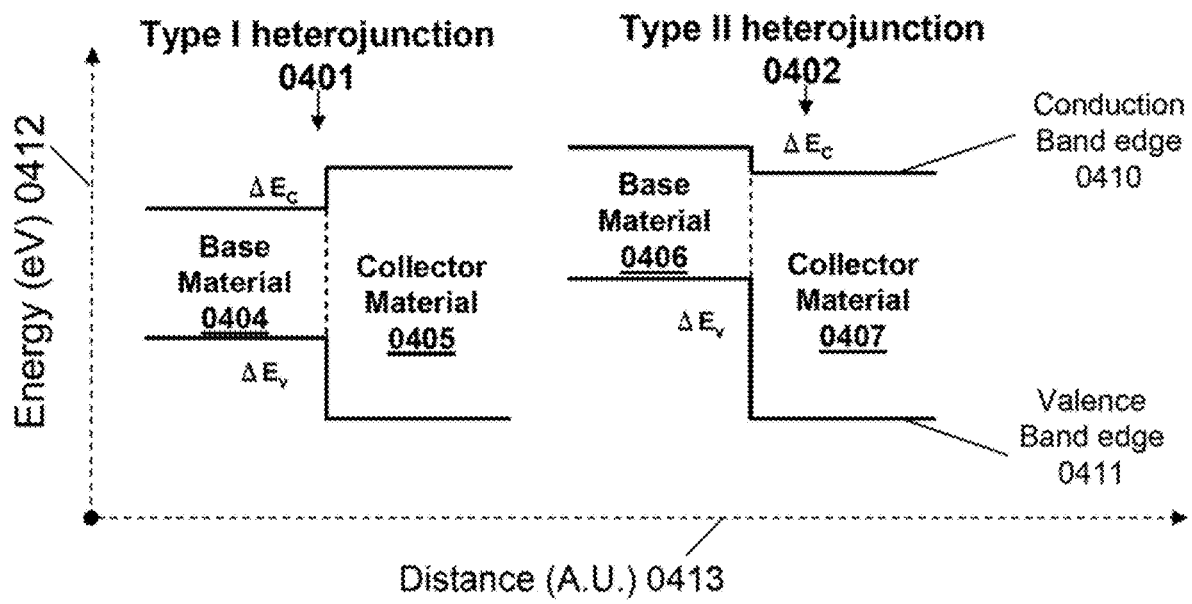
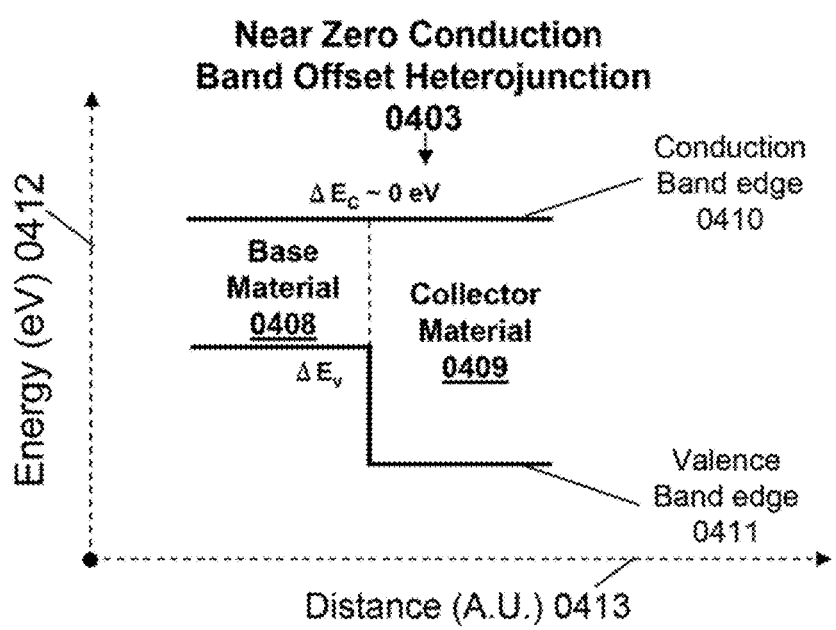

NPN HBT with a compositionally graded GeSiSn-GeSn base 2600

NPN HBT with graded interface GeSiSn QW or QD inserted in the base region 2800

NPN HBT laser or LET structure with a
GeSn QW or QD active region
in a GeSiSn P⁺ base/barrier material
3200

NPN edge emitting transistor laser or LET structure with a GeSn QW or QD active region in a GeSiSn P-type base/barrier material 3300

NPN HBT laser or LET structure with a GeSiSn QW or QD active region in a GaAs P+ base/barrier material
3400

NPN HBT with an ordered InGaP emitter, compositionally graded GeSiSn-GeSn base, GaAs collector 4200

Inverted Strained GeSiSn HBT Structure
Emitter grown first, Collector up
4300

Inverted Strained GeSi HBT Structure
Emitter grown first Collector up
4400

Compressively strained GeSiSn HBT Collector grown first Emitter up 4500

NPN AlGaAs Emitter – GeSiSn Base – GaAs Collector double HBT 4700

Symmetric double HBT
GeSiSn emitter – Ge base – GeSiSn collector structure
Where GeSiSn is latticed matched or near latticed matched to Ge
4900

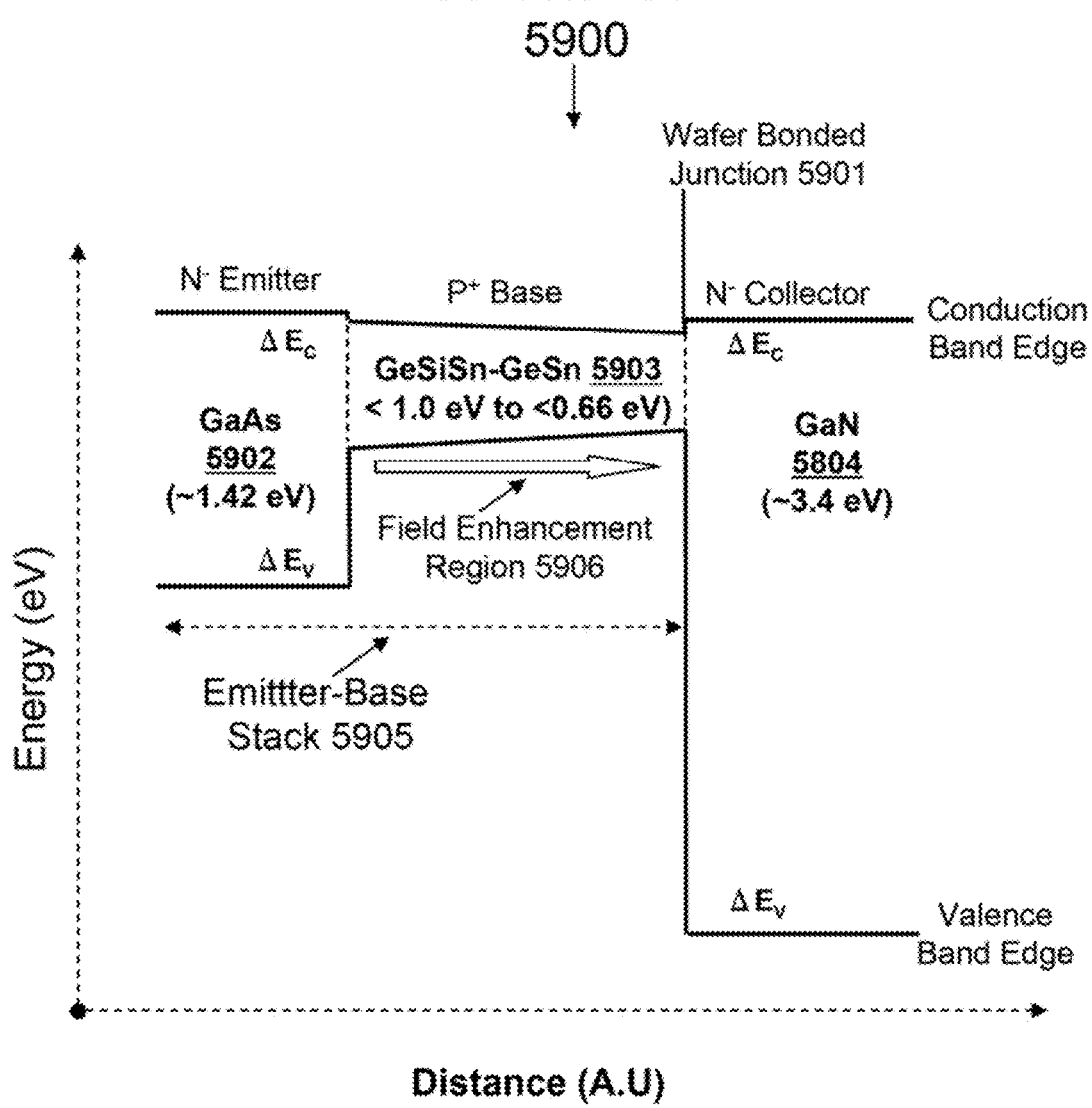

NPN HBT
InGaP Emitter – GeSiSn Base – GaN Collector Double HBT
6400

Figure 67
Top half of the HBT
InGaP emitter/GeSiSn base stack
6701
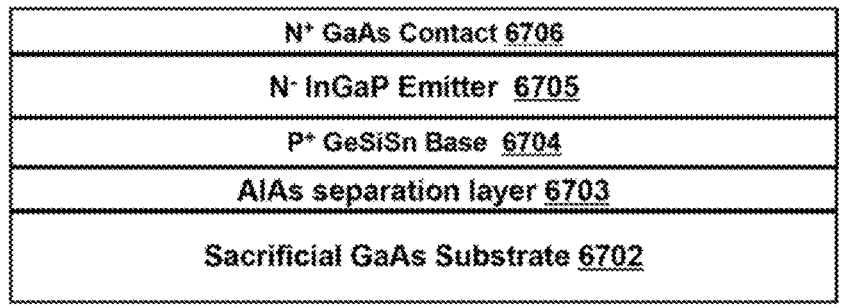
| N+ GaAs Contact 6706 |
| N- InGaP Emitter 6705 |
| P+ GeSiSn Base 6704 |
| AlAs separation layer 6703 |
| Sacrificial GaAs Substrate 6702 |
GaN collector structure
6707
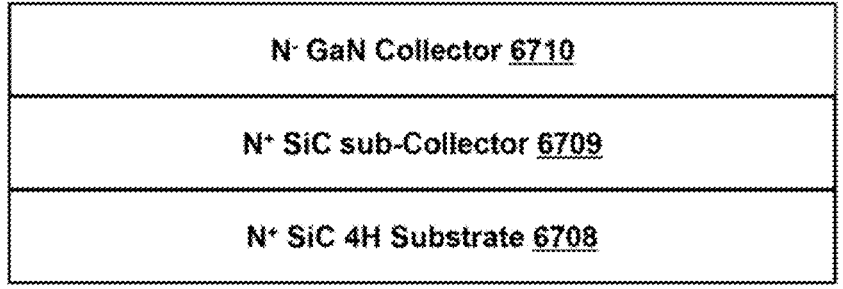
| N- GaN Collector 6710 |
| N+ SiC sub-Collector 6709 |
| N+ SiC 4H Substrate 6708 |

Figure 68
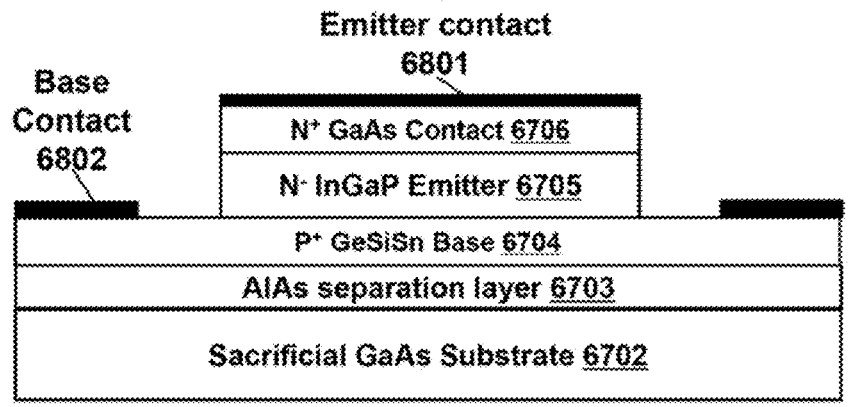
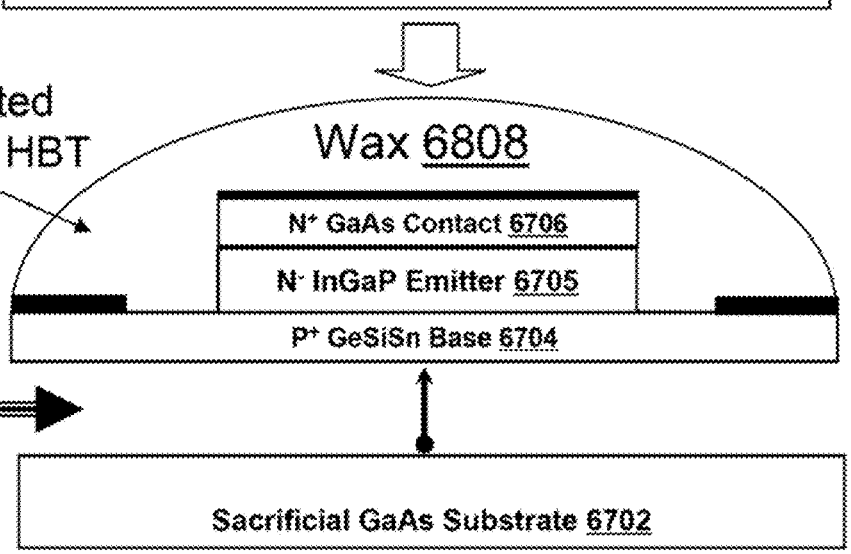

Figure 69
Top Half of HBT
Wafer Bonded to Collector Structure 6901
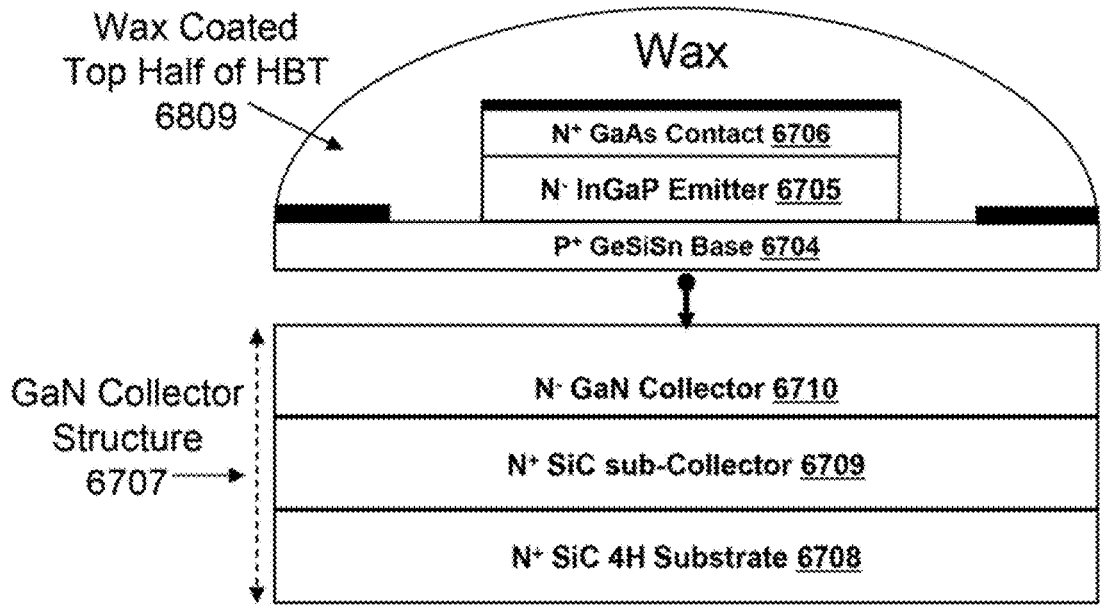
Wafer Bonded HBT Final Structure 6902
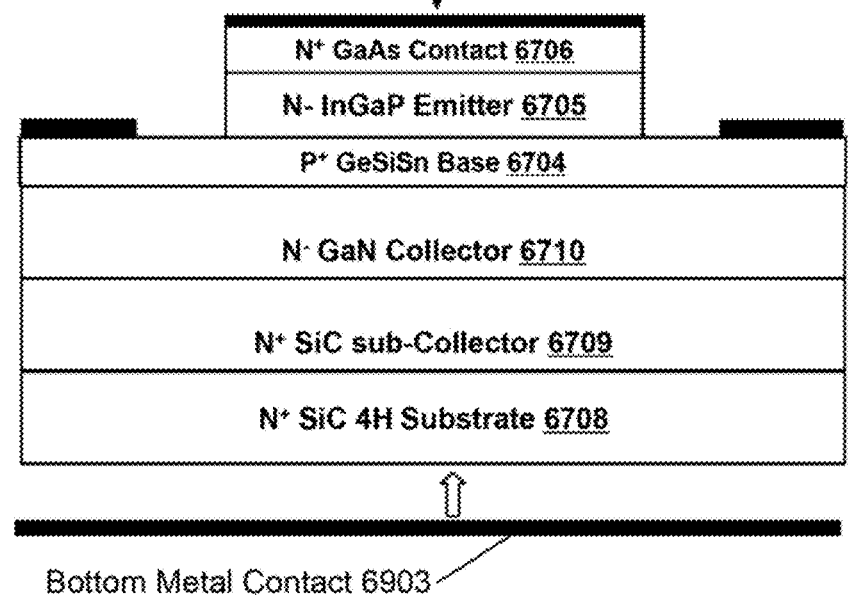

Inverted Top Half of HBT 7000

Figure 71
Wafer Bonding 7101
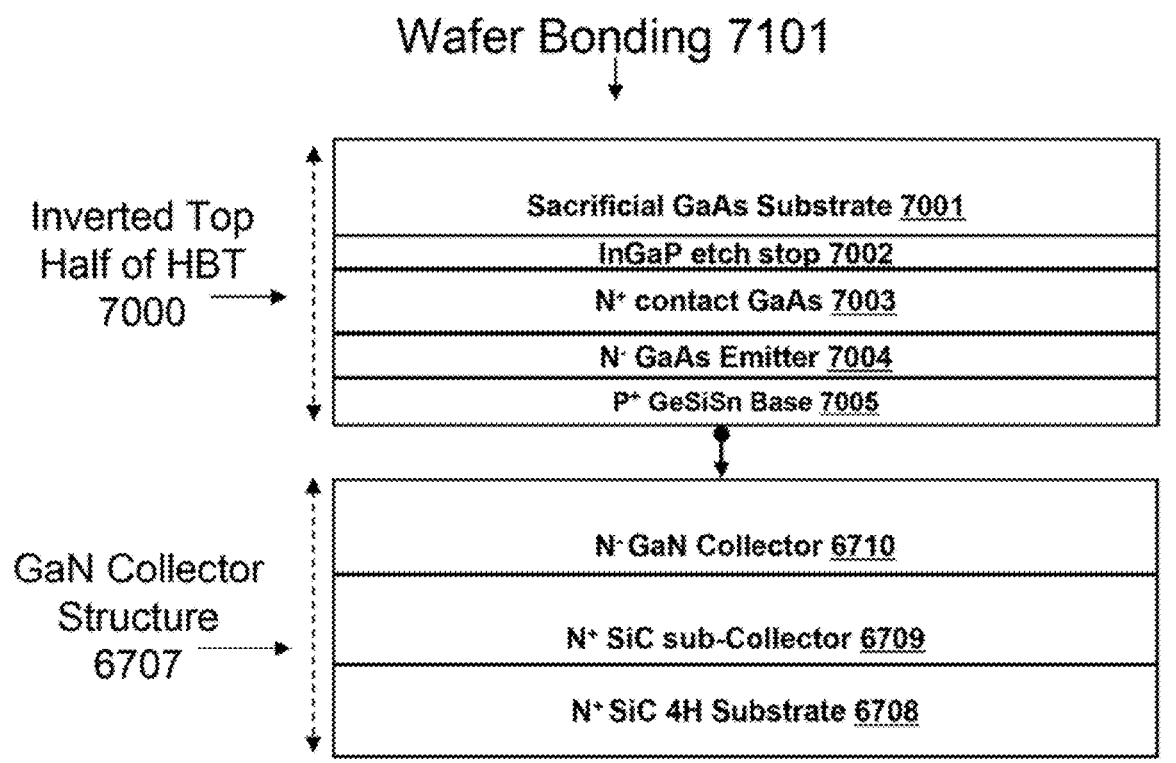
Wafer Bonded structure and removal
of sacrificial GaAs substrate and InGaP Stop etch 7102
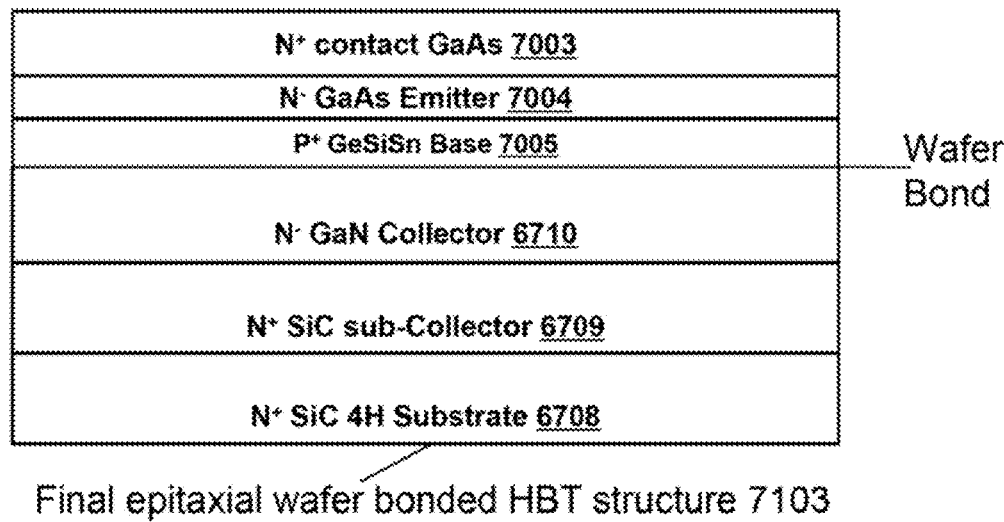
Final epitaxial wafer bonded HBT structure 7103

NPN GaAs Emitter – GeSi Base – cubic GaN Collector 7400

NPN GaAs Emitter – GeSiSn Base – ZnSe Collector 8100

NPN GaAs-GeSiSn-ZnSe Double HBT 8200

NPN GaAs Emitter – Graded GeSiSn to GeSn Base – ZnSe Collector HBT
8300

SCH Laser Utilizing a GeSn QW or QD Region with UID GeSiSn Barrier/OCL Region 8400

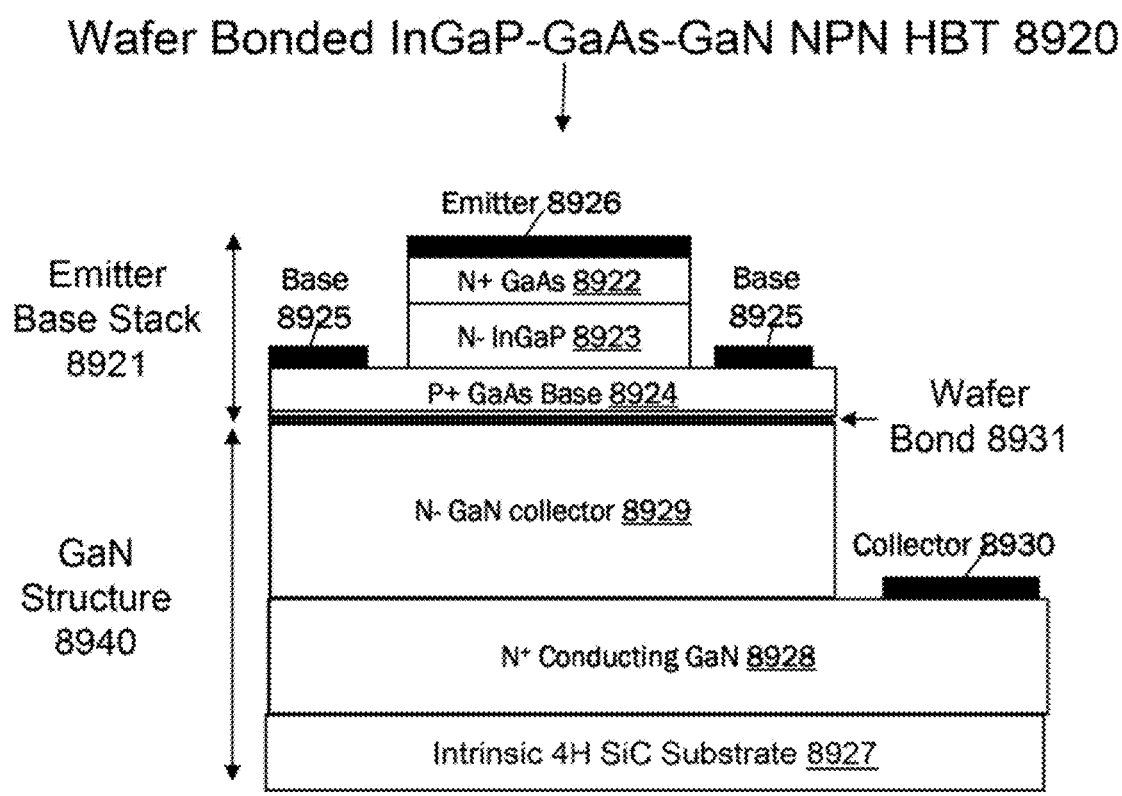

GERMANIUM-SILICON-TIN (GESISN) HETEROJUNCTION BIPOLAR TRANSISTOR DEVICES

CROSS-REFERENCE TO RELATED APPLICATIONS

This application claims benefit of U.S. Provisional Patent Application No. 62/677,180, filed May 29, 2018, the contents of which are hereby incorporated by reference.

Further, this application is a continuation-in-part of U.S. Non-Provisional patent application Ser. No. 15/606,965, filed May 26, 2017. Application Ser. No. 15/606,965 is a continuation of U.S. Non-Provisional patent application Ser. No. 14/504,114, filed Oct. 1, 2014, now U.S. Pat. No. 9,666,702, which is a continuation-in-part of U.S. Non-Provisional application Ser. No. 14/217,022, filed Mar. 17, 2014, now U.S. Pat. No. 9,437,772. Application Ser. No. 14/217,022 claims benefit of U.S. Provisional Patent Application No. 61/885,434, filed Oct. 1, 2013, and of U.S. Provisional Patent Application No. 61/800,175, filed Mar. 15, 2013. U.S. Non-Provisional patent application Ser. Nos. 15/606,965, 14/504,114 and 14/217,022, U.S. Provisional Patent Application No. 61/885,434, and U.S. Provisional Patent Application No. 61/800,175 are incorporated herein by reference in their entirety.

BACKGROUND

Heterojunction transistors, including heterojunction bipolar transistors are desirable for use as electronic and photonic devices.

BRIEF SUMMARY

This description relates generally to semiconductor devices, and more particularly to advanced heterojunction bipolar transistors (HBT), light emitting transistors (LET), transistor lasers, photo-diodes, photo-transistors and microelectronic devices. These devices may utilize quantum wells (QW) and quantum (QD) regions.

DESCRIPTION OF THE DRAWINGS

FIG. 1 shows a general configuration of a bipolar transistor as a three terminal device in its two constituent forms NPN and PNP.

FIG. 3 shows a flat band energy diagram for three typical heterojunction situations between the emitter and base materials: type I, type II, near zero conduction band offset.

FIG. 4 shows a flat band energy diagram for three typical heterojunction situations between the base and collector materials: type I, type II, near zero conduction band offset.

FIG. 59 shows an exemplary flat band energy diagram of an NPN HBT GaAs-graded GeSiSn—GeSn—GaN HBT. The compositionally graded GeSiSn—GeSn base layer can comprise at the emitter-base interface may be lattice matched or near latticed matched or strained $Ge_{1-z}(Si_{0.8}Sn_{0.2})_z$ to GaAs, where the GeSiSn may be compositionally graded by reducing the Si content and increasing Ge content to GeSn at the collector interface. The grading range can go from GeSiSn at the emitter-base junction to GeSn at the base-collector junction at various compositions.

FIG. 67 a shows a schematic of the top half of an HBT InGaP emitter/GeSiSn base stack with the inclusion of an AlAs separation layer and the GaN collector structure.

FIG. 68 shows a pre-processed top half of an HBT with GeSiSn base region and the HF etch of the AIAS and ELO.

FIG. 69 shows where a top half of an HBT with GeSiSn base wafer bonded to GaN collector structure.

FIG. 71 shows the wafer bonding of an inverted top half of an HBT with GeSiSn base region to a GaN collector structure.

FIG. 89 shows a possible exemplary cross-section device depiction of the wafer bonded InGaP—GaAs—GaN NPN HBT 8920 in a mesa configuration.

Figure 2:
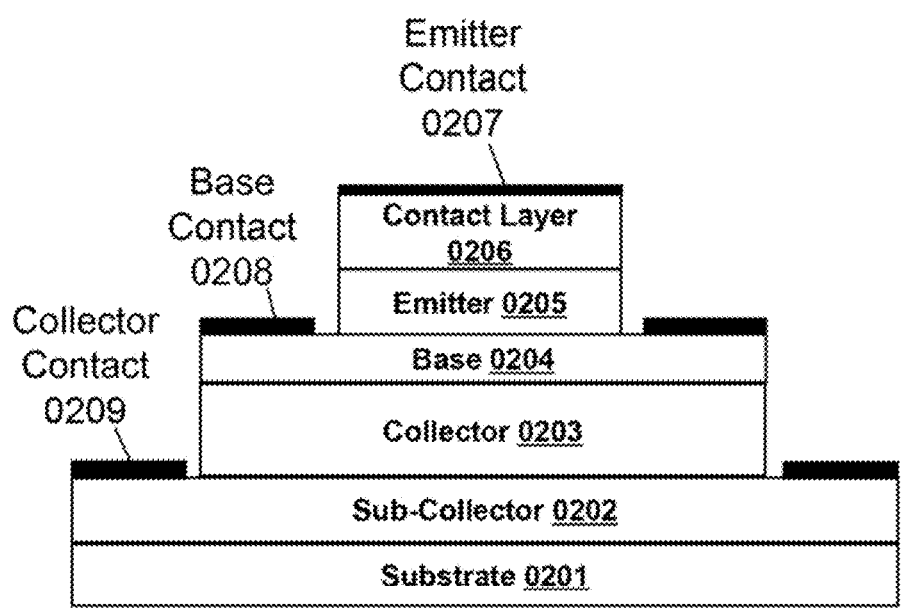
FIG. 2 shows a general cross-sectional device depiction of a bipolar transistor in a vertical stack geometry.

For simplicity and clarity of illustration, the drawing figures illustrate the general manner of construction, and descriptions and details of well-known features and techniques may be omitted to avoid unnecessarily obscuring the present disclosure. Elements in the drawing figures are not necessarily drawn to scale. For example, the dimensions of some of the elements in the figures may be exaggerated relative to other elements to help improve understanding of embodiments of the present disclosure. The same reference numerals in different figures denote the same elements.

The terms "first," "second," "third," "fourth," and the like in the description and in the claims, if any, are used for distinguishing between similar elements and not necessarily for describing a particular hierarchical, sequential, or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The terms "couple," "coupled," "couples," "coupling," and the like should be broadly understood and refer to connecting two or more elements or signals, electrically, mechanically or otherwise. Two or more electrical elements may be electrically coupled, but not mechanically or otherwise coupled; two or more mechanical elements may be mechanically coupled, but not electrically or otherwise coupled; two or more electrical elements may be mechanically coupled, but not electrically or otherwise coupled. Coupling (whether mechanical, electrical, or otherwise) may be for any length of time, e.g., permanent or semi-permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types. The absence of the word "removably," "removable," and the like near the word "coupled," and the like does not mean that the coupling, etc. in question is or is not removable.

DETAILED DESCRIPTION

The fabrication of a germanium-silicon-tin ($Ge_{1-x-y}Si_xSn_y$) semiconductor may be useful as a semiconductor material of a heterojunction bipolar transistor and/or light emitting transistor or transistor laser or light emitting device or laser or light absorbing or photo-diode or phototransistor for electronics and photonics is described herein. Where $Ge_{1-x-y}Si_xSn_y$ may be used as the base material in a heterojunction transistor; or can be used as the active region of a light emitting transistor or transistor laser or light emitting device or laser; or in a photo-diode or phototransistor is described. In one embodiment, a method of manufacturing a heterojunction bipolar transistor includes forming a $Ge_{1-x-y}Si_xSn_y$ base region. Note that $Ge_{1-x-y}Si_xSn_y$ may at various compositions be lattice matched to the lattice constants of GaAs and Ge semiconductors. Here y can vary from $0 \leq y \leq 0.1$, and x can vary $0 < x \leq 0.4$. $Ge_{1-x-y}Si_xSn_y$ can be comprised materials of Ge, $Ge_{1-a}Si_a$, $Ge_{1-b}Sn_b$, and $Si_{1-c}Sn_c$ at various compositions which may also be latticed matched or near latticed matched or strained to GaAs or Ge. GeSiSn may be also written in the following form $Ge_{1-z}(Si_{1-k}Sn_k)_z$. Where the value of k may be equal to 0.2 or near that value and have a range of values $0.1 \leq k \leq 0.4$ and where z has a range of $0 < z \leq 0.5$. However for the GeSiSn latticed matched or coherently strained to GaAs or Ge there may be a range of values that k can have, which may be close to 0.2. One may then write GeSiSn latticed matched or near latticed matched or strained to GaAs or Ge as $Ge_{1-z}(Si_{0.8}Sn_{0.2})_z$. In this designation the subscripts under the $Si_{0.8}$ and $Sn_{0.2}$ may be empirical values and can have a degree of variation as given by $0.1 \leq k \leq 0.4$ in $Ge_{1-z}(Si_{1-k}Sn_k)_z$. This form may be useful for the following materials composition $Ge_{1-z}(Si_{0.8}Sn_{0.2})_z$ where z is $0 < z \leq 0.5$, which may result in that $Ge_{1-z}(Si_{0.8}Sn_{0.2})_z$ may be lattice matched or near latticed matched or pseudomorphic to Ge or GaAs semiconductors. Thus GeSiSn has a range of Si and Sn for the lattice matched condition to GaAs and Ge. Here the lattice constant of GaAs and Ge may be about 5.65 Å. The lattice mismatch between Ge and GaAs may be less than about 0.1% which may be considered near-latticed matched or lattice matched. Also GeSiSn when grown on GaAs or Ge may be tensile or compressively strained, which may be useful in devices. Sometimes for strained GeSiSn the term pseudomorphic may be used. GeSi designated by $Ge_{1-a}Si_a$ may also be latticed matched or near lattice matched or coherently strained to GaAs or Ge. Here the value of a may be about 0.02, with a range of variation of $0.0 < a \leq 0.03$. Thus the designation for $Ge_{0.98}Si_{0.02}$ may represent GeSi lattice matched or near latticed matched or coherently strained to GaAs or Ge. In this designation the subscripts under the $Ge_{0.98}$ and $Si_{0.02}$ may be empirical values and can have a degree of variation as given by $0.0 < a \leq 0.3$ in $Ge_{1-a}Si_a$. The materials of Ge, $Ge_{1-a}Si_a$, $Ge_{1-b}Sn_b$, and $Si_{1-c}Sn_c$ may be interchanged with $Ge_{1-x-y}Si_xSn_y$ materials system for a variation of the embodiments of the devices elucidated. It should be noted where the subscripts are missing GeSiSn refers to $Ge_{1-x-y}Si_xSn_y$, GeSi refers to $Ge_{1-a}Si_a$, GeSn refers to $Ge_{1-b}Sn_b$, and SiSn refers to $Si_{1-c}Sn_c$. This terminology refers to the fact that alloy semiconductor GeSiSn consists of the following component materials GeSi, GeSn and SiSn at various possible compositions. Also it should be noted for GeSiSn where the Sn content is zero that GeSi can be grown latticed or near latticed matched to GaAs and Ge. This value may be close to the composition $Ge_{0.98}Si_{0.02}$. Throughout the context of the document $Ge_{1-x-y}Si_xSn_y$ may be referred to as GeSiSn where y can vary from $0 \leq y \leq 0.1$, and x can vary $0 < x \leq 0.4$. Also the term graded or grading refers to compositional grading of the semiconductor alloy.

In a further embodiment, a device includes: a first heterojunction bipolar transistor comprising a PNP device having a first GeSiSn base; and a second heterojunction bipolar transistor comprising an NPN device having a second GeSiSn base, wherein the first and second heterojunction bipolar transistors are located over a common substrate. In another embodiment, method of manufacturing a device includes: forming a first heterojunction bipolar transistor comprising a PNP device having a first GeSiSn base; and forming a second heterojunction bipolar transistor comprising an NPN device having a second GeSiSn base, wherein forming the first and second heterojunction bipolar transistors occur simultaneously with each other over a common substrate. In yet another embodiment, a device includes: a first bipolar transistor comprising a first GeSiSn base; and a second bipolar transistor comprising a second GeSiSn base, wherein the first and second bipolar transistors are complementary devices and are located over a common substrate. In a further embodiment, a method of manufacturing a device includes: forming a first bipolar transistor comprising a first GeSiSn base; and forming a second bipolar transistor comprising a second GeSiSn base, wherein forming the first and second bipolar transistors occur simultaneously with each other over a common substrate. In still another embodiment, a bipolar transistor includes a GeSiSn base region, and in yet another embodiment, a method of manufacturing a bipolar transistor includes providing a GeSiSn base region. In a further embodiment, a transistor laser or light emitting transistor includes a GeSiSn active region, and in another embodiment, a method of forming a transistor laser includes forming a GeSiSn active region. The description herein elucidates a methodology for making a heterojunction bipolar transistor (HBT) that utilizes GeSiSn as the base material. Furthermore, the unique properties of GeSiSn can be utilized as the active region of a variation of the transistor which is the transistor laser, or in a light emitting device like a laser. The GeSiSn can be used also as a light detection material for photo-diodes or photo-transistors embodiments described herein can relate to the following: GeSn which has the smallest bandgap energy for the material systems GeSi, GaN, GaAs, Si, InP, Ge, Sn, AlAs, InAs, GaP, ZnSe, SiC and the alloy semiconductor GaNInAs etc., and thus would be useful for making a heterojunction bipolar transistor, laser or transistor laser device or light emitting transistor or photo-diode or photo-transistor. Embodiments described herein can relate to GeSiSn ($Ge_{1-x-y}Si_xSn_y$) or GeSi ($Ge_{1-a}Si_a$) or GeSn ($Ge_{1-b}Sn_b$) or SiSn ($Si_{1-c}Sn_c$), and may have small bandgap energies (less than 1 eV), and may be relaxed, lattice matched, near lattice matched, pseudomorphic, tensile strained or compressively strained or coherently strained. Note that besides GeSiSn, that Ge or GeSn or GeSi or SiSn may make useful base materials for a heterojunction bipolar transistor (HBT). Nomenclature: Ga (gallium), N (nitrogen or nitride), As (arsenic or arsenide), Si (silicon), In (indium), P (phosphorous or phosphide), Ge (germanium), Al (aluminum), Sn (tin), Sb (antimony or antimonide), B (boron), C (carbon, carbide), Zn (zinc), and Se (selenium, selenide), Te (tellurium or telluride).

The embodiments can relate to the following:
1) Bipolar transistor using a latticed matched GeSiSn or strained GeSiSn base.
2) Bipolar transistor using a latticed matched GeSn or strained GeSn base.
3) Bipolar transistor using a latticed matched SiSn or strained SiSn base.
4) Bipolar transistor using a latticed matched GeSi or strained GeSi base.
5) Bipolar transistor using a compositionally graded GeSiSn—GeSn base.
6) Bipolar light emitting transistor or transistor laser using in the base region a strained GeSiSn quantum well, quantum dot, or GeSn quantum well (QW), quantum wire, or quantum dot (QD) active region.
7) Light emitting or laser structure using GeSiSn or strained Ge quantum well (QW), quantum wire, or quantum dot (QD) active region.
8) A photo-diode using a GeSiSn absorbing region.
9) A photo-transistor using a GeSiSn absorbing region.

The same or different embodiments can relate to:
1) Lateral structures (edge emitting).
2) Vertical structures.
3) Inverted vertical structures.
4) Indirect bandgap GeSiSn.
5) Indirect bandgap SiSn.
6) Indirect bandgap GeSi.
7) Indirect bandgap GeSn
10) Direct bandgap GeSn.
11) Strained GeSiSn: tensile or compressively strained.
12) Single or Multiple quantum well layers.
13) Single or Multiple quantum dot layers.
14) Single or Multiple quantum wire layers.

In one embodiment, a heterojunction bipolar transistor can include a GeSiSn base region. In another embodiment, a heterojunction bipolar transistor can include a GeSn base region. In another embodiment, a heterojunction bipolar transistor can include a Ge base region. In another embodiment, a heterojunction bipolar transistor can include a GeSi base region. In another embodiment, a heterojunction bipolar transistor can include a SiSn base region. In another embodiment, a method of manufacturing a heterojunction bipolar transistor can include forming a GeSiSn base region. Note that the term GeSiSn may be comprised of the following materials Ge, GeSi, GeSn, or SiSn. In a further embodiment, a device can include a first heterojunction bipolar transistor comprising a PNP device having a first GeSiSn base, and a second heterojunction bipolar transistor including an NPN device having a second GeSiSn base.

A bipolar transistor or bipolar junction transistor is a three terminal or three layer device that relies on doping (adding "impurity" atoms) of the semiconductor layers to form N-type or "N" (electron surplus layer) semiconductor and P-type or "P" (electron deficient layer) semiconductor to form PN junction (diodes) in a three terminal configuration. This three terminal or three layer device can include back-to-back PN junctions to form a three layer sandwich with each of the layers named the emitter, base, and collector. There are two kinds of bipolar transistors, NPN and PNP.

For simplicity and clarity of illustration, the drawing figures illustrate the general manner of construction, and descriptions and details of well-known features and techniques may be omitted to avoid unnecessarily obscuring the present disclosure. Elements in the drawing figures are not necessarily drawn to scale. For example, the dimensions of some of the elements in the figures may be exaggerated relative to other elements to help improve understanding of embodiments of the present disclosure. The same reference numerals in different figures denote the same elements.

FIG. 1 shows a general configuration of a bipolar transistor as a three terminal device in its two constituent forms NPN 0101 and PNP 0108. The NPN 0101 structure comprises an N-type emitter 0102, connected to a P-type base 0103, which is then connected to a N-type collector 0104 region, which comprises the three terminal device. The corresponding currents in the three terminal device correspond to the emitter current $I_E$ 0105, base current $I_B$ 0106, and collector current $I_C$ 0107. The NPN 0101 device has a junction at the emitter-base, where the applied voltage is $V_{BE}$ 0115, and a second junction at the base-collector, where the applied voltage is $V_{BC}$ 0116.

The PNP 0108 structure comprises a P-type emitter 0109, connected to an N-type base 0110, which is then connected to a P-type collector 0111 region, which comprises the three terminal device. The corresponding currents in the three terminal device correspond to the emitter current $I_E$ 0112, base current $I_B$ 0113, and collector current $I_C$ 0114. The PNP 0108 device has a junction at the emitter-base, where the applied voltage is $V_{BE}$ 0117, and a second junction is at the base-collector, where the applied voltage is $V_{BC}$ 0118. The base-emitter voltage $V_{BE}$ turns on the transistor and generally is operated in forward bias, and the base-collector voltage $V_{BC}$ is generally reversed biased and also determines the breakdown voltage of the device.

The base region controls the operation of the transistor. The characteristics and properties of the base material and the base-emitter junction and the base-collector junction are the dominant factors that determine the electronic properties of bipolar and heterojunction bipolar transistors. Thus the utilization of a new type of base material in these transistors allows for the development of vastly improved transistors for high speed and power efficient operation.

Semiconductors can be discussed in terms of their energy band structure. The energy band structure shows the allowable carrier (electron or hole) energy states for semiconductor as a function of the crystal momentum direction. The energy band structure can be divided into two main regions: the conduction band; and the valence band. N-type material conduction relies on free movement of electrons in the conduction band of the material. The conduction band can be characterized by the conduction band energy level (lowest energy in the conduction band). P-type material conduction relies on the free movement of holes (hole: absence of an electron) in the valence band of the material. The valence band is characterized by the valence band energy level (or the highest energy level in the valence band). The difference between the conduction band energy level and the valence band energy level determine the energy bandgap of the semiconductor (difference of the conduction band energy minima to the valence band energy maxima).

At the PN junctions of the bipolar transistor, there exists a depletion zone that in the absence of an externally applied electric field prevents the movement of the charge carriers across the junctions or different layers. The operation of this device relies on two types of carriers, free electrons (negative charges in the conduction band) and free holes (absent electron charge carrier, positive charge in the valence band). Thus, the name bipolar is ascribed to this device because its operation involves both electrons and holes, as opposed to unipolar devices like field effect transistors whose operation involves only one of electrons or holes.

The bipolar transistor has three distinct regions: the emitter, the base, and the collector. The flow of charges (called electrical current or current) in this transistor is due to the bidirectional diffusion of charge carriers across the junction. The bipolar transistor is biased as follows. The emitter is forward biased via the contact pads with the voltage potential (base-emitter voltage $V_{BE}$) to force charge carriers from the emitter to the base. The collector is reversed biased via the contact pads with a voltage potential (base-collector voltage) that causes charge carriers to be attracted from the base to the collector. The corresponding currents are called the emitter current, base current, and the collector current.

FIG. 2 shows a general configuration of a bipolar transistor as a vertical stack geometry. Typically the structure can be grown epitaxially, ion implanted or fabricated by various means. For a vertical bipolar transistor, typically a conducting or insulating substrate 0201 is used as the seed crystal to start the growth of the structure. A highly conducting sub-collector 0202 is then grown, followed by a low doped collector 0203. The base 0204 which is of opposite conductivity as the collector 0203 is then grown, followed by an emitter 0205, and finally a highly conducting contact layer 0206. Electrical contact is made to device via the metalized contact pads: emitter contact 0207, base contact 0208, and collector contact 0209. The voltages and currents are applied to the device via the contact pads. Vertical configuration offers some advantages.

Some of the advantages of a bipolar device are: typically in an NPN configuration electrons travel vertically in the device from the emitter to the collector. Thus it is straightforward to produce devices where the electron transit time through the device is short (high cut off frequency $F_t$). Generally the entire area of the emitter contact conducts the current; thus one can have high current densities in a small area, thus allowing for high circuit densities. The turn-on voltage (voltage across the base-emitter junction) $V_{BE}$ is independent of device processing issues like size because it corresponds to the potential at the base-emitter junction, thus process variations across a wafer can be minimized which is desirable for manufacturing. The turn-on voltage $V_{BE}$ controls the output current at the collector $I_C$ and results in a high transconductance $g_m = eI_C/k_BT$, where "e" is the charge of the electron, "$I_C$" is the collector current, "$k_B$" is Boltzmann's constant, and "T" is the temperature. This is the highest transconductance available for any three terminal device and allows circuit operation with low $V_{BE}$ swings.

The operation of the bipolar transistor (transistor action) is based on the flow of charge carriers injected from the emitter into the base which can diffuse into the collector forming the emitter to collector current (collector current). The free charge carriers initially in the emitter are called majority carriers. The majority charge carriers that are injected into the base from the emitter, once in the base, are called minority carriers, which then can diffuse to the collector. The base region controls the flow of the minority carriers injected into the base thus controlling the flow of the collector current from the emitter to the collector. By drawing out the minority carriers that are injected into the base from the emitter, small levels of minority carriers drawn from the base control the larger collector current that flows from the emitter to the collector. Also, the base region is made thin to enhance the diffusion of carriers from the emitter to the collector.

The current gain or "beta" of the bipolar transistor is the ratio of the collector current $I_C$ to the base current $I_B$. Basically, the ratio is the number of carriers that get across the transistor from the emitter to the collector, vs. the number of carriers that get caught in the base.

For a typical NPN transistor, the biasing scheme is as such. The emitter to base $V_{BE}$ bias is such that the base is biased slightly positive as compared to the emitter. The collector to base $V_{BC}$ bias is such that the collector is biased much more positively than the base. This biasing scheme can ensure that, for small values of base current, large values of collector currents can be controlled. The current gain is typically about "100".

For a typical PNP transistor, the biasing scheme is as such. The emitter to base $V_{BE}$ bias is such that the base is biased slightly negative as compared to the emitter. The collector to base $V_{BC}$ bias is such that the collector is biased much more negatively than the base. This biasing scheme can ensure that, for small values of base current, large values of collector currents can be controlled.

The bipolar homojunction transistor can be made of one semiconductor material. The bipolar transistor can be used as a switch, amplifier, or oscillator, etc. It can be fabricated in discrete (single) component or as a component in integrated circuits.

Heterojunction bipolar junction transistors (HBT) can differ from the bipolar transistor (also called a homojunction bipolar transistor) by using at least two different semiconductors. The heterojunction bipolar transistor typically uses different semiconductor materials for at least one of the junctions, the emitter-base junction, and/or the base-collector junction. The use of differing semiconductor materials is called a heterojunction.

Heterojunction bipolar transistors (HBTs) can be advantageous in some situations for formation of the emitter-base junction. In homojunction transistors, the emitter is typically doped (impurity incorporation with an atomic element to create free charge carriers) more heavily than the base region. If the heterojunction is designed properly, the emitter has an energy bandgap greater than the base region. If the conduction and valence band alignment of the two materials that form the heterojunction is proper, it is then possible to limit the injection of majority carriers (initial free charge carriers in the base) of the base region into the emitter region (or can be termed as to limit the minority carrier injection into the emitter). This occurs because the heterojunction can create a potential barrier either in the valence or conduction band to block the majority carriers in the base, thus eliminating injection of majority carriers from the base into the emitter. In the heterojunction transistor, the base can be heavily doped at concentrations much greater than the emitter material. The physics of the heterojunction can be strongly determined by the conduction and valence band alignment between the materials.

FIG. 3 shows a flat band energy diagram for three typical heterojunction situations between emitter and base materials (focuses on the case where we have an N-type emitter material and a P-type base material): type I, type II, and near zero conduction band offset. The heterojunction is at the interface between the emitter material and the base material. The type of diagram depicted is called a flat band energy diagram, which represents how the conduction band edge 0310 and the valence band edge 0311 change as one goes through the dissimilar semiconductor materials. The vertical axis 0312 has the value of Energy with typical units of "eV", and the horizontal axis 0313 is the relative Distance in arbitrary units "A.U." through the heterojunction of semiconductor materials. The energy level line called the conduction band edge 0310 is the minimum energy value of the conduction band, and the energy level line called the valence band edge 0311 is the maximum value of the valence band. The diagram shows distance on the horizontal scale and that is a relative distance into the semiconductor device. One could put units of thickness, but that is usually omitted, and this represents a schematic for carrier transport. The difference between the conduction band edge 0310 and the valence band edge 0311 in the base material is the bandgap energy of the base material. The difference between the conduction band edge 0310 and the valence band edge 0311 in the emitter material is the bandgap energy of the emitter material.

There are various types of heterojunctions between the emitter and base materials: (1) Type I heterojunction 0301; (2) Type II heterojunction 0302; and (3) near zero conduction band offset 0303 (there can also be a near zero valence band offset) at the heterojunction. Type I heterojunction has an energy discontinuity at the conduction band and valence band, where the smaller bandgap at base material 0305 lies between the conduction and valence band edges of emitter material 0304. $\Delta E_C$ is called the conduction band offset at the emitter-base heterojunction (difference between the conduction band edges in the respective materials), and $\Delta E_V$ is called the valence band offset at the emitter-base junction (difference between the valence band edges in the respective materials). Type II heterojunctions have a discontinuity at the conduction and valence band edge, but the base energy alignment is staggered or offset. The energy bandgap of base material 0307 can be staggered above emitter material 0306, and the bandgap as depicted in the figure (or staggered below the emitter material 0306 bandgap). One can have a situation of a zero or near zero conduction band offset heterojunction 0303 as shown in the figure, where the conduction band offset $\Delta E_C$ is zero or small, typically less than 0.1 eV between emitter material 0308 and base material 0309.

For NPN heterojunction transistors, where the emitter material is N-type and the base material is P-type, a large valence band offset $\Delta E_V$ between the emitter and the base is desired, as shown in the three cases: (1) Type I heterojunction 0301; (2) Type II heterojunction 0302; and (3) near zero conduction band offset heterojunction 0303. This large valence band offset $\Delta E_V$ prevents the back injection of holes from the base to emitter, which can reduce the gain of the transistor. Thus the base material bandgap energy should be less than the emitter material bandgap energy. Looking at the FIG. 3 diagram, it seems that a type II heterojunction current 0302 would be preferable because it has the largest valence band offset $\Delta E_V$, but in some examples, the desired situation for the efficient transport of carriers across the base to promote transistor action may be that there is a near zero conduction band offset heterojunction 0303 situation or where the conduction band offset $\Delta E_C$ may be typically less than 0.1 eV.

FIG. 4 shows a flat band energy diagram for three typical heterojunction situations between the base material and the collector material (focuses on the case where we have a P-type base material and an N-type collector material): type I, type II, and near zero conduction band offset. The heterojunction is at the interface between the base material and collector material. The type of diagram depicted is called a flat band edge energy diagram, where the vertical axis is the Energy (eV) 0412 value and the horizontal axis is a relative Distance (A.U.) 0413 through heterojunction of semiconductor materials. The energy level lines are called the conduction band edge 0410, is the minimum energy value of the conduction band and the valence band edge 0411 is the maximum value of the valence band. The diagram shows distance on the horizontal scale, and the distance is a relative distance into the semiconductor device. One could put units of thickness, but that is usually omitted and this represents a schematic for carrier transport. The difference between the conduction band edge 0410 and the valence band edge 0411 in the base material is the bandgap energy of the base material. The difference between the conduction band edge 0410 and the valence band edge 0411 in the collector material is the bandgap energy of the collector material.

There are various types of heterojunctions between the base and collector materials: (1) Type I heterojunction 0401; (2) Type II heterojunction 0402; and (3) near zero conduction band offset 0403 (there can also be a near zero valence band offset) at the heterojunction. Type I heterojunction has an energy discontinuity at the conduction band and valence band, where the smaller bandgap base material 0404 regions lies between the conduction and valence band edges of the collector material 0405. $\Delta E_C$ is called the conduction band offset at the base-collector heterojunction (difference between the conduction band edges in the respective materials), and $\Delta E_V$ is called the valence band offset at the base-collector heterojunction (difference between the valence band edges in the respective materials). Type II heterojunctions have a discontinuity at the conduction and valence band edge, but the base energy alignment is staggered or offset. The energy bandgap of base material 0406 can be staggered above the bandgap of collector material 0407 as depicted in the figure (or staggered below the bandgap of collector material 0407). One can have a situation of a zero or near zero conduction band offset heterojunction 0403 as shown in the figure, where the conduction band offset $\Delta E_C$ is zero or small, typically less than 0.1 eV between the base material 0408 and the collector material 0409.

For NPN heterojunction transistors, where the base material is P-type and the collector material is typically N-type, one would like a large collector bandgap energy because this allows the NPN transistor to have a big breakdown voltage. Looking at the FIG. 4 diagram, it seems that a type II heterojunction 0402 would be preferable because the base material 0406 has higher conduction band energy than the collector material 0407, but in some examples, the possible desired situation for the efficient transport of carriers across the base to promote transistor action is the there may be a near zero conduction band offset heterojunction 0403 situation or where the conduction band offset $\Delta E_C$ may be less than 0.1 eV.

Figure 5:
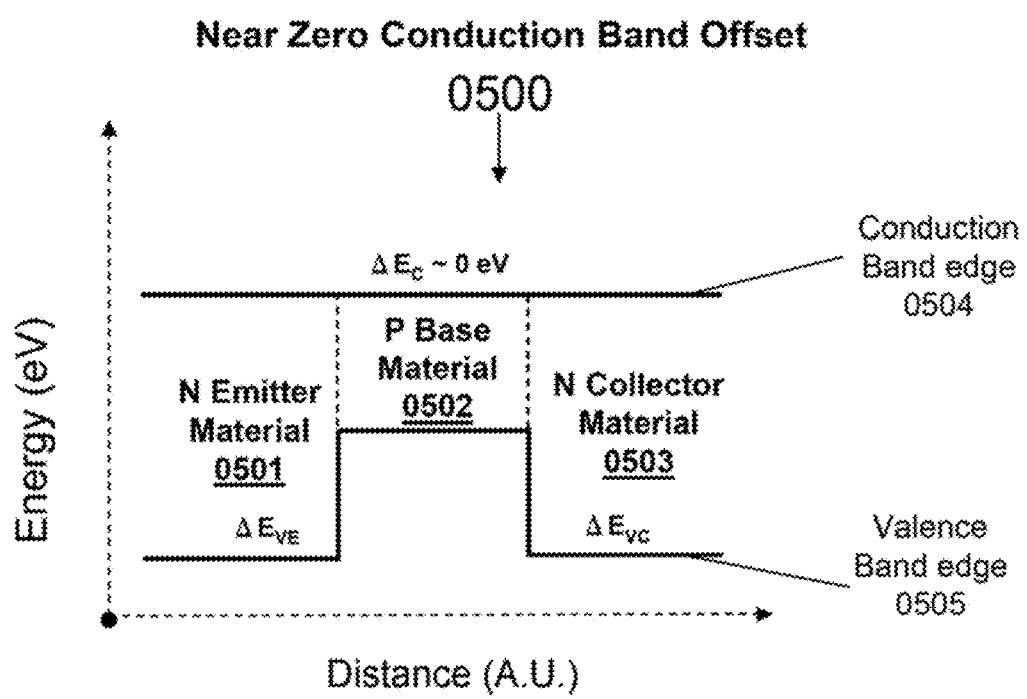
FIG. 5 shows a flat band edge diagram for an NPN transistor for possibly enhanced transport.

FIG. 5 shows a flat band energy diagram through an NPN heterojunction bipolar transistor 0500 for possibly enhanced carrier transport. The figure shows the lineup of the conduction band edge 0504 and the valence band edge 0505 through the NPN heterojunction transistor 0500. There is a zero conduction or near zero conduction band edge offset $\Delta E_C$ from the N emitter material 0501 to the P base material 0502 to the N collector 0503. The emitter-base valence band offset is represented by $\Delta E_{VE}$ and the base-collector valence band offset is $\Delta E_{VC}$. In physical situations it is desirable to have the smallest conduction band offset that is possible from N emitter material 0501 to P-base material 0502 to N collector 0503. Here the bandgap energy of N emitter material 0501 is larger than the bandgap energy of P base material 0502, where there is a large valence band offset $E_{VE}$ between N emitter material 0501 to P base material 0502, and the junction is a heterojunction. The bandgap energy of N collector material 0503 can be less than, equal to, or greater than the bandgap energy of P base material 0502. Generally the bandgap energy of N collector material 0503 should be equal to, or greater than the bandgap energy of P base material 0502. The greater the bandgap energy of N collector material 0503 the better the breakdown voltage of NPN heterojunction bipolar transistor 0500. This is generally desirable for high power and robust devices. If N collector material 0503 is the same material as P base material 0502, there is a homojunction at the base-collector junction and a heterojunction at the emitter-base junction, and such a device is called a single heterojunction bipolar transistor device. If N emitter material 0501 and N collector material 0503 are the same, then the device is called a symmetric double heterojunction bipolar transistor device, and such a device results in a minimum in zero offset voltage in the measurement of the collector current vs. the collector-emitter voltage as a function of the stepped voltage bias of the base-emitter junction, which is desirable to improve the power added efficiency of NPN heterojunction bipolar transistor 0500. For robust and high power, one would like the collector bandgap energy to be as large as possible. If the emitter material, the base material, and the collector material are all dissimilar, the device would be called an asymmetric double heterojunction bipolar transistor device.

The NPN heterojunction transistor can promote efficient transport when there may be a zero or near zero or the smallest conduction band offset between emitter-base-collector. In an NPN device, the electrons are key carrier that makes up the collector current, and the base-emitter junction controls this electron current. The base alignment of the conduction band offset can be desirable in some examples. Large conduction band energy offsets or discontinuities at the emitter-base or collector-base junctions can hinder electron transport.

Figure 6:
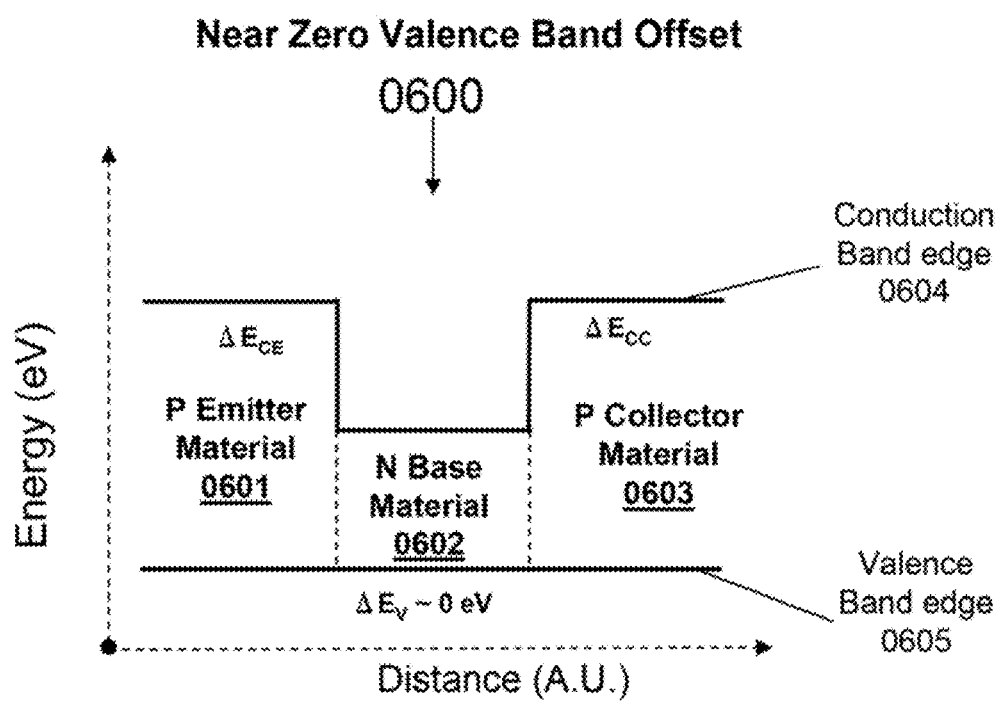
FIG. 6 shows a flat band edge diagram for a PNP transistor for possibly enhanced transport.

FIG. 6 shows a flat band energy diagram through a PNP heterojunction bipolar transistor 0600 for possibly enhanced carrier transport. The figure shows the line-up of conduction band edge 0604 and valence band edge 0605 through PNP heterojunction transistor 0600. There is a zero valence band or near zero valence band edge offset $\Delta E_V$ from P emitter material 0601 to N base material 0602 to P collector 0603. The emitter-base conduction band offset is represented by $\Delta E_{CE}$ and the base-collector conduction band offset is $\Delta E_{CC}$. In physical situations it is desirable to have the smallest valence band offset that is possible from P emitter material 0601 to N base material 0602 to P collector 0603. Here the bandgap energy of P emitter material 0601 is larger than the bandgap energy of N base material 0602, where there is a large conduction band offset $\Delta E_{CE}$ between P emitter material 0601 to N base material 0602, and the junction is a heterojunction. The bandgap energy P collector material 0603 can be less than, equal to, or greater than the bandgap energy of N base material 0602. Generally the bandgap energy of P collector material 0603 should be equal to, or greater than the bandgap energy of N-base material 0602. The greater the bandgap energy of P collector material 0603 the better the breakdown voltage of PNP heterojunction bipolar transistor 0600. This is generally desirable for high power and robust devices. If P collector material 0603 is the same material as N base material 0602, there is a homojunction at the base-collector junction and a heterojunction at the emitter-base junction, and such a device is called a single heterojunction bipolar transistor device. If P emitter material 0601 and P collector material 0603 are the same, then the device is called a symmetric double heterojunction bipolar transistor device, and such a device results in a minimum in zero offset voltage in the measurement of the collector current vs. the collector-emitter voltage as a function of the stepped voltage bias of the base-emitter junction, which is desirable to improve the power added efficiency of PNP heterojunction bipolar transistor 0600. For robust and high power, one would like the collector bandgap energy to be as large as possible. If the emitter material, the base material, and the collector material are all dissimilar the device would be called an asymmetric double heterojunction bipolar transistor device.

A PNP heterojunction transistor can promote efficient transport when there may be a zero or near zero valence band offset between emitter-base-collector. In a PNP device, the holes are key carriers that make up the collector current, and the base controls this hole current. The base alignment of the valence band offset can be desirable in some examples. Valence band energy discontinuities at the emitter-base or collector-base junctions can hinder hole transport.

The relationship of the conduction and valence band offsets for many semiconductors may be well studied, and numerous values of the conduction band offsets $\Delta E_C$ and valence band offsets $\Delta E_V$ between dissimilar semiconductors (heterojunction) have been published in the literature.

Unlike homojunction bipolar transistors, heterojunction bipolar transistors (HBTs) allow for a higher base doping density (>1×10$^{19}$ cm$^{-3}$) thus reducing the base resistance and maintaining current gain. For NPN HBTs, higher base doping density can occur as a result of the large valence band offset at the emitter-base junction. For PNP HBTs, higher base doping density can occur as a result of the large conduction band offset at the emitter-base junction.

Typically, one would like to have the highest doping density that is possible in the base. Typically the highest levels of base doping are greater than 1×10$^{19}$ cm$^{-3}$. High doping levels may be typically greater than 1×10$^{18}$ cm$^{-3}$ range and typically low doping levels may be in the 1×10$^{16}$ cm$^{-3}$ to 5×10$^{17}$ cm$^{-3}$ range. The high doping density in the base causes a reduction in the base sheet resistance thus allowing the transistor to have larger $F_{max}$ (e.g., the maximum frequency to get power gain out of the transistor). Also, by having high base doping one can reduce the thickness of the base and increase the $F_t$ (e.g., the transit frequency, time for carrier to go across base region). The relationship between transit frequency $F_t$ and the maximum oscillation frequency $F_{max}$ is as follows for an HBT: $F_{max}=(F_t/8\pi R_B C_{CB})^{1/2}$. The transit frequency $F_t$ is basically inverse of the time for the electron to traverse the emitter, base and collector. The parameters $R_B$ and $C_{CB}$ refer to the base sheet resistance and the capacitance of the collector-base junction. The parameter $F_{max}$ is the unity power gain frequency and indicates the maximum frequency with power gain from a device.

The reason why heterojunction bipolar transistors (HBTs) can be advantageous is that heterojunction bipolar transistors (HBTs) may allow for a higher base doping density (>1×10$^{19}$ cm$^{-3}$) thus reducing the base resistance and maintaining current gain. For various choices of the emitter and base materials, it is possible to obtain large valence band offset $\Delta E_V$. This large valence band offset $\Delta E_V$ prevents the back injection of minority carriers into the emitter, thus keeping the gain of the HBT high (no degradation of the gain with high doping of the base material).

In some examples for the base-collector junction, the base-collector breakdown voltage is set by the energy bandgap of the collector material. Typically, one would like to have a low energy bandgap base material (typically these are relevant semiconductors with bandgaps less than 1.0 eV, like GeSn or Ge or GeSi or GeSiSn or InGaAs or GaAsSb because that sets the turn-on voltage of the base-emitter junction or the onset of transistor action. However, in a homojunction (base and collector materials are the same), a low energy bandgap at the collector can result in a low base-collector breakdown voltage. Thus a large potential difference between the base and the collector junction could allow the transistor to have a low breakdown voltage which causes the transistor to be easily damaged thus hurting ruggedness. In a heterojunction bipolar transistor, it is possible to combine a low energy bandgap base region with a large energy bandgap collector region thus allowing for a large breakdown voltage. Heterojunctions transistor properties can be enhanced utilizing specific materials for the emitter, base, and collector.

The characteristics and properties of the base and the base-emitter junction and the base-collector junction are the dominant factors that determine the electronic properties of bipolar and heterojunction bipolar transistors. Thus the utilization of a new type of base material like GeSiSn in these transistors allows for the development of vastly improved transistors for high speed and power efficient operation.

GeSiSn is a useful material for use as the base material for bipolar transistors because it can be latticed matched to GaAs or Ge. It can also be grown pseudomorphic, tensile strained or compressively strained on GaAs or Ge. GeSiSn can be used a quantum wells (QW) or quantum dots (QD) active region for light emission in devices such as a light emitter, laser or transistor laser or light emitting transistor (LET). For light emitters or absorbers, GeSiSn can be a barrier of optical confinement layer (OCL).

Lasers are devices that can produce intense narrowly divergent, substantially single wavelength (monochromatic), coherent light. Laser light of different wavelengths can be advantageously applied in many fields, including biological, medical, military, space, industrial, commercial, computer, wireless devices, and telecommunications.

Semiconductor lasers may utilize an active region, which may be formed with a homojunction (using similar materials), single or double heterojunction (using dissimilar materials), or with a quantum well ("QW"), quantum dot ("QD"), quantum wire, or quantum cascade region. The energy transitions can occur from interband or inter-sub-band electronic states. The quantum well, quantum dot, or quantum wire structure may be formed when a low energy bandgap semiconductor material is typically surrounded or confined by a larger bandgap semiconductor materials. These quantum confined heterostructures can be type I, type II, or type III (broken energy alignment). The fundamental wavelength that characterizes quantum well (QW) or quantum dot (QD) is determined primarily by the thickness, composition, and material of the quantum well.

In order for lasing to occur, a laser device typically has a resonant cavity and a gain medium to create population inversion. In some highly efficient semiconductor laser examples, population inversion generally occurs with the injection of electrical carriers into the active region, and the resonant cavity is typically formed by a pair of mirrors that surround the gain medium. The method of injection of carriers can be divided into electrical injection of carriers and optical pumping for injection of carriers. Electrical injection is generally performed by an electrical current or voltage biasing of the laser and forms the basis of the electrical injection laser. Optical pumping typically uses incident radiation that allows the formation of electrons and holes in the laser. These methods can be operated in a continuous wave (CW) pulsed, synchronous, or asynchronous modes.

Figure 7:
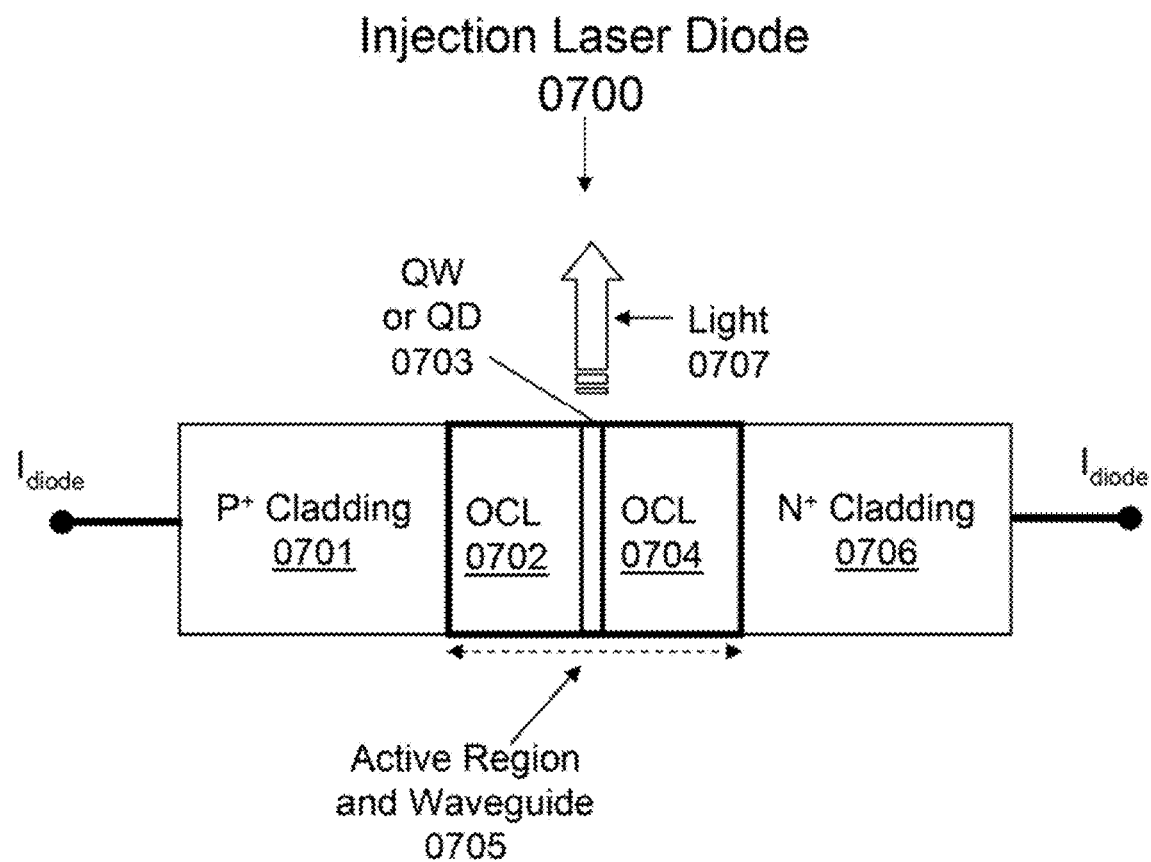
FIG. 7 shows a general configuration of an injection laser diode, with a quantum well or quantum dot active region.

FIG. 7 shows a general configuration of a PN junction laser or injection laser diode 0700, with a quantum well or quantum dot 0703 active region. This PN junction device operates on the principle of minority injection of carriers (electrons and holes, the $I_{diode}$ current) into the active region and waveguide 0705. The P$^+$ cladding 0701 region may serve as the injection of holes. N$^+$ cladding 0706 may serve as the injection of electrons. It can be possible when a low bandgap material is placed inside a larger energy bandgap, like the optical confinement layers OCL 0702 and OCL 0704, the formation of QW or QD 0703 can be formed. These QW or QD 0703 can serve as the active region for the collection of both electrons and holes and produces the inverted population necessary for laser operation. The wide bandgap P$^+$ cladding 0701 and N$^+$ cladding 0706 semiconductors provide for the optical confinement because their index of refraction is generally lower than that of the optical confinement materials OCL 0702 and OCL 0704. The cladding layers also provide funneling of the electrical carriers to the QW or QD 0703 regions. Light 0707 can be produced by recombination of carriers in the QW or QD. There are the optical confinement layers (OCL) which serve as the barrier to the QW or QD region thus providing for the quantum confinement, and also serves as the waveguide material. The OCL layers generally have bandgap energies between that of the QW or QD and the wide bandgap energy cladding layers. The combination of the QW or QD 0703 and the OCL 0702 and OCL 0704 form the active region and waveguide 0705 of the laser structure.

Figure 8:
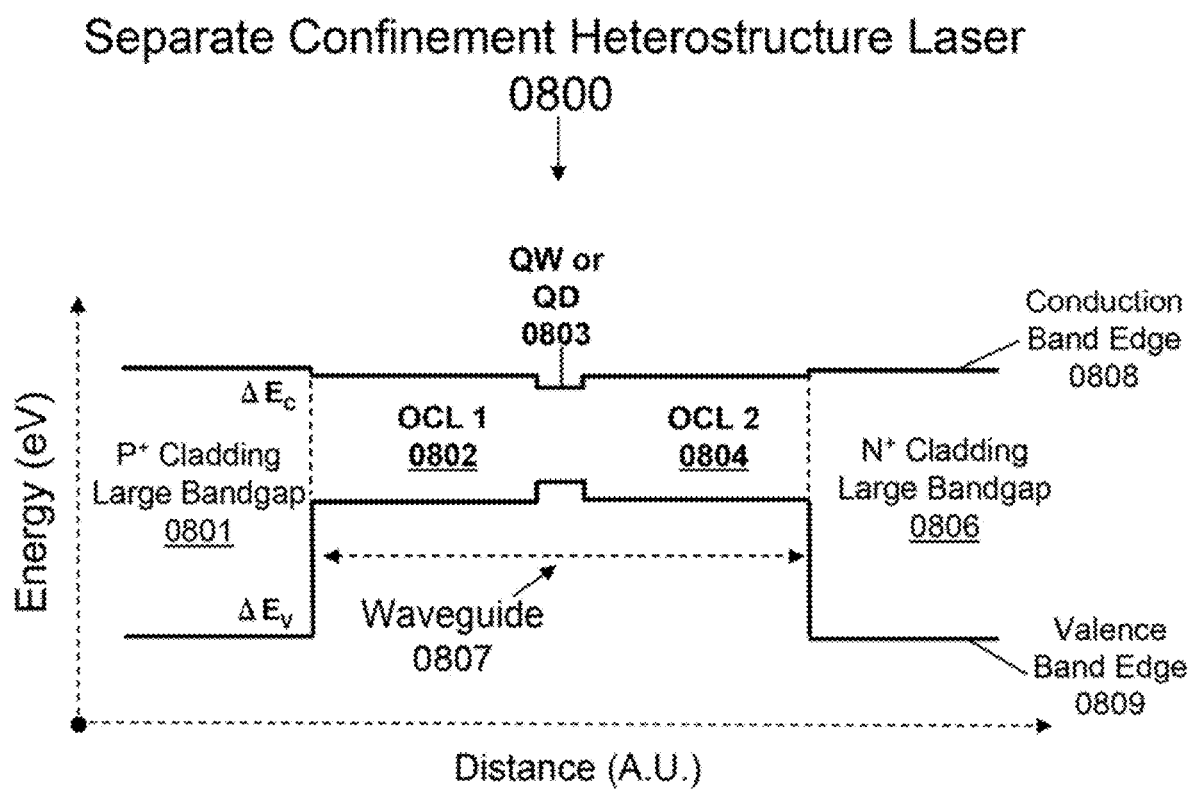
FIG. 8 shows a flat band energy diagram of a general configuration of a separate confinement heterostructure laser with an active QW or QD region which can be of the type I heterojunction band alignment.

FIG. 8 shows an exemplary flat band energy diagram showing the conduction band edge 0808 and the valence band edge 0809 of a separate confinement heterostructure (SCH) laser 0800 with an active QW or QD 0803 region. The OCL1 0802 and OCL2 0804 form the barrier layers to the QW or QD 0803 which allows for quantum confinement and can be of the type I heterojunction band alignment. Such a structure provides efficient recombination of the carriers and good optical confinement of the light produced from the recombination of the carriers. The $P^+$ cladding large bandgap 0801 and the $N^+$ cladding large bandgap 0806 provides for minority carrier injection and funnels the carriers into the waveguide region ultimately recombining in the QW or QD 0803 active region. The cladding layers form the boundary for the waveguide 0807 with the OCL1 0802 and OCL2 0804 regions thus providing for efficient confinement of light. In this design the $P^+$ cladding large bandgap 0801 and $N^+$ cladding large bandgap 0806 have the largest bandgap energies in the device structure. Next the OCL1 and OCL2 layers have the next largest bandgap energies. Finally the QW or QD 0803 materials have the smallest bandgap energies. In this design the $P^+$ cladding large bandgap 0801 and OCL1 0802 has a type I heterojunction alignment, and in this design the $N^+$ cladding large bandgap 0806 and OCL2 0804 also has a type I heterojunction alignment. Various configuration of the SCH are possible for enhancement of the laser. Note that though the figure shows only one QW or QD region, multiple QW or QD regions can be used, if higher efficiencies are wanted. Typically such a structure is inserted into a resonant cavity for the light amplification that is required for laser operation.

Two common types of semiconductor lasers: (1) in-plane, also known as edge emitting or Fabry Perot lasers (also includes distributed feedback lasers); and (2) surface emitting also known as vertical cavity surface emitting lasers ("VCSELs"). Edge emitting lasers emit light from the edge of the semiconductor wafer whereas VCSELs emits light from the surface of the laser. For the edge emitter, the resonant cavity is typically formed with cleaved mirrors at each end of the active region.

Figure 9:
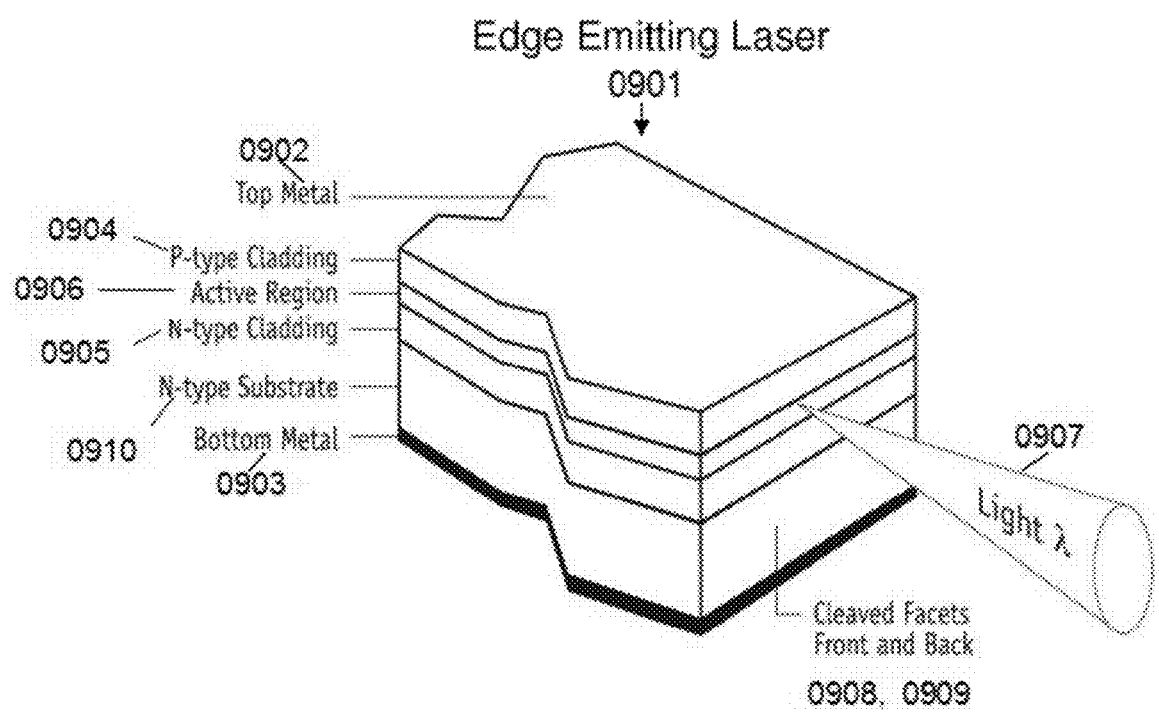
FIG. 9 shows an example of a cut away device depiction of an edge emitting injection diode laser.

FIG. 9 is a perspective schematic of a typical edge emitting injection diode laser or in-plane semiconductor laser 0901. The edge emitting laser 0901 can comprise a substrate 0910 with an active region 0906 disposed between a P-type cladding layer 0904 and an N-type cladding layer 0905. Cleaved facets on the front 0908 and on the back 0909 of the laser typically form a resonant optical cavity. The order of the layers may not be restricted as described above. To activate the laser, a bias current can be applied to top 0902 and bottom 0903 metal contacts. Upon application of the bias to the laser, light of a wavelength A 0907 is typically emitted from the edge of the laser. An exemplary edge emitting semiconductor laser may include a GeSn quantum well active region material 0906 with GaAs barriers for near-infrared (IR) light emission 0907, or their equivalents. The QW active region of the structure is typically capable of emitting a designed center wavelength over a wide range of possible wavelengths depending on a number of device design parameters including but not limited to the thickness and composition of the layer materials. Being able to tune light over the wide range of wavelengths could be useful for a variety of applications.

The design and fabrication of this type of edge emitting laser structure may utilize consideration of the material properties of each layer within the structure, including energy band structure and band alignments, electronic transport properties, optical properties, systems design, and the like. An edge emitting laser such as the exemplary one described above may satisfactorily be wavelength tuned in the manner previously described.

It may also be possible to omit the top metal 0902 and the bottom metal 0903 and optically pump the edge emitter from the top, bottom or side with another laser that may have an emission wavelength shorter than the edge emitter 0901. This may simplify the process because metallization of the laser 0901 can be avoided.

The second type of semiconductor laser, VCSELs, emits light normal to the surface of the semiconductor wafer. The resonant optical cavity of a VCSEL can be formed with two sets of distributed Bragg reflector (DBR) mirrors located at the top and bottom of the laser, with the active region (which can be a quantum well, quantum dot, or quantum wire region), sandwiched between the two Bragg reflectors. Note the designation of N DBR means that the DBR is doped N-type.

Figure 10:
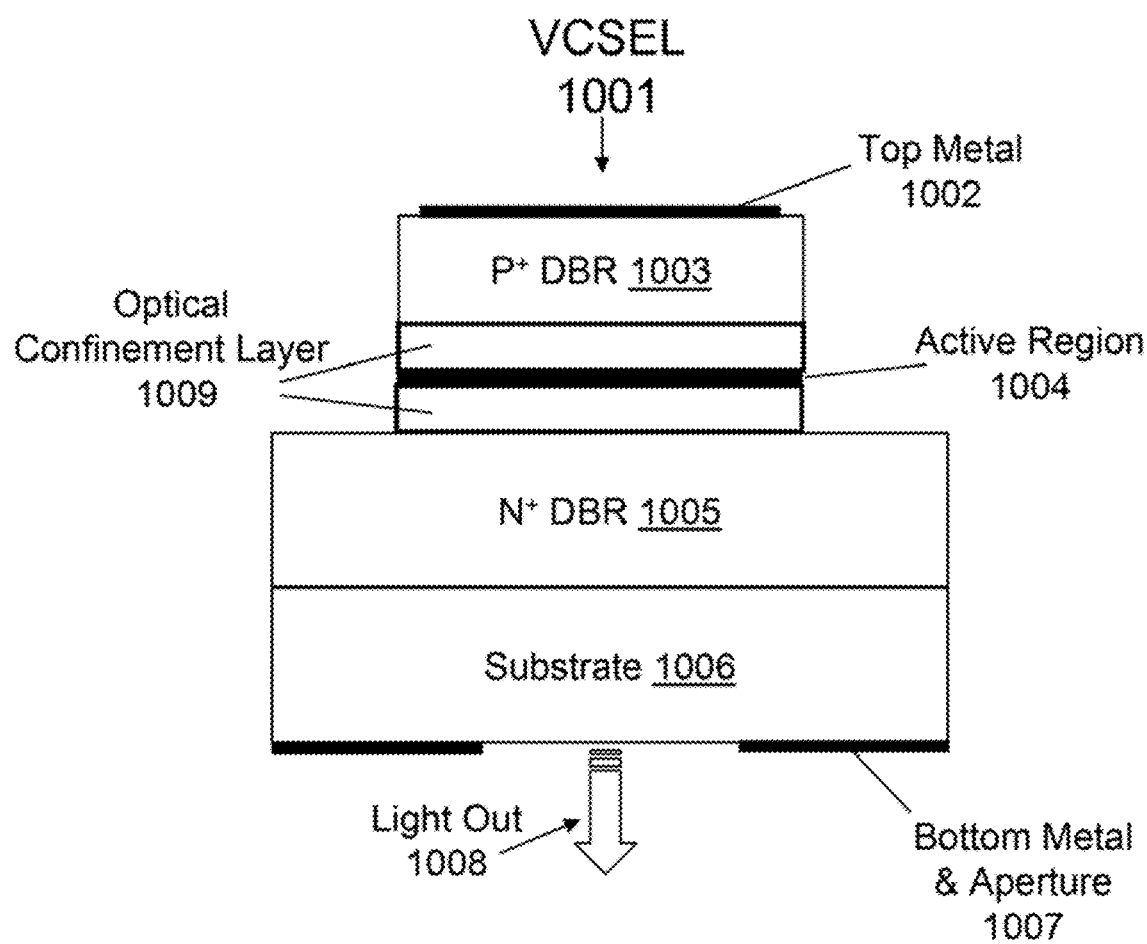
FIG. 10 shows an example of a cross-sectional device depiction of a vertical cavity surface emitting laser (VCSEL), where light is coming out of the bottom, but could be designed so that light comes out of the top. Also this can also depict a light emitting transistor.

FIG. 10 is an exemplary schematic of the side view of a vertical cavity surface emitting laser ("VCSEL") 1001. A substrate 1006 can have deposited layers of P-type distributed Bragg reflectors ("DBR") material 1003, and N-type distributed Bragg reflector material 1005. An active region 1004 is inserted in the optical confinement layer 1009 then sandwiched between the P DBR 1003 and the N DBR 1005 structures. Metal contacts 1002, 1007 are provided for applying a bias to the laser. The P-type DBRs 1003 and N-type DBRs 1005 form the resonant optical cavity. The order of the layers is not restricted as described above. Upon application of a current bias to the laser, light 1008 is typically emitted from the surface of the laser, which can be the bottom or top of the laser. A VCSEL laser 1001 such as the exemplary one described above can allow laser emission from the surface of the structure rather than from the side or edge, as in the edge emitting laser of FIG. 9. Though the diagram of an example of a VCSEL shows the light is coming out of the bottom, but could be designed so that light comes out of the top.

It can also be possible to omit the top metal 1002 and the bottom metal 1007 and optically pump the VCSEL 1001 from the top or bottom with another laser that can have an emission wavelength shorter than the VCSEL 1001. This may simplify the process because metallization of the laser 1001 can be avoided.

These lasers can be called diode lasers or injection diode lasers and are two terminal devices. The HBT are three terminal devices. It is possible to combine both structures to form the light emitting heterojunction bipolar transistor which can act as a three terminal device, but also can emit light. Such a device would allow for integrated circuit designs that could transmit data optically and act as high speed switching transistors, all in a single device. Because the light emitting transistor is a three terminal device, the extra terminal allows the biasing of the base collector junction to quickly collect the charge carriers, and thereby out performing laser diodes and/or two terminal devices.

For both the edge emitting laser 0901 and the VCSEL 1001, the input control to the lasers can be a current bias, voltage bias, or optical pump techniques as described. Furthermore, both electrical injection and optical pumping can be operated in continuous wave (CW), pulsed, synchronous, or asynchronous modes of operation.

The light emitting transistor or transistor laser could comprise a bipolar transistor with a direct gap quantum well, quantum dot, or quantum wire inserted in the base/barrier region. The quantum well, quantum dot or quantum wire forms the collection region (active region) for electrons and holes to recombine to generate light.

In the following figures or tables, $N^+$ refers to high N-type doping, $N^-$ refers to moderate N-type doping, $P^+$ refers to high P-type doping, $P^-$ refers to moderate N-type doping, and UID refers to unintentional doping.

Figure 11:
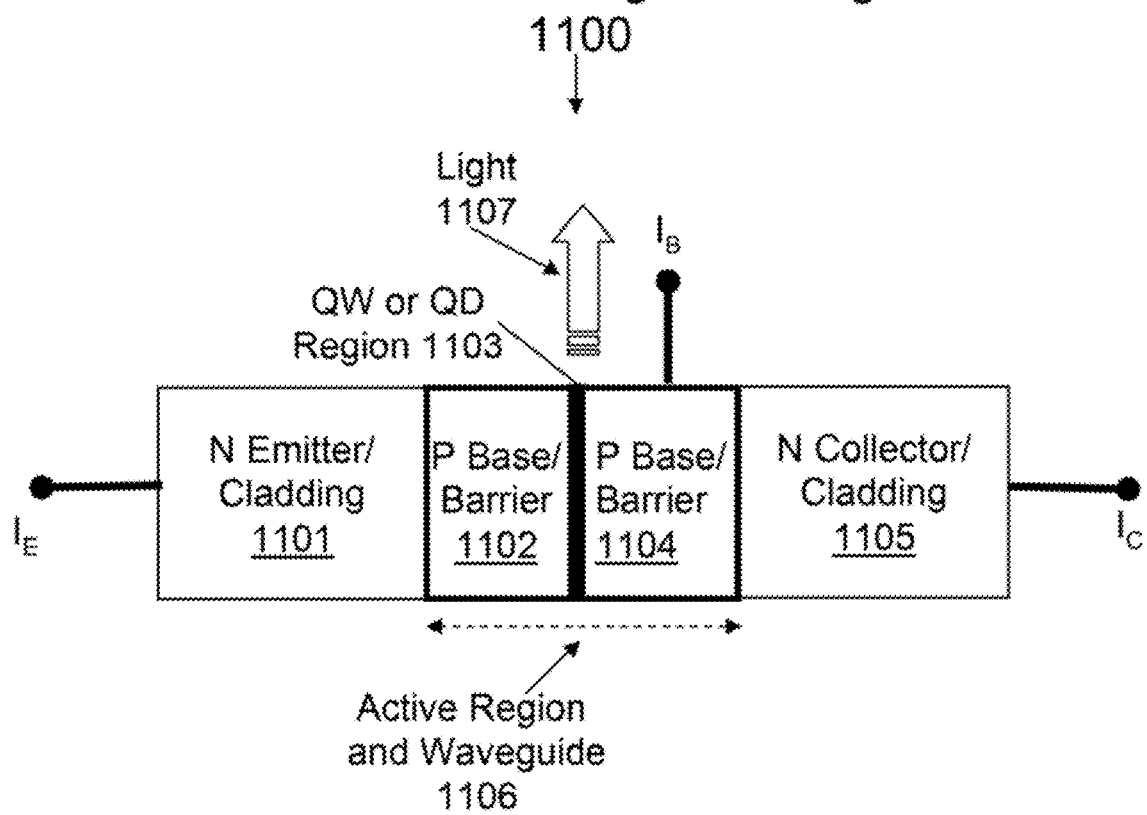
FIG. 11 shows a simple diagram of an NPN transistor laser or light emitting transistor showing the three terminal device configuration with a corresponding free carrier type designation, with a quantum well or quantum dot active region in the base.

FIG. 11 shows a simple diagram of an NPN transistor laser 1100 showing the three terminal device configuration with the corresponding emitter-base-collector designation, with a quantum well or quantum dot active 1103 inserted into P base/barrier 1102 and 1104. Here emitter 1101 and the collector 1105 can form the cladding regions for optical confinement of the light 1107 produced by recombination of the carriers in the quantum active region. The P base forms the barrier region for the quantum well, quantum dot, or quantum wire and also the waveguide material. Because the transistor laser acts as a transistor and a laser, the emitter-base-collector needs to have dual functions for the electrical and optical. For an NPN HBT laser the emitter has to inject electrons into the base and also form the cladding layer for light confinement as designated by N emitter/cladding 1101. The base region should be heavily P-type doped and forms the barrier to the QW or QD 1103 material and thus is designated by the P base/barrier 1102 and P base/barrier 1104. The P base/barrier 1102 and 1104 and the QW or QD 1103 form the active region and the waveguide 1106 of the NPN transistor laser 1100. To form for example, a light edge emitting transistor laser, a resonant cavity is typically formed by cleaving mirrors at the front and back facets of the crystal to optically amplify the photon population.

Figure 12:
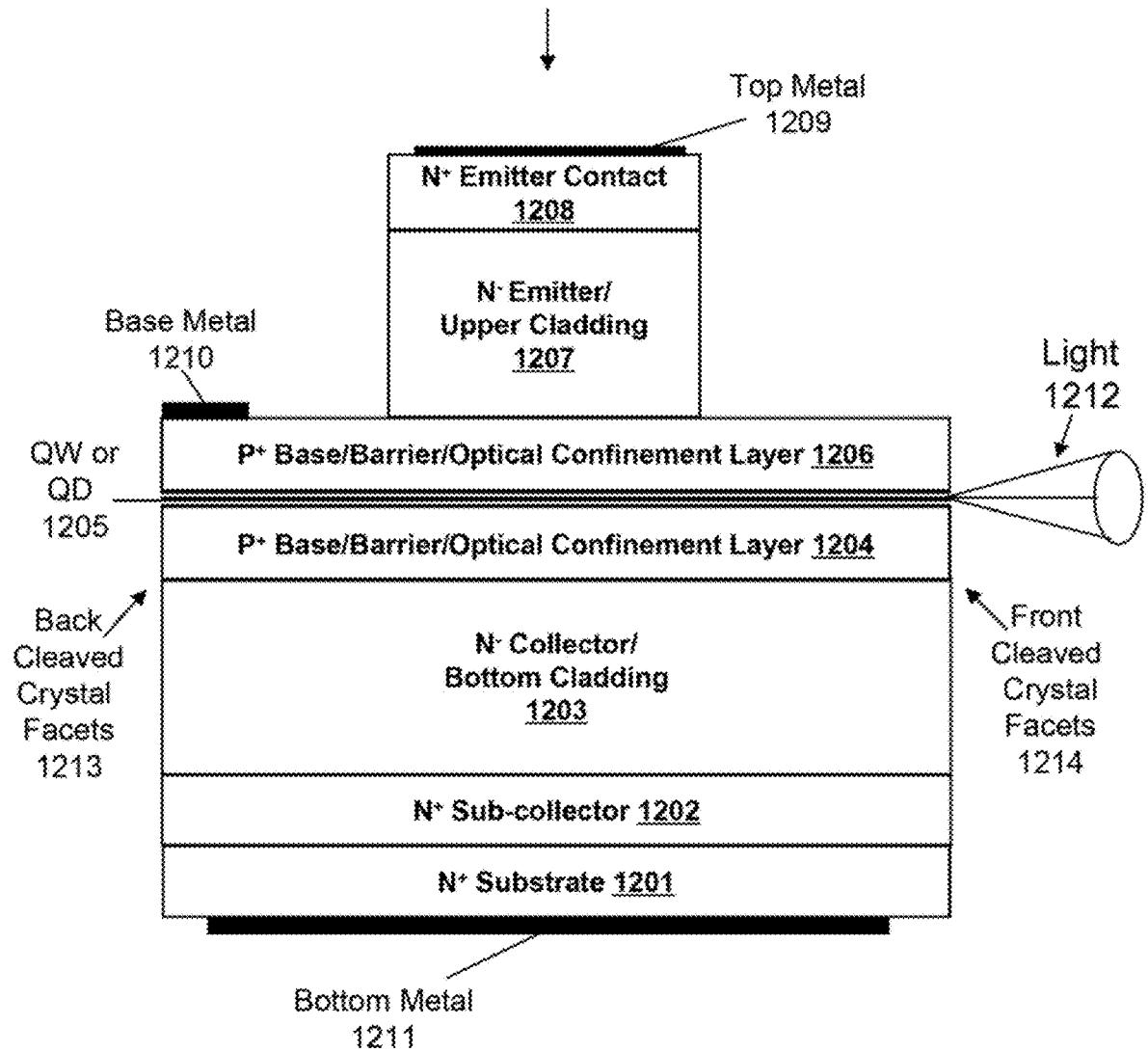
FIG. 12 shows a possible cross-sectional device depiction of an NPN edge emitting transistor laser or light emitting transistor (LET) structure.

FIG. 12 shows a cross-sectional device depiction of an NPN edge emitting transistor laser 1200. The device comprises an $N^+$ substrate 1201 as the starting point. A heavily doped $N^+$ sub-collector 1202 is grown on the $N^+$ substrate 1201. Then a dual purpose lightly doped N− collector/bottom cladding 1203 layer is formed. Then a $P^+$ base/barrier/optical confinement layer 1204 is grown and this also starts the formation of the waveguide region for the confinement of the light. Next the QW or QD 1205 active region is grown, and then on top of this layer is the $P^+$ base/barrier/optical confinement layer 1206 which finishes the waveguide portion of the device. On top of this layer is then grown the $N^-$ emitter/upper cladding 1207 which provides the cladding finishing up the device. Metal contacts are placed at the $N^+$ emitter contact 1208 via the top metal 1209 contact, the $P^+$ base/barrier/optical confinement layer 1206 via the base metal 1210, and the $N^+$ substrate 1201 via the bottom metal 1211. The resonant cavity is formed by the front cleaved crystal facets 1214 and the back cleaved crystal facets 1213. Light 1212 is emitted from the front of the device. The device is biased in a standard NPN transistor configuration, but because of the inclusion of the QW or QD 1205, $P^+$ base/barrier/optical confinement layer 1204 and 1206 and the N− collector/bottom cladding 1203 and $N^-$ emitter/upper cladding 1207, the device forms a light emitting or laser transistor when properly designed. A typical way of making this structure is to use epitaxial techniques to grow the basic layered structure then use standard device processing techniques to fabricate the full device. The laser includes quantum well, quantum dot, or quantum wire inserted into a base region of the heterojunction bipolar transistor. The laser can require a resonant cavity to get optical gain, and typically this can be formed from the front and back cleaved facets of the semiconductor crystal wafer.

Vertical emission of light normal to the surface of the semiconductor wafer is also a useful configuration for transistor lasers. The resonant optical cavity of a vertical transistor laser can be formed with two sets of distributed Bragg reflector (DBR) mirrors located at the top and bottom of the laser, with the active region (which can be a quantum well, quantum dot, or quantum wire region), sandwiched between the two Bragg reflectors.

Figure 13:
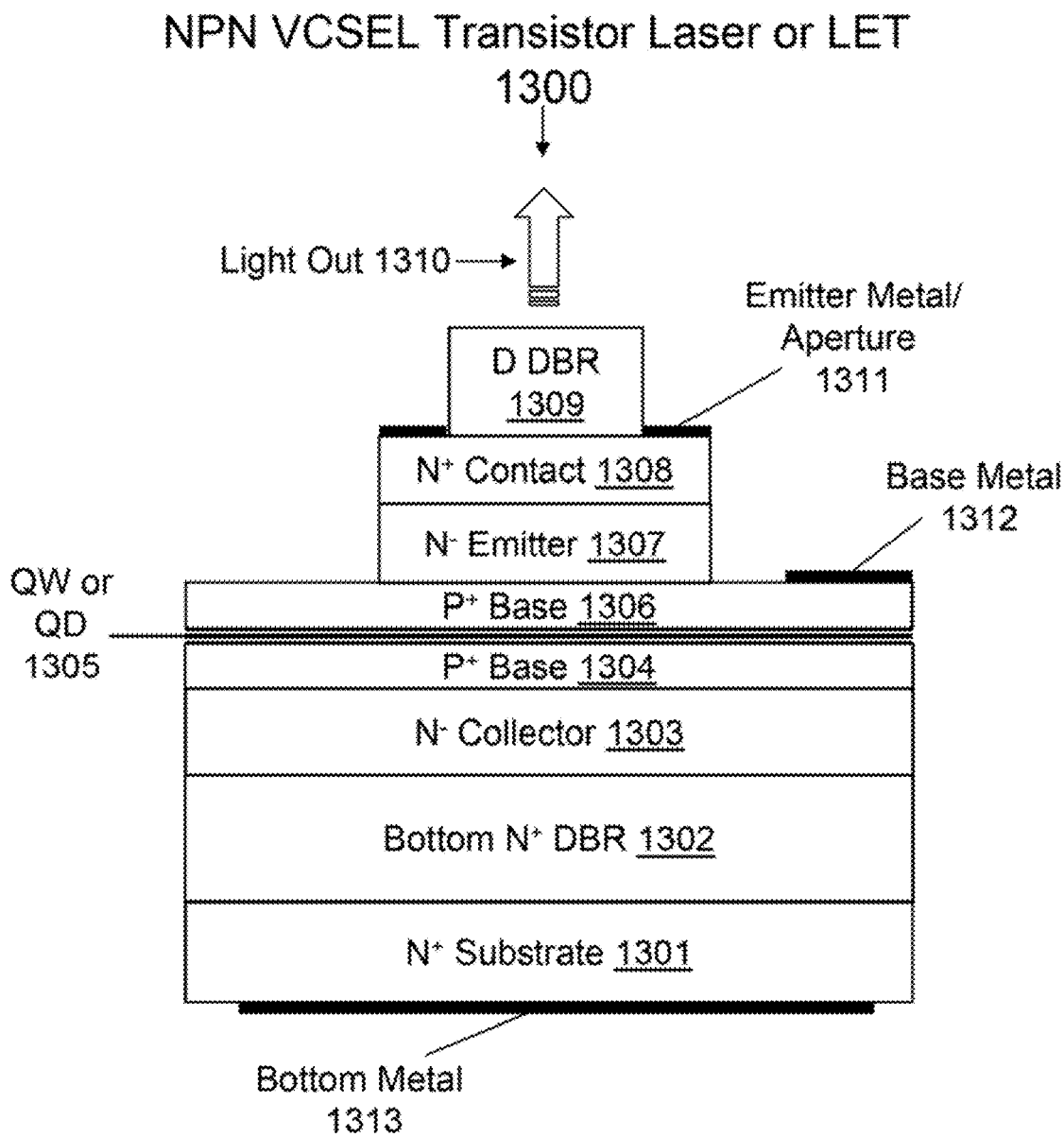
FIG. 13 shows an example of a possible cross-sectional device depiction of an NPN VCSEL transistor laser or light emitting transistor (LET) where light is coming out of the top, but also could be designed so that light comes out of the bottom.

FIG. 13 shows a cross-sectional device depiction of an example of a possible configuration of a NPN VCSEL transistor laser 1300, where the light is coming out of the top, but also could be designed so that light comes out of the bottom. The device can be grown on an $N^+$ conducting substrate 1301, with the growth of a bottom $N^+$ DBR 1302 stack which forms the bottom mirror of the device. $N^-$ collector 1303 is then grown on the bottom mirror. $P^+$ base 1304 is then grown on the $N^-$ collector 1303, and also forms the barrier for QW or QD 1305 active region. QW or QD 1305 is deposited on $P^+$ base 1304, and then $P^+$ base 1306 is deposited on QW or QD 1305, finalizing the barrier material to the active region for quantum confinement effects. $N^-$ emitter 1307 is then grown on $P^+$ base 1306. Then an $N^+$ contact 1308 is deposited on $N^-$ emitter 1307. Finally a dielectric mirror stack D DBR 1309 is deposited on $N^+$ contact 1308. VCSEL transistor laser 1300 is processed using standard techniques of mesa etch and metallization to form the final structure, where metal contacts emitter metal/aperture 1311 is deposited on $N^+$ contact 1308. Emitter metal 1311 forms an aperture for light out 1310. Base metal 1312 is deposited on $P^+$ base 1306, and bottom metal 1313 is deposited on $N^+$ substrate 1301. NPN VCSEL transistor laser 1300 is operated as a standard bipolar device.

GeSiSn is alloy semiconductor of the constituent semiconductors germanium (Ge, which is an indirect semiconductor, with an energy bandgap of 0.66 eV), silicon (Si, which is an indirect semiconductor, with an energy bandgap of 1.12 eV), and alpha tin or cubic tin (Sn, which is zero energy gap direct semiconductor). GeSiSn can be an indirect or direct energy bandgap semiconductor depending on the alloy composition. A direct gap semiconductor has its conduction band minimum energy and valence band energy maximum occur at the same crystal momentum (k-space). If the location of the conduction band energy minimum and the valence band energy maximum occurs at different crystal momentum (or different location in k-space), it is an indirect semiconductor. Direct gap semiconductors are highly efficient for radiative recombination of electrons and holes, thus most light emitting devices are fabricated from direct gap semiconductors.

GeSiSn semiconductors have been grown epitaxially by metalorganic chemical vapor deposition (MOCVD), molecular beam epitaxy (MBE), ion implantation follow by anneal, by pulse laser deposition (laser ablation), but, liquid phase epitaxy, vapor phase epitaxy and various other epitaxial growth techniques can be used to grow the GeSiSn material described herein. Both N-type and P-type doping has been achieved in GeSiSn layers.

Figure 14:
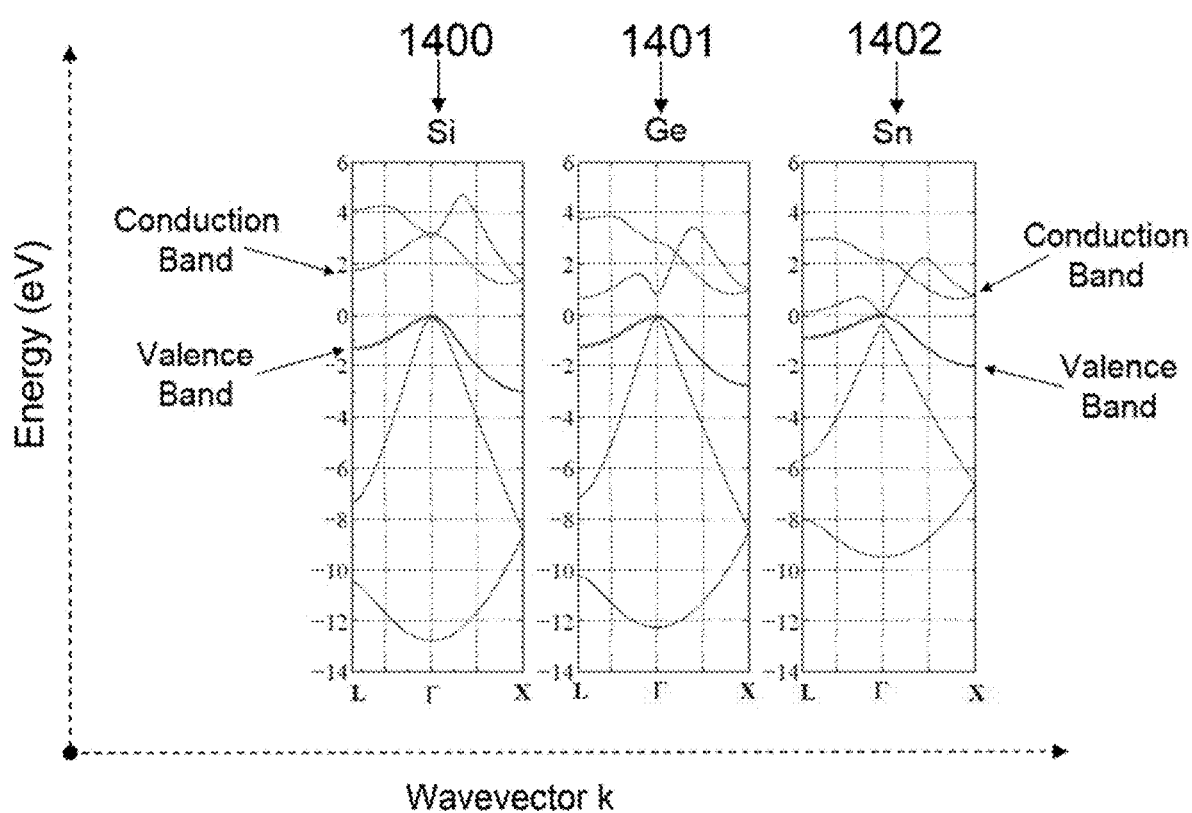
FIG. 14 shows energy band structure diagrams for Si, Ge and Sn semiconductor materials.

FIG. 14 shows the energy band structure diagrams for the semiconductors Si 1400, Ge 1401 and Sn 1402. The vertical axis is the Energy with units of (eV) and the horizontal axis is the Wavevector k. The energy band structure diagrams depict the available or unavailable (forbidden gap) energy levels for the charge carriers in the semiconductor. The plot shows energy on the vertical scale and the crystal momentum direction on the horizontal scale. There are significant crystal momentum points "X," "Γ" (Brillouin zone center) and "L." Si 1400 is an indirect gap semiconductor because the conduction band minima is at the "X" point and the valence band maximum is at the "Γ" point. Ge 1401 is an indirect gap semiconductor because the conduction band minima is at the "L" point and the valence band maximum is at the "Γ" point. Sn 1402 is a semimetal or zero direct gap semiconductors with the conduction band minima and valence band maxima at the "Γ" point. As Sn is added to Ge, the conduction band energy at the "Γ" point moves down faster than the conduction band energy at the "L" point, and thus, turning GeSn at some alloy composition turns into a direct gap semiconductor.

Ge is a group IV semiconductor and though it is an indirect semiconductor, it has some properties that are advantageous to electronic and photonic materials Ge 1401 has a local minimum at the "Γ" point of the conduction band. The lowest energy point in the Ge 1401 conduction band is at the "L" point and is only 0.14 eV lower than the "Γ" point a room temperature. Various methods can be used to lower the gamma point below the L point such as introducing biaxial tensile strain or heavily N-type doping the Ge. However, by adding Sn to Ge, it is possible to lower the bandgap but also form a direct gap semiconductor. One could employ both tensile strain and adding Sn to Ge to make a direct gap semiconductor. The other methodology to make Ge into a direct gap semiconductor is by applying tensile strain on the Ge of greater than 1.4%. In some embodiments, the tensile strain can be a biaxial tensile strain.

In some examples, heterojunction bipolar transistors (HBT) can be a desirable device for greater power handling capability, higher power efficiency, and lower signal distortion. The fabrication of a GeSiSn based HBT structure enables a new transistor technology that can significantly outperform SiGe, GaAs, InP, and GaN transistors in high-power, high-frequency applications. The new HBT semiconductor structure described herein exhibits a large valence band discontinuity between the emitter and base; has a low energy bandgap base (the term low energy bandgap base typically refers to the relevant semiconductors with bandgaps less than 1.0 eV, like GeSn or Ge or GeSi or GeSiSn or InGaAs or GaAsSb); and a second (double) heterojunction can be inserted between the base and collector with a good breakdown electric field. These attributes positively can impact several key device parameters such as collector-emitter breakdown voltage, DC current gain, and power gain cutoff frequency ($F_{max}$). The low bandgap GeSiSn base can significantly decrease transistor turn-on voltage and thereby increase the power added efficiency of the device. The indirect gap semiconductors there is the an added benefit that there is less base radiative recombination enhancing the carrier transport across the device such as increases in the gain of the transistor.

Figure 15:
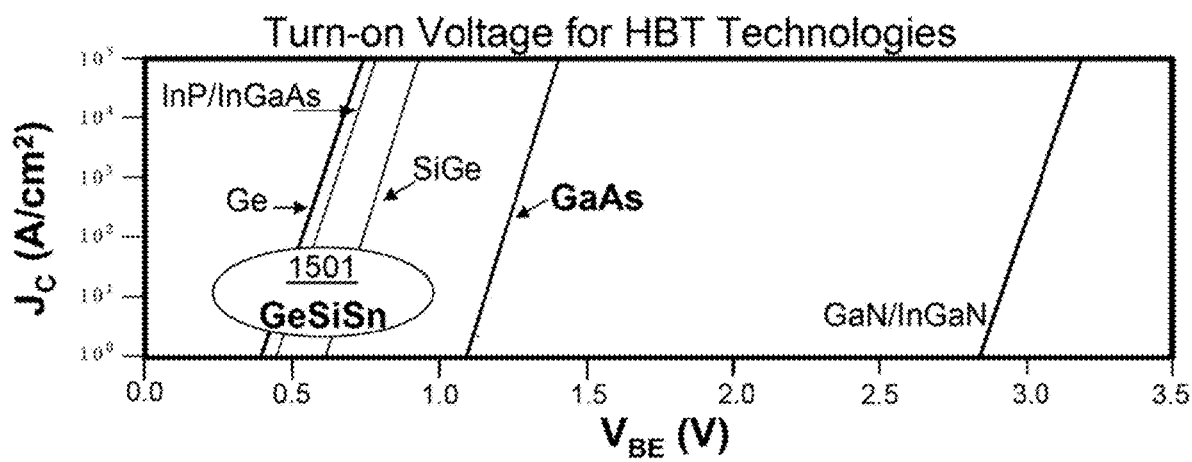
FIG. 15 shows a graph of collector current density $J_C$ vs. turn-on voltages ($V_{BE}$) of various HBT material systems. The GeSiSn alloy semiconductor can have a wide range of turn on voltages less than 1.0 V.

FIG. 15 shows a graph of the collector current density $J_C$ vs. the turn-on voltages ($V_{BE}$) of various HBT material systems. The figure shows a plot of the collector current density $J_C$ (A/cm$^2$) vertical scale versus base-emitter voltage $V_{BE}$ (V), horizontal scale. The plotted characteristics for several different heterojunction bipolar transistor (HBT) technologies are shown. The GeSiSn HBT structure described herein can achieve low turn-on voltages 1501 when compared to the technologies of Ge, InP/InGaAs, SiGe, GaAs, and GaN/InGaN. Thus the following materials may be able to achieve low turn on voltages less than 1.0 V; GeSi latticed matched or near latticed matched to GaAs, GeSiSn latticed matched or near latticed matched to GaAs, for GaAs based HBT geometries For NPN heterojunction transistors, it is generally desirable for the base region to be heavily P-type doped. This allows for the base sheet resistance to be minimized thus allowing for high frequency operation of the transistor. The GeSn alloy semiconductor can have the lowest turn-on voltage because the bandgap of GeSn is less than that of Ge, which than can be less than the relevant materials systems of GaN, GaAs, Si, InP, GaP, and AlAs. The GeSn base can be heavily doped P-type in some embodiments. When the hole concentration as measured by Hall Effect, high doping levels (>1×10$^{19}$ cm$^{-3}$) can be achieved in GeSn.

Figure 16:
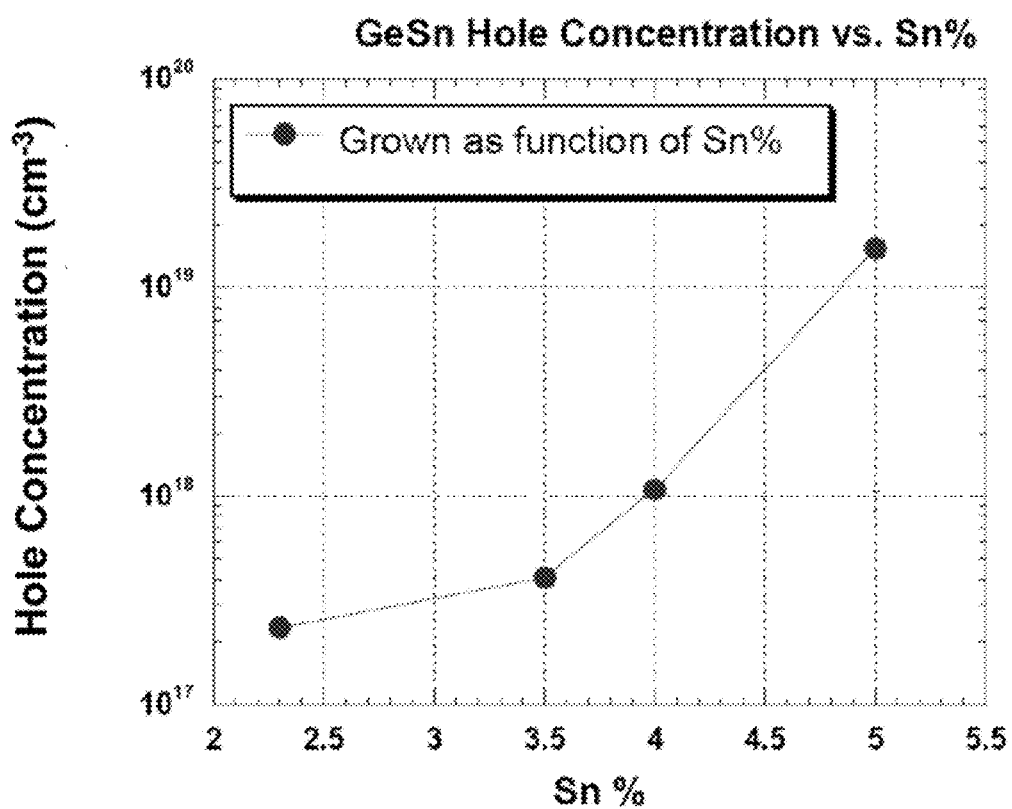
FIG. 16 shows the hole concentration of GeSn films as a function of Sn %, as measured by Hall effect. High hole concentrations can be achieved by GeSn.

FIG. 16 shows the hole concentration of GeSn films as a function of Sn % as measured by Hall effect. The vertical axis is the hole concentration (cm$^{-3}$) and the horizontal axis is the Sn %. From the hole concentration data vs. Sn % of FIG. 16, it is readily seen that GeSn can be P-type doped at the highest levels of base doping which are greater than 1×10$^{19}$ cm$^{-3}$. GeSn can achieve a large hole mobility (Ge hole mobility is about 1800-2000 cm$^2$/Vs, as compared to GaAs hole mobility 400 cm$^2$/Vs) which is a precondition for making the base region thin.

By utilizing GeSiSn in the base material of a GaAs heterojunction bipolar transistor, one can achieve low tunable turn-on voltage. At low Si and Sn content, GeSiSn has all the advantages that a Ge base material adds. For an NPN structure, Ge is desirable for the base region because it can be heavily doped P-type, it has the highest hole mobility (desirable for reducing the resistance of the base), also this hole mobility can be increased by applying tensile or compressive strain, and its conduction band alignment is favorable with numerous semiconductors. Ge is an indirect semiconductor which results in less radiative recombination in the base region of the transistor.

Figure 17:
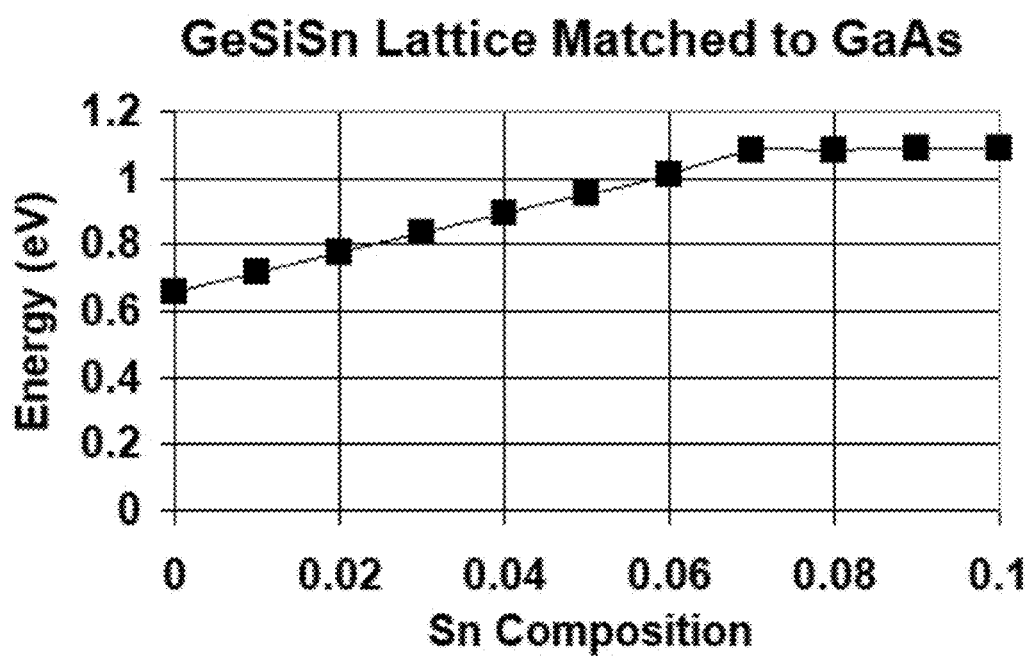
FIG. 17 shows a representative possible graph showing GeSiSn (lattice matched to GaAs) bandgap energy vs. Sn %.

FIG. 17 shows the possible indirect energy bandgap of GeSiSn lattice matched to GaAs or Ge as a function of Sn composition.

Figure 18:
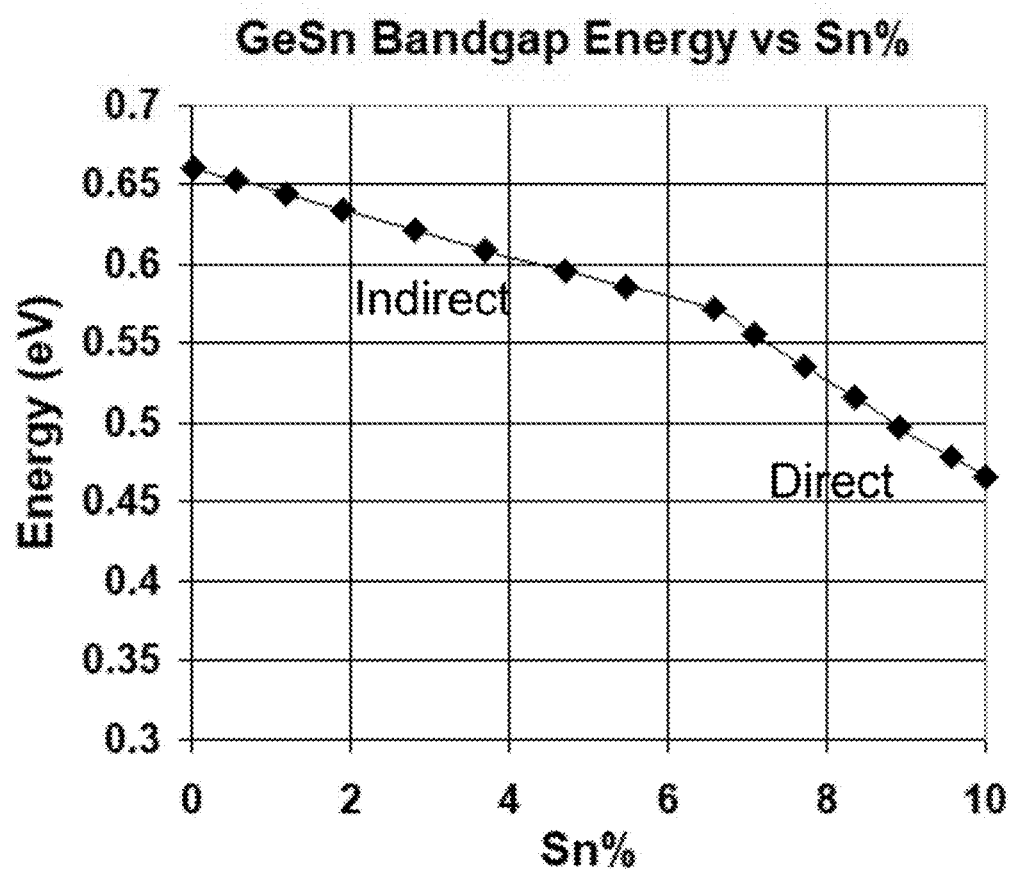
FIG. 18 shows the bandgap energy of relaxed GeSn vs. Sn %. GeSn bandgap starts indirect and transitions to direct at higher Sn %.

FIG. 18 shows a possible representative graph showing the GeSn direct bandgap energy vs. lattice constant. The vertical axis shows the values of the Energy Bandgap (eV) and the horizontal axis shows the Lattice Constant (Å). The dots and the line through the dots represent GeSn direct gap energy as a function of its lattice constant. The data for the indirect to direct bandgap transition may occur near 7% Sn. Ge has an indirect bandgap energy near 0.66 eV. GeSn may be indirect up to about 7% Sn then becomes a direct gap semiconductor with an energy gap which may be 0.585 eV and a lattice constant of which may be 5.725 Å. The GeSn bandgap energy may be about 0.25 eV at about 20% Sn with a lattice constant of about 5.835 Å. The emission wavelengths that can occur in bulk direct gap GeSn range from about 2370 nm at 7% Sn to 5540 nm at 20% Sn. For on-chip communications 1000 nm to 3000 nm is acceptable. For telecommunications applications, the typical wavelengths used are 1300 nm and 1550 nm. These wavelengths can be achieved by using quantum well or quantum dot GeSn materials. These low dimensional structures like two dimensional "2D" QW, one dimensional "1D" quantum wires, or zero dimensional "0D" quantum dot structures increase the light emission energy due to quantum confinement effects.

It should be noted that GeSn is an alloy semiconductor and that Sn percentages can be varied from 0%≤Sn %≤20%.

GeSiSn materials are useful for photonic and quantum confined structures. Quantum confined structures such as quantum wells (QWs), quantum dots (QDs), and quantum wires structures add a new degree of freedom in making light emitting materials. Also GeSiSn is a tunable bandgap for enhancing optical barriers as in optical confinement structures (OCL). One method of taking GeSiSn bulk material to get emission energies that cover this wide range is to use quantum well, quantum dot, or quantum wire technologies, because the light emission is then dependent on quantum confinement or quantum size effects.

QDs form artificial semiconductor atoms with electronic "shells" that can be engineered to control their light absorption properties. Besides their novel electronic properties, QDs also have interesting material properties; their 3-dimensional shape allows greater strain relief at the QD surfaces than for planar growth. GeSiSn QDs can be grown on Si without creating dislocations. Absorption over broad wavelengths comes from an ensemble of QDs that have sizes that vary statistically. Also because GeSiSn at low Sn content starts as indirect material, it may be possible to produce efficient light emission in QD structures with indirect gap semiconductors. The limitations of the indirect nature of the bandgap can be overcome by the formation of low-dimensional structures such as quantum dots because this method uses the spread in k-space caused by the quantum confinement to circumvent the indirect bandgap problem of the GeSiSn. Thus QDs are useful for producing light emission in direct and indirect gap materials.

This 3-dimensional growth mode is a method of making zero dimensional structures (i.e., QD). For QDs to effectively provide light emission, the QD material is generally of a lower energy bandgap than the barrier material. The relatively low GeSiSn bandgap energy makes it a desirable starting point for absorption in the near-IR and mid-IR. It is possible by controlling the size of the GeSiSn quantum dots, to change the interband (electron-hole recombination) to allow for energy transitions in the near-IR to mid-IR.

Figure 19:
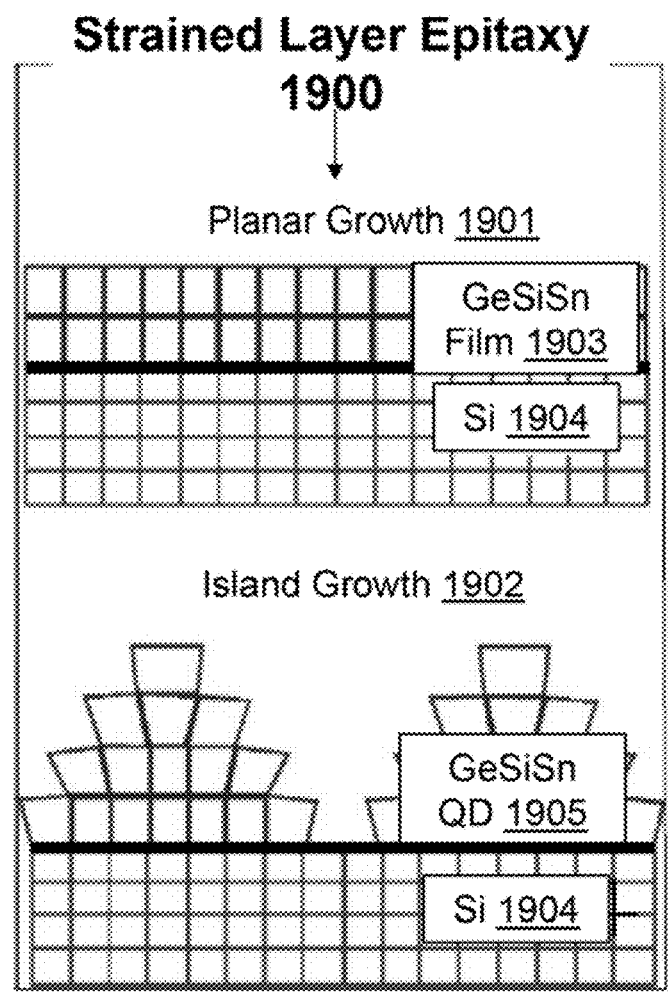
FIG. 19 shows a formation of quantum dot structures resulting from self-assembled GeSiSn quantum dots by the Stranski-Krastanov (SK) method that transitions from two dimensional planar growths to island growth.

FIG. 19 shows that the formation of quantum dot structures are a result of ability of self-assembled GeSiSn by the Stranski-Krastanov (SK) or strained layer epitaxy 1900 method that transitions from two dimensional planar growth 1901 to island growth 1902. In SK growth methodology a larger lattice constant semiconductor GeSiSn film 1903 is grown on a semiconductor with a smaller lattice constant Si 1904. Under proper conditions two dimensional planar growth 1901 starts but quickly transitions to island growth 1902 thus forming the GeSiSn QD 1905 structure. Thus when a larger lattice constant semiconductor is grown on a semiconductor with a smaller lattice constant, the critical thickness of the larger lattice constant layer is exceeded and QDs can form. The lattice mismatch between the two layers should be generally greater than 2% for dot formation. The mismatch of GeSiSn (latticed matched to GaAs 5.65 Å) to Si with a lattice constant of 5.43 Å, may be about 4%. If SiGe layers are used as the barrier depending on the Ge content in the SiGe, the lattice mismatch could be significantly reduced. Typically quantum dots are less than 15 nm, but they can range from 1 to 100 nm in size. Strained layer epitaxy 1900 is a methodology for growing quantum structures with dissimilar lattice constant materials. After the 3D growth of the QD, the QD layer usually has a barrier layer grown on top to finalize the quantum confinement.

Figure 20:
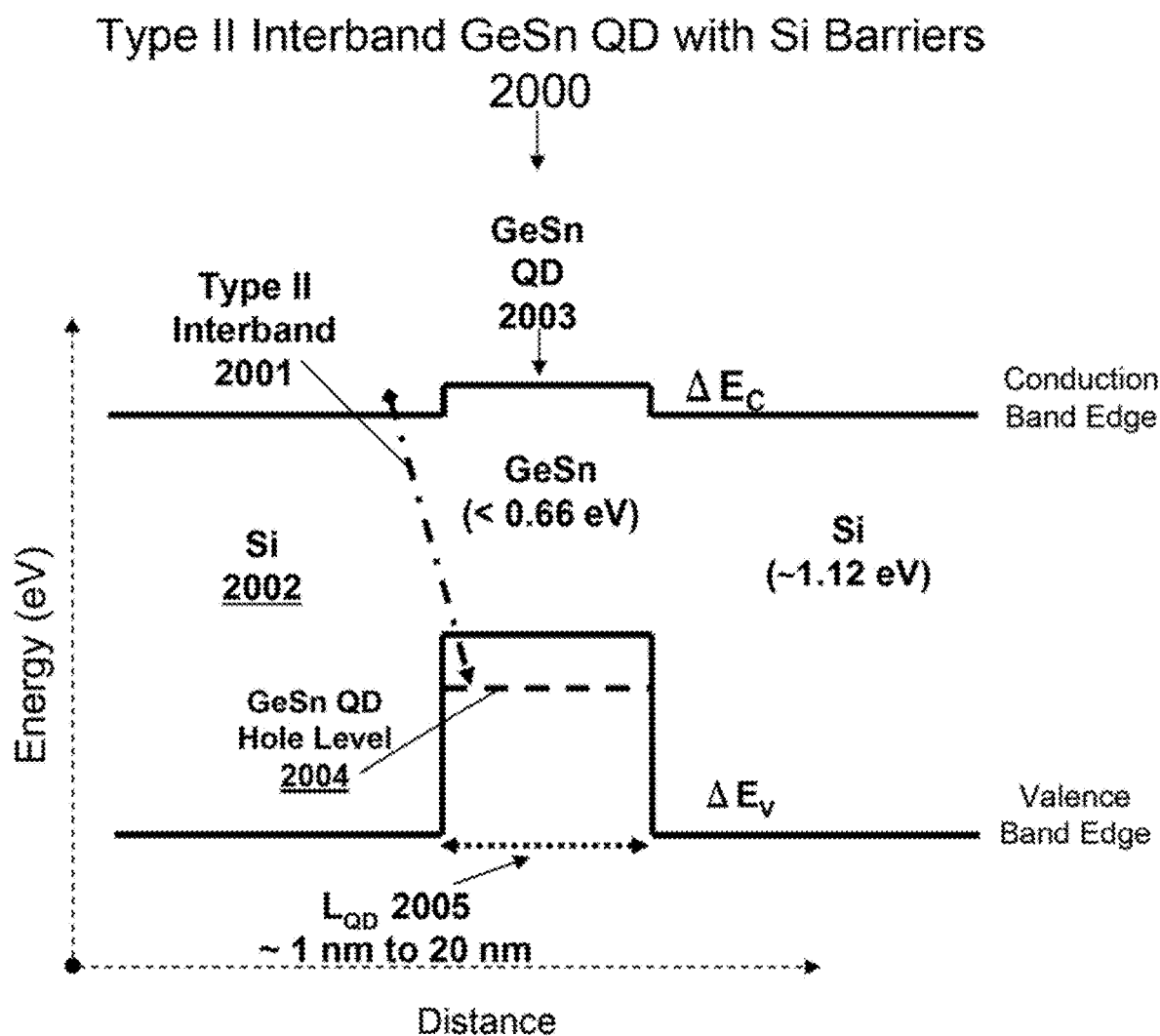
FIG. 20 shows a flat band energy diagram of a GeSiSn quantum dot (QD) to Si which can be of type II or type I heterojunction band alignment.

FIG. 20 shows a flat band energy diagram of type II interband GeSn QD with Si (bandgap energy approximately 1.12 eV) barriers 2000. The GeSn (bandgap energy less than about 0.66 eV) QD 2003 to Si 2002 heterojunction which can be of a type II heterojunction band alignment but at higher Sn % can become type I alignment. The figure shows a type II interband 2001 transition from the conduction band of the Si 2002 to the GeSn QD hole level 2004. The energy bandgap is indicated in parenthesis below the material of interest. These type II interband 2001 transitions allow the possibility of light emission. Type II energy band alignments allow for emission energy levels that can be the closest to the energy bandgap of the bulk semiconductor. Note the size $L_{QD}$ 2005 of the GeSn QD 2003 determines the energy difference of the type II interband transition. By changing the size $L_{QD}$ one can change the emission wavelength of the structure.

Figure 21:
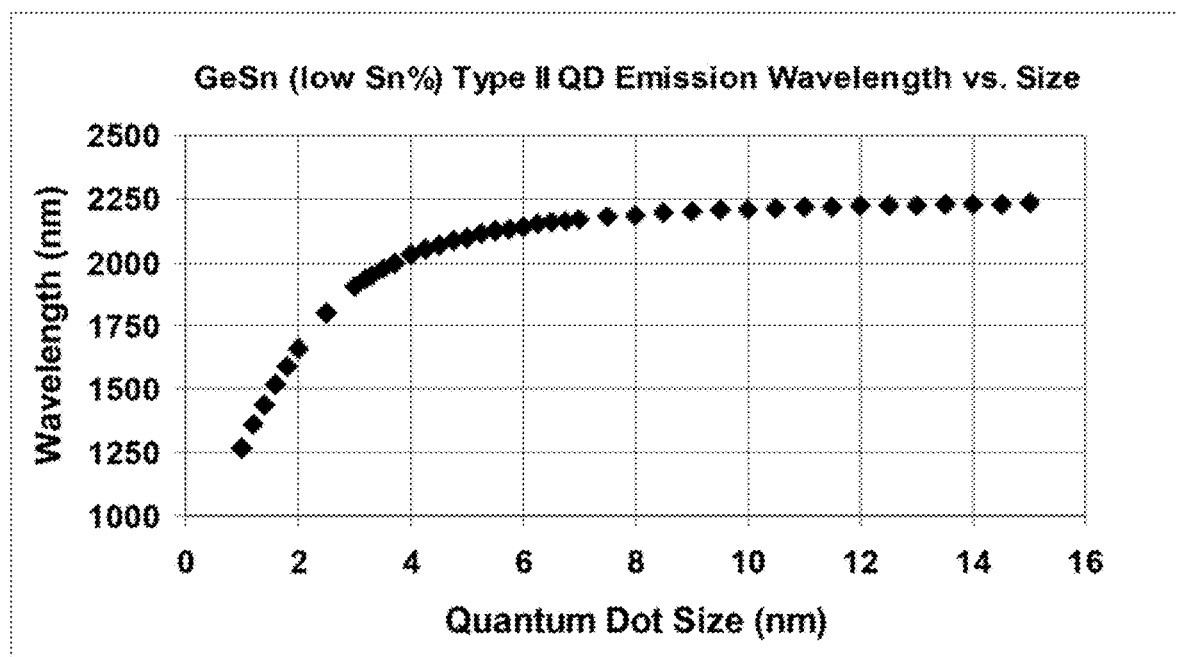
FIG. 21 shows a possible range of emission wavelengths that are achievable in a type II GeSn quantum dot heterostructure with Si barriers. This possible data is for low Sn % GeSn alloys.

FIG. 21 shows the possible range of emission wavelengths that are achievable in a type II GeSn quantum dot heterostructure with Si barriers. The vertical axis is the wavelength (nm). The horizontal axis is the Quantum dot size (nm). This possible data represents the case for low Sn % GeSn alloys. The graph shows that emission wavelengths achievable depend on the size of the quantum dot. Note the wavelengths are in the range of telecommunications. If the Sn % is increased, the wavelengths achieved gets longer.

A type I heterostructure band alignment can occur for a GeSiSn QD on alloy SiGe, because adding the Ge to Si barriers alter the Si band structure. The addition of Ge into Si increases the lattice constant, thus SiGe has a larger lattice constant than Si.

Figure 22:
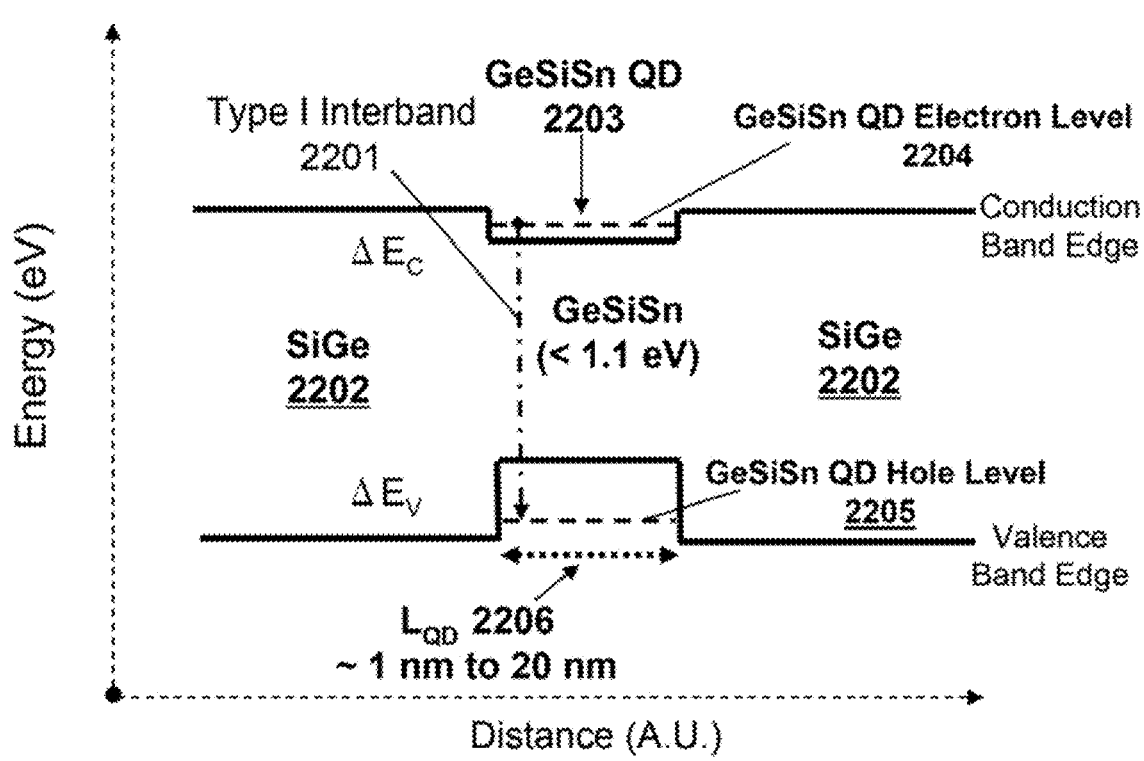
FIG. 22 shows a flat band energy diagram of GeSiSn (low Sn %) quantum dot (QD) or quantum well (QW) with SiGe barriers which can be of type I alignment.

FIG. 22 shows type I alignment of the GeSiSn (bandgap energy approximately less than 1.2 eV) QD with SiGe barriers 2200. The flat band energy diagram of GeSiSn QD 2203 with SiGe 2202 barriers which can be of type I alignment. The figure shows a type I interband 2201 transition from the conduction band of GeSiSn QD electron level 2204 to the GeSiSn QD hole level 2205. These type I interband 2201 transitions allow the possibility of light emission. Note the size $L_{QD}$ 2206 of the GeSiSn QD 2203 determines the interband transition energy. Because the arrangement is of a type I heterostructure the emission energies that can be achieved are typically higher than in a type II heterostructure. It is straightforward to calculate the range of wavelengths achievable in the GeSiSn quantum dot with SiGe barriers. Basically the emission wavelengths that can be achieved for a type I alignment may be shorter than that of type II QD heterostructures (energy bandgap is indicated in parenthesis below the material of interest). By utilizing SiGe 2202 one can change the Ge content of the SiGe thus changing the properties of the SiGe barrier layer to the GeSiSn QD 2203, thus in this structure the emission wavelengths achievable depends on the QD size $L_{QD}$, the composition of GeSiSn 2203 material, and the ratio of Si to Ge in the SiGe 2202 barrier layer. If the Ge content is high enough (greater than 50%) in the SiGe barrier it can be possible to grow GeSiSn in a planar growth mode thus forming two dimensional growth or QWs.

The formation of QWs are more straightforward because the materials are grown in a planar structure, and the QW can be coherently strained or near latticed matched.

Figure 23:
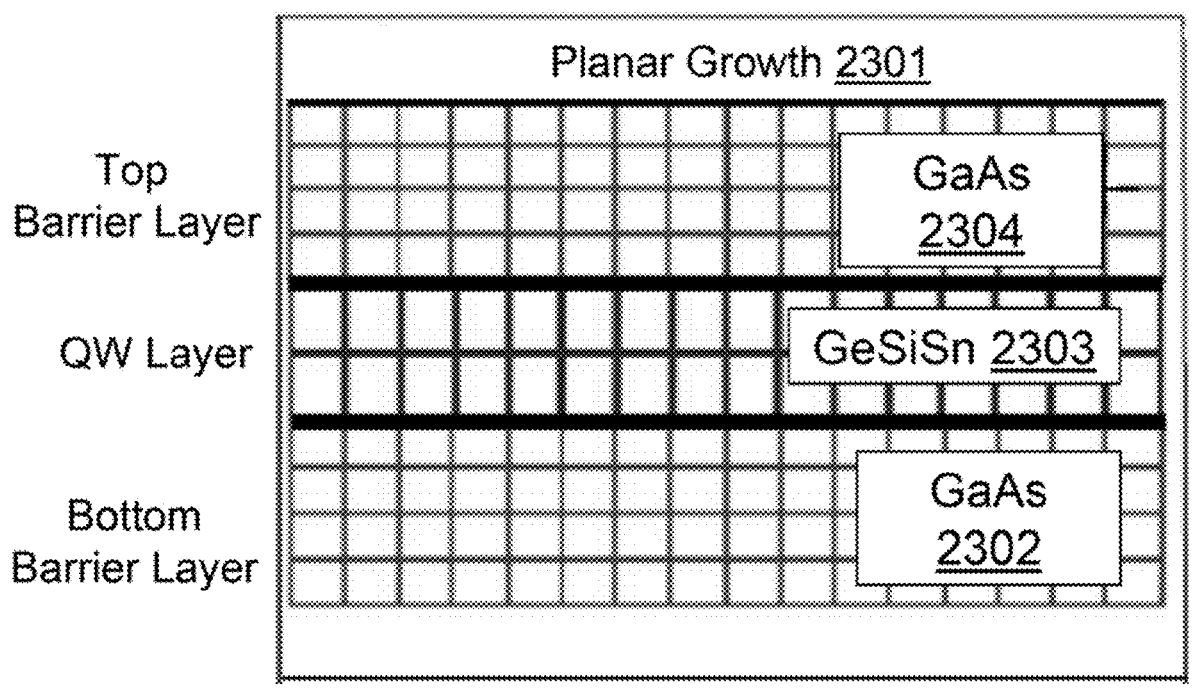
FIG. 23 shows a methodology of planar growth of a GeSiSn quantum well QW region on top of a GaAs barrier layer, and then growth of another GaAs barrier layer on top of the GeSiSn QW layer.

FIG. 23 shows the methodology of planar growth 2301 of the GeSiSn 2303 QW region on the GaAs 2302 bottom barrier layer. GaAs 2302 bottom barrier layer has a may be lattice matched to GeSiSn 2303 or can be grown coherently or pseudomorphic on the GaAs 2302 (near lattice matched). To finalize the QW layer a GaAs 2304 top barrier layer is grown on the GeSiSn 2303 QW layer. Note that the barrier layer generally has a larger bandgap energy than the QW layer. The thickness of the QW region and the band alignment to the barrier materials determine the allowable energy transitions.

Figure 24:
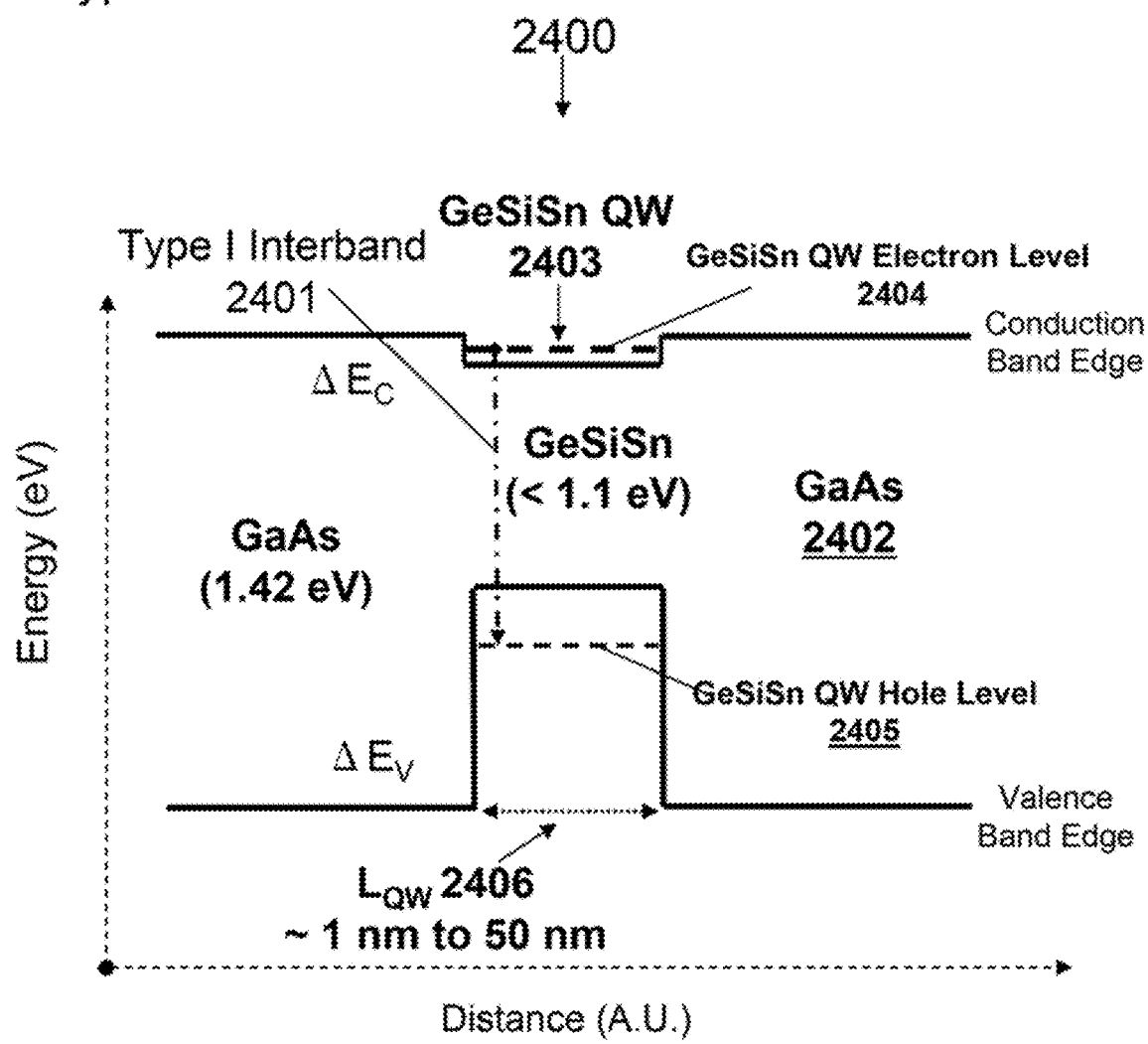
FIG. 24 shows a flat band energy band type I alignment of a GeSiSn QW with a GaAs barrier.

FIG. 24 shows a flat band energy band diagram of a type I interband GeSiSn QW with GaAs barriers 2400. The band alignment of GeSiSn QW 2403 with GaAs 2402 barrier (bandgap energy of approximately 1.42 eV) can be of a type I heterojunction. GeSiSn (bandgap energy less than approximately 1.1 eV) can be grown latticed matched to GaAs or Ge (energy bandgap is indicated in parenthesis below the material of interest). It can also be coherently strained in tension or compression. As long as the GeSiSn thickness is less than the critical thickness, coherent planar or pseudomorphic growth can proceed on the GaAs or Ge material. The Type I interband transitions are an excellent method for producing the emission of light from semiconductor heterostructures. The FIG. 24 shows a type I interband 2401 transition from the conduction band GeSiSn QW electron level 2404 to the GeSiSn QW hole level 2405. These type I interband 2401 transitions allow the possibility of light emission. Note the size $L_{QW}$ 2406 of the GeSiSn QW 2403 determines the type I interband transition energy. Because the arrangement is of a type I heterostructure the emission energies that can be achieved are typically higher than in a type II heterostructure. Generally the emissions wavelengths that can be achieved for a type I alignment may be shorter than that of type II QW heterostructures.

For QW of a type I heterostructure the emission energies that can be achieved may be typically higher than in a type II heterostructure. Type I interband transitions generally result in energy transitions that are greater than the bulk GeSiSn transitions. Type II transitions can result in energy transitions that can be less than the bulk GeSiSn transitions. Basically the emission wavelengths that can be achieved for a type I alignment are shorter than that of type II QW heterostructures.

By utilizing a GeSiSn quantum well or a GeSiSn quantum dot in the base region of a transistor can achieve a light emitting HBT that can emit light from 1000 nm to 5000 nm.

For an NPN HBT, utilizing a GeSiSn base region, has a tunable bandgap energy depending on its composition.

Figure 25:
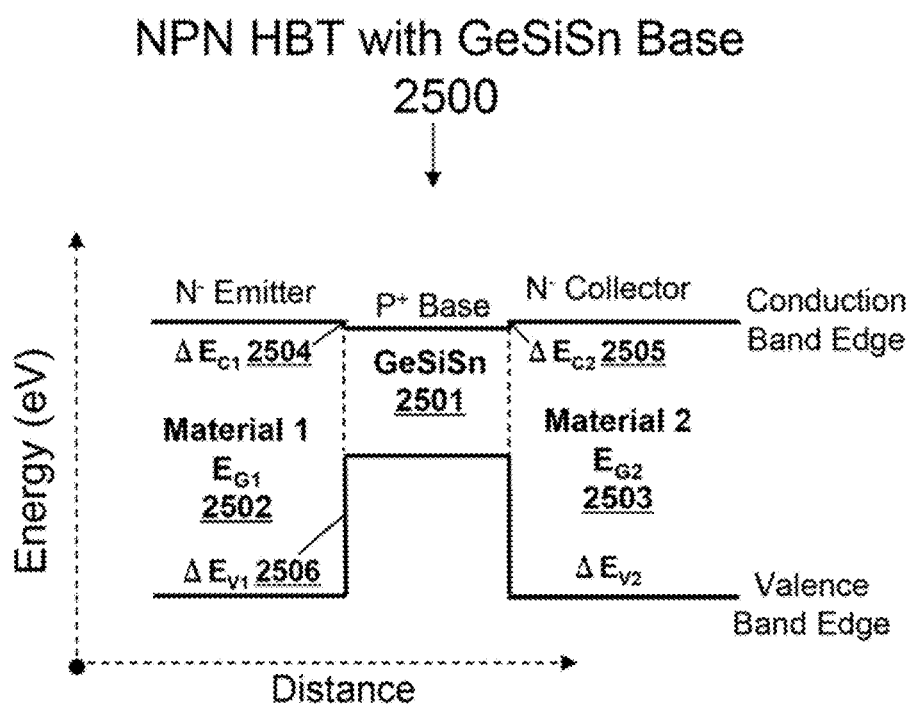
FIG. 25 shows a general flat band energy diagram of an NPN GeSiSn double heterojunction bipolar transistor.

FIG. 25 shows the general flat band energy diagram of an NPN GeSiSn double heterojunction bipolar transistor. This shows the general configuration of an NPN HBT with GeSiSn base 2500 region can include an N-type emitter of material 1 $E_{G1}$ 2502, with a $E_{G1}$ energy bandgap greater than the GeSiSn 2501 and forms the P-type base region; then an N-type collector material 2 $E_{G2}$ 2503 where the energy bandgap energy $E_{G2}$ which can equal or be greater than the material 1 $E_{G1}$ 2502. Furthermore, the conduction band offset energies $\Delta E_{C1}$ 2504 at the emitter base junction and the $\Delta E_{C2}$ 2505 at the base collector junction may be less than 0.1 eV. Small conduction band offsets between the emitter-base junction and the collector-base junction are desirable for electron transport. The valence band offset $\Delta E_{V1}$ 2506 at the emitter base junction should be as large as possible to ensure that there is no back injection of holes from the GeSiSn 2501 P-type base to material 1 $E_{G1}$ 2502 N-type emitter material. This GeSiSn structure can be latticed matched or near latticed matched or coherently strained to GaAs or Ge.

HBT performance can be improved, in some examples, by grading the compositionally grading the base region to decrease the energy bandgap from the emitter base junction to the base collector junction. The grading of the base energy bandgap can create an electric field, which causes a reduction in the transit time of the charged carriers. This can be accomplished by grading from the emitter base junction of the base starting with GeSiSn and grading down to GeSn. The slope of the GeSiSn compositional grade in the base in this example can be varied from linearly or step graded. The compositionally graded GeSiSn may comprise for example (not the only possibility) starting growth a near latticed match $Ge_{90}Si_{0.8}Sn_{0.2}$ (to GaAs) then reducing the Si content while increasing the Ge content to have compressively strained $Ge_{0.98}Sn_{0.2}$ at base-collector junction.

Figure 26:
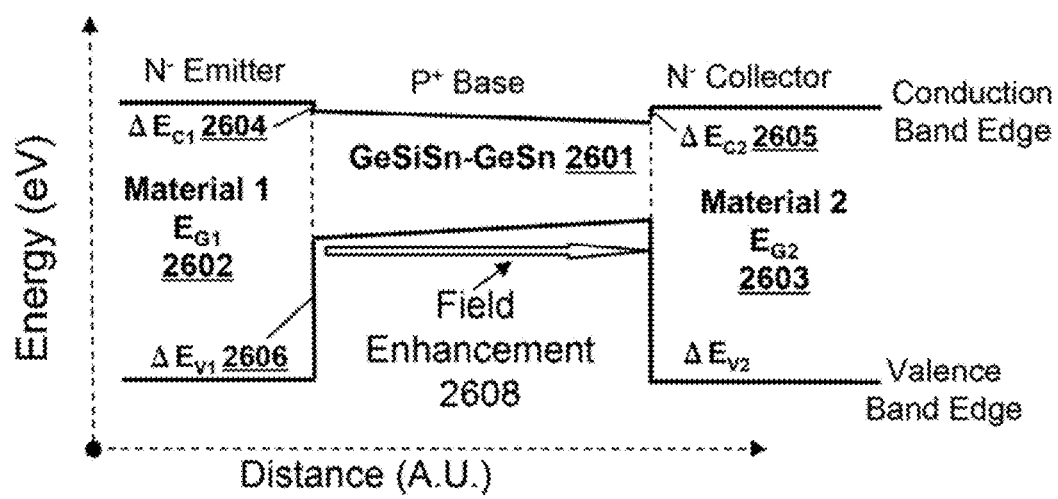
FIG. 26 shows a flat band energy diagram of an NPN HBT with a compositionally graded GeSiSn base. The compositionally graded GeSiSn—GeSn base layer can comprise at the emitter-base interface a lattice matched or near latticed matched or strained $Ge_{1-z}(Si_{0.8}Sn_{0.2})_z$ to GaAs, where the GeSiSn may be compositionally graded by reducing the Si content and increasing Ge content to GeSn at the base-collector interface. The grading range can go from GeSiSn at the emitter-base junction to GeSn at the base-collector junction various compositions and may result in field enhancement in the base region.

FIG. 26 shows the general flat band energy diagram of an NPN HBT with a graded GeSiSn—GeSn base 2600 region. Starting next to the N emitter material 1 $E_{G1}$ 2602 with a $Ge_{1-z}(Si_{0.8}Sn_{0.2})_z$ where z is less than 0.5, which is then graded to layer $Ge_{1-b}Sn_b$ where b is less than 0.1 and this is represented by GeSiSn—GeSn 2601. Such a structure results in a field enhancement 2608 region. The general configuration of this NPN HBT with the graded GeSiSn—GeSn 2601 P-type base region can include an N-type emitter of material 1 $E_{G1}$ 2602, with an $E_{G1}$ energy bandgap greater than the GeSiSn—GeSn 2601 energy bandgap range; then a GeSiSn—GeSn 2601 P-type base region; then a N-type collector material 2 $E_{G2}$ 2603 where the energy bandgap energy $E_{G2}$ may equal or be greater than that of material 1 $E_{G1}$ 2602. Furthermore, the conduction band offset energies $\Delta E_{C1}$ 2604 at the emitter base junction and the $\Delta E_{C2}$ 2605 at the base collector junction may be less than 0.1 eV. Having small conduction band offsets between the emitter-base junction and the collector based junction is desirable for electron transport. The valence band offset $\Delta E_{V1}$ 2606 at the emitter base junction should be as large as possible to ensure that there is no back injection of holes from the GeSiSn—GeSn 2601 P-type base to material 1 $E_{G1}$ 2602 N-type emitter material.

The importance of the base region of the HBT can be further elucidated by the following example. A GaAs base HBT has a base thickness of 1000 Å, for an equivalent device a GeSiSn base HBT, the base thickness could be halved to 500 Å with no detrimental results. The $F_t$ for GeSiSn HBT may be increased because of the thinner base. Because the GeSiSn base resistivity could be for example 0.0026 ohm-cm at a high p-type doping level and this may be 2 times less than GaAs resistivity 0.0052 ohm-cm at high doping, then for this example the parameter $F_{max}$ would increase by a factor of $(2*F_t)^{1/2}$.

$Ge_{1-z}(Si_{0.8}Sn_{0.2})_z$ base material advantages. It can be latticed matched to GaAs and Ge for z<0.5. At low Sn % comprises similar properties to Ge. GeSiSn may have a tunable bandgap energy from 0.66 eV to 1.1 eV, and thus can be used as low turn-on voltage base emitter junction. GeSiSn (low Sn %<2%) may have a high hole mobility like Ge (2000 cm$^2$/Vs) as compared to GaAs (400 cm$^2$/Vs) and acceptors can be incorporated to high density (>1×10$^{19}$ cm$^{-3}$). GeSiSn base can be made ultra-thin (much less than 500 Å) while maintaining a low base sheet resistance (P-type base resistivity may be about 0.0026 ohm-cm) which increases current gain and decreases electron transit time. GeSiSn can be heavily doped P-type (>2×10$^{19}$ cm$^{-3}$). GeSiSn for low Sn concentration, has shallow acceptors, so the hole concentration is generally equal to the acceptor doping level and independent of temperature. The low base sheet resistance of GeSiSn results in a high $F_{max}$. The surface recombination velocity may be low for P-type GeSiSn. GeSiSn at low Sn % is an indirect semiconductor thus direct recombination of carriers in the base is reduced.

Another possible different embodiment may be an NPN HBT utilizing a GeSi base region.

Figure 26A:
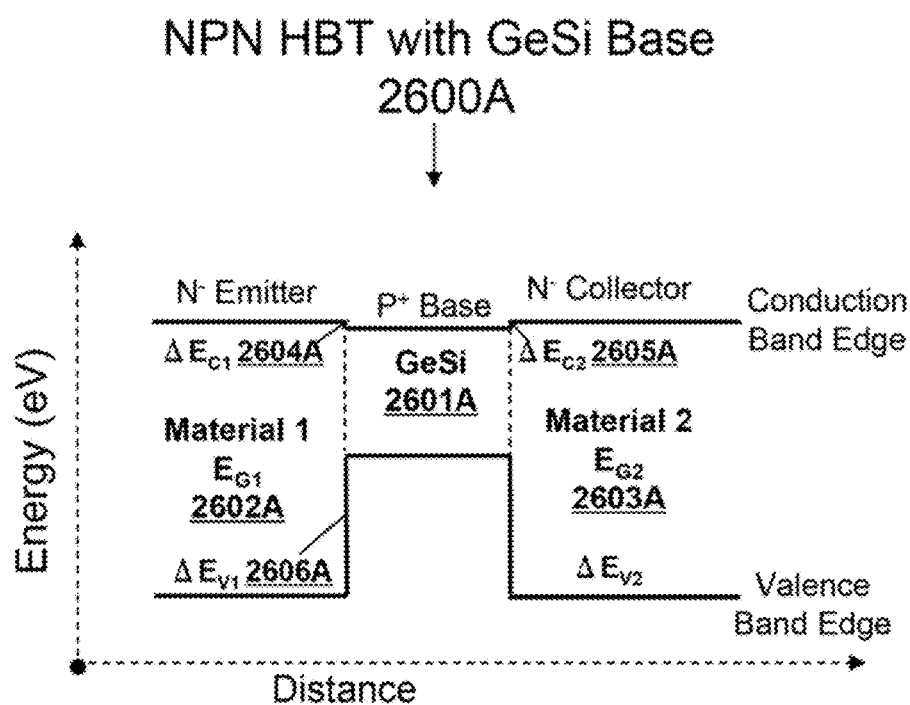
FIG. 26A shows a flat band energy diagram of an NPN HBT with GeSi base.

FIG. 26A shows the general flat band energy diagram of an NPN GeSi double heterojunction bipolar transistor. The alloy semiconductor GeSi may be latticed matched to various semiconductors like GaAs or Ge, etc. This shows the general configuration of an NPN HBT with GeSi base 2600A region include an N-type emitter of material 1 $E_{G1}$ 2602A, with a $E_{G1}$ energy bandgap greater than the GeSi 2601A and forms the P-type base region; then an N-type collector material 2 $E_{G2}$ 2603A where the energy bandgap energy $E_{G2}$ which can equal or be greater than the material 1 $E_{G1}$ 2602A. Furthermore, the conduction band offset energies $\Delta E_{C1}$ 2604A at the emitter base junction and the $\Delta E_{C2}$ 2605A at the base collector junction may be less than 0.1 eV. Small conduction band offsets between the emitter-base junction and the collector-base junction may be desirable for electron transport. The valence band offset $\Delta E_{V1}$ 2606A at the emitter base junction should be as large as possible to ensure that there is no back injection of holes from the GeSi 2601A P-type base to material 1 $E_{G1}$ 2602A N-type emitter material. This GeSi structure can be latticed matched between to GaAs or Ge and can also be in a coherently strained structure (near latticed matched).

A light emitting heterojunction bipolar transistor can be formed by placing a GeSiSn quantum well or quantum dot in the base region of a heterojunction transistor. This is a methodology for the formation of a light emitting transistor or transistor laser.

Figure 27:
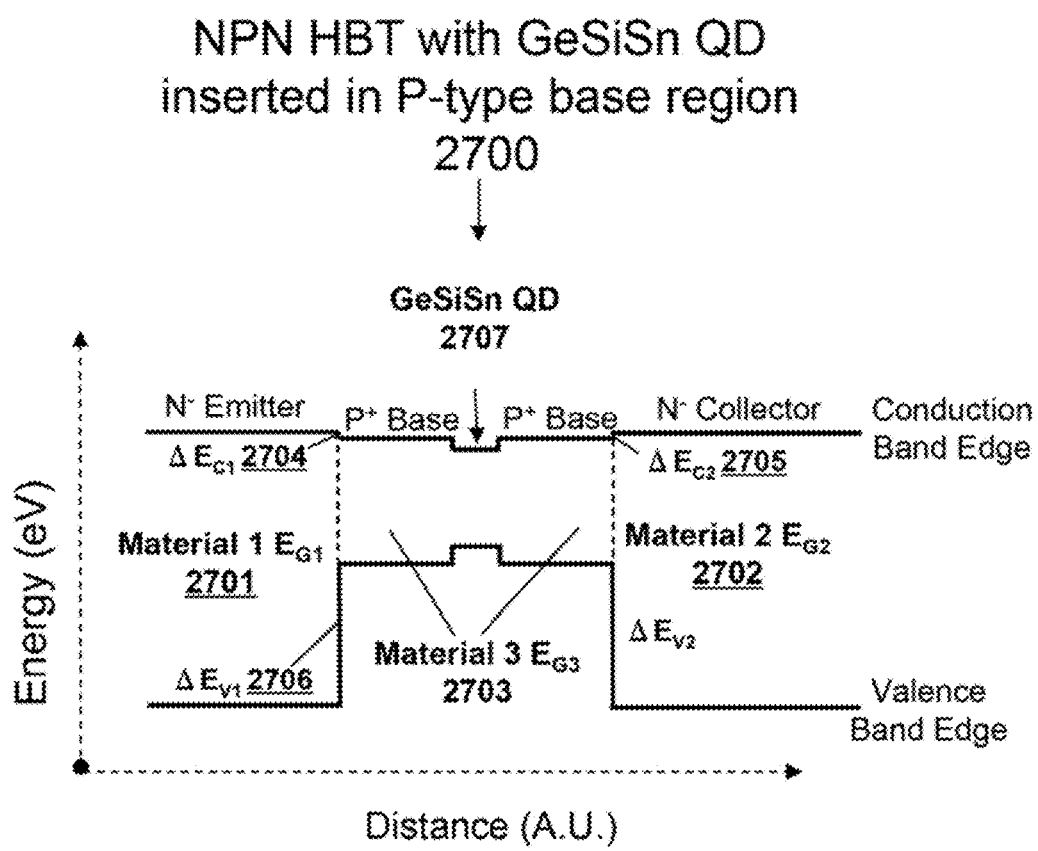
FIG. 27 shows a resulting flat band energy diagram of a GeSiSn quantum well or quantum dot material placed in the base region of a heterojunction transistor.

FIG. 27 shows the resulting flat band energy diagram of an NPN HBT with GeSiSn QD inserted in the P-type base region 2700 for the initial formation of a light emitting transistor. Material 3 $E_{G3}$ 2703 is the P-type base region and forms the barrier to the GeSiSn QD 2707 to get quantum confinement and also can serve as the waveguide material. The material 3 $E_{G3}$ 2703 bandgap energy should be greater than the bandgap energy of the bulk GeSiSn material which may be less than 1.1 eV. The N-type emitter material 1 $E_{G1}$ 2701 and N-type collector material 2 $E_{G2}$ 2702 can serve as the cladding layers of the transistor laser or light emitting transistor (LET). The general configuration of an NPN HBT can include an N-type emitter of material 1 $E_{G1}$ 2701, with an $E_{G1}$ energy bandgap greater than material 3 $E_{G3}$ 2703 P-type base region. The N-type collector material 2 $E_{G2}$ 2702 should have a bandgap energy $E_{G2}$ equals to the material 1 $E_{G1}$ 2701 or can be much larger. The conduction band offset energies $\Delta E_{C1}$ 2704 at the emitter base junction and the $\Delta E_{C2}$ 2705 at the base collector junction need not be small because a type I alignment assists in funneling the carriers into the waveguide and to the GeSiSn QD 2707. The valence band offset $\Delta E_{V1}$ 2706 at the emitter base junction should be as large as possible to ensure that there is no back injection of holes from the P-type base to material 1 $E_G$, 2701 N-type emitter material.

Variations could include grading of the quantum region in the base material of such a device.

Figure 28:
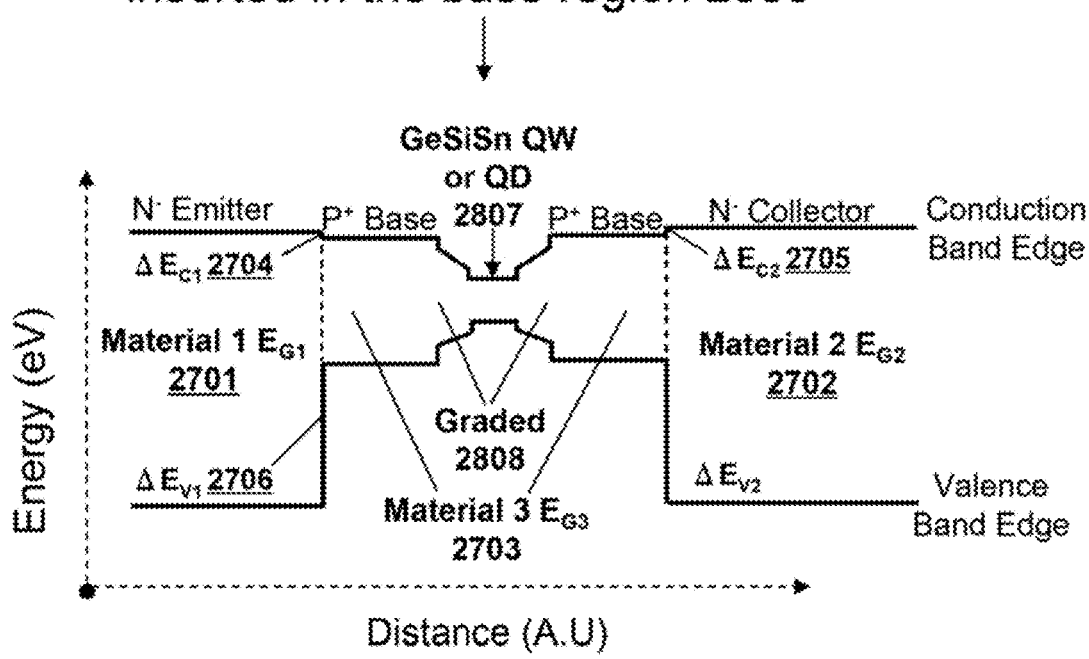
FIG. 28 shows a flat band energy diagram of a GeSiSn quantum well (QW) or quantum dot (QD) where a barrier has been graded from a base material to a GeSiSn active region.

FIG. 28 shows a slight variation to FIG. 27 where the flat band energy diagram of NPN HBT 2800 has a GeSiSn QW or QD 2807 inserted in the base region where the barrier layer has been graded 2808 from the P-base material 3 $E_{G3}$ 2703.

Exemplary Configurations: Note these are exemplary heterojunction bipolar transistor and/or transistor laser configurations or light emitting transistor and are used to illustrate the purposes and uses of the various configurations. In various embodiments, the GeSiSn base region can be replaced by a graded GeSiSn to GeSn base region.

Exemplary Configuration 1: An NPN structure of a GaAs Emitter-GeSiSn Base-GaAs Collector symmetric double heterojunction transistor. $Ge_{1-z}(Si_{0.8}Sn_{0.2})_z$ can be latticed matched to or near latticed matched or strained to GaAs for z<0.5. Typically GaAs HBTs have been the standard of the industry. The device elucidated in this example can include a symmetric double heterojunction GaAs—GeSiSn—GaAs HBT device. This device can have desirable base characteristics with a low voltage base turn-on (bandgap energy is <1.0 eV depending on the Si % and Sn %) region and a symmetric double heterojunction thus eliminating the offset voltage in the transistor output characteristic that reduces power added efficiency.

Figure 29:
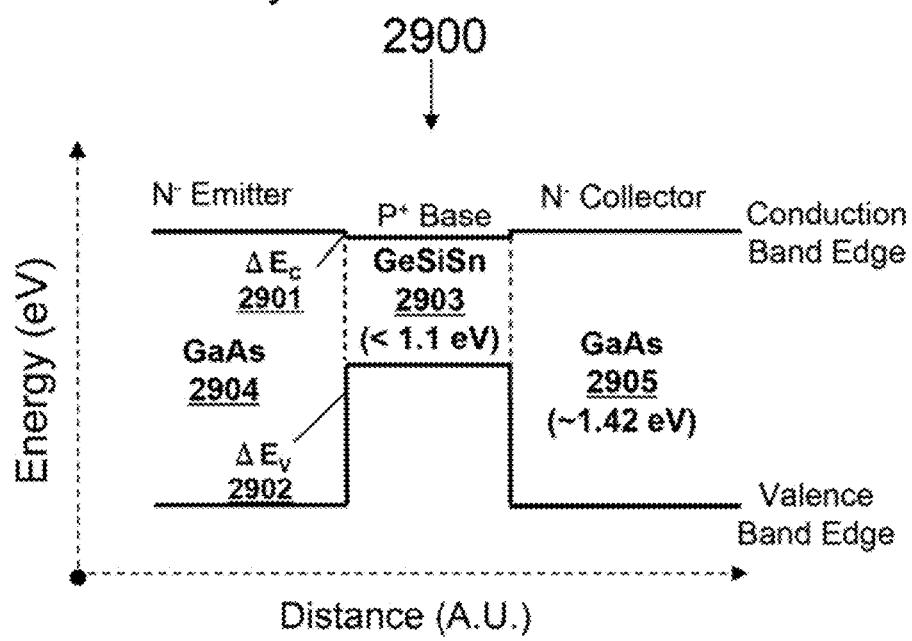
FIG. 29 illustrates an exemplary flat band energy diagram of an NPN structure of a GaAs emitter-GeSiSn base-GaAs collector symmetric double HBT.

FIG. 29 illustrates an exemplary flat band energy diagram of a GaAs Emitter-GeSiSn Base-GaAs Collector NPN symmetric double HBT 2900. $Ge_{1-z}(Si_{0.8}Sn_{0.2})_z$ can be latticed matched to GaAs for z<0.5 and may have a tunable bandgap energy from 0.66 eV to 1.1 eV (energy bandgap is indicated in parenthesis below the material of interest). For low Sn % less than equal to 2% the bandgap of GeSiSn may be less than 0.8 eV. For example the composition $Ge_{0.90}Si_{0.08}Sn_{0.02}$ may have a bandgap energy of near 0.78 V. At this composition the conduction band offset may be approximately $\Delta E_C$<0.1 eV 2901 which may result in a large valence band offset $\Delta E_V$ 2902. Near zero conduction band offsets are generally less than 0.1 eV. This unique arrangement of materials combines the high transconductance of heterojunction bipolar transistor (HBT) technology, and a desirable emitter-base heterojunction (wide bandgap GaAs 2904 emitter on a narrow bandgap high conductivity P+ GeSiSn 2903 base). The large valence band discontinuity between the GaAs emitter and GeSiSn base allows one to lightly N dope the GaAs emitter, while heavily doping P base GeSiSn 2903. The large valence band discontinuity prevents the back injection of holes into the emitter thus preventing the degradation in the gain or beta of the transistor. The GaAs 2905 collector provides a reasonable base collector breakdown because the bandgap energy of the GaAs is approximately 1.42 eV.

This unique arrangement of materials combines the high transconductance of heterojunction bipolar transistor (HBT) technology, with the breakdown voltage (using a GaAs collector), and a desirable emitter-base heterojunction (wide bandgap GaAs emitter on a narrow bandgap high conductivity P-type GeSn base). The combination of a low bandgap (<0.8 eV depending for Sn %<2%) GeSiSn base coupled with a wide bandgap GaAs (can be about 1.42 eV) collector can be used for high speed power applications. This symmetric double heterojunction bipolar transistor device results in a minimum in the zero offset voltage in the measurement of the collector current vs. the collector-emitter voltage as a function of the stepped voltage bias of the base-emitter junction, which is desirable for improving the power added efficiency of the NPN heterojunction bipolar transistors. The use of efficient GaAs—GeSiSn—GaAs transistors can significantly enhance battery life while also enabling operation at high frequency response, which can be desirable when used as RF power amplifiers for wireless devices or cellular phone applications.

Figure 30:
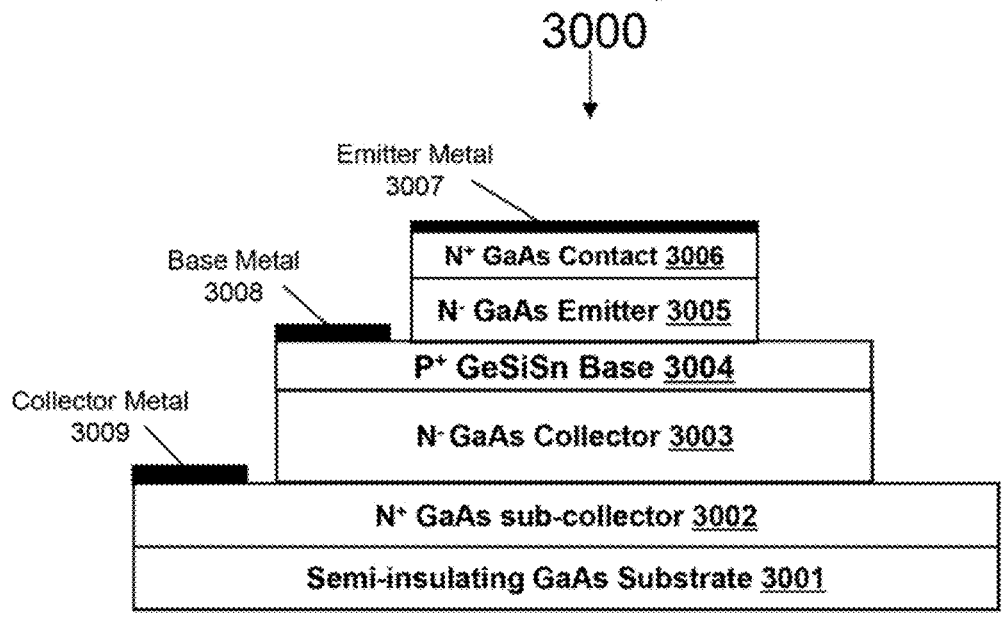
FIG. 30 shows an exemplary cross-sectional device depiction embodiment of an NPN GaAs—GeSiSn—GaAs symmetric double HBT.

FIG. 30 shows an exemplary cross-sectional device depiction of embodiment of an NPN GaAs—GeSiSn—GaAs symmetric double HBT 3000. This device depiction shows the standard HBT in a mesa configuration. One can grow this device epitaxially with a variety of techniques like molecular beam epitaxy (MBE), metalorganic chemical deposition (MOCVD), pulsed laser deposition (PLD) or other epitaxy methods. One starts with a high quality single crystal semi-insulating GaAs substrate 3001. An N+ GaAs sub-collector 3002 is grown first, followed by the N− GaAs collector 3003, then the GeSiSn Base 3004 (which may be grown by MBE, MOCVD, PLD, etc.). An N⁻ GaAs emitter 3005 is grown on the P-type base, followed by the N⁺ GaAs contact layer 3006. Contact is made to the device through the emitter metal 3007, the base metal 3008, and the collector metal 3009. The structure may be lattice matched or coherently strained.

The base can be compositionally graded from GeSiSn—GeSn to have field enhancement of the carriers.

GeSiSn at the emitter-base junction to GeSn at the base-collector junction in various compositions. GeSiSn is an alloy semiconductor $Ge_{1-x-y}Si_xSn_y$, and GeSn ($Ge_{1-b}Sn_b$) is a component semiconductor of GeSiSn. Note the dopants listed are only one of many possible dopants, and does preclude the use of other dopants and doping values are only nominal values but can take on many variations. The thicknesses are all exemplary and can take on many different values.

TABLE 1

Exemplary Epitaxial Structure of NPN GaAs—GeSiSn—GaAs HBT.

| Layer | Layer Name | Description | Comment |
|---|---|---|---|
| 1 | N⁺ Cap | ~1000 Å InGaAs (can be Te-doped >$10^{19}$ cm⁻³) InGaAs layer may be relaxed | Te = tellurium |
| 2 | N⁻ Emitter Cap | ~1500 Å GaAs (can be Si-doped ~5 × $10^{18}$ cm⁻³) | Si = silicon, other dopants possible |
| 3 | N⁻ Emitter | ~500 Å GaAs (can be Si-doped ~3 × $10^{17}$ cm⁻³) | |
| 4 | P⁺ Base | ~500 Å $Ge_{1-z}(Si_{0.8}Sn_{0.2})_z$ 0 ≤ Si % ≤ 40% 0 ≤ Sn % ≤ 10% Thickness range 100 Å-5000 Å | Latticed matched or Can be compositionally graded GeSiSn—GeSn |
| 5 | N⁻ Collector | ~10000 Å GaAs (can be Si-doped ~1 × $10^{16}$ cm⁻³) | |
| 6 | N⁺ Sub-Collector | ~5000 Å GaAs (can be Si-doped ~5 × $10^{18}$ cm⁻³) | |
| 7 | Buffer | ~500 Å GaAs | Can be undoped or N-type doped |
| 8 | | GaAs semi-insulating or conducting substrate | Substrate |

Note
the dopants listed are only one of many possible dopants, and does preclude the use of other dopants and doping values are only nominal values but can take on many variations. The thicknesses are all exemplary and can take on many different values.

Figure 31:
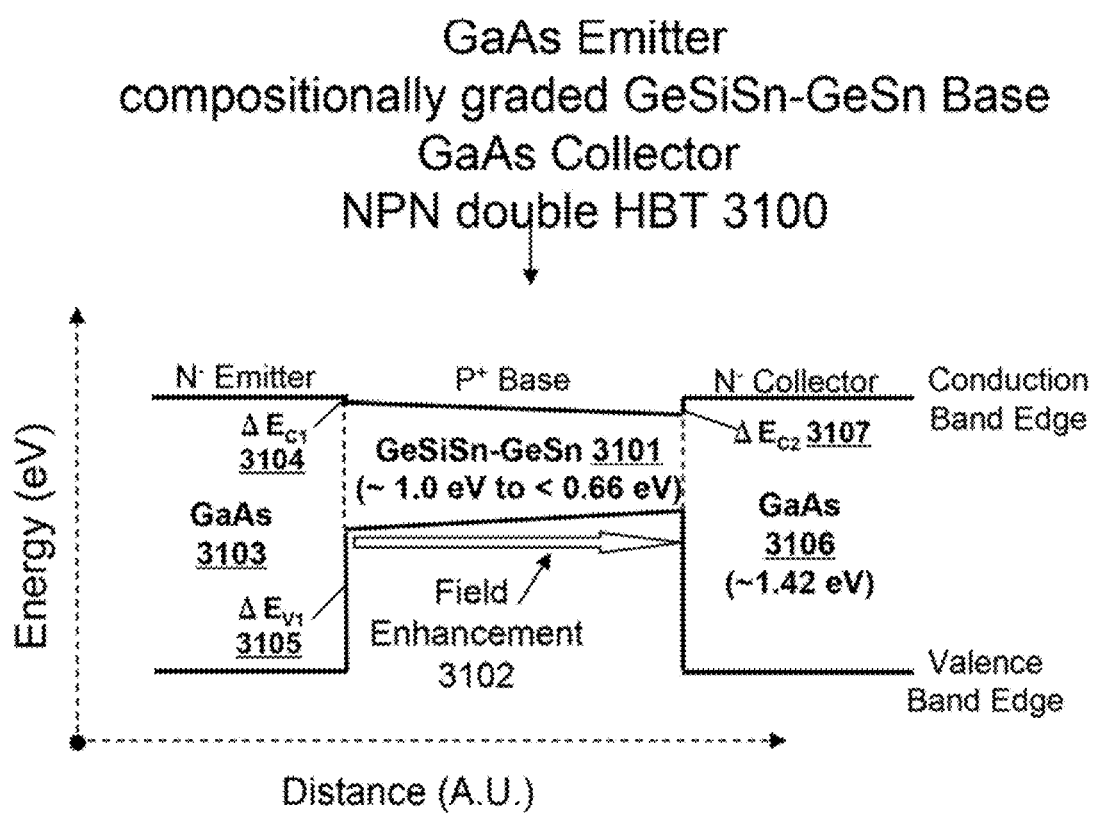
FIG. 31 illustrates an exemplary flat band energy diagram of an NPN structure of a GaAs emitter-compositionally graded GeSiSn—GeSn base-GaAs collector double heterojunction transistor. The compositionally graded GeSiSn—GeSn base layer can comprise at the emitter-base interface a lattice matched or near-latticed matched or strained $Ge_{1-z}(Si_{0.8}Sn_{0.2})_z$ to GaAs, where the GeSiSn may be compositionally graded by reducing the Si content and increasing Ge content to GeSn at the base-collector interface. The grading range can go from GeSiSn at the emitter-base junction to GeSn at the base-collector junction various compositions and may result in field enhancement in the base region.

FIG. 31 illustrates an exemplary flat band energy diagram of an NPN structure of a GaAs Emitter-graded GeSiSn—GeSn Base-GaAs Collector double HBT 3100. FIG. 31 is a variation on FIG. 29, by including the compositionally graded GeSiSn—GeSn 3101 P-type base region; this structure creates an electric field that accelerates the electrons across the base to the collector, thus creating the field enhancement 3102 region. Starting next to the N emitter GaAs 3103 with a $Ge_{1-z}(Si_{0.8}Sn_{0.2})_z$ where z is less than 0.5 which may be latticed matched near latticed matched or strained to GaAs, which can be graded to layer $Ge_{1-b}Sn_b$ where b is less than 0.1 and this is represented by GeSiSn—GeSn 3101. Such a structure results in a field enhancement 3102 region. The general configuration of this NPN HBT with the graded include an N-type emitter of GaAs 3103, then a GeSiSn—GeSn 3101 P-type base region with an energy bandgap range that may be from 1.0 eV to less than 0.66 eV, then a N-type GaAs collector 3106. Furthermore, the GaAs conduction band offset energies $\Delta E_{C1}$ 3104 at the emitter base junction and the $\Delta E_{C2}$ 3107 at the base collector junction may be less than 0.1 eV. The $\Delta E_{V1}$ 3105 may be large to stop back injection of carriers.

Table 1 shows an exemplary structure that could be grown for an NPN structure of a GaAs Emitter-GeSiSn Base-GaAs Collector double heterojunction transistor. Note the table shows the variation of GeSiSn base region or a compositionally graded GeSiSn—GeSn base region, either which can be used in the structure. $Ge_{1-z}(Si_{0.8}Sn_{0.2})_z$ can be latticed matched to GaAs for 0≤z≤0.5. The $Ge_{1-z}(Si_{0.8}Sn_{0.2})_z$ can be a near lattice matched of coherently strained structure. Note the compositionally graded GeSiSn—GeSn layer can comprise at the emitter-base interface starting with a lattice matched or near latticed matched or strained $Ge_{1-z}(Si_{0.8}Sn_{0.2})_z$ to GaAs and then compositionally grading the GeSiSn by reducing the Si % and increasing Sn % to GeSn at the collector interface. The grading range can be from It should be noted where the subscripts are missing GeSiSn refers to $Ge_{1-x-y}Si_xSn_y$, GeSi refers to $Ge_{1-a}Si_a$, GeSn refers to $Ge_{1-b}Sn_b$, and SiSn refers to $Si_{1-c}Sn_c$. $Ge_{1-x-y}Si_xSn_y$ can be comprised materials of $Ge_{1-a}Si_a$, $Ge_{1-b}Sn_b$, and $Si_{1-c}Sn_c$ at various compositions which may also be latticed matched or near latticed matched or strained to GaAs or Ge. $Ge_{1-x-y}Si_xSn_y$ may be written in the following form $Ge_{1-z}(Si_{1-k}Sn_k)_z$. Where the value of k may be equal to 0.2 and may have a range of 0≤k≤0.4. This designation form may be useful for the following materials composition $Ge_{1-z}(Si_{0.8}Sn_{0.2})_z$ where z is 0≤x≤0.5 may be lattice matched or near latticed matched or coherently strained or pseudomorphic to Ge or GaAs semiconductors. The subscripts for example $Si_{0.8}$ and $Sn_{0.2}$ may be empirical values and can have a degree of variation. Thus GeSiSn may have a range of Si and Sn contents for $Ge_{1-x-y}Si_xSn_y$ to lattice matched condition to GaAs and Ge.

Exemplary GaAs advantages: The large valence band offset between GaAs emitter and GeSiSn base can stop back injection of holes into the emitter. This allows for low N-type doping of the emitter and high P-type doping of the base, thus lowering base emitter capacitance while still achieving sizable current gain. GeSiSn can be latticed matched to GaAs (~5.65 Å), which enables dislocation free growth.

The latticed matched GaAs—GeSiSn emitter base junction may have a large valence offset (for example >0.7 eV). This eliminates the back injection of holes to the emitter from the base, which reduces the gain of the transistor. The base may be doped heavily P-type (typically >1×$10^{19}$ cm⁻³), with such high doping of the base, the emitter valence band offset blocks the holes even though the base doping may be much higher than the N-type emitter doping low $10^{17}$ cm⁻³). Furthermore, because GeSiSn may have low resistivity of 0.0026 ohm-cm at high p-type doping, one can decrease the thickness of the base significantly, while still moderately increasing the base sheet resistance value. The frequency response of the device may be related to the $F_t$ and $F_{max}$. The relationship between transit frequency $F_t$ and the maximum oscillation frequency $F_{max}$ is as follows for an HBT: $F_{max}=(F_t/8\pi R_B C_{CB})^{1/2}$. The transit frequency $F_t$ may be the inverse of the time for the electron to traverse the emitter, base, and collector. The parameters $R_B$ and $C_{CB}$ refer to the base sheet resistance and the capacitance of the collector base junction. The parameter $F_{max}$ is the unity power gain frequency and indicates the maximum frequency with power gain from a device. The transit frequency can be further improved by having a higher saturation velocity for the collector.

It should be noted that there are many types of N-type and P-type dopants. For standard III-V semiconductors like GaAs, InP, InGaAs, InGaP, the N-type dopants may be Si, Ge, Sn, Pb, S, Se, Te. The P-type dopants for standard III-V semiconductors may be C, Zn, Be, Mg. Common dopants for group IV semiconductors like GeSn, Ge, Si, SiGe, GeSiSn for N-type dopants may be P, As, Sb. The P-type dopants may be B, Al, Ga. Also the concentrations of the dopants vary depending on transistor design and those listed in the table are only possible guidelines.

Also designations such as N+ reference highly N-type doped material and N− lightly doped N-type material. Also designations such as P+ reference highly P-type doped material and P− lightly doped P-type material. Unintentionally doped material can be denoted as UID.

Figure 31A:
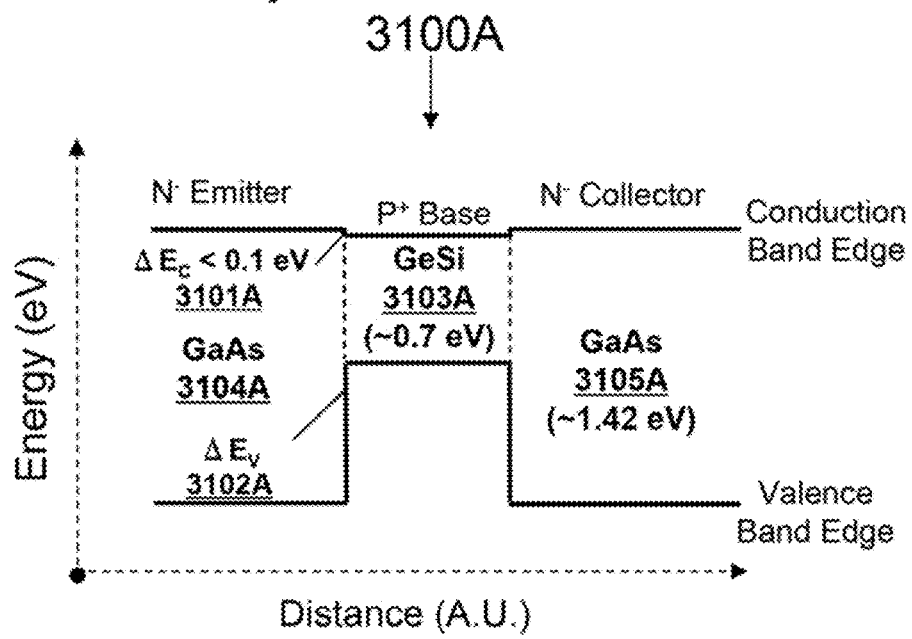
FIG. 31A shows a flat band energy diagram of a GaAs emitter-GeSi base-GaAs collection symmetric double HBT. The GeSi can be lattice matched or near latticed matched or coherently strained to the GaAs layers.

FIG. 31A illustrates an possible example of an exemplary flat band energy diagram of a GaAs Emitter-GeSi Base-GaAs Collector NPN symmetric double HBT 3100A. For example $Ge_{0.98}Si_{0.02}$ can be latticed matched to GaAs and may have a bandgap energy of approximately 0.7 eV (ranging from 0.67 eV to 0.72 eV). Note for this example the conduction band offset $\Delta E_C$<0.1 eV 3101A with a large valence band offset $\Delta E_V$>0.1 eV 3102A. Near zero conduction band offsets are generally less than 0.1 eV. This unique arrangement of materials combines the high transconductance of heterojunction bipolar transistor (HBT) technology, and a desirable emitter-base heterojunction (wide bandgap GaAs 3104A emitter on a narrow bandgap high conductivity P+ GeSi 3103A base). The large valence band discontinuity between the GaAs emitter and GeSi base allows one to lightly N dope the GaAs emitter, while heavily doping P base GeSi 3103A. The large valence band discontinuity prevents the back injection of holes into the emitter thus preventing the degradation in the gain or beta of the transistor. The GaAs 3105A collector provides a reasonable base collector breakdown because the bandgap energy of the GaAs is 1.42 eV.

In some examples, to fabricate a light emitting bipolar transistor may require an insertion into the high Sn % (>5%) GeSiSn P-type base region (or GaAs base), a GeSn quantum dot QD or quantum well QW. $Ge_{1-z}(Si_{0.8}Sn_{0.2})_z$ can be latticed matched to GaAs for z<0.5. The GeSiSn layer may be latticed matched to GaAs or coherently strained.

Figure 32:
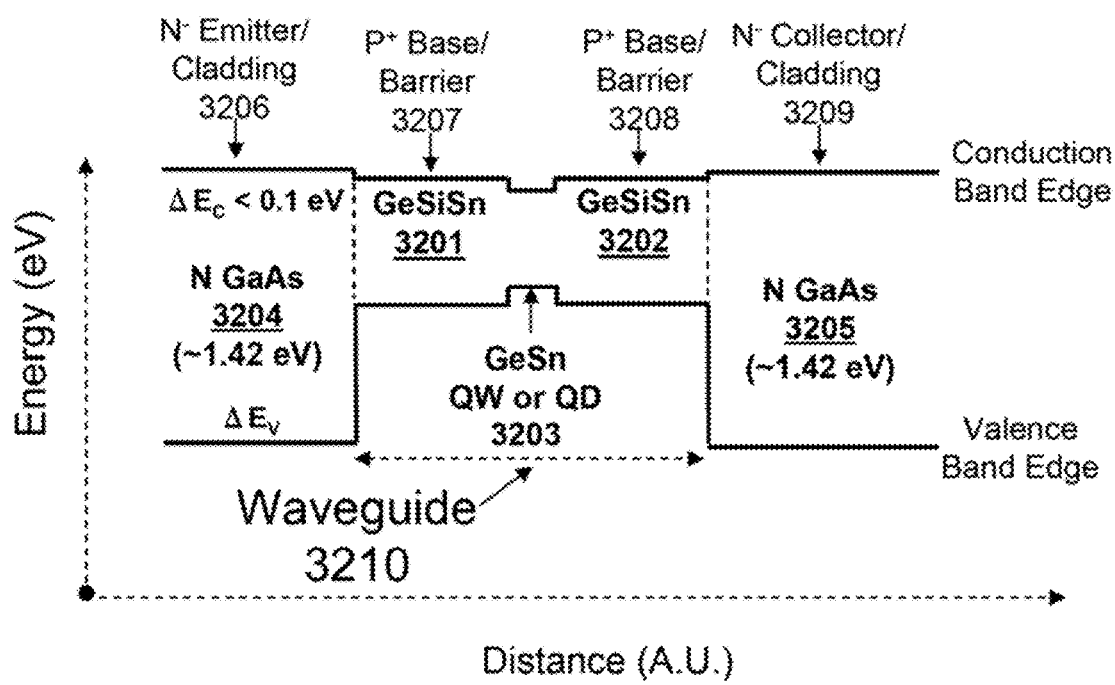
FIG. 32 shows an exemplary flat band energy diagram of an NPN transistor laser or light emitting transistor (LET) structure with a GeSn QW or QD active region in a GeSiSn P-type base/barrier material 3200.

FIG. 32 shows an exemplary flat band energy diagram of an NPN transistor laser or LET structure with a GeSn QW or QD active region in a high Sn % GeSiSn P+ base/barrier material 3200. The high Sn % GeSiSn 3201 and 3202 forms the P+ base and also acts as a barrier layer for quantum confine the electrons and holes in the GeSn QW or QD 3203. QWs are formed by having a large energy bandgap material surrounded by a low energy bandgap material which results in two dimensional electron confinement. For a QD the growth of a large lattice constant material on a smaller lattice constant material results in strained layer epitaxy allowing the self-assembled three dimensional island growth. Typical thickness of quantum wells can be about 10 nm but they can range from 1 nm to 50 nm depending on the wavelength of interest that needs to be produced. Typical quantum dot diameters are in the range of 1 nm-20 nm, but are dependent on the wavelength of light that needs to be emitted. The GeSn QW or QD 3203 inserted into a high Sn % GeSiSn 3201 & 3202 base/barrier serves for the collection region for electrons and holes to recombine to generate light. The GeSiSn 3201 & 3202 also serve as the optical confinement layer and the waveguide material. The GaAs 3204 & 3205 serves as the emitter/cladding and collector/cladding material for this structure. The cladding serves as funneling carriers into the active/waveguide region and traps the emit light in the waveguide structure. The large energy bandgap difference between the GaAs 3204 & 3205 and the GeSiSn 3201 & 3202 ensures a large index of refraction difference at the N− emitter/cladding 3206 and P+ base/barrier 3207 junction and a large index refraction difference at the P+ base/barrier 3208 and N− collector/cladding 3209, thus making an excellent waveguide 3210 to optically confine the light produced by the active region.

Figure 33:
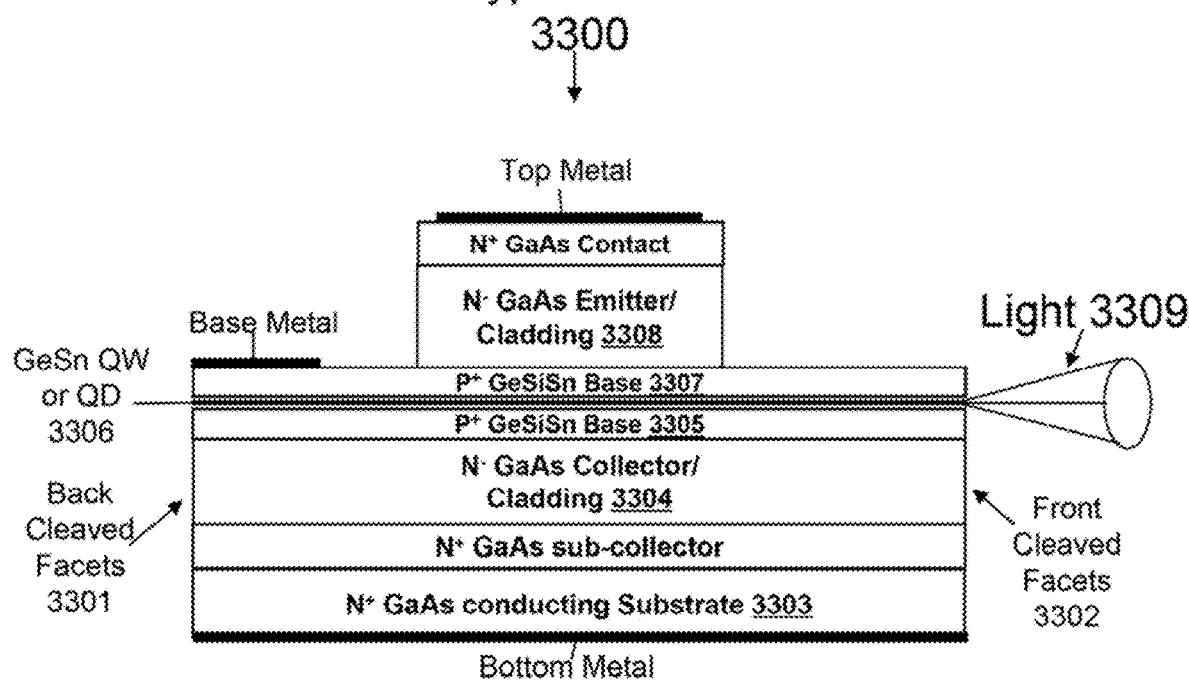
FIG. 33 shows a possible cross-sectional device depiction of an NPN transistor laser or light emitting transistor structure with a GeSn QW or QD active region in a GeSiSn P-type base/barrier material 3300.

FIG. 33 shows a possible cross-sectional device depiction of an NPN transistor laser structure or light emitting transistor with a GeSn QW or QD 3306 active region in a high Sn % GeSiSn P-type base/barrier material 3300. The structure can be grown on N+ GaAs conducting substrate 3303, which is the seed crystal to grow the full structure. N− GaAs collector/cladding 3304 and the N− GaAs emitter/cladding 3308 do dual functions of optical confinement of the light 3309 produced and controlling the flow of electrons and holes. The P+ GeSiSn base 3305 and 3307 forms the barrier material for the GeSn QW or QD 3306, and also provide the waveguide material. The laser can require a resonant cavity to get optical gain, and typically this can be formed from the front cleaved facets 3302 and back cleaved facets 3301 of the semiconductor crystalline structure.

Table 2 shows an exemplary epitaxial structure of an NPN light emitting structure with a GeSn QW or QD active region in a GeSiSn P-type base/barrier HBT.

TABLE 2

Exemplary epitaxial structure of NPN light emitting structure with a GeSn QW or QD active region in a GeSiSn P-type base/barrier HBT.

| Layer | Layer Name | Description | Comment |
|---|---|---|---|
| 1 | N+ Cap | ~1000 Å InGaAs (Te-doped >$10^{19}$ cm$^{-3}$) | |
| 2 | N− Emitter/Cladding | ~1000 Å GaAs (Si-doped ~3 × $10^{17}$ cm$^{-3}$) | |
| 3 | P+ Base/Barrier | ~450 Å GeSiSn (B-doped >$10^{19}$ cm$^{-3}$) | B = boron, high Sn % May be lattice matched |

TABLE 2-continued

Exemplary epitaxial structure of NPN light emitting structure with a
GeSn QW or QD active region in a GeSiSn P-type base/barrier HBT.

| Layer | Layer Name | Description | Comment |
|---|---|---|---|
| 4 | QW or QD | ~100 Å GeSn<br>Sn content can be: $0 \leq Sn \% \leq 20\%$<br>QW (Sn % ~0% to 10% GeSn)<br>QW thickness range 10 Å-1000 Å<br>QD (Sn % ~10% to 20% GeSn)<br>QD size range 10 Å-500 Å | For light emission<br>1000 nm-5000 nm |
| 5 | P$^+$ Base/Barrier | ~450 Å GeSiSn (B-doped >$10^{19}$ cm$^{-3}$) | B = boron, high Sn %<br>May be lattice matched |
| 6 | N$^-$ Collector | ~1000 Å GaAs (Si-doped ~1 × $10^{16}$ cm$^{-3}$) | |
| 7 | N$^+$ Sub-Collector | ~500 Å GaAs (Si-doped ~5 × $10^{18}$ cm$^{-3}$) | |
| 8 | N$^+$ Buffer | ~500 Å GaAs (Si-doped ~5 × $10^{18}$ cm$^{-3}$) | |
| 9 | | GaAs N$^+$ conducting or semi-insulating | Substrate |

Note
the p+ base barriers may be lattice matched or coherently strained $Ge_{1-z}(Si_{0.8}Sn_{0.2})_z$ with tunable band gaps based on the z value to GaAs.

Note
the dopants listed are only one of many possible dopants, and does preclude the use of other dopants and doping values are only nominal values but can take on many variations. The thicknesses are all exemplary and can take on many different values.

The semiconductor alloy $In_{0.49}Ga_{0.51}P$ (InGaP refers to alloy semiconductor through the text) can be lattice matched to GaAs. This is the literature composition values of InGaP that can be grown lattice matched to GaAs, but may have variations in actual practice. Also the composition of InGaP can be varied to be tensile strained or compressive strained to the GaAs. InGaP can be grown in a disordered phase, ordered phase, or a combination of the two. The disordered InGaP phase may have a bandgap energy of 1.9 eV. The bandgap of the ordered InGaP may be about 1.85 eV. In some examples, to fabricate a light emitting bipolar transistor may require an insertion into the GaAs base region a GeSn quantum well, quantum dot, or quantum wire layer or GeSiSn quantum well, quantum dot, or quantum wire layer. The GaAs is the p type base material but also acts as a barrier layer to quantum confine the electrons and holes in the QW and QDs or quantum wires. QWs are formed by having a large energy bandgap material surrounded by a low energy bandgap material which results in two dimensional electron confinement. For a QD the strained layer growth results in three dimensional electron confinement. Typical thicknesses of quantum wells are about 100 Å but they could be larger or less than that thickness depending on the emission wavelength desired. Typical quantum dot diameters are in the range of 1 nm-20 nm, but are dependent on the wavelength of light that needs to be emitted.

Figure 34:
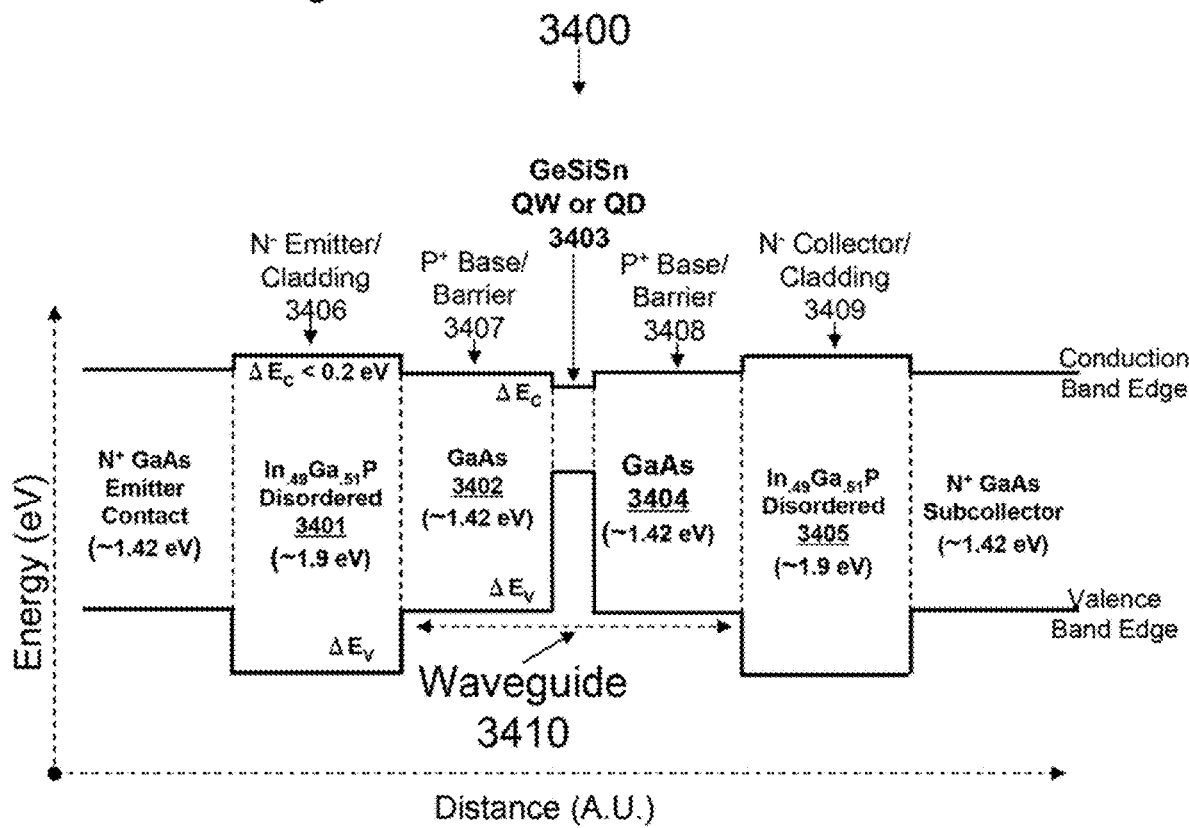
FIG. 34 shows an exemplary flat band energy diagram of an NPN transistor laser or light emitting transistor structure with a GeSiSn QW or QD active region in a GaAs P-type base/barrier material 3400.

FIG. 34 shows an exemplary flat band energy diagram of an NPN transistor laser or LET structure with a GeSiSn QW or QD active region in a GaAs P$^+$ base/barrier material 3400. The $In_{0.49}Ga_{0.51}P$ disordered 3401 & 3405 serves as the N$^-$ emitter/cladding and N$^-$ collector/cladding layers. Note the relevant band discontinuities $\Delta E_C$, $\Delta E_V$ are shown in the figure and are approximate values and may have a wide variation. The laser includes a GeSiSn QW or QD 3403 active region for the collection region for electrons and holes to recombine to generate light, which is inserted into a P$^+$ GaAs base/barrier 3402 & 3404, which also serves as the barrier layer of the GeSiSn QW or QD 3403 active region, thus serving also as the optical waveguide 3410 material. The large energy bandgap difference between the $In_{0.49}Ga_{0.51}P$ disordered 3401 & 3405 and the GaAs base/barrier 3402 & 3404 ensures a large index of refraction difference at the N$^-$ emitter/cladding 3406 and P$^+$ base/barrier 3407 junction and a large index refraction difference at the P$^+$ base/barrier 3408 and N$^-$ collector/cladding 3409, thus making an excellent waveguide 3410 to optically confine the light produced by the active region. GeSn QW or QD could also be used as the active region.

Figure 35:
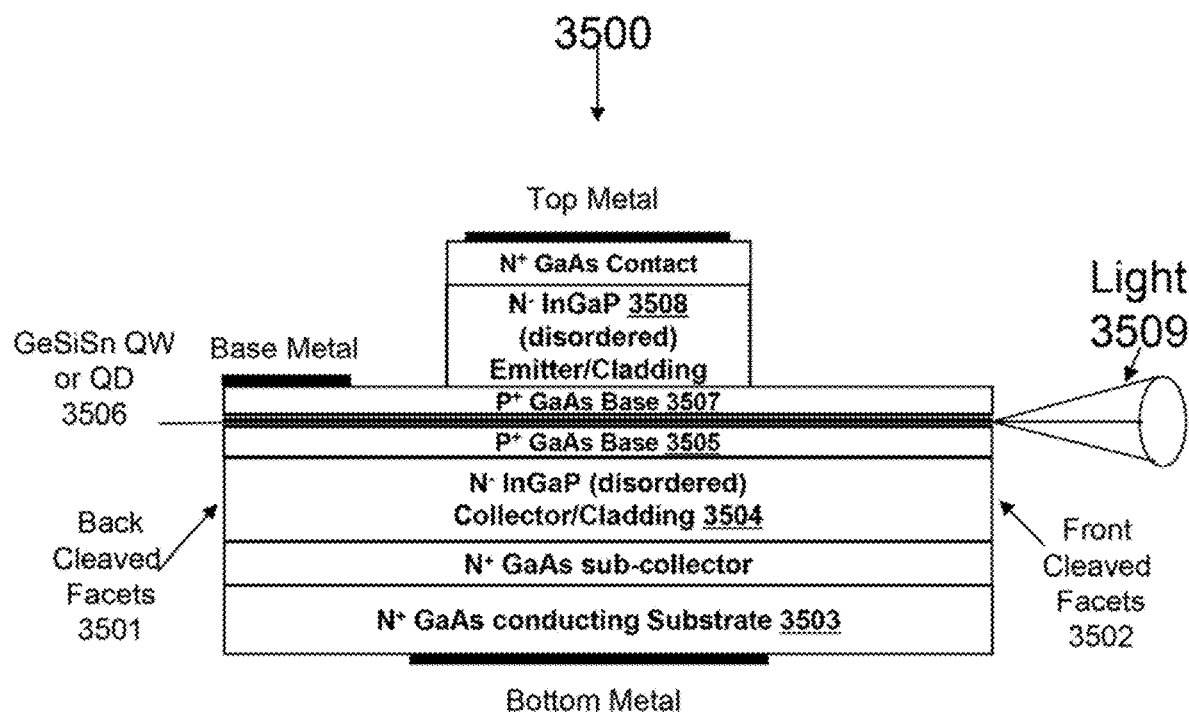
FIG. 35 shows a possible cross-sectional device depiction of an NPN edge emitting transistor laser or light emitting transistor (LET) structure with a GeSiSn QW or QD active region in a GaAs P-type base/barrier material 3500.

FIG. 35 shows a possible cross-sectional device depiction of an NPN edge emitting transistor laser or light emitting structure with a GeSiSn QW or QD active region in a GaAs P$^+$ base/barrier material 3500. A GeSiSn QW or QD 3506 active region in a P$^+$ GaAs base 3505 & 3507 which also functions as the barrier material for the QW or QD. This is an exceptional device because the type I discontinuities form an excellent optical and electrical confining structure. The structure can be grown on N$^+$ GaAs conducting substrate 3503, which is the seed crystal to grow the full structure. N$^-$ InGaP (disordered) collector/cladding 3504 and the N$^-$ InGaP (disordered) emitter/cladding 3508 do dual functions of optical confinement of the light 3509 produced and controlling the flow of electrons and holes. P$^+$ GaAs base 3505 & 3507 form the barrier material for GeSiSn QW or QD 3506, and also provide the waveguide material. The laser can require a resonant cavity to get optical gain, and typically this can be formed from the front cleaved facets 3502 and back cleaved facets 3501 of the semiconductor crystalline structure.

Table 3 shows an exemplary table of the epitaxial structure of an NPN light emitting GeSiSn QW or QD active region in a GaAs P-type base/barrier HBT.

TABLE 3

An Exemplary epitaxial structure of an NPN edge emitting transistor laser structure with a GeSiSn QW or QD active region in a GaAs P-type base/barrier material.

| Layer | Layer Name | Description | Comment |
|---|---|---|---|
| 1 | N$^+$ Cap | ~1000 Å InGaAs (Te-doped >10$^{19}$ cm$^{-3}$) | |
| 2 | N$^-$ Emitter/Cladding | ~5000 Å In$_{0.49}$Ga$_{0.51}$P (Si-doped ~3 × 10$^{17}$ cm$^{-3}$) | Disordered |
| 3 | P$^+$ Base/Barrier | ~500 Å GaAs (B-doped >10$^{19}$ cm$^{-3}$) | |
| 4 | QW or QD | ~55 Å GeSiSn<br>QW Ge$_{1-z}$(Si$_{0.8}$Sn$_{0.2}$)$_z$ where z < 0.5<br>QW thickness range 10 Å-1000 Å<br>QD GeSiSn with high Sn % ~10% to 20%<br>QD size range 10 Å-500 Å | For light emission<br>1000 nm-5000 nm |
| 5 | P$^+$ Base/Barrier | ~500 Å GaAs (B-doped >10$^{19}$ cm$^{-3}$) | |
| 6 | N$^-$ Collector/Cladding | ~5000 Å In$_{0.49}$Ga$_{0.51}$P (Si-doped ~3 × 10$^{17}$ cm$^{-3}$) | Disordered |
| 7 | N$^+$ Sub-Collector | ~500 Å GaAs (Si-doped ~5 × 10$^{18}$ cm$^{-3}$) | |
| 8 | N$^+$ Buffer | ~500 Å GaAs (Si doped ~5 × 10$^{18}$ cm$^{-3}$) | |
| 9 | | N$^+$ GaAs conducting substrate | Crystalline |

Note
for the QW a near lattice matched or strained Ge$_{1-z}$(Si$_{0.8}$Sn$_{0.2}$)$_z$ to GaAs may be used, with tunable band gaps based on the z value. For the QDs a high Sn % GeSiSn layer would be used.
Note
the dopants listed are only one of many possible dopants, and does preclude the use of other dopants and doping values are only nominal values but can take on many variations. The thicknesses are all exemplary and can take on many different values.

The transistor laser has the integrated features of both the transistor and the laser. It is closely similar to a light emitting transistor except it has light amplification. From such a structure it can be straightforward to simplify the structure and grow a separate confinement heterostructure (SCH) laser.

Figure 36:
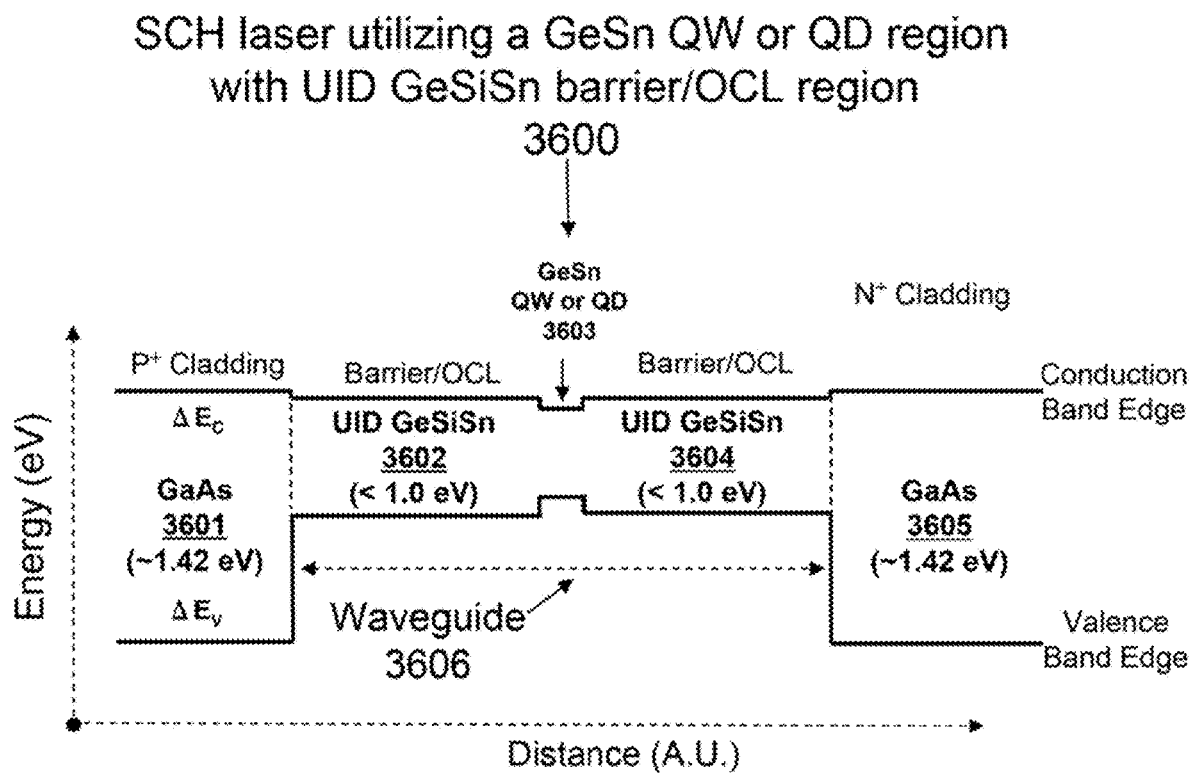
FIG. 36 shows an exemplary flat band energy diagram of a SCH laser utilizing a GeSn QW or QD, or GeSiSn QW or QD active region located in UID GeSiSn barrier/OCL region with GaAs cladding.

FIG. 36 shows an exemplary flat band energy diagram of an SCH laser utilizing a GeSn QW or QD region 3600 located in UID high Si GeSiSn barrier/OCL layer 3602 & 3604 region with P$^+$ GaAs 3601 cladding and N$^+$ GaAs 3605 cladding layers. This structure represents a PN junction or diode with an unintentionally doped (UID) active region and optical confinement region between the P$^+$ GaAs 3601 and N$^+$ GaAs 3605 cladding. The UID Ge 3602 and 3604 forms the barrier material for the GeSn QW or QD 3603 active region. The combination of the barrier and active region forms the waveguide 3606 of the laser. The P$^+$ GaAs 3601 cladding region serves for injection of the holes and for the optical confinement of the light emitted from the active region. The N$^+$ GaAs 3605 cladding region serves for injection of the electrons and for the optical confinement of the light emitted from the active region. Though this depicts a symmetric structure it can be also asymmetric.

Figure 37:
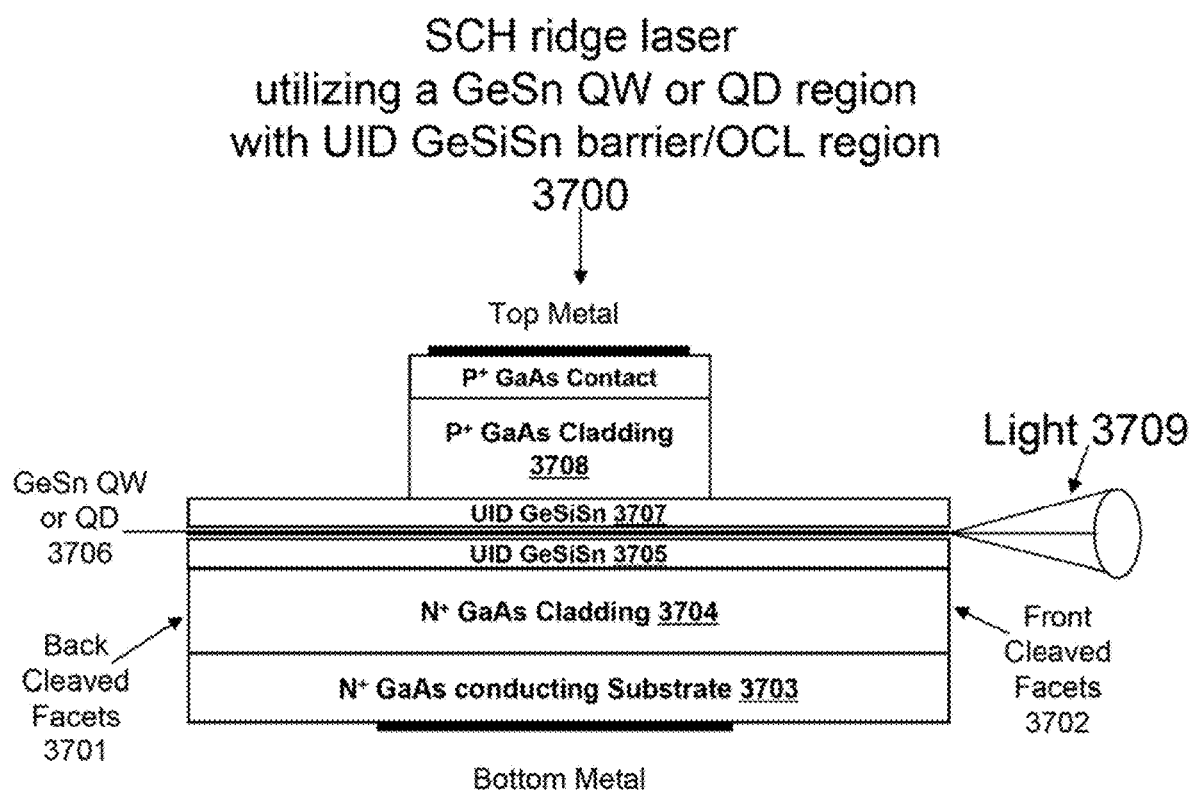
FIG. 37 shows a cross-sectional device depiction of a SCH laser utilizing a GeSn QW or QD region; or GeSiSn QW or QD active region located in UID GeSiSn barrier/OCL region with GaAs cladding.

FIG. 37 shows a cross-sectional depiction of a SCH ridge laser utilizing a GeSn QW or QD region 3700 located in UID GeSiSn barrier/OCL region with P-type GaAs and N-type GaAs cladding. The structure can be grown on N$^+$ GaAs conducting substrate 3703. N$^+$ GaAs cladding 3704 serves for the injection of electrons into the active region and the bottom cladding for the optical confinement of the light emitted from the active region. The P$^+$ GaAs cladding 3708 serves for the injection of holes into the active region, and the top cladding for optical confinement of the light 3709 emitted from the active region. The UID GeSiSn 3705 & 3707 forms the barrier material for the GeSn QW or QD 3706, and also provide the OCL material. The laser can require a resonant cavity to get optical gain, and typically this can be formed from the front cleaved facets 3702 and back cleaved facets 3701 of the semiconductor crystalline structure. The ridge structure provides the vertical guiding of the current into the active region.

Table 4 shows an exemplary epitaxial structure SCH injection diode laser with a GeSn QW or QD region with GeSiSn barriers.

TABLE 4

Exemplary epitaxial structure SCH injection diode laser with a GeSn QW or QD region with GeSiSn barriers.

| Layer | Layer Name | Description | Comment |
|---|---|---|---|
| 1 | P$^+$ Cap | ~1000 Å GaAs (Zn doped >10$^{19}$ cm$^{-3}$) | |
| 2 | P$^+$ Cladding | ~10000 Å GaAs (Zn doped ~1 × 10$^{18}$ cm$^{-3}$) | |
| 3 | Barrier/OCL | ~450 Å GeSiSn | UID |
| 4 | QW or QD | ~100 Å GeSn<br>QW (Sn % ~0% to 10% GeSn)<br>QW thickness range 10 Å-1000 Å<br>QD (Sn % ~10% to 20% GeSn)<br>QD size range 10 Å-500 Å | For light emission<br>1000 nm-5000 nm |
| 5 | Barrier/OCL | ~450 Å GeSiSn | UID |

TABLE 4-continued

Exemplary epitaxial structure SCH injection diode laser with a
GeSn QW or QD region with GeSiSn barriers.

| Layer | Layer Name | Description | Comment |
|---|---|---|---|
| 6 | N$^+$ Cladding | ~10000 Å GaAs (Si-doped ~1 × 10$^{18}$ cm$^{-3}$) | |
| 7 | N$^+$ Buffer | ~5000 Å GaAs (Si-doped ~5 × 10$^{18}$ cm$^{-3}$) | |
| 8 | | GaAs N$^+$ conducting substrate | Crystalline |

Note
for the barrier/OCL a near lattice matched or strained Ge$_{1-z}$(Si$_{0.8}$Sn$_{0.2}$)$_z$ to GaAs may be used, with tunable band gaps energy based on the z value.

Note
the dopants listed are only one of many possible dopants, and does preclude the use of other dopants and doping values are only nominal values but can take on many variations. The thicknesses are all exemplary and can take on many different values.

A variation of the laser structure could incorporate GeSn QW or QD; GeSiSn QW or QD region in a UID GaAs barrier/waveguide region, and utilizing latticed match InGaP as the cladding material.

Figure 38:
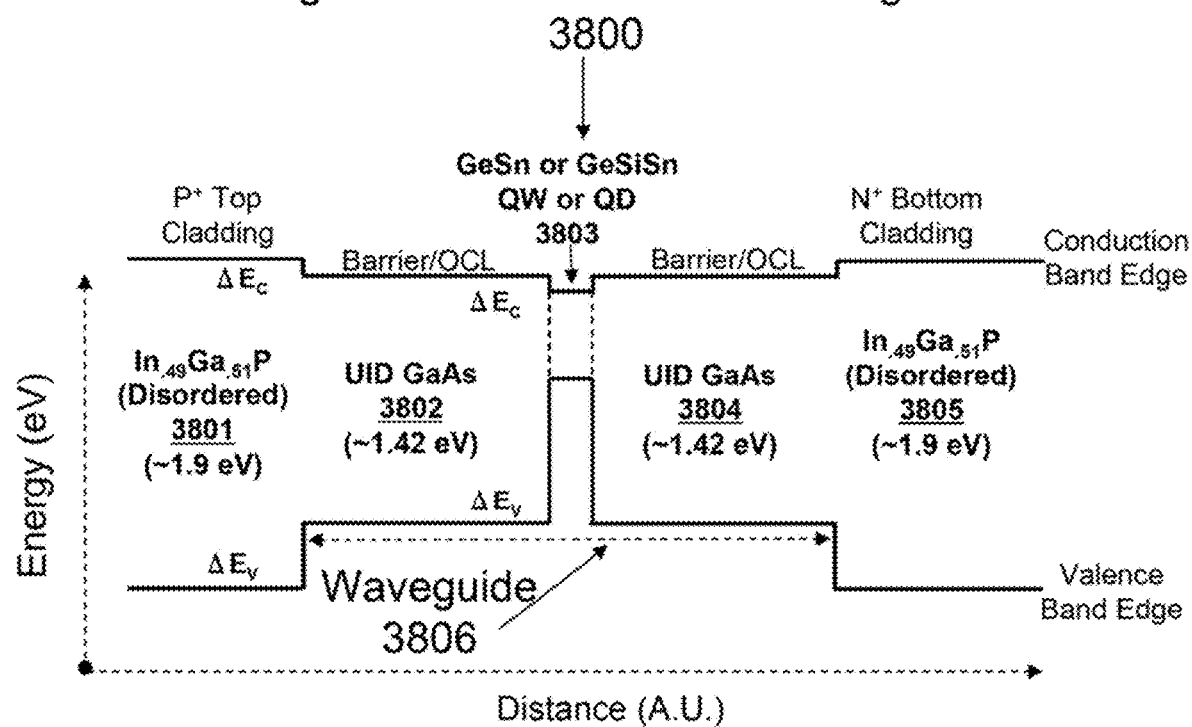
FIG. 38 shows an exemplary flat band energy diagram of an SCH diode laser utilizing a GeSn QW or QD, or GeSiSn QW or QD region located in GaAs barrier/OCL region with type InGaP cladding.

FIG. 38 shows an exemplary flat band energy diagram of an SCH diode laser utilizing a GeSn QW or QD; or GeSiSn QW or QD region 3800 located in UID GaAs 3802 & 3804 barrier/OCL region with P$^+$ InGaP 3801 disordered and N$^+$ InGaP 3805 disordered cladding. This structure represents a PN junction or diode with an unintentionally doped (UID) active region and optical confinement region between the P$^+$ InGaP 3801 disordered and N$^+$ InGaP 3805 disordered cladding. The UID GaAs 3802 & 3804 forms the barrier material for the GeSn QW or QD; or GeSiSn QW or QD 3803 active region. The combination of the barrier and active region forms the waveguide 3806 of the laser. The P$^+$ In$_{0.49}$Ga$_{0.51}$P disordered 3801 top cladding region serves for injection of the holes and for the optical confinement of the light emitted from the active region. The N$^+$ In$_{0.49}$Ga$_{0.51}$P disordered 3805 bottom cladding region serves for injection of the electrons and for the optical confinement of the light emitted from the active region. Though this depicts a symmetric structure it can be also asymmetric.

Table 5 shows an exemplary epitaxial structure SCH injection diode laser with a GeSn QW or QD region with GaAs barriers.

TABLE 5

Exemplary epitaxial structure SCH injection diode laser with a
GeSn QW or QD region with GaAs barriers.

| Layer | Layer Name | Description | Comment |
|---|---|---|---|
| 1 | P$^+$ Cap | ~1000 Å GaAs (Zn doped >10$^{19}$ cm$^{-3}$) | |
| 2 | P$^+$ Cladding | ~10000 Å In$_{0.49}$Ga$_{0.51}$P (Zn-doped ~1 × 10$^{18}$ cm$^{-3}$) | Disordered |
| 3 | Barrier/OCL | ~450 Å GaAs | UID |
| 4 | QW or QD | ~10-1000 Å GeSn<br>QW (Sn % ~0% to 10% GeSn)<br>QW thickness range 10 Å-1000 Å<br>QD (Sn % ~10% to 20% GeSn)<br>QD size range 10 Å-500 Å | For light emission<br>1000 nm-5000 nm |
| 5 | Barrier/OCL | ~450 Å GaAs | UID |
| 6 | N$^+$ Cladding | ~10000 Å In$_{0.49}$Ga$_{0.51}$P (Si-doped ~1 × 10$^{18}$ cm$^{-3}$) | Disordered |
| 7 | N$^+$ Buffer | ~5000 Å GaAs (Si-doped ~5 × 10$^{18}$ cm$^{-3}$) | |
| 8 | | GaAs N$^+$ conducting substrate | Crystalline |

Note
for the QW a near lattice matched or strained (Ge$_{1-x}$(Si$_{0.8}$Sn$_{0.2}$)$_z$ to GaAs may be used, with tunable band gaps based on the z value. For the QDs a high Sn % GeSiSn layer would be used.

Note
the dopants listed are only one of many possible dopants, and does preclude the use of other dopants and doping values are only nominal values but can take on many variations. The thicknesses are all exemplary and can take on many different values.

The lattice constant of GaAs and Ge may be about 5.65 Å. The GeSn lattice constant can change from 5.66 Å to 5.833 Å at about 20% Sn content, the range of lattice mismatch at the highest Sn content may be about 3%. This makes GeSn useful for growth on Ge or GaAs or GeSiSn materials which may be lattice matched to Ge and GaAs, because at low Sn % GeSn can be grown coherently strained or psuedomorphic on these materials. For low Sn % GeSn the lattice mismatch may be reasonable and films can be grown pseudomorphic (strained) if thin enough, or partial relaxation may occur for thicker films (1000 Å or more). Thus for growth of GeSn QW on Ge or GaAs or GeSiSn, planar growth can be achieved.

Figure 39:
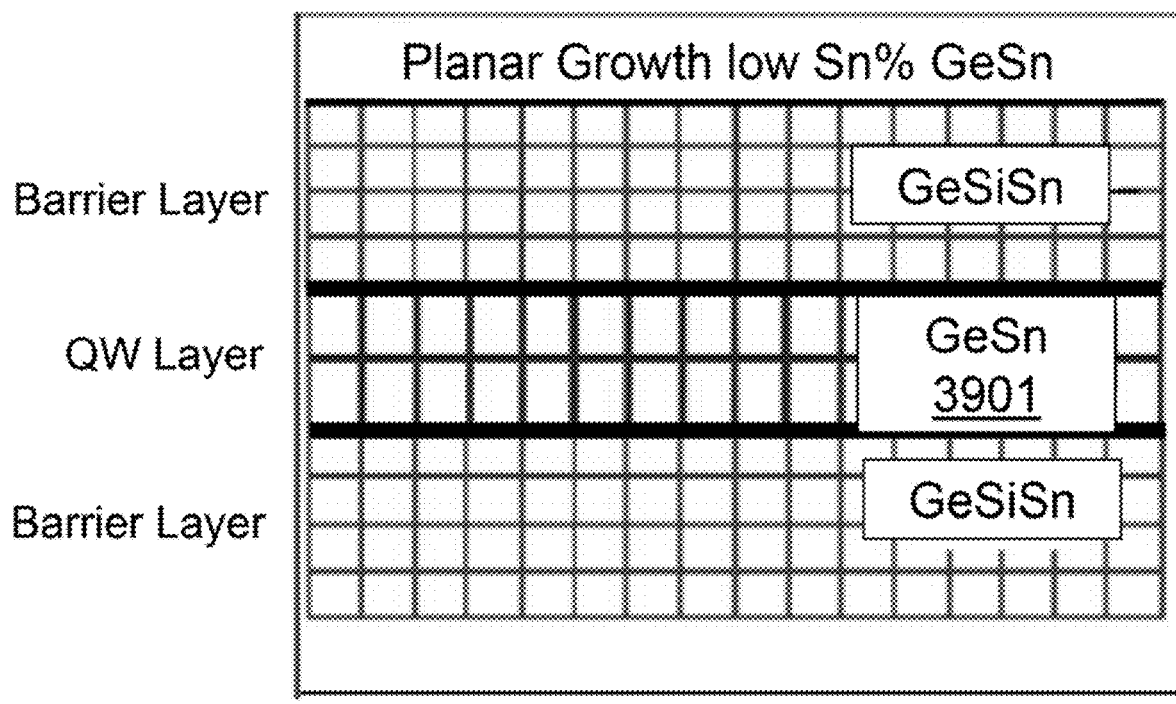
FIG. 39 shows a planar growth of strained GeSn (low Sn %) or GeSiSn (low Si % and low Sn %) on GeSiSn, with GeSiSn barriers above and below a QW GeSn film.

FIG. 39 shows the planar growth of strained GeSn 3901 (low Sn %) on GeSiSn, with GeSiSn barriers above and below the QW GeSn film. For low Sn % GeSn either Ge or GaAs barriers can be used for the formation of the strained GeSn QW.

The formation of quantum dot structures are a result of the ability of self-assembled GeSn quantum dots by the Stranski-Krastanov (SK) method that transitions from two dimensional to island growth.

Figure 40:
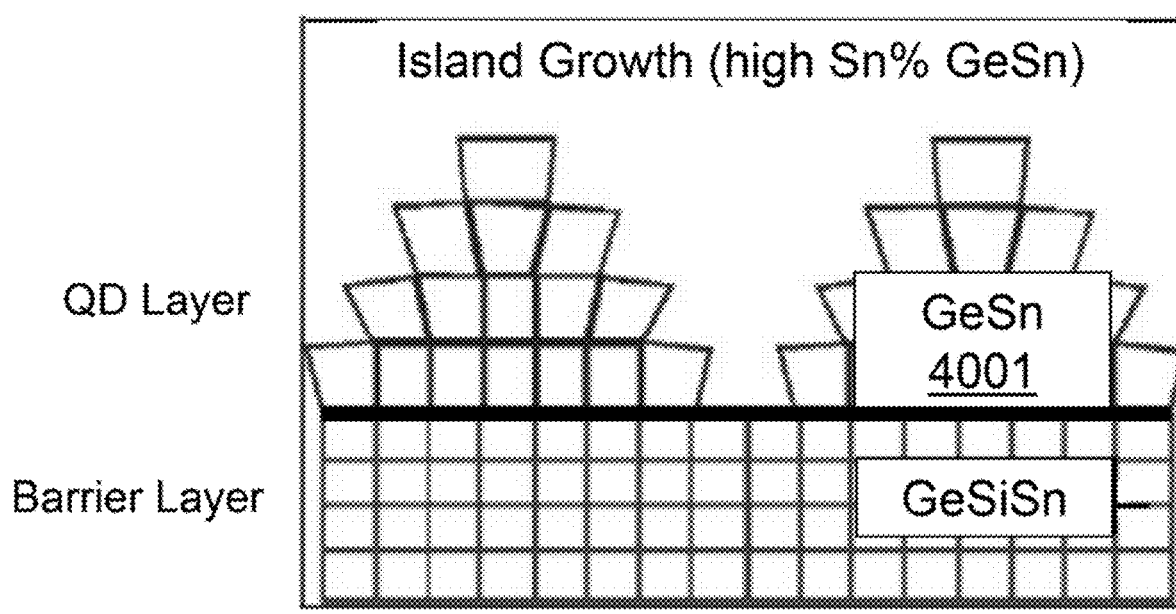
FIG. 40 shows an island growth of strained GeSn (high Sn %) on GeSiSn barrier layer with a subsequent formation of a QD layer.

FIG. 40 shows the methodology of formation. A larger lattice constant semiconductor is grown on a semiconductor with a smaller lattice constant. Under proper conditions, two dimensional planar growth starts but quickly transitions to island growth, thus forming the quantum dot structure. The lattice constant of GeSn may be typically greater than that of GeSiSn. Typically the formation of the quantum dots occurs when the critical thickness of the GeSn layer is exceeded. The lattice mismatch should be typically greater than 2% for dot formation. The range of lattice mismatch of GeSn to that of Ge (or GaAs or lattice matched $Ge_{1-z}(Si_{0.8}Sn_{0.2})_z$ approximately starts at 0% and may go up to 3% to 4% lattice mismatch at 20% Sn in GeSn. FIG. 40 shows the island growth of strained GeSn 4001 (high Sn %) on GeSiSn barrier layer with the subsequent formation of the QD layer.

GeSn quantum structure provide a unique methodology to form both QW and QD in the same structure because the Sn % for becoming a direct gap semiconductor can vary from 7%≤Sn %≤20%. GeSn may be indirect up to about 7% Sn then may become a direct gap semiconductor with an approximate energy bandgap of 0.585 eV and an approximate lattice constant of about 5.725 Å. The bandgap energy typically may be reduced to about 0.25 eV at 20% Sn with a lattice constant of about 5.835 Å. Utilizing Ge or GaAs or $Ge_{1-z}(Si_{0.8}Sn_{0.2})_z$ barriers which may have a lattice constant of about 5.65, one can calculate the lattice mismatch at various compositions. The lattice mismatch between GeSn to GaAs or Ge at 7% Sn content GeSn may be about 1%. The lattice mismatch between GeSn (20% Sn) to GaAs or Ge or $Ge_{1-x}(Si_{0.8}Sn_{0.2})_x$ may be about 3% to 4%. Typically the formation of the quantum dots generally occurs when the critical thickness of the GeSn layer is exceeded. The lattice mismatch should be typically greater than 2% for quantum dot formation. A 2% lattice mismatch of GaAs to the GeSn corresponds to a lattice constant of about 5.76 Å which is about 12% Sn in GeSn. Thus if one grows on Ge or GaAs or $Ge_{1-z}(Si_{0.8}Sn_{0.2})_z$ barriers, one can get GeSn planar direct gap Type I QW for 7% Sn % 12% and direct gap type I QD for 12% Sn % 20%. The GeSn direct gap energies may vary from 7% Sn with an approximate bandgap energy of 0.585 eV; to 12% Sn with an approximate bandgap energy of 0.48 eV; to 20% Sn with an approximate bandgap energy of about 0.25 eV. Thus GeSn QW energies could be in the near-IR and the GeSn QD energies could be in the mid-IR, utilizing the exact same laser or transistor laser or LET structure.

Exemplary Configuration 2A: Ordered InGaP Emitter-GeSiSn Base-GaAs Collector double heterojunction transistor. The device elucidated can include a double heterojunction InGaP—GeSiSn—GaAs HBT device. The $Ge_{1-z}(Si_{0.8}Sn_{0.2})_z$ for z≤0.5 can be lattice matched to GaAs and InGaP at the composition $In_{0.49}Ga_{0.51}P$. $In_{0.49}Ga_{0.51}P$ can be grown in two forms ordered and disordered. InGaP semiconductor grown by various epitaxial growth technologies can be latticed matched to GaAs. At high temperature growth the InGaP can grow in a crystalline structure such that the sheets of In—P and Ga—P atoms can alternate in the (001) planes of the face centered cubic (FCC) unit cell without the intermixing of the Ga and In atoms on the lattice planes. Such an arrangement may result in a small conduction band discontinuity between the InGaP and GaAs and is called the ordered phase (this can be of weakly type I or weakly type II because it is close to zero). The ordered phase has an approximate bandgap energy of 1.85 eV and the disordered phase has an approximate bandgap energy of 1.9 eV, thus the ordered phase has a bandgap energy of which may be 0.05 eV less than the disordered phase. With different growth conditions, the In and Ga atoms can intermix and the disordered InGaP phase can form, which may have a larger conduction band offset of 0.1 eV (type I) vs. 0.03 eV for the ordered phase. It is also possible to have a mixture of ordered and disordered InGaP materials. The lattice constant of GaAs and Ge may be about 5.65 Å, and this may be the lattice constant of InGaP at the composition $In_{0.49}Ga_{0.51}P$.

In some examples, the ordered phase may have an advantage to the disordered phase, because the ordered phase may have a near zero conduction band offset. In some examples, this device has desirable base characteristics with a low voltage base turn-on region and that the GeSiSn base region can be directly inserted into a standard InGaP—GaAs HBTs, which is typically used in RF power amplifiers in wireless devices and cellular handsets to send the voice and data to the cell tower. In an inverted HBT structure by using the ternary alloy InGaP as the emitter and varying the In composition away from the latticed matched condition, strain can be introduced into the GeSiSn base layer, thus the GeSiSn layer can be tensile or compressively strained, an may have a tunable bandgap energy from 0.66 eV to about 1 eV.

Figure 41:
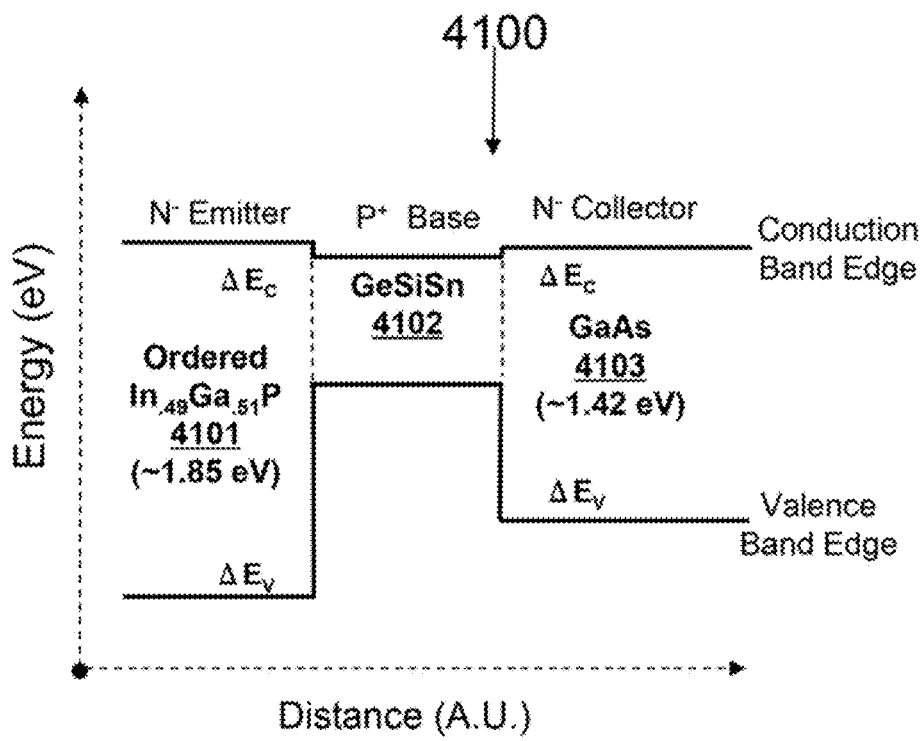
FIG. 41 shows an exemplary flat band energy diagram of an NPN HBT with an ordered InGaP emitter, GeSiSn base, GaAs collector.

FIG. 41 shows an exemplary flat band energy diagram of an NPN HBT with an ordered InGaP emitter, GeSiSn base, and a GaAs collector 4100. The lattice matched $Ge_{1-z}(Si_{0.8}Sn_{0.2})_z$ for z≤0.5 to GaAs may be used, with tunable band gaps based on the z from 0.66 eV to 1 eV. This type of HBT structure is called an asymmetric double heterojunction device. Note conduction band offsets may be less than 0.1 eV and may be desirable for NPN transistors. The ordered $In_{0.49}Ga_{0.51}P$ 4101 (disordered InGaP can also be used here) may be a good material for the emitter because it of the small conduction band offset and a large valence band offset with GeSn 4102 $P^+$ base region. The N-type GaAs 4103 is a proven collector material for HBTs.

The base can be graded from GeSiSn—GeSn to have electric field enhancement of the charge carriers (electrons). Such structure creates an electric field that accelerates the electrons across the base to the collector.

Figure 42:
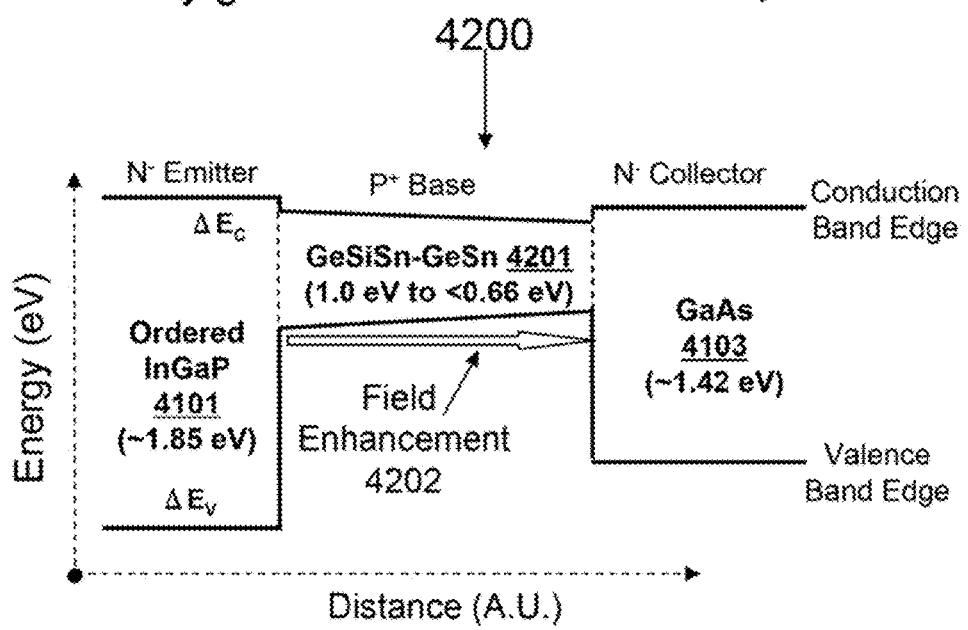
FIG. 42 shows an exemplary flat band energy diagram of an NPN HBT with an ordered InGaP N emitter, where the base is compositionally graded GeSiSn—GeSn. The compositionally graded GeSiSn—GeSn base layer can comprise at the emitter-base interface may be lattice matched or near latticed or strained $Ge_{1-z}(Si_{0.8}Sn_{0.2})_z$ to GaAs, where the GeSiSn may be compositionally graded by reducing the Si content and increasing Ge content to GeSn at the collector interface. The grading range can go from GeSiSn at the emitter-base junction to GeSn at the base-collector junction at various compositions.

FIG. 42 shows an exemplary flat band energy diagram of an NPN HBT with an ordered InGaP N emitter 4200, a graded GeSiSn—GeSn 4201 $P^+$ base, and a GaAs N– collector 4103, and an Ordered InGaP 4101. The compositionally graded GeSiSn—GeSn 4201 layer can comprise at the emitter-base interface a lattice matched or near latticed matched or strained $Ge_{1-z}(Si_{0.8}Sn_{0.2})_z$ to GaAs, where the GeSiSn may be compositionally graded by reducing the Si content and increasing Ge content to GeSn at the collector interface. The grading range can go from GeSiSn at the emitter-base junction to GeSn at the base-collector junction at various compositions, which provides for Field Enhancement 4202 of the carriers.

Table 6 shows an exemplary epitaxial structure of an NPN HBT with an ordered InGaP emitter, GeSiSn base region, and a GaAs collector.

TABLE 6

Epitaxial structure of NPN HBT with ordered InGaP emitter-GeSiSn base-GaAs collector.

| Layer | Layer Name | Description | Comment |
|---|---|---|---|
| 1 | $N^+$ Cap | ~1000 Å InGaAs (Te-doped >$10^{19}$ cm$^{-3}$) | |
| 2 | $N^-$ Emitter Cap | ~1500 Å GaAs (Si-doped ~5 × $10^{18}$ cm$^{-3}$) | |
| 3 | $N^-$ Emitter | ~500 Å $In_{0.49}Ga_{0.51}P$ (Si-doped ~3 × $10^{17}$ cm$^{-3}$) | Ordered |

TABLE 6-continued

Epitaxial structure of NPN HBT with ordered InGaP emitter-GeSiSn base-GaAs collector.

| Layer | Layer Name | Description | Comment |
|---|---|---|---|
| 4 | P+ Base | ~500 Å $Ge_{1-z}(Si_{0.8}Sn_{0.2})_z$ (for z ≤ 0.5)<br>0 < Si % ≤ 40%<br>0 ≤ Sn % ≤ 10%<br>Thickness range 100 Å-5000 Å | Latticed matched<br>or<br>Compositionally<br>GeSiSn GeSiSn—GeSn |
| 5 | N− Collector | ~10000 Å GaAs (Si-doped ~1 × $10^{16}$ cm$^{-3}$) | |
| 6 | N+ Sub-Collector | ~5000 Å GaAs (Si-doped ~5 × $10^{18}$ cm$^3$) | |
| 7 | High Purity Buffer | ~500 Å GaAs (un-doped) | UID |
| 8 | | GaAs semi-insulating or conducting | Substrate |

Note
the compositionally graded GeSiSn—GeSn layer can comprise at the emitter-base interface a lattice matched or near latticed matched or strained $Ge_{1-z}(Si_{0.8}Sn_{0.2})_z$ to GaAs can be compositionally graded for the GeSiSn by reducing the Si % and increasing Ge % to GeSn at the collector interface. The grading range can go from GeSiSn at the emitter-base junction to GeSn at the base-collector junction at various compositions.
Note
the dopants listed are only one of many possible dopants, and does preclude the use of other dopants and doping values are only nominal values but can take on many variations. The thicknesses are all exemplary and can take on many different values.

It should be noted that there are many types of N-type and P-type dopants. For standard III-V semiconductors like GaAs, InP, InGaAs, InGaP, the N-type dopants may be Si, Ge, Sn, Pb, S, Se, Te. The P-type dopants for standard III-V semiconductors may be C, Zn, Be, Mg. Common dopants for group IV semiconductors like GeSn, Ge, Si, SiGe, GeSiSn for N-type dopants may be P, As, Sb. The P-type dopants may be B, Al, Ga.

GeSiSn used as a base material in HBTs has many advantages. At low Sn % GeSiSn latticed matched to GaAs has the following properties that make it an excellent P-type base. GeSiSn has a low bandgap (the term low energy bandgap base typically refers to the relevant semiconductors with bandgaps less than 1.0 eV, like GeSn or Ge or GeSi, or GeSiSn or InGaAs or GaAsSb) which results in a low turn-on voltage. The GeSiSn hole mobility is high and acceptors can be incorporated to high density (>1×$10^{19}$ cm$^{-3}$), thus the base can be made ultra-thin (less than 5000 Å) while maintaining a low base sheet resistance which increases current gain and decreases electron transit time. GeSiSn may have shallow acceptors, so that the hole concentration is generally equal to the acceptor doping level and independent of temperature. The surface recombination velocity is low for P-type Ge. Low resistance ohmic contacts can be formed on P-type GeSiSn. GeSiSn mobility (electron and hole) can be significantly improved by being biaxially tensile strain, thus for both NPN and PNP structures the base sheet resistance can be improved significantly.

Typically for HBTs the collector is grown first followed by growing the base and then growing the emitter. However, for this structure, it can be advantageous to grow an inverted HBT. By growing the $In_{0.49}Ga_{0.51}P$ emitter first, one could increase the indium content to greater than 49% In, thus, the bandgap energy would be reduced, but the lattice constant would be increased. The conduction band offset between the InGaP (In %>49) would cause the bands to be closer to zero offset between the InGaP and Ge. This methodology could be applied to a GeSiSn base.

Figure 43:
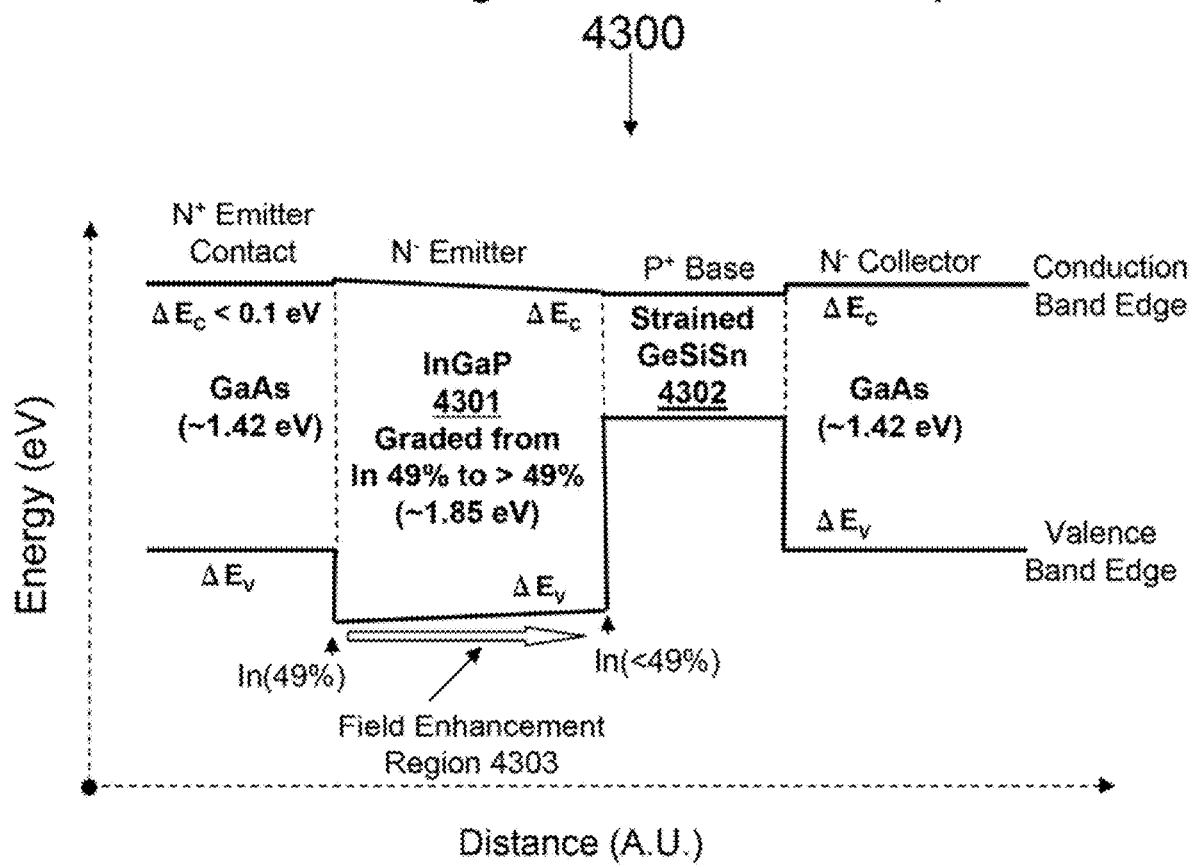
FIG. 43 shows an exemplary flat band energy diagram of an inverted NPN HBT structure where an emitter is grown first, a base material is coherently strained GeSiSn, a collector up structure.

FIG. 43 shows an exemplary flat band energy diagram of an inverted NPN HBT structure where the emitter is grown first, and the base material is strained GeSiSn. This Inverted HBT structure emitter grown first collector up 4300 has a field enhancement region 4303 in the compositionally graded InGaP 4301 N− emitter. This structure allows for the P+ base to be strained GeSiSn 4302, thus possibly enhancing the hole mobility. One could decrease the In % in the InGaP and then the GeSiSn would be biaxially compressively strained.

The device structure advantages: By growing the emitter InGaP on GaAs, one can initially lattice match the InGaP to the GaAs. When the In composition can be increased to the point where GeSiSn is biaxially tensile strained to may be about 2% it then may become a direct gap semiconductor.

Tensile Strain effects on GeSiSn: It has shown that biaxial tensile compression may cause enhancements in the hole and electron mobility. Biaxial tension on the band structure of GeSiSn breaks the heavy hole and light hole band degeneracy and raises the light hole above the heavy hole band. This effectively increases may increase the hole mobility. Typically the for low Sn % GeSiSn which may be latticed matched to GaAs the band structure shows that it is an indirect semiconductor because the "L" point <111> is the conduction band minimum and the gamma "Γ" point is the valence band maximum. However GeSiSn may become a direct gap semiconductor with 1.4% biaxial tensile strain or greater, because the gamma "Γ" point in GeSiSn band structure gets closer to the valence band maximum faster than the "L" point <111>, thus making it a direct bandgap semiconductor.

With biaxial tensile strain there may be a dramatic increase in the GeSiSn hole mobility "$\mu_h$". Thus, by growing an inverted emitter structure one can effectively tensile or compressive strain the GeSiSn layer. For example it has been shown experimentally that biaxial tensile can increase the in-plane hole mobility at 3% biaxial strain of a Ge hole mobility >40,000 cm$^2$/Vs. If the InGaP is graded to higher In % then an electric field can be built-in that can promote free charge carriers from the emitter into the base region.

Compressive strain effects on GeSiSn: GeSiSn under biaxial compression may show enhancements in the in-plane hole mobility. It has been shown experimentally that biaxial compressive strain of 1.7% in the Ge layer increases the low field hole mobility by a factor of 3.38 to 6350 cm$^2$/V-s.

The elucidated tensile and compressive strain effects should also work for GeSiSn for low compositions of Sn %.

Figure 44:
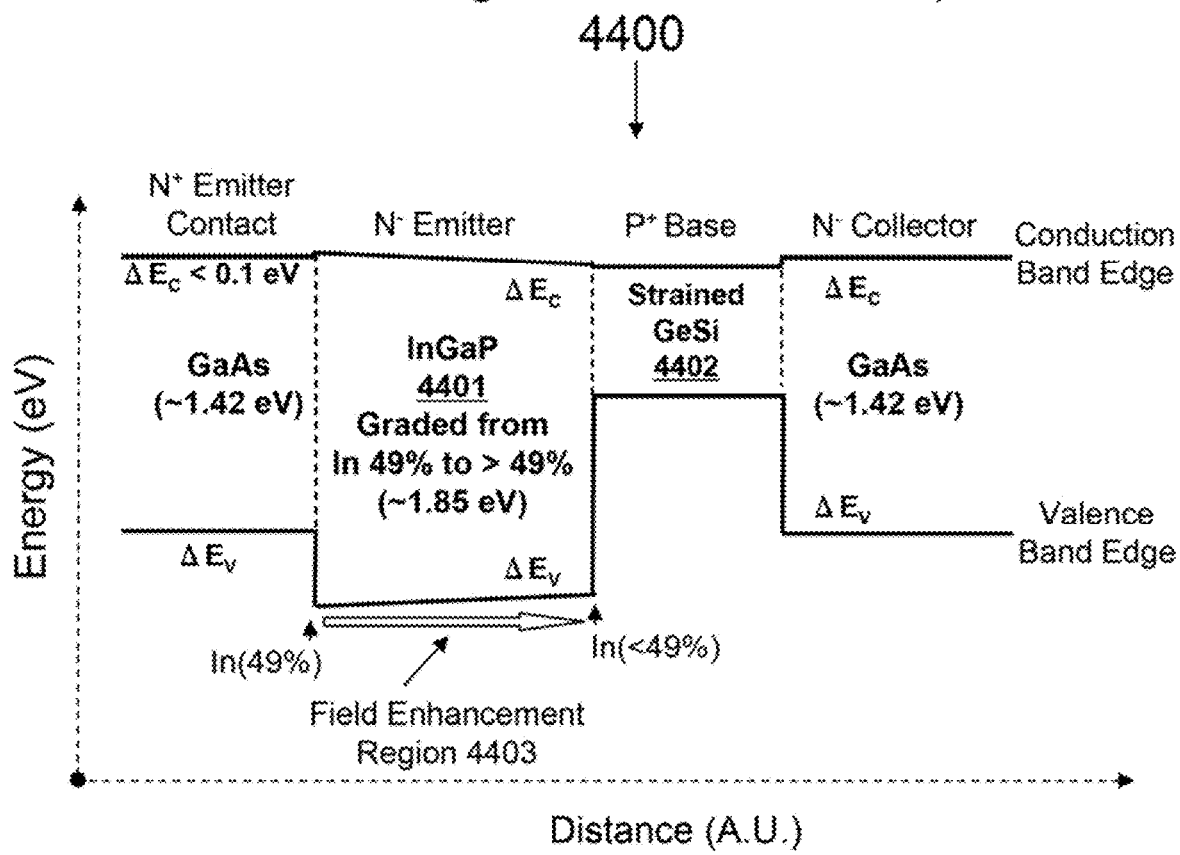
FIG. 44 shows an exemplary flat band energy diagram of an inverted NPN HBT structure where an emitter is grown first, a base material is coherently strained GeSi, a collector up structure.

FIG. 44 shows an exemplary flat band energy diagram showing an inverted tensile strained GeSi HBT structure emitter grown first collector up 4400. This NPN HBT structure where the emitter is grown first, and the base material may be tensile strained GeSi 4402 may have some advantages. This inverted HBT structure has a field enhancement region 4303 in the graded InGaP 4301 N− emitter. This structure allows for the P+ base to be tensile strained GeSi 4402, thus possibly enhancing the hole mobility. By utilizing InGaP in this configuration one can strain the GeSi in tension or compression.

If an inverted structure is not desirable, the collector grown first structure (emitter up) can be grown and the InGaP collector can be graded as follows: from the GaAs sub-collector the InGaP starts at 49% In, then is slowly graded up to an In % greater than 49% at the start of the GeSiSn base region. This results in field enhancement region in the collector to accelerate the electrons to the sub-collector.

Figure 45:
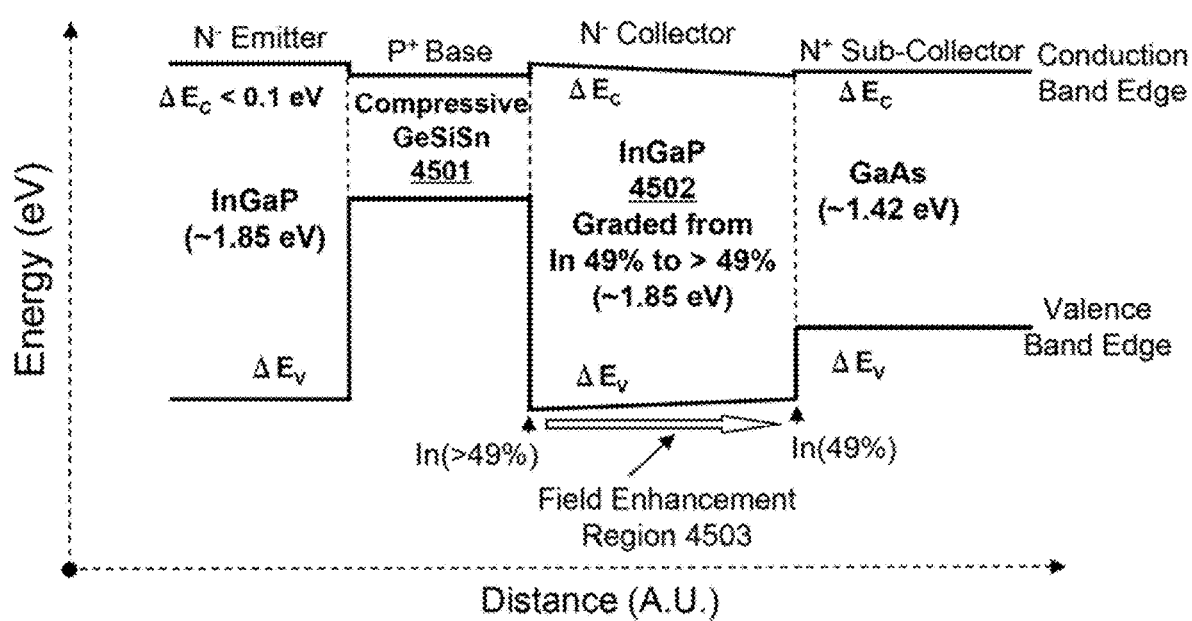
FIG. 45 shows an exemplary flat band energy diagram of an NPN configuration where a compressively strained GeSiSn HBT collector grown first, emitter up.

FIG. 45 shows an exemplary flat band energy diagram of an NPN configuration, compressively strained GeSiSn HBT collector grown first emitter up 4500 structure, where the compressive strained GeSiSn 4501 is grown on the N⁻ collector InGaP 4502 compositionally graded from In 49% to >49% collector which now has a field enhancement region 4503. This device has the advantage that it is a true double heterojunction almost symmetric device. This may minimize the offset voltage found in standard InGaP—GaAs HBTs that causes a reduction in power added efficiency.

A variation of this device results in GeSiSn that may or may not be biaxially strained, by having both the emitter and collector InGaP layers compositionally graded. Basically this is a combination of the previously described embodiments for the strained GeSiSn HBTs. Here the emitter and collector both have field enhancement regions because the InGaP is graded in both layers. The standard configuration where the collector is grown first (emitter up) and the InGaP collector can be graded as follows: from the GaAs sub-collector the InGaP starts at 49% In, then is slowly graded up to an In % greater than 49% at the start of the GeSiSn base. This process is repeated for the emitter where InGaP starts at 49% In, then is slowly graded up to an In % greater than 49% at the start of N emitter contact region.

Figure 46:
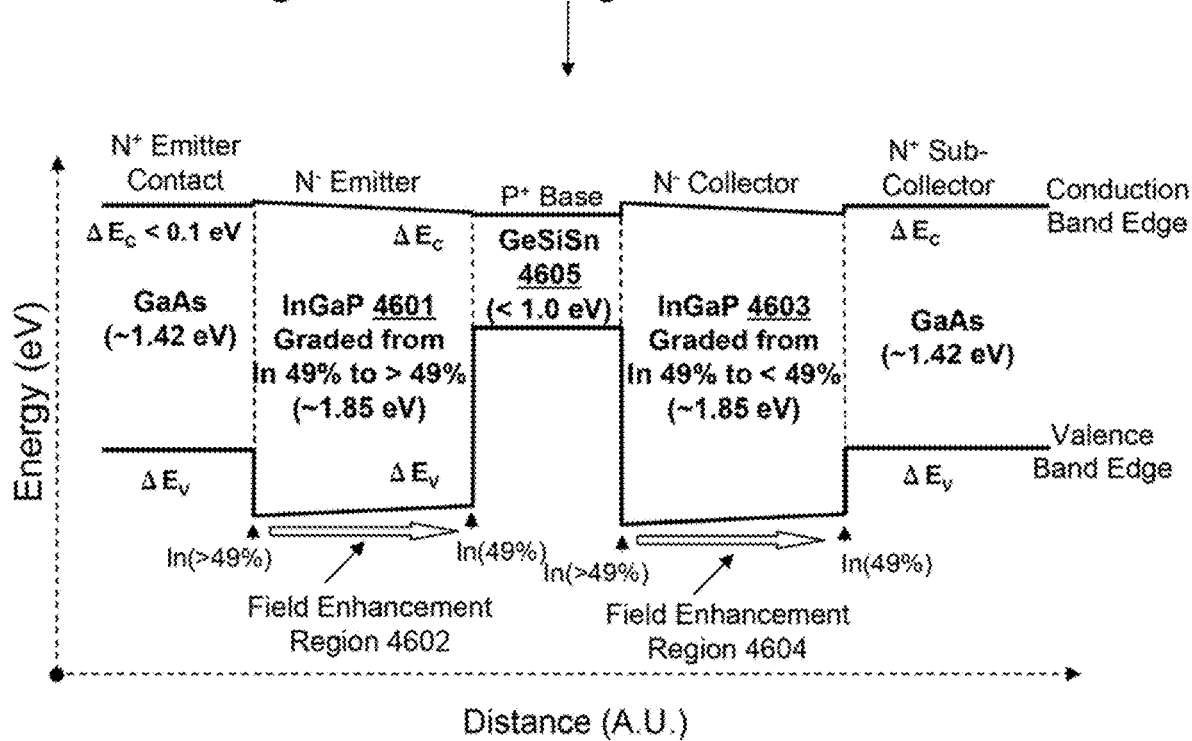
FIG. 46 shows an exemplary flat band energy diagram of a GeSiSn Double HBT Structure graded Emitter and graded Collector grown first, where a GeSiSn base can be compressively strained.

FIG. 46 shows an exemplary flat band energy diagram of a GeSiSn Double HBT Structure graded Emitter and graded Collector grown first 4600, where the GeSiSn 4605 base may or may not be compressively strained. The N⁻ emitter InGaP 4601 is graded from In % 49% to >49% has a field enhancement region 4602. The N⁻ collector InGaP 4603 is graded from In % 49% to <49% has a field enhancement region 4604. The field enhancement regions cause an acceleration of the electrons to the NPN device, thus reducing the transit time of the device.

Note through this patent InGaP is used throughout the text. Where ordered InGaP is referred to an equivalent device using disordered InGaP can be used. Likewise where disordered InGaP is used ordered InGaP can also be used. Though at some instance the lattice matched composition to GaAs is used $In_{0.49}Ga_{0.51}P$. Though this is a useful "In" composition for starting the InGaP layer, it can be graded or have a different composition.

Exemplary Configuration 2B: NPN Disordered InGaP Emitter-GeSiSn Base-GaAs Collector double heterojunction transistor: The device elucidated can include a double heterojunction disordered $In_{0.49}Ga_{0.51}P$—GeSiSn—GaAs HBT device. In some examples, this device has desirable base characteristics with a low voltage base turn-on region. This device structure can be directly inserted into standard manufacturing InGaP—GaAs HBT. This is a slight variation on Configuration 2A. The difference is the conduction band offset of disordered InGaP to GeSiSn may be <0.2 eV and the valence band offset of the disordered InGaP to GeSn (low Sn %) may be >0.8 eV. In some instances it can be easier to grow the disordered InGaP.

Exemplary Configuration 2C: NPN AlGaAs Emitter-GeSiSn Base-GaAs Collector double heterojunction transistor: The device elucidated can include a double heterojunction AlGaAs—GeSiSn—GaAs HBT device. The lattice matched $Ge_{1-z}(Si_{0.8}Sn_{0.2})_z$ for z≤0.5 to GaAs can easily be tensile strained by changing the ratio of Si/Sn to less than 4. Likewise the lattice matched $Ge_{1-z}(Si_{0.8}Sn_{0.2})_z$ to GaAs can be compressively strained by changing the ratio of Si/Sn to greater than 4. The previous embodiments have elucidated the advantages of tensile strained GeSiSn or compressively strained GeSiSn. In some examples, this device has desirable base characteristics with a low voltage base turn-on region. This is a second variation on Configuration 2A. For AlGaAs for Al % less than 0.4 the material is direct gap semiconductor. For example the energy bandgap of $Al_{0.3}Ga_{0.7}As$ may be 1.8 eV as opposed $In_{0.49}Ga_{0.51}P$, which has an energy bandgap of 1.85 eV.

Figure 47:
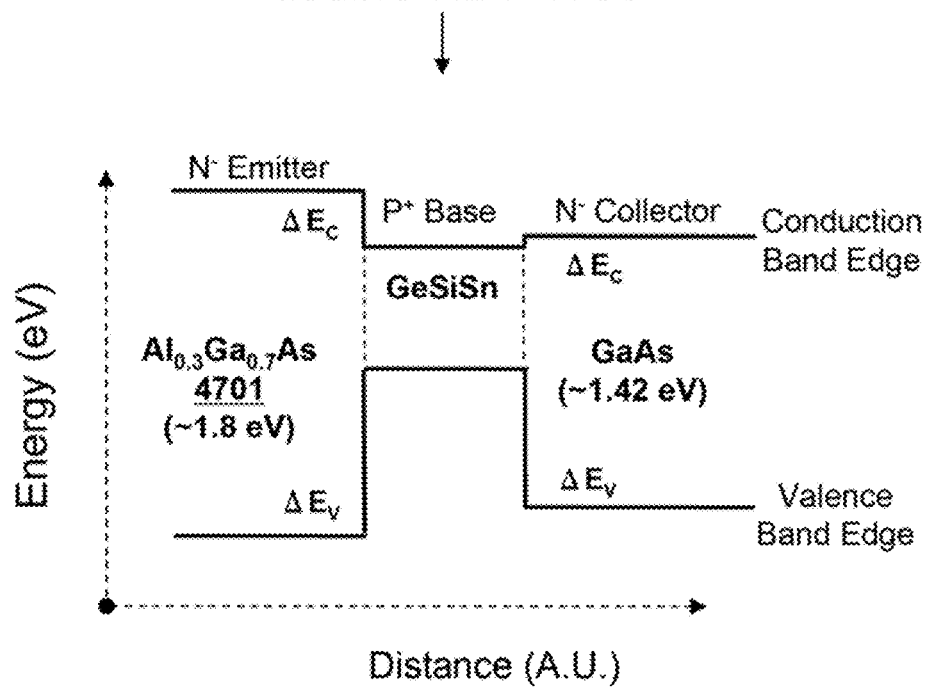
FIG. 47 shows an exemplary flat band energy diagram of an NPN AlGaAs emitter-GeSiSn base-GaAs collector double HBT.

FIG. 47 shows an exemplary flat band energy diagram of the NPN AlGaAs Emitter-GeSiSn Base-GaAs Collector double HBT 4700. In this HBT the N emitter is $Al_{0.3}Ga_{0.7}As$ 4701 but the Al % could be varied to different levels for possibly enhanced carrier transport.

To fabricate a light emitting NPN heterojunction bipolar transistor in this $Al_{0.3}Ga_{0.7}As$ (InGaP could also be used as the emitter and collector) emitter HBT, a GeSn QW or QD region can be inserted into the GeSiSn base (GaAs could also be used as the base).

Figure 48:
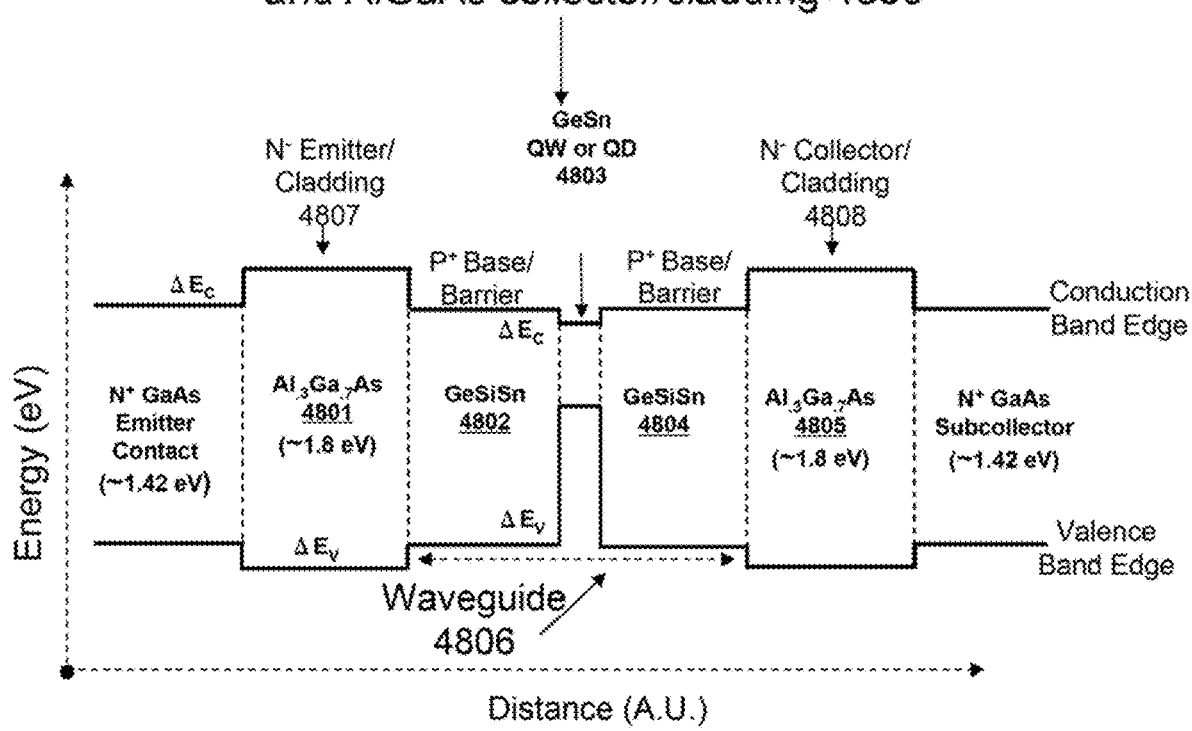
FIG. 48 shows an exemplary flat band energy diagram of an NPN HBT laser with AlGaAs emitter/cladding and AlGaAs collector/cladding utilizing a GeSn QW or QD, or GeSiSn QW or QD region with GaAs barrier/OCL region for use as a transistor laser or light emitting transistor (LET)

FIG. 48 shows an exemplary flat band energy diagram of the NPN HBT laser with AlGaAs emitter/cladding and AlGaAs collector/cladding 4800. This is an exceptional device because the type I alignment allows for excellent carrier and optical confinement. The device structure is symmetric. The N⁻ $Al_{0.3}Ga_{0.7}As$ 4801 & 4805 is an excellent cladding layer and has small mismatch with GaAs. The P⁺ GeSiSn base 4802 & 4804 acts as the barrier layer for the GeSn QW or QD 4803 active region. The large energy bandgap difference between the N⁻ $Al_{0.3}Ga_{0.7}As$ 4801 & 4805 and the P⁺ GeSiSn base 4802 & 4804 ensures a large index of refraction difference at the N⁻ emitter/cladding 4807 and P⁺ GeSiSn 4802 base interface; and a large index refraction difference at the P⁺ GeSiSn base 4804 and N⁻ collector/cladding 4808, thus making an excellent waveguide 4806 to optically confine the light produced by the active region. The laser can require a resonant cavity to get optical gain, and typically this can formed from the front and back cleaved facets of the semiconductor crystal wafer.

Table 7 shows an exemplary table of the epitaxial structure of an NPN light emitting AlGaAs—GeSiSn—GeSn—GeSiSn—AlGaAs HBT.

TABLE 7

An exemplary epitaxial structure of an NPN edge emitting transistor laser structure with a GeSn QW or QD active region in a GaAs P-type base/barrier material and AlGaAs Cladding.

| Layer | Layer Name | Description | Comment |
|---|---|---|---|
| 1 | N⁺ Cap | ~1000 Å InGaAs (Te-doped >$10^{19}$ cm⁻³) | |
| 2 | N⁻ Emitter/Cladding | ~5000 Å $Al_{0.3}Ga_{0.7}As$ (Si-doped ~3 × $10^{17}$ cm⁻³) | Different A % AlGaAs can be used |

TABLE 7-continued

An exemplary epitaxial structure of an NPN edge emitting transistor laser structure with a GeSn QW or QD active region in a GaAs P-type base/barrier material and AlGaAs Cladding.

| Layer | Layer Name | Description | Comment |
|---|---|---|---|
| 3 | P$^+$ Base/Barrier | ~500 Å GeSiSn (B-doped >10$^{19}$ cm$^{-3}$) | |
| 4 | QW or QD | ~55 Å GeSn<br>QW (Sn % ~0% to 10% GeSn)<br>QW thickness range 10 Å-1000 Å<br>QD (Sn % ~10% to 20% GeSn)<br>QD size range 10 Å-200 Å | For light emission<br>1000 nm-5000 nm |
| 5 | P$^+$ Base/Barrier | ~500 Å GeSiSn (B-doped >10$^{19}$ cm$^{-3}$) | |
| 6 | N$^-$ Collector/Cladding | ~5000 Å Al$_{0.3}$Ga$_{0.7}$As (Si-doped ~3 × 10$^{17}$ cm$^{-3}$)<br>Different A % AlGaAs can be used | |
| 7 | N$^+$ Sub-Collector | ~500 Å GaAs (Si-doped ~5 × 10$^{18}$ cm$^{-3}$) | |
| 8 | N$^+$ Buffer | ~500 Å GaAs (Si-doped ~5 × 10$^{18}$ cm$^{-3}$) | |
| 9 | | N$^+$ GaAs conducting substrate | Crystalline |

Note
the barriers are lattice matched or coherently strained Ge$_{1-z}$(Si$_{0.8}$Sn$_{0.2}$)$_z$ to GaAs for $z \leq 0.5$.

Note
the dopants listed are only one of many possible dopants, and does preclude the use of other dopants and doping values are only nominal values but can take on many variations. The thicknesses are all exemplary and can take on many different values.

Exemplary Configuration 3: An NPN and PNP GeSiSn Emitter-GeSn Base-GeSiSn Collector symmetric double heterojunction transistor. This device configuration is different because GeSiSn can be latticed match to GeSn, even though the GeSiSn may have a larger bandgap energy than GeSn. Because the ternary alloy GeSiSn can be grown at various compositions, it is possible to also biaxial tensile strain or compressive strain the GeSn base region. For GeSiSn the Sn % and Si % can be adjusted so that the lattice parameter remains constant. Also P-type and N-type doping have been achieved in GeSiSn. GeSiSn can be grown on Si, GaAs, Ge substrates. For exemplary Configuration 3, Si substrates is a possible choice.

For Si based HBTs, GeSiSn is a unique semiconductor alloy because it can be latticed matched to Ge or GaAs at the composition Ge$_{1-z}$(Si$_{0.8}$Sn$_{0.2}$)$_z$, where z can vary from 0 to 0.5 and the direct gap energy of this material can vary from 0.66 eV to 1.1 eV. Thus GeSiSn is an excellent emitter for a Si HBT or a barrier layer for a Ge quantum well or quantum dot (for GeSn quantum well or quantum dot), because it can be latticed matched to Ge or can compressively strain the Ge thus promoting island growth necessary for quantum dot formation. By lowering the Si to Sn ratio in GeSiSn the lattice constant can be decreased. The GeSiSn can also be latticed matched to GeSn or can tensile strain or compressively strain the GeSn layer.

Figure 49:
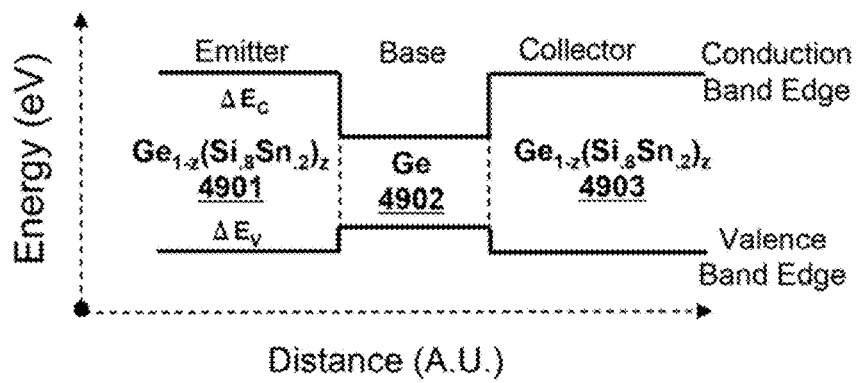
FIG. 49 shows a possible exemplary flat band energy band diagram for a symmetric double heterojunction GeSiSn emitter-Ge base-GeSiSn collector structure which can work as an NPN or PNP transistor device. The base could be also GeSi or GeSn or GeSiSn at low Sn %.

FIG. 49 shows a possible exemplary flat band energy band diagram for a symmetric double HBT GeSiSn emitter-Ge base-GeSiSn collector structure 4900 which can work as an NPN or PNP transistor device. Note that a GeSn layer can be used as the base with similar results. However, because Ge$_{1-z}$(Si$_{0.8}$Sn$_{0.2}$)$_z$ 4901 & 4903 can be grown at different alloy (z) compositions, both compressive and tensile strain can be applied to the Ge 4902 base, both configurations PNP and NPN are useful. This figure shows the flat "Γ" band edge energy diagram of the material structure.

Figure 50:
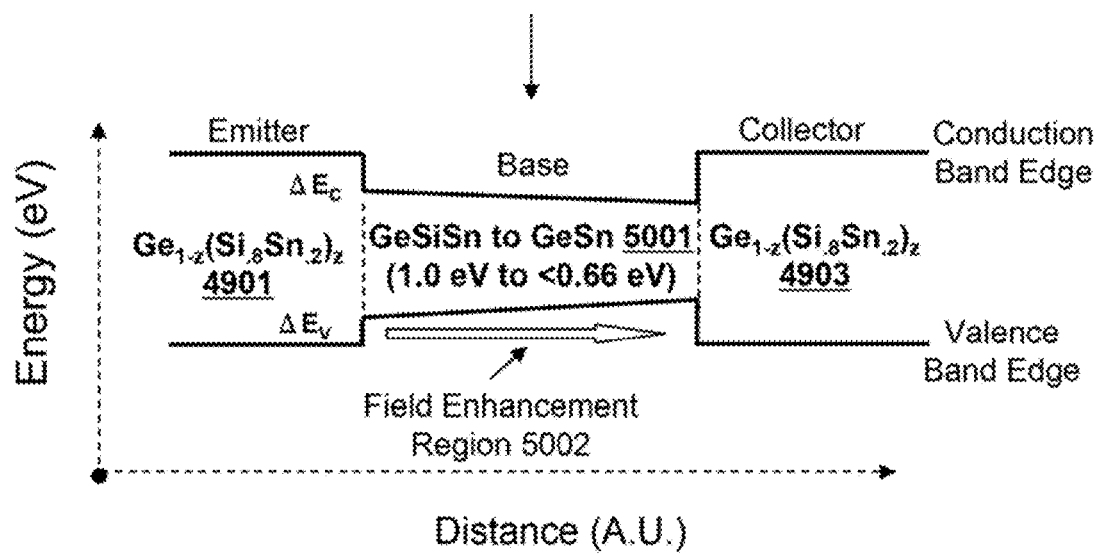
FIG. 50 shows a possible exemplary flat band energy band diagram for GeSiSn emitter-graded GeSiSn—GeSn base-GeSiSn collector structure double HBT 5000 which can work as an NPN or PNP transistor device. The compositionally graded GeSiSn—GeSn base layer can comprise at the emitter-base interface a lattice matched or near latticed matched or coherently strained $Ge_{1-z}(Si_{0.8}Sn_{0.2})_z$ to GaAs, where the GeSiSn may be compositionally graded by reducing the Si content and increasing Ge content to GeSn at the collector interface. The grading range can go from GeSiSn at the emitter-base junction to GeSn at the base-collector junction at various compositions.

The base can be graded from GeSiSn to GeSn to have electric field enhancement of the charge carriers (electrons and holes) as shown in the "r" band edge diagram of FIG. 50.

FIG. 50 shows a possible exemplary flat band energy band diagram for GeSiSn emitter-graded Ge—GeSn base-GeSiSn collector structure double HBT 5000 which can work as an NPN or PNP transistor device. With the graded GeSiSn—GeSn 5001 base region a field enhancement region 5002 is created in the base. Starting with an emitter Ge$_{1-z}$(Si$_{0.8}$Sn$_{0.2}$)$_z$ 4901 (near latticed matched to Ge) at the emitter-base interface and then a compositionally graded GeSiSn—GeSn 5001 layer which can be comprised of GeSiSn compositionally graded by reducing the Si content and increasing Ge content to GeSn at the collector interface 4903. The grading range can go from GeSiSn at the emitter-base junction to GeSn at the base-collector junction at various compositions.

Table 8 shows a possible exemplary structure for a symmetric double heterojunction GeSiSn emitter-Ge base-GeSiSn collector structure which can work as an NPN device grown on a Si substrate. If the GeSiSn lattice constant is made larger than the Ge lattice constant, the Ge can be tensile strained. This may cause the light hole band to rise above the heavy hold band in the valence band and may result in a significant enhancement in the P-type Ge base mobility and, thus, the same base thickness the base sheet resistance can be reduced and the high frequency performance of the transistor is (F$_{max}$) increased. Because the hole mobility may be enhanced, the base resistivity may be reduced. A thinner base may promote an F$_T$ to increase. In this exemplary structure the base could be a P$^+$ GeSn layer.

TABLE 8

Epitaxial structure of an NPN heterojunction GeSiSn emitter-Ge base-GeSiSn collector.

| Layer | Layer Name | Description | Comment |
|---|---|---|---|
| 1 | N$^+$ Emitter Cap | ~1500 Å SiGe (As-doped ~5 × 10$^{18}$ cm$^{-3}$) | |
| 2 | N$^-$ Emitter | ~500 Å Ge$_{1-z}$(Si$_{0.8}$Sn$_{0.2}$)$_z$ (As-doped ~3 × 10$^{17}$ cm$^{-3}$) | |
| 3 | P$^+$ Base | ~500 Å Ge (B-doped >10$^{19}$ cm$^{-3}$)<br>Or GeSn, Sn content 0 ≤ Sn % ≤ 20%<br>Thickness range 100 Å-5000 Å | Or can be graded<br>Ge—GeSn for field<br>enhancement |

TABLE 8-continued

Epitaxial structure of an NPN heterojunction GeSiSn emitter-Ge base-GeSiSn collector.

| Layer | Layer Name | Description | Comment |
|---|---|---|---|
| 4 | N⁻ Collector | ~10000 Å $Ge_{1-z}(Si_{0.8}Sn_{0.2})_z$ (As-doped ~1 × $10^{16}$ cm⁻³) | |
| 5 | N⁺ Sub-Collector | ~5000 Å SiGe (As-doped 5 × $10^{18}$ cm⁻³) SiGe Ge content can be varied to accomodate the $Ge_{1-z}(Si_{0.8}Sn_{0.2})_z$ layer | |
| 6 | N⁺ Buffer | ~500 Å Si (As-doped 2 × $10^{18}$ cm⁻³) | |
| 7 | | N⁺ Si substrate | Crystalline |

$Ge_{1-z}(Si_{0.8}Sn_{0.2})_z$ for z ≤ 0.5 can be latticed matched to Ge.
Note
the dopants listed are only one of many possible dopants, and does preclude the use of other dopants and doping values are only nominal values but can take on many variations. The thicknesses are all exemplary and can take on many different values.

Table 9 shows a possible exemplary structure for a symmetric double heterojunction GeSiSn emitter-Ge base-GeSiSn collector structure which can work as a PNP device. If the GeSiSn lattice constant is made larger than the Ge lattice constant then the Ge can be tensile strained. This causes the light hole band in the valence to split from the heavy hole band and results in an enhancement in the P-type Ge base mobility, thus reducing the base sheet resistance and increasing the high frequency performance of the transistor. In this exemplary structure the base could be a heavily N⁺ GeSn layer.

TABLE 9

Epitaxial structure of a PNP heterojunction GeSiSn emitter-Ge base-GeSiSn collector.

| Layer | Layer Name | Description | Comment |
|---|---|---|---|
| 1 | P⁺ Emitter Cap | ~1500 Å SiGe (B-doped ~5 × $10^{18}$ cm⁻³) | |
| 2 | P⁻ Emitter | ~500 Å $Ge_{1-z}(Si_{0.8}Sn_{0.2})_z$ (B-doped ~3 × $10^{17}$ cm⁻³) | |
| 3 | N⁺ Base | ~500 Å Ge (As-doped >$10^{19}$ cm⁻³) Or GeSn, Sn content 0 ≤ Sn % ≤ 20% Thickness range 100 Å-5000 Å | Or can be graded Ge—GeSn for field enhancement |
| 4 | P⁻ Collector | ~10000 Å $Ge_{1-z}(Si_{0.8}Sn_{0.2})_z$ (B-doped ~1 × $10^{16}$ cm⁻³) | |
| 5 | P⁺ Sub-Collector | ~5000 Å SiGe (B-doped ~5 × $10^{18}$ cm⁻³) SiGe Ge content can be varied to accomodate the $Ge_{1-z}(Si_{0.8}Sn_{0.2})_z$ layer | |
| 6 | P⁺ Buffer | ~500 Å Si (B-doped ~2 × $10^{18}$ cm⁻³) | |
| 7 | | P⁺ Si substrate | Crystalline |

$Ge_{1-z}(Si_{0.8}Sn_{0.2})_z$ for z ≤ 0.5 can be latticed matched or near latticed matched to Ge. GeSiSn can also be near latticed matched to GeSn.
Note
the dopants listed are only one of many possible dopants, and does preclude the use of other dopants and doping values are only nominal values but can take on many variations. The thicknesses are all exemplary and can take on many different values.

Figure 51:
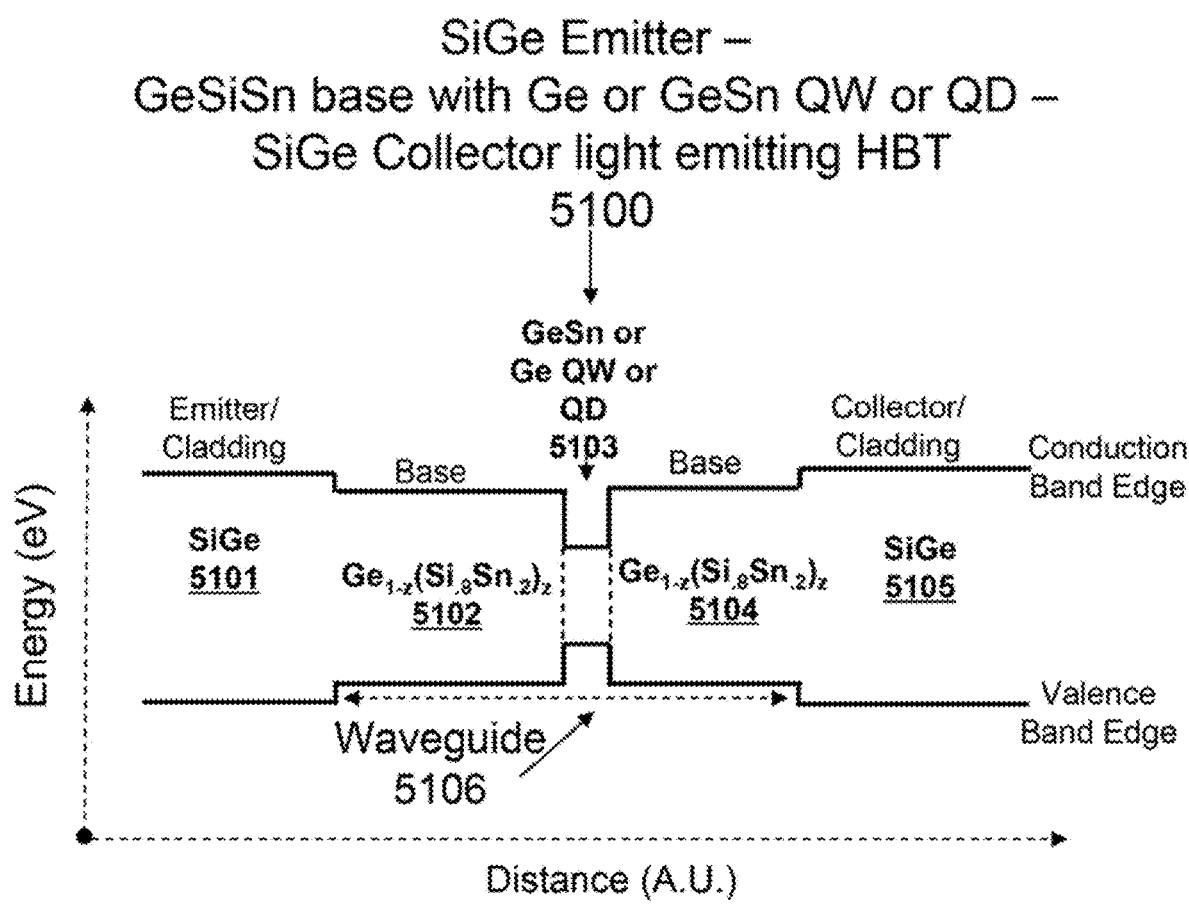
FIG. 51 shows a possible exemplary flat band energy band diagram for a symmetric double HBT where a Ge QW or QD, or GeSn QW or QD is embedded in a GeSiSn base region with SiGe emitter/cladding and SiGe collector/cladding.

FIG. 51 shows a possible exemplary flat band energy band diagram for a symmetric double heterojunction light emitting transistor or transistor laser where a Ge QW or QD is embedded in the GeSiSn base region with SiGe emitter/cladding and SiGe collector/cladding forming the light emitting HBT 5100. Note a GeSn QW or QD can also be used here. This structure can work as an NPN or PNP transistor light emitter device. Here a Ge QW or QD 5103 is inserted into a $Ge_{1-z}(Si_{0.8}Sn_{0.2})_z$ 5102 & 5104 base region. Note a GeSn QW or QD can replace the Ge QW or QD. The SiGe 5101 emitter/cladding and the SiGe 5105 collector/cladding, form the major index difference for light confinement in the waveguide 5106 region, and also have a large bandgap energy to funnel carriers into the active region.

Table 10 shows a possible exemplary structure for a symmetric NPN double heterojunction transistor laser or light emitting transistor structure with an N⁻ SiGe emitter/cladding, a Ge QW or QD embedded in P⁺ GeSiSn base with an N⁻ SiGe collector/cladding. Note a GeSn QW or QD can replace the Ge QW or QD.

TABLE 10

A symmetric NPN double heterojunction transistor laser or light emitting transistor structure with a SiGe emitter/cladding, a Ge QW or QD embedded in GeSiSn base with a SiGe collector/cladding.

| Layer | Layer Name | Description | Comment |
|---|---|---|---|
| 1 | N$^+$ Cap | ~1000 Å SiGe (As-doped >$10^{19}$ cm$^{-3}$) | |
| 2 | N$^-$ Emitter Cladding | ~4000 Å SiGe (As-doped ~5 × $10^{17}$) | |
| 3 | P$^+$ Base | ~500 Å Ge$_{1-z}$(Si$_{0.8}$Sn$_{0.2}$)$_z$ (B-doped >$10^{19}$ cm$^{-3}$) | |
| 4 | QW or QD | ~55 Å Ge or GeSn QW (Sn % ~0% to 10% GeSn) QW thickness range 10 Å-1000 Å QD (Sn % ~10% to 20% GeSn) QD size range 10 Å-500 Å | Light emission 1000 nm-5000 nm. GeSn QW or QD can be used here. |
| 5 | P$^+$ Base | ~500 Å Ge$_{1-z}$(Si$_{0.8}$Sn$_{0.2}$)$_z$ (B-doped >$10^{19}$ cm$^{-3}$) | |
| 6 | N$^-$ Collector/Cladding | ~4000 Å SiGe (As-doped ~5 × $10^{17}$ cm$^{-3}$) | |
| 7 | N$^+$ sub-collector | ~500 Å Si (As-doped ~5 × $10^{18}$ cm$^{-3}$) | |
| 8 | | N$^+$ Si conducting substrate | Crystalline |

Table 11 shows a possible exemplary structure for a symmetric PNP double heterojunction transistor laser structure or light emitting transistor with a P$^-$ SiGe emitter/cladding, Ge QW or QD embedded in N$^+$ GeSiSn base with a P$^-$ SiGe collector/cladding. Note a GeSn QW or QD can replace the Ge QD or QW.

TABLE 11

A symmetric PNP double heterojunction transistor laser SiGe emitter/cladding, Ge QW or QD embedded in GeSiSn base, and SiGe collector/cladding.

| Layer | Layer Name | Description | Comment |
|---|---|---|---|
| 1 | P$^+$ Cap | ~1000 Å SiGe (B-doped >$10^{19}$ cm$^{-3}$) | |
| 2 | P$^-$ upper Cladding | ~4000 Å GaAs (B-doped ~5 × $10^{17}$) | |
| 3 | N$^+$ Base | ~500 Å Ge$_{1-z}$(Si$_{0.8}$Sn$_{0.2}$)$_z$ (As-doped >$10^{19}$ cm$^{-3}$) | |
| 4 | QW or QD | ~55 Å Ge or GeSn QW (Sn % ~0% to 10% GeSn) QW thickness range 10 Å-1000 Å QD (Sn % ~10% to 20% GeSn) QD size range 10 Å-500 Å | Light emission 1000 nm-5000 nm. GeSn QW or QD can be used here. |
| 5 | N$^+$ Base | ~500 Å Ge$_{1-z}$(Si$_{0.8}$Sn$_{0.2}$)$_z$ (As-doped >$10^{19}$ cm$^{-3}$) | |
| 6 | P$^-$ Collector/Cladding | ~4000 Å SiGe (B-doped ~5 × $10^{17}$ cm$^{-3}$) | |
| 7 | P$^+$ Sub-collector | ~500 Å Si (B-doped ~5 × $10^{18}$ cm$^{-3}$) | |
| 8 | | P$^+$ Si substrate | Crystalline |

It should be noted that there are many types of N-type and P-type dopants. For standard III-V semiconductors like GaAs, InP, InGaAs, InGaP, the N-type dopants may be Si, Ge, Sn, Pb, S, Se, Te. The P-type dopants for standard III-V semiconductors may be C, Zn, Be, Mg. Common dopants for group IV semiconductors like GeSn, Ge, Si, SiGe, GeSiSn for N-type dopants may be P, As, Sb. The P-type dopants may be B, Al, Ga.

Figure 52:
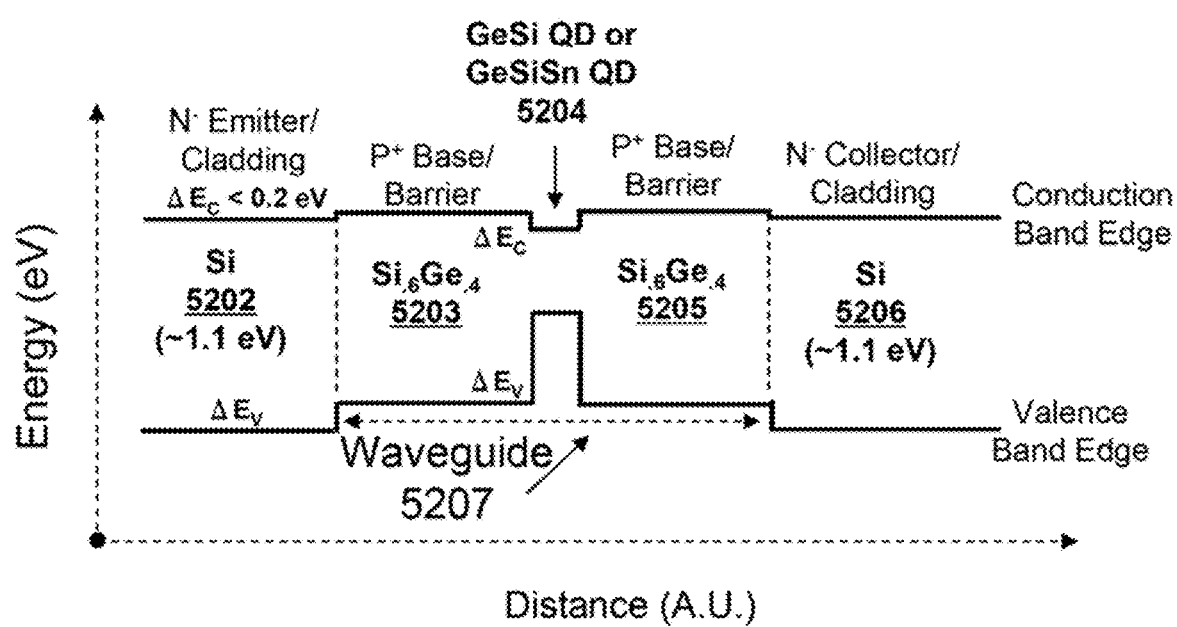
FIG. 52 shows a possible exemplary flat band energy band diagram for a Si emitter-SiGe base with GeSi QD-Si collector light emitting HBT. The base could also be a different composition of GeSi with a higher Si content then the QD.

Exemplary Configuration 4: Si Emitter-SiGe base with Ge QD or QW-Si Collector transistor laser. The introduction of a Ge QD or QW or (GeSn QD or QW) into a standard SiGe HBT design allows for the novel development of a Si photonic transistor laser. SiGe has a wide range of bandgaps from a starting point of Si with a bandgap energy of 1.1 eV, at Si$_{0.8}$Ge$_{0.2}$ has a bandgap energy of approximately 1 eV, at Si$_{0.6}$Ge$_{0.4}$ has a bandgap energy of approximately 0.93 eV, and at Si$_{0.2}$Ge$_{0.8}$ has a bandgap energy of approximately 0.87 eV. To fabricate a light emitting bipolar transistor the flat band diagram is shown in FIG. 52 for an NPN device. Inserted into the SiGe base is a Ge QD or QW or (or GeSn QD or QW).

FIG. 52 shows an exemplary flat band energy diagram of a Si Emitter-SiGe base with GeSi QD or QW-Si Collector light emitting HBT 5200. This HBT laser is grown on Si substrates, thus compatible with Si processing. Here a GeSi (low Si %<20%) QD or QW 5204 has barriers region of Si$_{0.6}$Ge$_{0.4}$ 5203 & 5205 P$^+$ base/barrier. The Si$_{0.6}$Ge$_{0.4}$ (has an approximate band gap energy of 0.93, but other compositions of SiGe can be used) forms the P$^+$ base and also acts as a barrier layer for quantum confine the electrons and holes in the GeSi QD or QW 5204. For a QD the growth of a large lattice constant material on a smaller lattice constant material results in strained layer epitaxy allowing the self-assembled three dimensional island growth. Typical quantum dot diameters are in the range of 1-20 nm, but are dependent on the wavelength of light that needs to be emitted. For a growth of the QW, it is typically grown on a latticed match layer with a larger bandgap layer than the QW material or can be grown strained. A large bandgap barrier then covers the QW layer. Typical QW thicknesses are in the range of 5-20 nm, but are not restricted to these thicknesses. The GeSi QD 5204 inserted into a base/barrier serves for the collection region for electrons and holes to recombine to generate light. The Si$_{0.6}$Ge$_{0.4}$ 5203 & 5205 also serve as the optical confinement layer and the waveguide material. The Si 5202 & 5206 serves as the N$^-$ emitter/cladding and N$^-$ collector/cladding material for this structure. The cladding serves as funneling carriers into the active/waveguide region and traps the emit light in the waveguide 5207 structure. GeSiSn could also be used as the QD active region.

Figure 53:
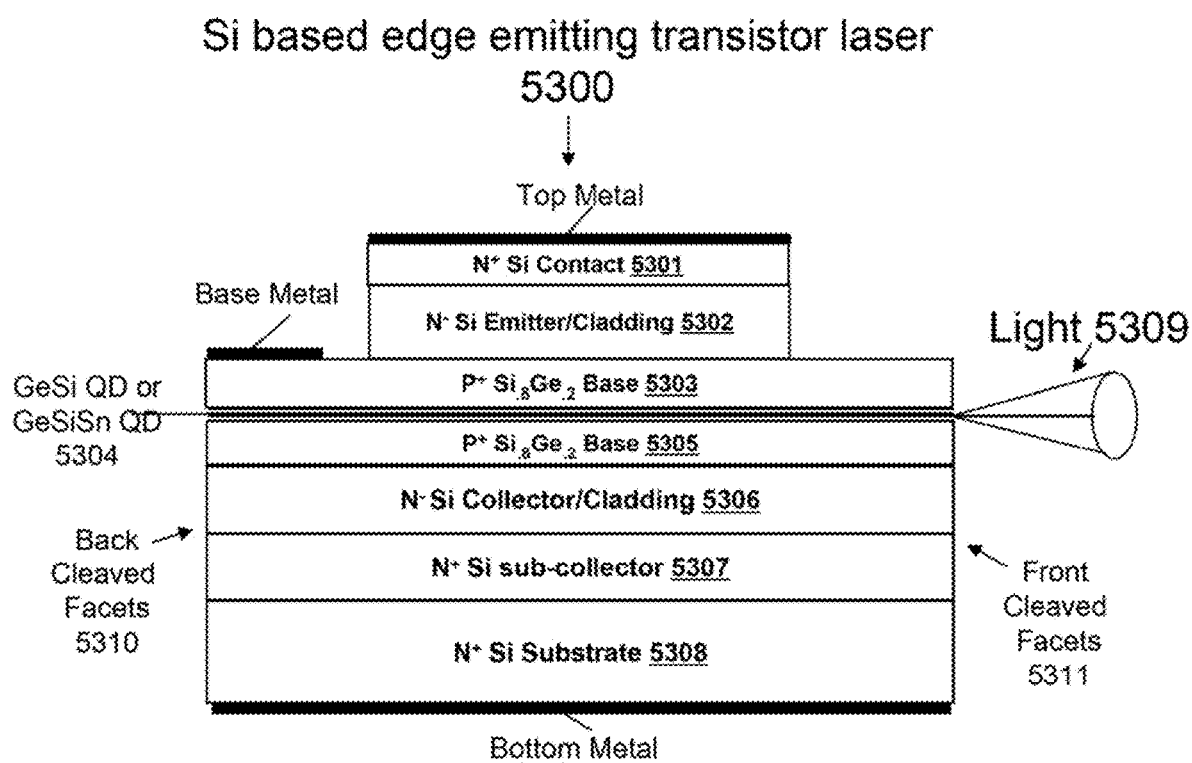
FIG. 53 shows a possible depiction of a cross-sectional device of a Si based edge emitting transistor laser or light emitting structure, utilizing a GeSiSn quantum well (QW) or quantum (QD) active region. The active region could be a GeSi quantum well or quantum dot layer.

FIG. 53 shows a possible cross-sectional device depiction of a Si based edge emitting transistor laser or light emitting structure 5300. The transistor laser includes a GeSi QD 5304 (or a GeSiSn QD can also be used) inserted into a $Si_{0.8}Ge_{0.2}$ 5303 & 5305 P+ base/barrier of the HBT. Layer 5301 is the highly conductive N+ type Si contact. The laser can require a resonant cavity to get optical gain, and typically this can be formed from the front and back cleaved facets of the semiconductor crystal wafer. The structure can be grown on N+ Si conducting substrate 5308, which is the seed crystal to grow the full structure. An N+ Si sub-collector 5307 is grown on the substrate. An N− Si collector/cladding 5306 and the N− Si emitter/cladding 5302 do dual functions of optical confinement of the light 5309 produced from the active region GeSi QD 5304 and the controlling the flow of electrons and holes. The P+ $Si_{0.8}Ge_{0.2}$ Base 5305 & 5303 form the barrier material for the GeSi QD 5304, and also provide the waveguide material. The laser can require a resonant cavity to get optical gain, and typically this can be formed from the front cleaved facets 5311 and back cleaved facets 5310 of the semiconductor crystalline structure.

Table 12 shows an example of an exemplary structure that could be grown. Note for this HBT device the $Si_{0.8}Ge_{0.2}$ base could be graded down to lower Si content.

TABLE 12

Epitaxial structure of NPN light emitting SiGe—GeSi—SiGe HBT.

| Layer | Layer Name | Description | Comment |
|---|---|---|---|
| 1 | N+ Cap | ~2000 Å Si (As-doped >$10^{19}$ $cm^{-3}$) | As = Arsenic |
| 2 | N− Emitter/Cladding | ~5000 Å Si (As-doped ~5 × $10^{17}$ $cm^{-3}$) | |
| 3 | P+ Base | ~500 Å $Si_{0.8}Ge_{0.2}$ (B-doped >$10^{19}$ $cm^{-3}$) | SiGe could be graded |
| 4 | QD | GeSi<br>Si % ≤20%<br>QD size range ~10 Å-500 Å<br>QW thickness range ~10 Å-1000 Å | Light emission<br>1000 nm-5000 nm.<br>GeSiSn QD can be used here. |
| 5 | P+ Base | ~500 Å $Si_{0.8}Ge_{0.2}$ (B-doped >$10^{19}$ $cm^{-3}$) | SiGe could be graded |
| 6 | N− Collector/Cladding | ~5000 Å Si (As-doped ~5 × $10^{17}$ $cm^{-3}$) | |
| 7 | N+ Sub-Collector | ~2000 Å Si (As-doped ~5 × $10^{18}$ $cm^{-3}$) | |
| 8 | | N+ Si conducting substrate | Crystalline |

Note
the dopants listed are only one of many possible dopants, and does preclude the use of other dopants and doping values are only nominal values but can take on many variations. The thicknesses are all exemplary and can take on many different values.

Figure 54:
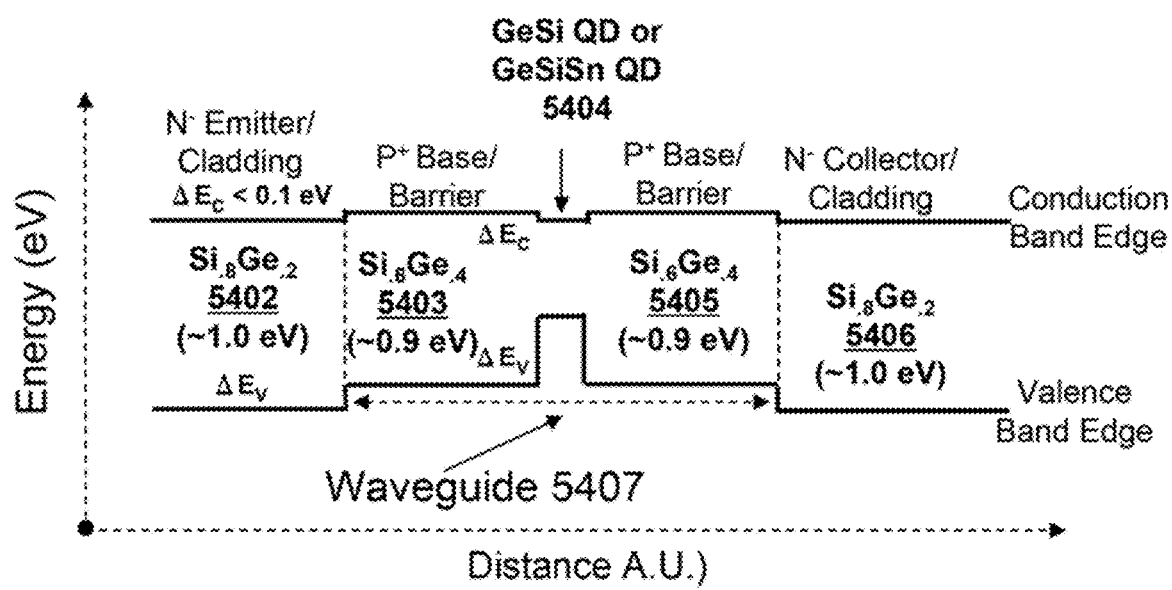
FIG. 54 shows a variation of the laser structure of FIG. 52 using SiGe cladding layer instead of Si cladding material.

FIG. 54 shows a laser structure, a variation of FIG. 52, because using higher Ge content in the $Si_{0.8}Ge_{0.4}$, it can be possible to produce QDs or QWs with longer wavelength light emission. FIG. 54 shows the exemplary flat band energy diagram of this structure. The laser includes a GeSi QD or QW 5404 inserted into a $Si_{0.8}Ge_{0.4}$ P+ barrier/base 5403 & 5405. This HBT laser is grown on Si substrates, thus compatible with Si processing. The $Si_{0.8}Ge_{0.4}$ forms the P+ base and also acts as a barrier layer for quantum confinement of the electrons and holes in the GeSi QD or QW. The GeSi QD or QW 5404 inserted into a base/barrier serves for the collection region for electrons and holes to recombine to generate light. The $Si_{0.8}Ge_{0.4}$ 5403 & 5405 also serve as the optical confinement layer and the waveguide material. The $Si_{0.8}Ge_{0.2}$ 5402 & 5406 serves as the emitter/cladding and collector/cladding material for this structure. The cladding serves as funneling carriers into the active/waveguide 5407 region and traps the emitted light in the waveguide structure. The approximate bandgap energies are shown below the corresponding materials.

Table 13 shows an exemplary structure that could be grown which includes $Si_{0.8}Ge_{0.4}$ P+ base.

TABLE 13

Epitaxial structure of NPN light emitting SiGe—GeSi—SiGe HBT (with $Si_6Ge_4$).

| Layer | Layer Name | Description | Comment |
|---|---|---|---|
| 1 | N+ Cap | ~2000 Å $Si_{0.8}Ge_{0.2}$ (As-doped >$10^{19}$ $cm^{-3}$) | As = Arsenic |
| 2 | N− Emitter/Cladding | ~5000 Å $Si_{0.6}Ge_{0.2}$ (As-doped ~5 × $10^{17}$ $cm^{-3}$) | |

TABLE 13-continued

Epitaxial structure of NPN light emitting SiGe—GeSi—SiGe HBT (with $Si_6Ge_4$).

| Layer | Layer Name | Description | Comment |
|---|---|---|---|
| 3 | P⁺ Base | ~500 Å $Si_{0.8}Ge_{0.4}$ (B-doped >$10^{19}$ cm⁻³) | SiGe could be graded |
| 4 | QD | ~55 Å GeSi | Light emission |
|   | Or QW | Si % ≤20% | 1000 nm-5000 nm |
|   |   | QW thickness range 10 Å-1000 Å | GeSn QD or QW can |
|   |   | QD size range 10 Å-200 Å | be used here |
| 5 | P⁺ Base | ~500 Å $Si_{0.6}Ge_{0.4}$ (B-doped >$10^{19}$ cm⁻³) | SiGe could be graded |
| 6 | N⁻ Collector/Cladding | ~5000 Å $Si_{0.8}Ge_{0.2}$ (As-doped ~5 × $10^{17}$ cm⁻³) |   |
| 7 | N⁺ Sub-Collector | ~2000 Å Si (As-doped ~5 × $10^{18}$ cm⁻³) |   |
| 8 |   | N⁺ Si conducting substrate | Crystalline |

Note
the dopants listed are only one of many possible dopants, and does preclude the use of other dopants and doping values are only nominal values but can take on many variations. The thicknesses are all exemplary and can take on many different values.

The transistor laser has the integrated features of both the transistor and the laser. From such a structure it can be straightforward to simplify the structure and grow a separate confinement heterostructure (SCH) laser.

Figure 55:
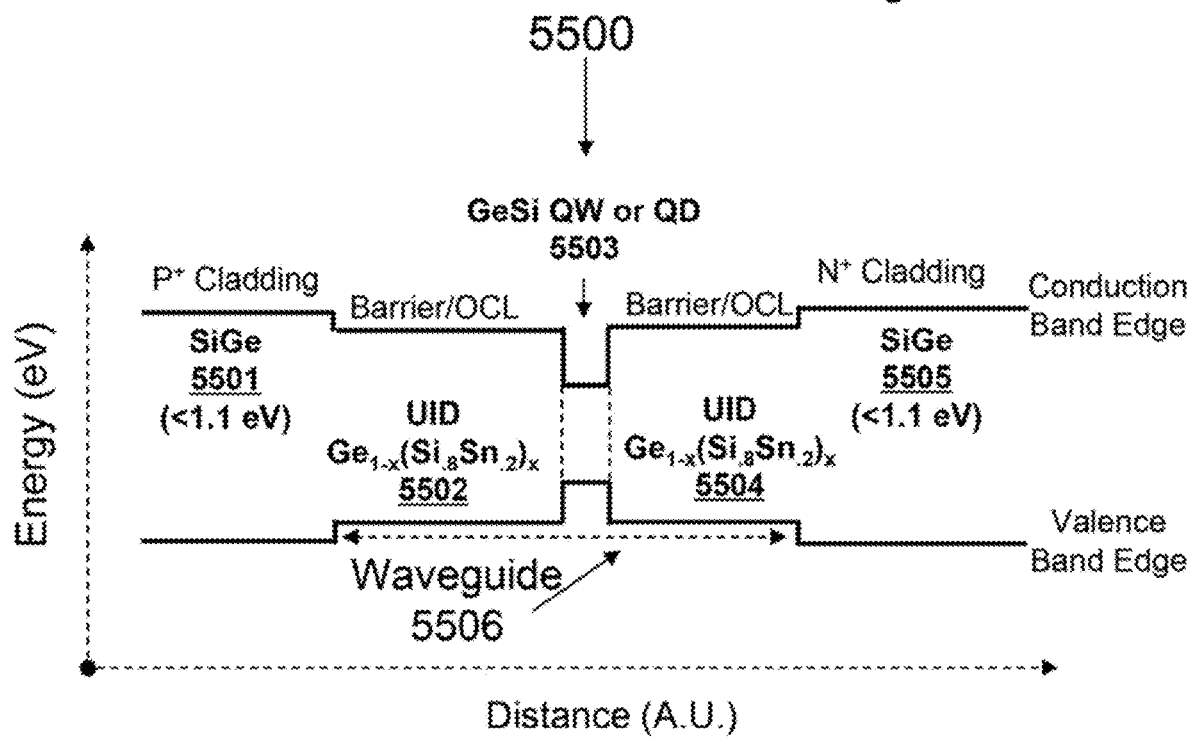
FIG. 55 shows an exemplary flat band energy diagram of a SCH laser utilizing a Ge QW or QD active region located in UID $Ge_{1-x}(Si_{0.8}Sn_{0.2})_z$ barrier/OCL. The active region could be GeSiSn, GeSn or GeSi.

FIG. 55 shows an exemplary flat band energy diagram of an SCH laser utilizing 5500 a GeSi QW or QD region 5503 located in UID $Ge_{1-z}(Si_{0.8}Sn_{0.2})_z$ barrier/OCL layer 5502 & 5504 region with P⁺ SiGe 5501 cladding and N⁺ SiGe 5505 cladding layers. This structure represents a PN junction or diode with an unintentionally doped (UID) active region and optical confinement region between the P⁺ SiGe 5501 and N⁺ SiGe 5505 cladding. The UID $Ge_{1-z}(Si_{0.8}Sn_{0.2})_z$ 5502 & 5504 forms the barrier material for the GeSi QW or QD 5503 active region. The combination of the barrier and active region forms the waveguide 5506 of the laser. The P⁺ SiGe 5501 cladding region serves for injection of the holes and for the optical confinement of the light emitted from the active region. The N⁺ SiGe 5505 cladding region serves for injection of the electrons and for the optical confinement of the light emitted from the active region in the waveguide 5506. The UID $Ge_{1-z}(Si_{0.8}Sn_{0.2})_z$ 5502 & 5504 could be replaced with a SiGe barrier layer as other examples of the SCH laser structure. A GeSn QW or QD could also be used.

Table 14 shows an exemplary epitaxial structure SCH injection diode laser with a GeSi QW or QD region with GeSiSn barriers.

TABLE 14

Exemplary epitaxial structure SCH injection diode laser with a Ge QW or QD region with GeSiSn barriers.

| Layer | Layer Name | Description | Comment |
|---|---|---|---|
| 1 | P⁺ Cap | ~1000 Å SiGe (B-doped >$10^{19}$ cm⁻³) |   |
| 2 | P⁺ Cladding | ~5000 Å SiGe (B-doped ~1 × $10^{18}$) |   |
| 3 | UID Barrier/OCL | ~500 Å $Ge_{1-z}(Si_{0.8}Sn_{0.2})_z$ | Also could use a Ge barrier |
| 4 | QW | ~55 Å GeSi | Light emission |
|   | or QD | Si % ≤20% | 1000 nm-5000 nm. |
|   |   | QW thickness range 10 Å-1000 Å | A GeSn QW or QD |
|   |   | QD size range 10 Å-200 Å | can be used here. |
| 5 | UID Barrier/OCL | ~500 Å $Ge_{1-z}(Si_{0.8}Sn_{0.2})_z$ | Also could use a Ge barrier |
| 6 | N⁺ Cladding | ~5000 Å SiGe (As-doped ~1 × $10^{18}$ cm⁻³) SiGe: Ge content can be varied |   |
| 7 | N⁺ Buffer | ~5000 Å Si (As-doped ~5 × $10^{18}$ cm⁻³) |   |
| 8 |   | N⁺ Si conducting substrate | Crystalline |

Exemplary Configuration 5A: An NPN GaAs Emitter-GeSiSn Base-GaN Collector double heterojunction bipolar transistor with dissimilar materials. This device configuration comprises an emitter/base stack of GaAs—GeSiSn wafer bonded to a GaN collector. This device configuration may comprise an emitter/base stack of GaAs—GeSiSn or a emitter/base stack of GaAs—GeSi wafer bonded to a GaN collector. GaN with its high bandgap offers tremendous improvements in the breakdown voltage of the HBT. The device elucidated can include a double heterojunction GaAs—GeSiSn—GaN HBT or a GaAs—GeSi—GaN device. The advent of device technology based on GaN with its high electric field strength is a new direction for high-power RF amplification. GaN based materials have a large bandgap and high electron saturation velocity. The embodiments described herein demonstrate a new semiconductor transistor integrated circuit with ultra-high performance in applications requiring both high speed and high power rugged electronics. In examples described herein, the GaN can be grown on the various substrates like sapphire, SiC, Si GaAs, GaN, and template substrates.

Polar GaN wurtzite structure can be grown on sapphire, SiC (many polytypes: 3C, 4H, 6H, etc.), Si substrates, or template substrates and has piezoelectric and polarization charge. GaN grown in the wurtzite (hexagonal) phase results in large spontaneous and piezoelectric polarization charge.

Non-polar GaN cubic (FCC) structure can be grown on GaAs, Si, or template substrates. GaN in this form has no polarization charge. A cubic form of GaN with (001) orientation can be grown on zinc blend GaAs. Thus the cubic GaN can be grown on conducting GaAs which can act as the sub-collector. The zinc-blend (cubic) GaN collector has a negligible conduction band offset with respect to the GeSn base. The conduction band offset between GaAs and cubic GaN may be $\Delta E_C$<0.1 eV. Thus for low Sn % GeSiSn and low Si % GeSi have properties close to Ge, and the conduction band offset to GaN may be about $\Delta E_C$<0.1 eV at the base/collector heterojunction. Non-polar wurtzite forms can be cut from the c-plane growth along the "a" or "m" plane directions. If the GaN is grown along the "m" or "a" plane axis, these polarization effects can be eliminated. Typical GaN wurzite crystals grown along the direction (c-plane) of III-nitrides suffer from polarization induced electric fields. Electric fields do not exist across the along nonpolar directions (a-plane or m-plane). Thus, high quality non-polar GaN substrate crystals are produced by slicing a c-plane GaN boule along the "a" or "m" plane. Such a material in low defect density non-polar substrates have improved substrates for fabrication of devices.

The GaAs—GeSiSn—GaN the heterojunction transistor described herein may represent a high power and high frequency performance device. This device embodies enormous RF power output, ruggedness, high bandwidth, and good linearity, combined with low turn-on voltage, which may be desirable for minimizing power consumption. This unique arrangement of materials combines the high transconductance of heterojunction bipolar transistor (HBT) technology, with the breakdown voltage (using a GaN collector), and a desirable emitter-base heterojunction (wide bandgap GaAs emitter on a narrow bandgap high conductivity P-type GeSiSn base). The large breakdown field of GaN may allow the use of short collector devices with high bandwidths (e.g. cut-off frequency $F_t$ and maximum oscillation frequency $F_{max}$ >than 150 Ghz). The combination of a low bandgap (<1.0 eV) GeSiSn base coupled with a wide bandgap GaN 9~3.4 eV) collector can be used for high speed power applications. By using a vertical stack of junctions, the device layers may be shorter, resulting in lower resistances and shorter transit delays, both contributing to much higher frequencies. The use of efficient GaAs—GeSiSn—GaN transistors can significantly enhance battery life while also enabling operation at high powers with exceptional frequency response.

The various crystal growth technologies, pulse laser ablation epitaxy, molecular beam epitaxy, metal organic chemical vapor deposition, liquid phase epitaxy, vapor phase epitaxy, or various other epitaxial growth techniques for the growth of base-emitter stack of P$^+$ GeSiSn base onto the N$^-$ GaAs emitter may be useful in devices. The base $Ge_{1-z}(Si_{0.8}Sn_{0.2})_z$ with tunable band gaps may be latticed matched to GaAs. Also for the approximate composition the base material $Ge_{0.98}Si_{0.02}$ may be also latticed matched to GaAs. The GaAs—GeSiSn emitter base stack can be coupled together through wafer bonding technology to the GaN collector, thus forming a monolithic GaAs(emitter)-GeSiSn (base)-GaN(collector) semiconductor stack that is a desirable HBT embodiment for high-power, high-frequency electronics can be created. In some examples, the uniqueness of embodiments can result in a small conduction band offset through the three different semiconductor materials (GaAs—GeSiSn—GaN). New materials are required to build high power electronics that can also operate at frequencies in the 10 to 100 GHz range. The formation of lattice-matched GeSiSn on GaAs then wafer bonded to GaN is a possible key to the realization of these devices.

Figure 56:
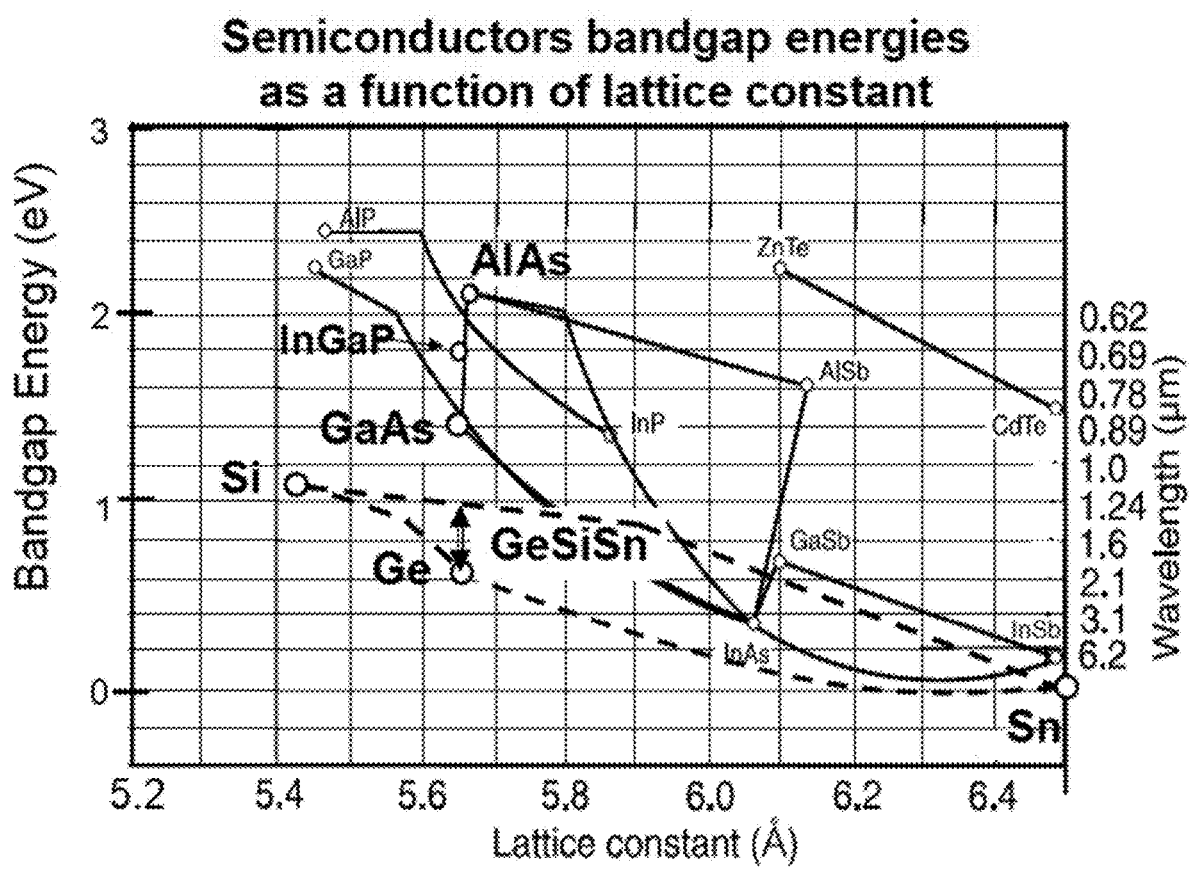
FIG. 56 shows energy bandgaps of various semiconductors vs. their lattice constant. The dotted line encloses the possible GeSiSn material compositions.

FIG. 56 shows the energy bandgaps of various semiconductors vs. their lattice constant. The graph has a vertical axis with the values of the bandgap energy (eV) and a horizontal axis with the values of the Lattice constant (Å). Various semiconductors are plotted as a function of their bandgap energy and lattice constant. The condition of lattice matching constrains certain combinations of semiconductors. It is readily seen that new types of semiconductor devices can be formed if the lattice matching constraint were eliminated. It would then be possible to fabricate new types of heterojunctions based on the materials characteristics instead of those constrained to near lattice constant materials.

The merging of the GeSiSn base region with the GaN collector by utilizing the wafer bonding process for fabrication of heterogeneous materials described herein. With this approach, the GeSiSn and GaN epitaxial layers can be joined to make a single composite structure. Monolithic wafer bonding is an advanced process for forming PN junctions. This wafer bonding technique allows formation of a robust monolithic structure, where the interface is covalently bonded. The new composite material establishes the GeSiSn—GaN base-collector heterointerface. One could use latticed matched or near latticed matched $Ge_{0.98}Si_{0.02}$ to GaAs as the base layer. Wafer bonding allows for the formation of a heterointerface without having to perform heteroepitaxy of two poorly latticed matched materials.

The new HBT has a base-collector junction comprising the GeSiSn P$^+$ base region wafer bonded to the GaN N$^-$ collector is described herein. $Ge_{1-z}(Si_{0.8}Sn_{0.2})_z$ for z≤0.5 and $Ge_{0.98}Si_{0.02}$ may be latticed matched or near latticed matched to GaAs. With this approach, the GeSiSn or GeSi and GaN epitaxial layers can be joined to make a single composite crystalline structure. The wafer bonding technique described herein allows to form a junction that is a robust monolithic structure, where the interface is covalently bonded.

Figure 57:
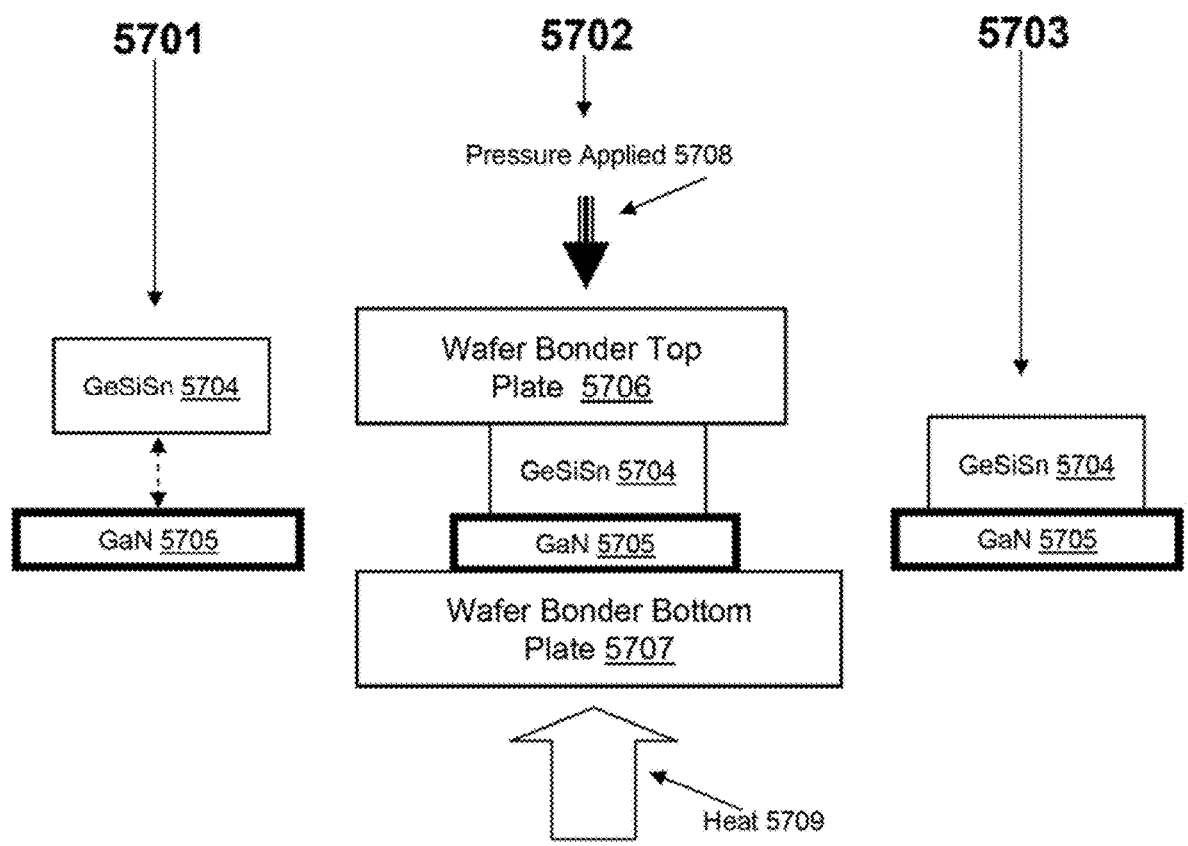
FIG. 57 shows an exemplary wafer bonding process that enables monolithic joining of two dissimilar semiconductor materials.

FIG. 57 shows the exemplary wafer bonding process that enables monolithic joining of two dissimilar semiconductor materials. By employing pressure, heat, gas ambient, and time, covalently bonded composite structures can be developed. The new composite material establishes the critical GeSiSn—GaN base-collector heterointerface. Wafer bonding allows formation of a heterointerface without having to perform heteroepitaxy of two poorly matched materials. Exemplary wafer bonding methodology comprises step S701 where the GeSiSn 5704 and GaN 5705 semiconductors are cleaned in preparation for joining, step S702 the GeSiSn 5704 and GaN 5705 are placed on each other in between the wafer bonder top plate 5706 and wafer bonder bottom plated 5707, basically the jaws of the wafer bonder, and held under heat 5709 and pressure 5708 for the requisite time and in a gas ambient, then step S703 the final structure is a monolithic composite material with GeSiSn 5704 bonded to GaN 5705. Also for example the composition $Ge_{0.98}Si_{0.02}$ could also be used in this wafer bonded process, but is not only limited to this composition NPN GaAs—GeSiSn—GaN HBTs can include the following concepts: Growth of lattice matched P-type GeSiSn base on N-type GaAs emitter (GaAs/GeSiSn stack). For example GeSiSn at the following composition $Ge_{0.95}Si_{0.04}Sn_{0.01}$ could be a possible of numerous candidates for the base region. Monolithic formation by wafer bonding of GeSiSn/GaAs stack to the N-type GaN (to circumvent large lattice mismatched growth). One of the advantages of the embodiments described herein is the formation of a unique transistor semiconductor stack that can have a small conduction band offset between all three materials.

Figure 58:
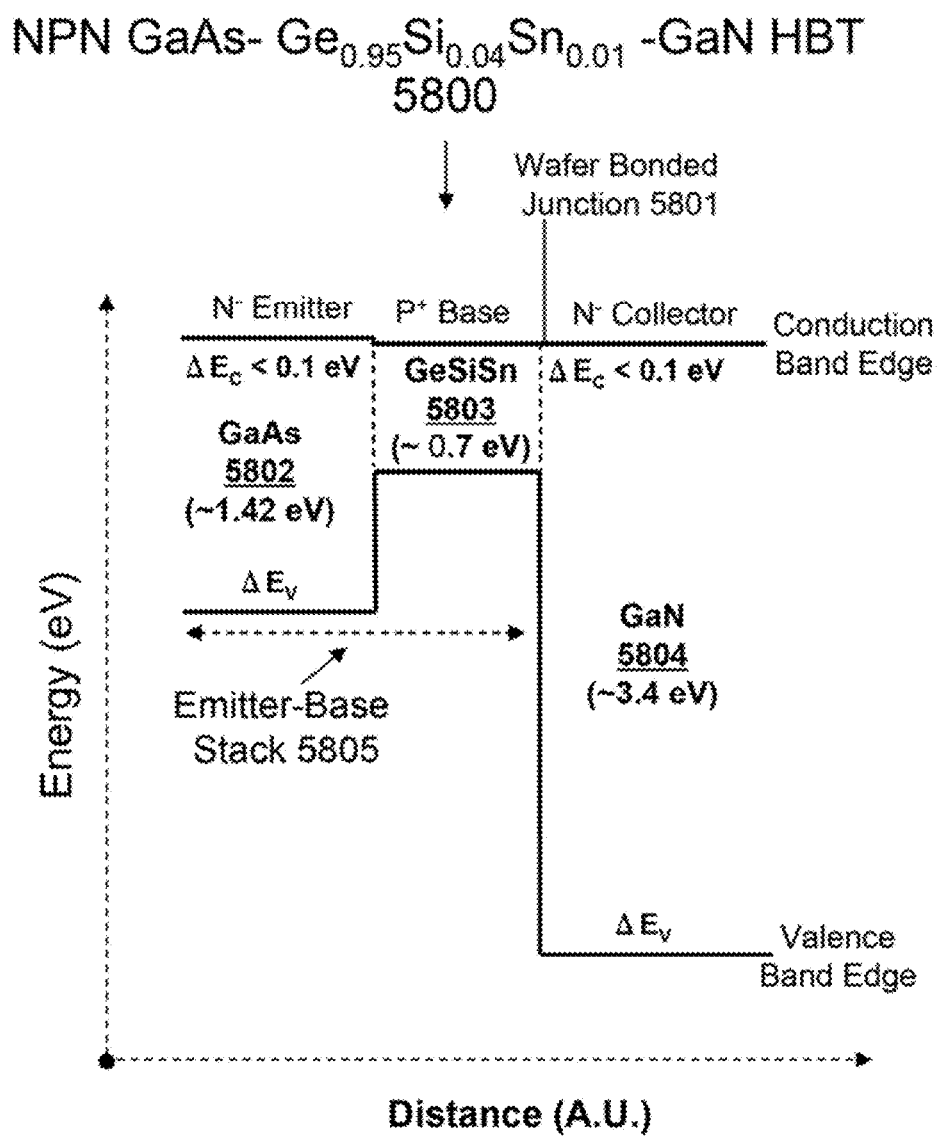
FIG. 58 shows an example of an exemplary flat band energy diagram of a wafer bonded NPN GaAs—$Ge_{0.95}Si_{0.04}Sn_{0.01}$—GaN HBT.

FIG. 58 shows an example of a possible exemplary flat band energy diagram wafer bonded NPN GaAs—GeSiSn—GaN HBT 5800. In this example a composition of $Ge_{0.95}Si_{0.04}Sn_{0.01}$ was used, but is not the only composition that can be used. Here an emitter up emitter-base stack 5805 comprising of N⁻ emitter GaAs 5802 with a P⁺ Base GeSiSn 5803. The full monolithic structure can be formed using an epitaxial liftoff (ELO) procedure. This emitter-base stack 5805 is wafer bonded to the N⁻ collector GaN 5804 thus forming a wafer bonded junction 5801 at the base-collector interface. Possible methodologies of wafer bonding this emitter-base stack to the GaN is described in Exemplary ELO Wafer Bonding Configuration 6A and in Exemplary Inverted Wafer Bonding Configuration 6B. Note the conduction band offset $\Delta E_C$ may be less than 0.1 eV through the NPN HBT structure.

Figure 58A:
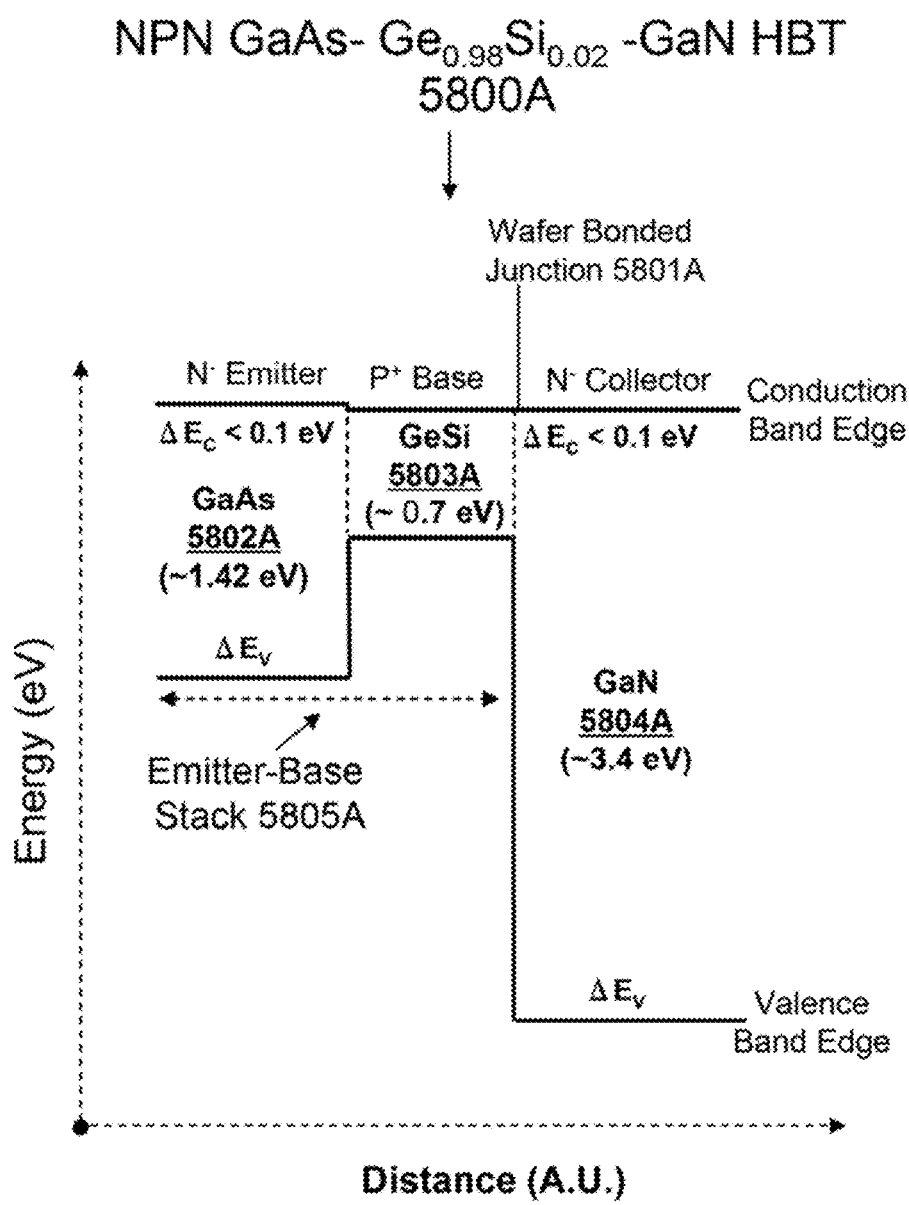
FIG. 58A shows an example of an exemplary flat band energy diagram of a wafer bonded NPN GaAs—$Ge_{0.98}Si_{0.02}$—GaN HBT.

FIG. 58A shows an exemplary flat band energy diagram wafer bonded NPN GaAs—GeSi—GaN HBT 5800A. Here an emitter up emitter-base stack 5805A comprising of N⁻ emitter GaAs 5802A grown on P⁺ Base GeSi 5803A structure. In this example a composition of $Ge_{0.98}Si_{0.02}$ layer may be lattice matched to GaAs, however this is not the only composition that can be used. The full monolithic structure can be formed using an epitaxial liftoff (ELO) procedure. The GaAs—GeSi emitter-base stack 5805A is wafer bonded to the N⁻ collector GaN 5804A thus forming a wafer bonded junction 5801A at the base-collector interface. Possible methodologies of wafer bonding this emitter-base stack to the GaN is described in Exemplary ELO Wafer Bonding Configuration 6A and in Exemplary Inverted Wafer Bonding Configuration 6B. Note the conduction band offset $\Delta E_C$ may be less than 0.1 eV through the NPN HBT structure.

The base can be graded from GeSiSn—GeSn to have electric field enhancement of the charge carriers.

FIG. 59 shows an exemplary flat band energy diagram of the NPN GaAs, compositionally graded GeSiSn—GeSn, GaN HBT 5900. Here a base up emitter-base stack 5905 comprises a P⁺ Base compositionally graded GeSiSn—GeSn 5903 grown on an N⁻ emitter GaAs 5902 structure. The compositionally graded GeSiSn—GeSn 5903 layer can comprise at the emitter-base interface a lattice matched or near latticed matched $Ge_{1-z}(Si_{0.8}Sn_{0.2})_z$ to GaAs, the GeSiSn can be compositionally graded by reducing the Si content and increasing Ge content to GeSn at the collector interface. The grading range can go from GeSiSn at the emitter-base junction to GeSn at the base-collector junction at various compositions. This emitter-base stack 5905 is then wafer bonded with the P⁺ Base next to the N⁻ collector GaN 5804 thus forming a wafer bonded junction 5901 at the base-collector interface. Due to the compositional grading of the GeSiSn—GeSn 5903 in the P⁺ Base, there is a field enhancement region 5906 that accelerates the carriers toward the collector. The methodology of wafer bonding this emitter-base stack is described in Exemplary Inverted Wafer Bonding Configuration 6B. Note the conduction band offset $\Delta E_C$ may be small through the NPN HBT structure.

Figure 60:
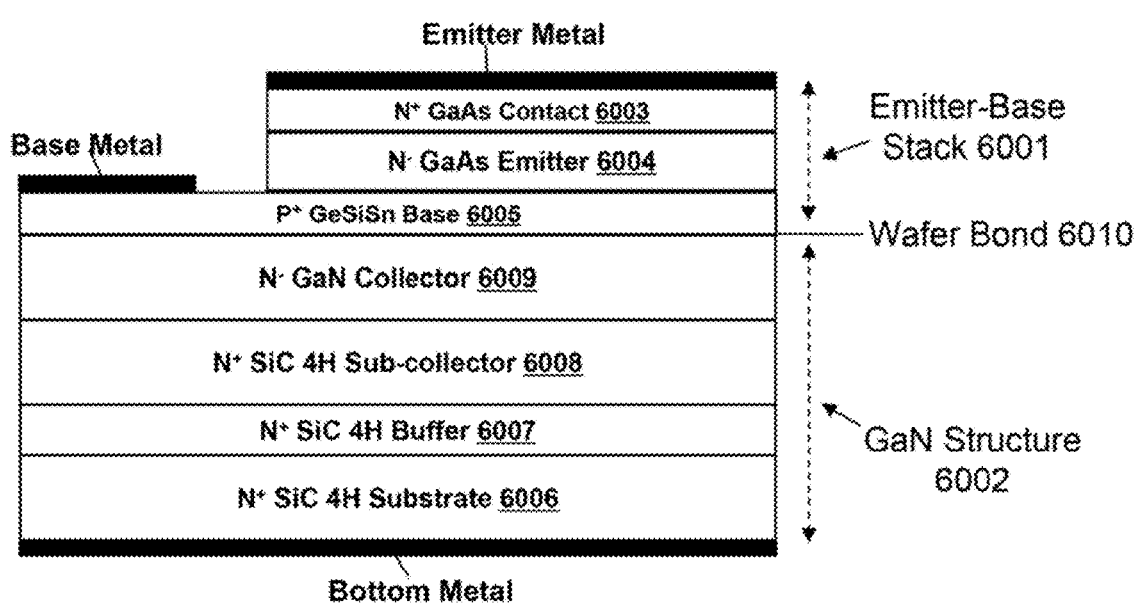
FIG. 60 shows an exemplary cross-sectional device depiction of a wafer bonded GaAs—GeSiSn—GaN/SiC NPN double HBT in a mesa configuration.

FIG. 60 shows an exemplary cross-sectional device depiction of the wafer bonded GaAs—GeSiSn—GaN NPN double HBT 6000 in a mesa configuration. Note that this is a vertical device, which is desirable for power applications because the lateral area can be minimized. The device is grown on an N⁺ SiC 4H substrate 6006. The NPN HBT comprises an emitter base stack 6001 with a wafer bond 6010 to the GaN structure 6002 to form the monolithic device. The GaN structure 6002 can comprise a variety of forms, but for an exemplary case the GaN is grown on a SiC substrate, though a GaN, sapphire, GaAs, Si substrate could also be used. Starting with an N⁺ SiC substrate 6006, which can be of the 3C, 4H, 6H, etc. variety, on which an N⁺ SiC buffer 6007 is grown. Then an N⁺ SiC sub-collector 6008 can be grown, onto which an N⁻ GaN collector 6009 is grown. This finalizes the GaN structure 6002. Because the GaN is grown on 4H SiC (wurtzite or hexagonal), such a growth results in a polar GaN collector 6009. For the emitter-base stack 6001 an ELO procedure to be described in Exemplary Configuration 6A, forms the N⁺ GaAs contact 6003—the N⁻ GaAs emitter 6004 and the P⁺ GeSiSn base 6005, finalizing the emitter base stack 6001. P⁺ GeSn base 6005 layer forms the heavily doped P-type base. GeSiSn also has a large hole mobility which is a precondition for making the base region thin. The conduction band offset between GaAs—GeSiSn may be small, thus resulting in a large valence band offset. The GaN can serve as the collector layer with a large breakdown voltage for the transistor because it has a large bandgap energy of 3.4 eV.

Table 15 is an exemplary Epitaxial structure of an NPN GaAs—GeSiSn—GaN wafer bonded HBT. In this structure, the GaN is grown on SiC which is a typical substrate for the growth and one of the many described substrates that can be used. SiC is preferred for high power electronics because it has the highest thermal conductivity between GaN, Si, GaAs and sapphire the other primary substrates for GaN. Note the compositionally graded GeSiSn—GeSn layer can comprise at the emitter-base interface a lattice or near latticed matched or strained $Ge_{1-z}(Si_{0.8}Sn_{0.2})_z$ to GaAs, where the GeSiSn is compositionally graded by reducing the Si % and increasing Ge content to GeSn at the collector interface. The grading range can go from GeSiSn at the emitter-base junction to GeSn at the base-collector junction at various compositions.

TABLE 15

Epitaxial structure of an NPN GaAs—GeSiSn—GaN wafer bonded HBT.

| Layer | Layer Name | Description | Comment |
|---|---|---|---|
| 1 | N⁺ Cap | ~1000 Å InGaAs (Te-doped >$10^{19}$ cm⁻³) | |
| 2 | N⁻ Emitter Cap | ~1500 Å GaAs (Si-doped ~5 × $10^{18}$ cm⁻³) | |
| 3 | N⁻ Emitter | ~500 Å GaAs (Si-doped ~3 × $10^{17}$ cm⁻³) | |
| 4 | P⁺ Base | ~500 Å $Ge_{1-z}(Si_{0.8}Sn_{0.2})_z$ | Latticed matched |
| | | can be B-doped >$10^{19}$ cm⁻³ | or |
| | | 0 < Si % ≤ 40% | Can be compositionally |
| | | 0 ≤ Sn % ≤ 10% | graded GeSiSn—GeSn |
| | | Thickness range 100 Å-5000 Å | |
| 5 | N⁻ Collector | ~10000 Å GaN (N-doped ~1 × $10^{18}$ cm⁻³) | Wafer bonded to above |
| 6 | N⁺ Sub-Collector | ~5000 Å SiC (N-doped ~5 × $10^{18}$ cm⁻³) | |
| 7 | High Purity Buffer | ~500 Å SiC (N-doped ~5 × $10^{18}$ cm⁻³) | N = nitrogen |
| 8 | | N⁺ SiC (4H) conducting substrate | Crystalline |

Note the dopants listed are only one of many possible dopants, and does preclude the use of other dopants and doping values are only nominal values but can take on many variations. The thicknesses are all exemplary and can take on many different values.

Figure 61:
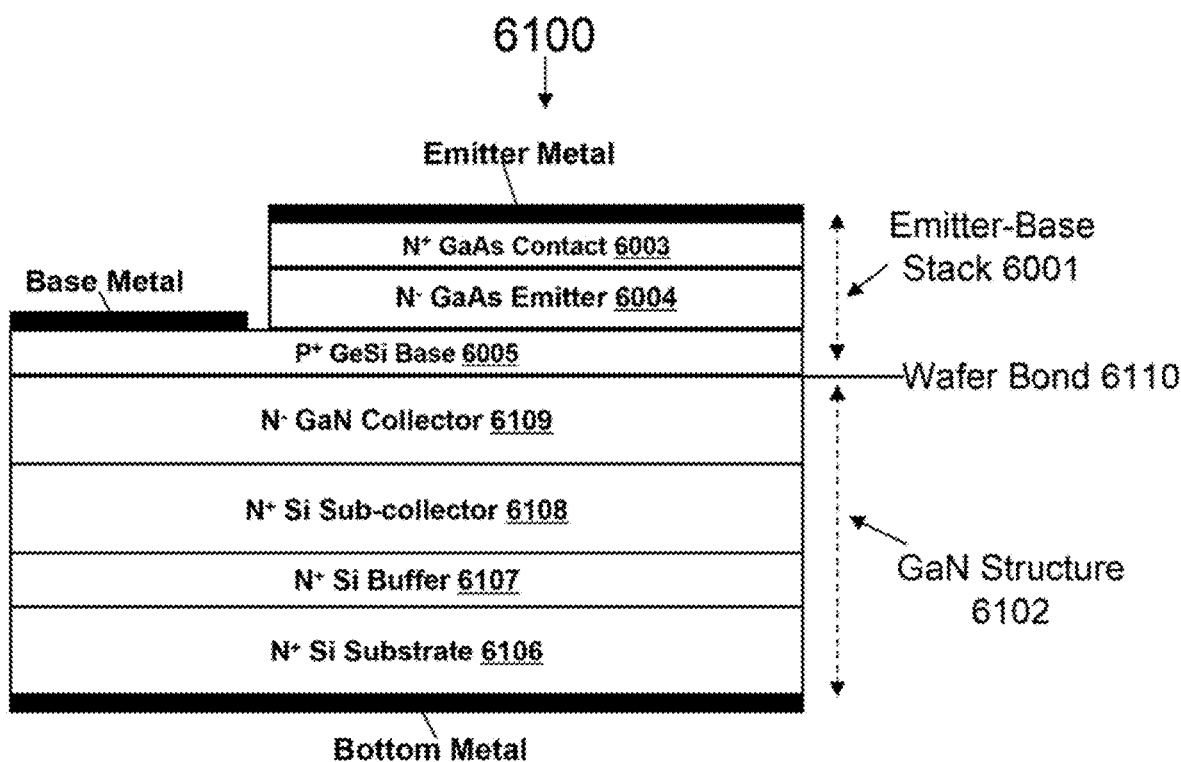
FIG. 61 shows a possible exemplary cross-section embodiment of a wafer bonded GaAs—GeSiSn—GaN/Si NPN double HBT in a mesa configuration.

FIG. 61 shows another possible exemplary cross-section device depiction of the wafer bonded GaAs—GeSi—GaN/Si NPN double HBT 6100 in a mesa configuration. Note that this is a vertical device, which is desirable for power applications because the lateral area can be minimized. In this case the device is grown on a face centered cubic (FCC) N$^+$ Si substrate 6106. The NPN HBT comprises an emitter base stack 6001 with a wafer bond 6110 to the GaN structure 6102 to form the monolithic device. The GaN structure 6102 can comprise a variety of forms, but for an exemplary case the GaN is grown on a Si substrate, though a GaN, sapphire, SiC, GaAs substrate could also be used. Starting with an N$^+$ Si substrate 6106, which an N$^+$ Si buffer 6107 is grown. Then an N$^+$ Si sub-collector 6108 can be added, onto which an N$^-$ GaN collector 6109 is grown. This finalizes the GaN structure 6102. Because the GaN is grown on FCC Si (cubic) such a growth results in a non-polar GaN collector 6109. An ELO procedure in Exemplary Configuration 6A, describes how the emitter-base stack 6001 is wafer bonded to the GaN collector structure. P$^+$ GeSi base 6005 layer forms the heavily doped P-type base. For example the Ge$_{0.98}$Si$_{0.02}$ layer may be lattice matched to GaAs. GeSi may have a large hole mobility which may be important for making the base region thin. The conduction band offset between GaAs—GeSi may be small, thus resulting in a large valence band offset. The GaN can serve as the collector layer with a large breakdown voltage for the transistor because it has a large bandgap energy of 3.4 eV.

In some examples, formation of this monolithic composite material of an NPN GaAs—GeSiSn—GaN wafer bonded HBT can create a desirable device architecture in that the conduction band offsets may be small for both emitter-base and base-collector hetero-interfaces, and the valence band offset may be large at the emitter-base GaAs—GeSiSn and base-collector GeSiSn—GaN heterojunctions. This property allows for the formation of heterojunction transistor structure that can have large gain (large valence band offset between GaAs and GeSiSn), low base sheet resistance (GeSiSn has high hole mobility), low turn-on voltage (GeSiSn has low bandgap energy <1.0 eV), and large breakdown voltage (GaN has large breakdown electric field strength and high saturated velocity), which are desirable device metrics for next-generation electronic transistors. Electrons can easily be injected from the GaAs emitter through the GeSiSn base to the GaN collector. By adding the ability to compositionally grade the base GeSiSn to GeSn such that the bandgap energy of the material is gradually reduced throughout the base as described in these configurations. This grading causes an electric field, which in turn reduces the transit time, thus increasing F$_t$. The GaAs—GeSiSn—GaN materials stack can be desirable for making NPN HBTs that can outperform standard SiGe, GaAs, and InP heterojunction bipolar transistors.

Exemplary GaAs Emitter Advantages: The large valence band offset between GaAs emitter and GeSiSn base can stop back injection of holes into the emitter. This is desirable because the base is doped heavily P-type (typically >1×10$^{19}$ cm$^{-3}$), with such high doping of the base, the emitter-base valence band offset blocks the holes even though the base doping is much higher than the N-type emitter doping (low 10$^{17}$ cm$^{-3}$). This allows for low N-type doping of the emitter and high P-type doping of the base, thus lowering base emitter capacitance while still achieving sizable current gain. Ge$_{1-z}$(Si$_{0.8}$Sn$_{0.2}$)$_z$ can be lattice matched to GaAs which may enable dislocation free crystal growth. The use of a GaAs (instead of InGaP) emitter and GaN (instead of GaAs) collector significantly increases the overall thermal conductivity of the material structure. The GaAs—GeSiSn emitter base junction has a large valence due to the small conduction band discontinuity. This eliminates the back injection of holes to the emitter from the base, which reduces the gain of the transistor.

Exemplary GeSiSn Base Advantages (low Sn % similar properties to Ge): GeSiSn can have a low bandgap (semiconductors with bandgaps less than 0.8 eV, which results in low turn-on voltage (less than 0.5 V). GeSiSn (low Sn %) hole mobility is high (2000 cm$^2$/Vs) like Ge and acceptors can be incorporated to high density (>1×10$^{19}$ cm$^{-3}$), thus the base can be made ultra-thin while maintaining a low base sheet resistance which increases current gain and decreases electron transit time. By adding the ability to grade the base composition from GeSiSn to GeSn such that the bandgap energy of the material is gradually reduced throughout the base as described in these configurations. This grading causes an electric field, which in turn reduces the transit time, thus increasing F$_t$. GeSiSn may be an indirect semiconductor thus reducing radiative recombination in the base region. GeSiSn for low Sn concentration has shallow acceptors, so the hole concentration is generally equal to the acceptor doping level and independent of temperature. GeSiSn can be heavily doped P-type.

Exemplary GaN Collector Advantages: GaN collector can be grown on GaN, SiC (many polytypes, i.e., 3C, 4H, 6H), Si, Sapphire, GaAs, and template substrates. Thus the substrate can be chosen to enhance the properties of the device. For instance for high power devices it can be useful to grow the GaN on SiC substrates because they have a thermal conductivity. Typically GaN comes in the wurtzite and cubic phase. GaN (wurzite and cubic form) has a large lattice mismatch with GeSn, thus wafer bonding circumvents the problem of growing strained and incompatible layers. GaN has high breakdown field, which is excellent for the collector breakdown voltage. GaN has small conduction band offset with GaAs, thus minimizing the blocking field at the interface. The use of GaN (instead of GaAs) collector significantly increases the overall thermal conductivity of the material structure. GaN has a high saturation velocity, thus electrons travel without intervalley scattering.

The NPN GaAs—GeSiSn—GaN HBT (referred to as GeSiSn HBT) as compared to standard NPN InGaP—GaAs—GaAs HBT (referred as GaAs HBT) would have the following advantages. The differences between the two devices mostly rely on the base material GeSiSn and the collector material GaN.

A commonly used metric for comparing various semiconductors is the Johnson's figure of merit (FOM), which compares different semiconductors for suitability for high frequency power transistor applications. Table 16 shows a comparison Johnson FOM for Si, GaAs, and GaN.

TABLE 16

Johnson FOM for Si, GaAs, and GaN.

|  | Si | GaAs | GaN |
|---|---|---|---|
| Energy Bandgap (eV) E$_{gap}$ | 1.1 | 1.4 | 3.4 |
| Electron Saturation Velocity (cm/s) V$_{sat}$ | 1 × 10$^7$ | 1 × 10$^7$ | 1.5 × 10$^7$ |
| Peak Electron Saturation Velocity (cm/s) V$_{sat\ peak}$ | 1 × 10$^7$ | 1.9 × 10$^7$ | 2.5 × 10$^7$ |
| Normalized Johnson Figure of Merit (E$_{gap}^4$ × V$_{sat\ peak}^2$) | 1 | 9.5 | 572 |

Johnson Figure of Merit = Maximum power times frequency ≈ E$_{gap}^4$ × V$_{sat}^2$ Advantage 2: Because GaN has such large breakdown voltage for example for a GeSiSn—GaN base collector junction where the GaN collector is only 5000 Å thick, the breakdown voltage is greater than 100 V. A typical GaAs heterojunction base-collector, where the GaAs collector is over 10000 Å thick has a breakdown voltage of only 20 volts. Thus one can reduce the GaN collector thickness as compared to the GaAs, without hurting robustness, thus the transit time or $F_t$ is increased because of a thinner base and collector, which in turn increases the $F_{max}$ with another factor because of the low resistivity GeSn base. Typical values of $F_t$ and $F_{max}$ should be greater than 150 GHz.

Exemplary Wafer Bonding of GeSiSn Stack to GaN: The method of wafer bonding is chosen as the most direct means of forming the GeSn to the GaN structure. A pneumatic bonder can eliminate the problems associated with the more conventional torqued jig fixtures. Using the method described here, the bonder allows gradual pressure application for the delicate bonding of GeSiSn and GaN. The large size heaters in the plates provide fast temperature ramp up for the bonding process. The bonder has a self-leveling action to the surface mechanism and ensures that it is flat with the surface.

The wafer bonders have a unique feature in that the top and bottom plates are under electronically controlled differential air pressure. There is no non-linear return spring force needing to be concerned. The top plate moving up and down relies on the differential air pressure in the top plate's air cylinder; and thus, the bonding pressure can be continuously adjusted precisely to provide controlled wafer bonding conditions. The wafer bonding system has precise temperature and pressure control to ensure the bonding of the materials. Operation step 1 comprises lowering the wafer bonder top plate so that it barely touches the materials to be bonded. Pressure is then slowly applied at this time and the temperature of the bonder top and bottom plate are raised. Independent temperature control of the top and bottom plate temperatures allows the accommodation of materials that may have different thermal expansion coefficients, thus minimizing stress to the bonded interface. The bonders can reach temperatures above 500° C. in various gas ambients, but typically a nitrogen purge is used during the bonding process. The bonders can accommodate up to 4" diameter wafers. In a single step a PN homojunction or heterojunction bonded materials can be formed.

Figure 62:
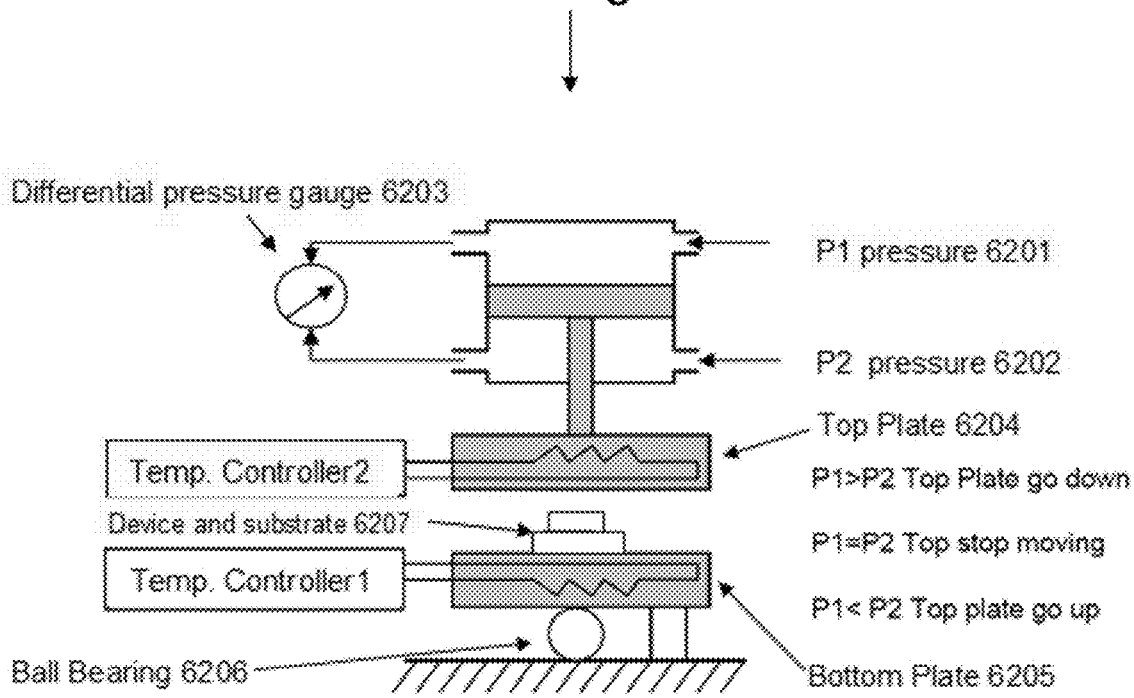
FIG. 62 shows QuantTera's wafer bonder configuration.

FIG. 62 shows a pneumatic wafer bonder configuration 6200. The bonder uses differential air pressure between P1 pressure 6201 and P2 pressure 6202, where the pressure is measured by the differential pressure gauge 6203. The pressure controls the action of the top plate 6204 in moving down to clamp the device and substrate 6207, which sits on the bottom plate 6205, which has a ball bearing 6206 for conformal leveling action. Two independent temperature controllers control the temperature of the top plate 6204 and bottom plate 6205.

Table 17 shows an exemplary wafer bonding process.

TABLE 17

Exemplary Wafer Bonding Process.

| Step | Description |
|---|---|
| 1 | The wafer is cleaved to appropriate size. |
| 2 | Semiconductor materials are thoroughly cleaned. |
| 3 | Oxides are removed from surface by chemical etch or plasma etch. |
| 4 | GeSiSn stack material and the GaN material are placed on top of each other. |
| 5 | GeSiSn and GaN materials are placed in wafer bonder, which under low pressure (<5 psi) joins the materials together at possible temperatures of 24° C. up to 600° C. for 15 min to 60 min. In a gas ambient or vacuum. |
| 6 | The composite structure is cooled and then removed. |
| 7 | The composite unit acts as a monolithic PN structure. |
| 8 | Current voltage testing of the PN junction. |
| 9 | Shear test to evaluate the strength of wafer bonded junction. |

Wafer bonding allows formation of a heterointerface without having to perform heteroepitaxy of two poorly matched materials.

Figure 63:
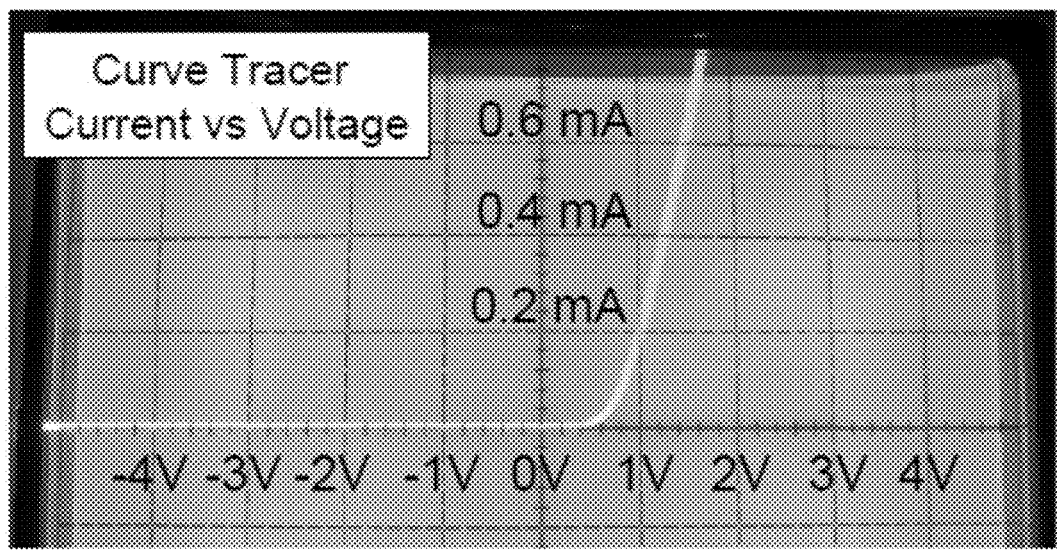
FIG. 63 shows a current-voltage characteristic of a wafer bonded P GeSn to N⁻ GaN showing PN rectifying behavior.

FIG. 63 shows the current-voltage characteristic of the wafer bonded P GeSn to N—GaN showing PN rectifying behavior. The vertical axis is current in units of mA, and the horizontal axis is voltage in units of V. The turn-on voltage of the device may be less than 0.5 V.

The wafer bonding process may allow for independent enhancement of materials without regard to lattice matching. It should be noted that Ge lattice constant may be about 5.65 Å and GaN may be about 4.4 Å, which is a huge mismatch (28%). Interface defects can be minimized by varying wafer bonding parameters such as oxide removal, temperature, time, and pressure. Table 18 lists the thermal expansion coefficients of the GaAs, GeSn, and GaN. Because the thermal expansion coefficients of all the materials are similar, the thermal stress generated during wafer bonding should be minimal.

TABLE 18

Thermal Expansion Coefficients of GaAs, GeSiSn, and GaN.

| Material | Thermal Expansion Coefficient ($10^{-6}$ $K^{-1}$) @ 300 K |
|---|---|
| GaAs | 6.0 |
| GeSn similar to Ge (low Sn %) | 5.9 |
| GaN | 5.6 |

Exemplary Configuration 5B: NPN InGaP Emitter-GeSiSn Base-GaN Collector Double HBT with all dissimilar materials Desirable combination of semiconductors. To further improve on Configuration 5A, an InGaP emitter region is added that is lattice matched to GaAs. This device comprises an emitter stack of InGaP—GeSiSn wafer bonded to a GaN collector. GaN with it high bandgap offers tremendous improvements in the breakdown voltage of the HBT. Note the InGaP layer can be compositionally graded to enhance device performance. The monolithic InGaP—GeSiSn—GaN stack may have a conduction band offset though the device less than 0.1 eV. This special property may allow for the formation of heterojunction transistor structure that can have large gain, and large breakdown voltage (GaN has large breakdown electric field strength and high saturated velocity). These material characteristics can make a desirable bipolar transistor. The InGaP—GeSiSn—GaN materials stack can be desirable for making NPN HBTs that can outperform standard SiGe, GaAs, and InP heterojunction bipolar transistors.

Figure 64:
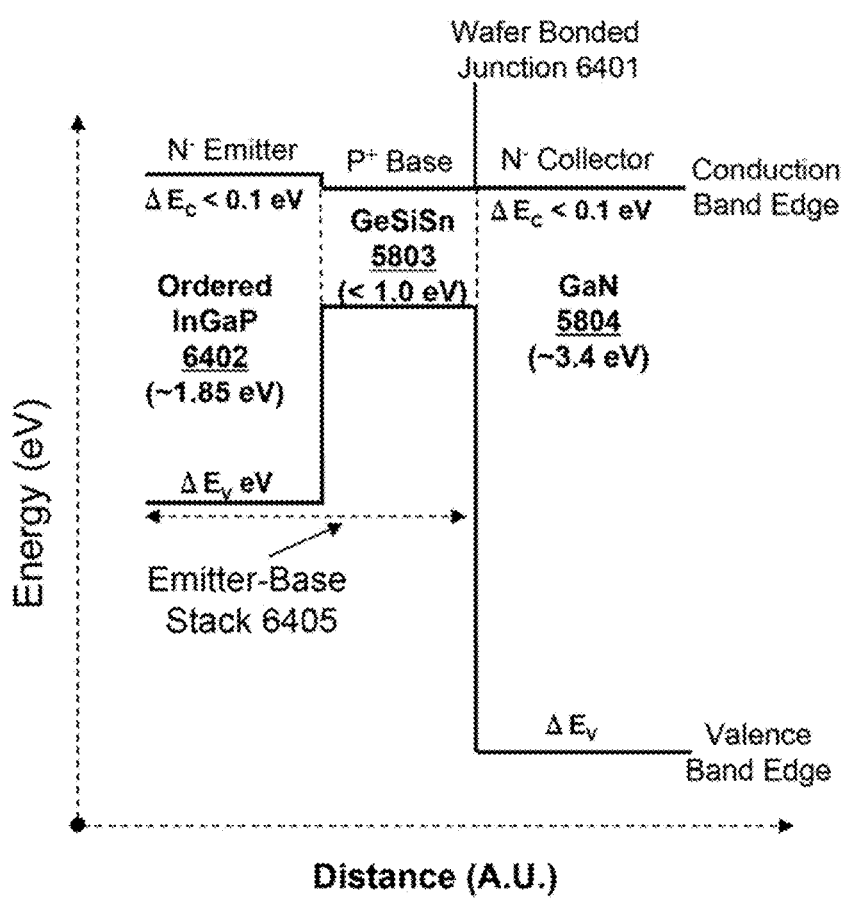
FIG. 64 shows an exemplary flat band energy band diagram of an NPN InGaP emitter-GeSiSn base-GaN collector double HBT.

FIG. 64 shows the exemplary flat band energy band diagram of NPN InGaP Emitter-GeSiSn Base-GaN Collector Double HBT 6400. This new material structure with possibly a near zero conduction band offsets between interfaces and large valence band offsets at the emitter-base and base collector heterojunction may be a improvement over existing HBT technologies. Electrons can easily be injected from the InGaP emitter through the GeSiSn base to the GaN collector. Conduction band offsets at emitter-base and base-collector junctions may be small, with large valence band offsets between the InGaP—GeSiSn and GeSiSn—GaN heterojunctions. The band alignments are desirable for high performance HBTs. Here an emitter up emitter-base stack 6405 comprising N⁻ emitter ordered InGaP 6402 and a P⁺ Base GeSiSn 5803 structure. The ordered InGaP 6402 may have a conduction band offset $\Delta E_C < 0.2$ eV with the GeSiSn 5803. This emitter-base stack 6405 is then wafer bonded to the N⁻ collector GaN 5804 thus forming a wafer bonded junction 6401 at the base-collector interface. The methodology of wafer bonding this emitter-base stack is described in Exemplary ELO Wafer Bonding Configuration 6A. Note the conduction band offset $\Delta E_C$ may be small through the NPN HBT structure.

InGaP semiconductor can be grown epitaxially and may be latticed matched to GaAs at the composition $In_{0.49}Ga_{0.51}P$. If typically grown at high temperatures, it can grow in an ordered phase where the crystalline structure forms sheets of In—P and Ga—P atoms can alternate in the (001) planes of the FCC unit cell without the intermixing of the Ga and In atoms on the lattice planes. The ordered InGaP results in a small conduction band discontinuity between the InGaP and GaAs and is called the ordered phase (this can be of weakly type I or weakly type II because it is close to zero). With different growth conditions, the In and Ga atoms can intermix and the disordered InGaP phase can form, which has a conduction band offset (0.1 eV vs. 0.03 eV for the ordered phase) with GaAs.

The base can be graded from GeSiSn to GeSn to have electric field enhancement of the charge carriers.

Figure 65:
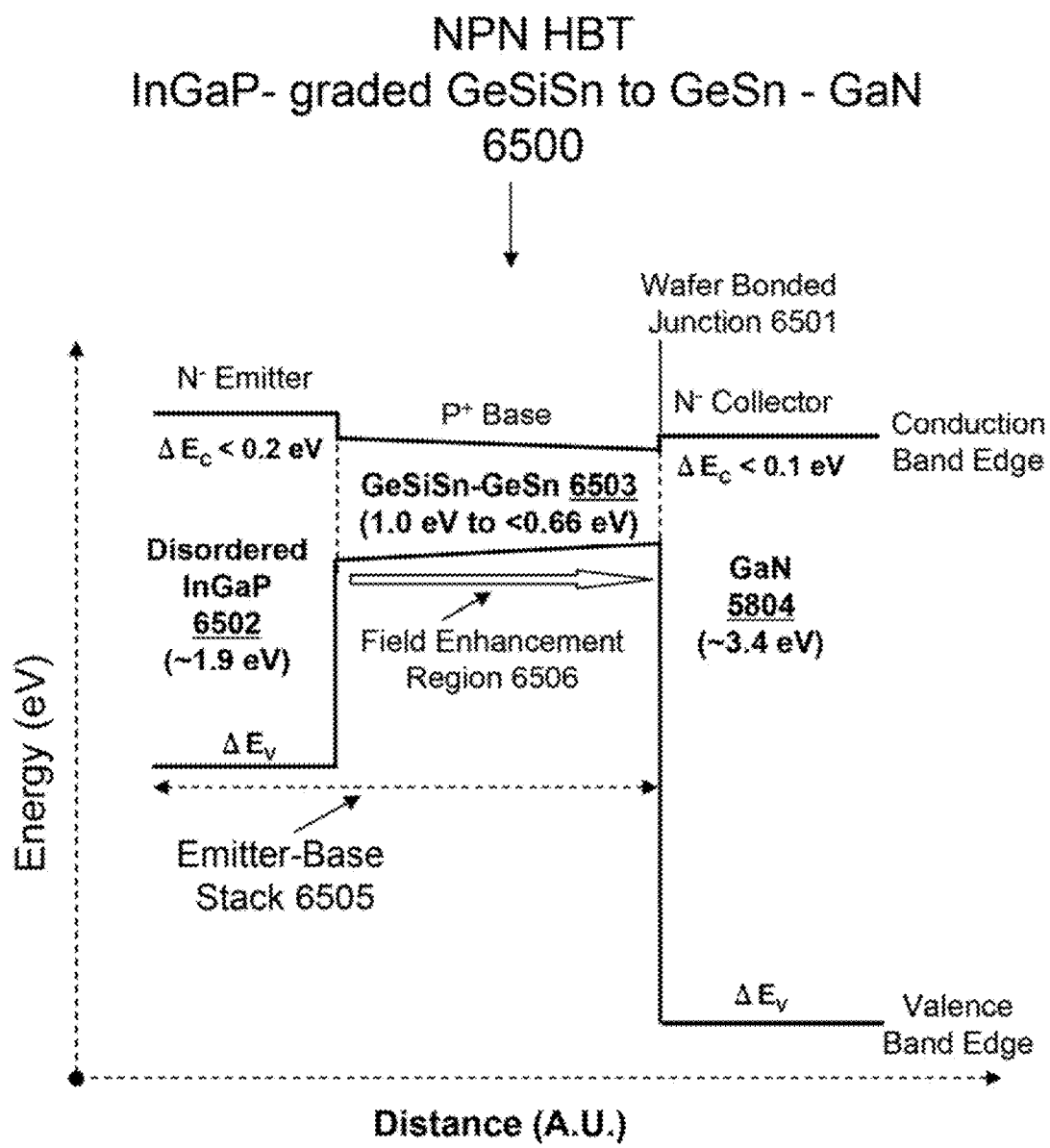
FIG. 65 shows an exemplary flat band energy diagram of an NPN InGaP-graded Ge—GeSn—GaN HBT. The compositionally graded GeSiSn—GeSn base layer can comprise at the emitter-base interface may be lattice matched or near latticed matched or coherently strained $Ge_{1-z}(Si_{0.8}Sn_{0.2})_z$ to GaAs. The GeSiSn compositionally graded by reducing the Si content and increasing Ge content to GeSn at the collector interface. The grading range can go from GeSiSn at the emitter-base junction to GeSn at the base-collector junction at various compositions.

FIG. 65 shows an exemplary flat band energy diagram of the NPN InGaP-graded GeSiSn to GeSn—GaN HBT 6500. Here for variation a base up emitter-base stack 6505 comprising P⁺ Base compositionally graded GeSiSn—GeSn 6503 grown on a N⁻ emitter disordered InGaP 6502 structure. The compositionally graded GeSiSn—GeSn 6503 layer can comprise at the emitter-base interface a lattice matched or near latticed matched or strained $Ge_{1-z}(Si_{0.8}Sn_{0.2})_z$ to GaAs, where the GeSiSn may be compositionally graded by reducing the Si content and increasing Ge content to GeSn at the collector interface. The grading range can go from GeSiSn at the emitter-base junction to GeSn at the base-collector junction at various compositions. This emitter-base stack 6505 is then wafer bonded with the P⁺ Base next to the N⁻ collector GaN 5804 thus forming a wafer bonded junction 6501 at the base-collector interface. Due to the compositional grading of the GeSiSn—GeSn 6503 in the P⁺ Base, there is a field enhancement region 6506 that accelerates the carriers toward the collector. The methodology of wafer bonding the emitter-base stack to the GaN is described in Exemplary Inverted Wafer Bonding Configuration 6B. Note the conduction band offset $\Delta E_C$ may be small through the NPN HBT structure. Note the differences between flat band energy diagrams FIG. 63 with the ordered InGaP and FIG. 64 with disordered InGaP is small.

Exemplary InGaP ($In_{0.49}Ga_{0.51}P$) Emitter Advantages: The large valence band offset between InGaP emitter and GeSiSn base stops back injection of holes into the emitter. This allows for low N-type doping of the emitter and high P-type doping of the base, thus lowering base emitter capacitance while still achieving sizable current gain. The conduction offset between the InGaP and the GeSn base can be less than 0.2 eV, which may be desirable for electron injection into the base layer. Ordered InGaP may have reduced temperature sensitivity to the current gain. InGaP can be latticed matched to GaAs or Ge or GeSiSn (low Sn %), which enables dislocation free growth.

Table 19 shows an exemplary epitaxial structure of NPN InGaP—GeSiSn—GaN HBT grown and wafer bonded. In this structure the GaN is wurtzite hexagonal structure, "a" or "m" plane material. GaN in this form has no polarization charge that degrades the base-collector performance. Non-polar GaN wurzite substrates are illustrated here though one could use SiC, GaAs, Si, sapphire (non-polar and polar forms). GaN (FCC) can also be grown on GaAs which also lacks polarization charge effects.

TABLE 19

Epitaxial Structure of NPN InGaP—GeSiSn—GaN HBT.

| Layer | Layer Name | Description | Comment |
|---|---|---|---|
| 1 | N⁺ Cap | ~1000 Å InGaAs (Te-doped >$10^{19}$ cm⁻³) | |
| 2 | N− Emitter Cap | ~1500 Å GaAs (Si-doped ~5 × $10^{18}$ cm⁻³) | |
| 3 | N− Emitter | ~500 Å InGaP (Si-doped ~3 × $10^{17}$ cm⁻³) | Ordered or disordered |
| 4 | P⁺ Base | ~500 Å $Ge_{1-z}(Si_{0.8}Sn_{0.2})_z$ can be B-doped >$10^{19}$ cm⁻³) 0 < Si % ≤ 40% 0 ≤ Sn % ≤ 10% Thickness range 100 Å-5000 Å | Latticed matched or Can be compositionally graded GeSiSn—GeSn |
| 5 | N− Collector | ~10000 Å Non-polar GaN (Si-doped ~1 × $10^{18}$ cm⁻³) | Wafer bonded to above |
| 6 | N⁺ Sub-Collector | ~5000 Å Non-polar GaN (Si-doped ~5 × $10^{18}$ cm⁻³) | |
| 7 | Substrate | Non-polar GaN N⁺ conducting substrate | Crystalline |

Note
the compositionally graded GeSiSn—GeSn layer can comprise at the emitter-base interface a lattice matched or near latticed matched or strained $Ge_{1-z}(Si_{0.8}Sn_{0.2})_z$ to GaAs, where the GeSiSn may be compositionally graded by reducing the Si content and increasing Ge content to GeSn at the collector interface. The grading range can go from GeSiSn at the emitter-base junction to GeSn at the base-collector junction various compositions.
Note
the dopants listed are only one of many possible dopants, and does preclude the use of other dopants and doping values are only nominal values but can take on many variations. The thicknesses are all exemplary and can take on many different values.

Exemplary Advantages of InGaP—GeSiSn—GaN HBT Technology: The NPN InGaP—GeSiSn—GaN stack minimizes the conduction band offsets, which hinder electron transport (ultra-fast transistor action). The following semiconductor materials may enhance transistor performance: GaN collector, GeSiSn base, InGaP emitter. Wafer bonding allows for the integration of GaN without having to perform lattice-mismatch growth. Wafer bonding is desirable for GaN—GeSiSn because the thermal expansion coefficients are close to each other. Strain effects can be incorporated in this device because the alloy composition of the InGaP can be changed to introduce tensile or compressive strain.

GaN collector for its high saturation velocity and large bandgap energy which results in a high breakdown voltage. In examples described herein, the GaN can be grown on the various substrates like sapphire or various SiC polymorphs or Si or GaAs or GaN or diamond or template substrates. Polar GaN wurtzite structure can be grown on sapphire or SiC (many polytypes: 3C, 4H, 6H, etc.) or Si substrates, or GaN substrates or template substrates and may have piezoelectric and polarization charge. GaN is grown in the wurtzite (hexagonal) phase results in large spontaneous and piezoelectric polarization charge thus possibly creating a potential energy barrier at the wafer-bonded GeSiSn—GaN base/collector interface. Non-polar GaN cubic (FCC) structure can be grown on GaAs or Si or GaN or template substrates. GaN in this form has no polarization charge that degrades the base-collector performance. A cubic form of GaN with (001) orientation can be grown on zinc-blende GaAs. Thus the cubic GaN can be grown on conducting GaAs which can act as the sub-collector. The zinc-blende (cubic) GaN collector has a negligible conduction band offset with respect to the GeSiSn base. The conduction band offset between GaAs and cubic GaN may be roughly $\Delta E_C < 0.1$ eV. Thus the GeSiSn (close to Ge) conduction band offset to GaN may be about $\Delta E_C < 0.1$ eV at the base/collector heterojunction. Non-polar wurtzite forms, are cut from the c-plane growth along the "a" or "m" plane directions. If the GaN is grown along the "m" or "a" plane axis, these polarization effects can be eliminated. Typical GaN wurzite crystals grown along the direction (c-plane) of III-nitrides suffer from polarization induced electric fields. Electric fields do not exist across nonpolar directions (a-plane or m-plane). Thus, high quality non-polar GaN substrate crystals are produced by slicing a c-plane GaN boule along the "a" or "m" plane. Such a material results in low defect density non-polar substrates, which have improved substrates for fabrication of devices. Because Configuration 5A showed the wafer bonding of emitter stack to a polar GaN collector, for this Configuration 5B a non-polar GaN substrate is demonstrated.

The (ordered or disordered) InGaP—GeSiSn emitter base junction has a large valence offset which may be greater than 1.0 eV and a small conduction band offset. This eliminates the back injection of holes to the emitter from the base, which reduces the gain of the transistor. Also because this is a double HBT, the offset voltage in the output characteristic is reduced thus enhancing the power added efficiency. The base is doped heavily P+ (typically $>1\times10^{19}$ cm$^{-3}$), with such high doping of the base, the emitter valence band offset blocks the holes even though the base doping is much higher than the N− emitter doping (low $10^{17}$ cm$^{-3}$).

In some examples, a feature described herein can be the formation of an advanced manufacturing platform to demonstrate a possibly novel transistor semiconductor stack, which cannot be grown with standard crystal growth methodologies. The uniqueness of the device described herein may lie in the small conduction band offset (less than <0.1 eV) through the three different semiconductor materials (InGaP—GeSiSn—GaN) emitter-base-collector may enhance overall HBT performance, which is impossible to grow by standard crystal growth techniques. The parameters that InGaP—GeSiSn—GaN NPN transistor can achieve are the following: double heterojunction, emitter-base, and base collector can reduce offset voltage; high gain (large valence band offset at emitter base junction); high breakdown voltages for improved ruggedness for high power applications; and a short collector structure can result in improved electron transit time.

Exemplary ELO Wafer Bonding Configuration 6A: Fabrication of InGaP Emitter-GeSiSn Base-GaN Collector double HBT as an example of the ELO wafer bonding device fabrication process. For Configuration 6A an epitaxial lift off (ELO) process and wafer bonding can be used to fabricate the emitter/base stack to the GaN collector. Epitaxial lift off and wafer bonding process is a quick-turn method for integration of fabricated GeSiSn devices to be joined on the GaN substrate. Combining the techniques of epitaxial lift off and wafer bonding releases the restrictions of lattice matching imposed by epitaxial growth and opens new degrees of freedom for the design of semiconductor devices, because the combination of unique properties of different materials becomes possible.

Figure 66:
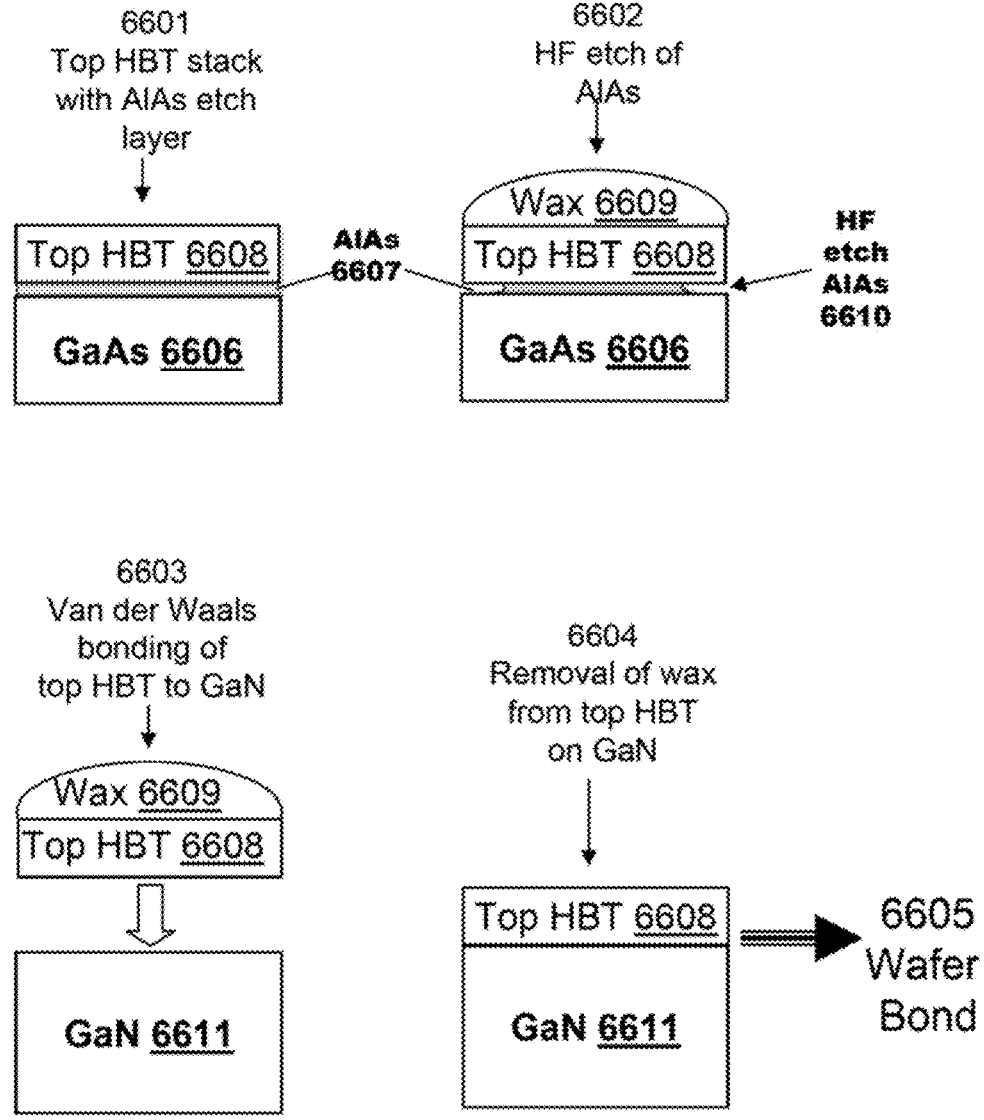
FIG. 66 shows a schematic methodology of the epitaxial lift off (ELO) process.

FIG. 66 shows a schematic methodology of the epitaxial lift off process 6600. An epitaxial layer stack top HBT 6608 (pre-processed top half of the HBT device: InGaP emitter/GeSiSn base stack) is grown on a sacrificial GaAs 6606 substrate with a thin aluminum arsenide (AlAs 6607) etch layer inserted in between the two layers. The top HBT 6608 is covered with wax 6609 for mechanical strength. This thin AlAs separation layer 6607 is removed by etching in hydrofluoric acid (HF etch AlAs 6610) in order to lift off the epitaxial layers from the GaAs 6606 substrate. The wax 6609 protecting the top HBT 6608 without the GaAs 6606 substrate is then transferred onto a new substrate like GaN 6611 via Van der Waals forces. This technique allow for the clean and flat surfaces of two dissimilar materials to be brought into close proximity where attractive forces pull them together, forming an intimate contact between different materials. The strength of the adhesion depends on the type of interaction. Van der Waals forces provide the first step of attraction. The bonding strength can be increased in the materials by wafer bonding at elevated temperatures. FIG. 66 which demonstrates an exemplary epitaxial lift off (ELO) process 6600 can be described as follows: (6601) epitaxial HBT stack layer growth with AlAs separation layer 6607, top HBT 6608 on GaAs 6606 with AlAs 6607; (6602) Wax 6609 covers top HBT 6608, epitaxial lift off by HF etch AlAs 6610 removes AlAs 6607 and releases the top layer off of GaAs 6606 substrate; (6603) Van der Waals bonding by surface tension of the top HBT 6608 to GaN 6611 substrate; (6604) removal of wax from top HBT 6608 on GaN 6611; and (6605) then wafer bonding to further strengthen the top HBT/GaN monolithic structure.

Exemplary details of device fabrication and growth of ELO top half (example: InGaP—GeSiSn—GaN HBT).

FIG. 67 shows the schematic of the top half of the HBT InGaP emitter/GeSn base stack 6701 with the inclusion of the AlAs separation layer 6703. Note the separation layer could be AlGaAs from 40% to 100% Al. The top half of the HBT InGaP emitter/GeSn base stack 6701 comprises: a sacrificial GaAs substrate 6702; AlAs separation layer 6703; P+ GeSiSn Base 6704; N− InGaP emitter 6705; N+ GaAs contact 6706 epitaxial stack. This top half of the HBT InGaP emitter/GeSn base stack 6701 is then wafer bonded to the GaN collector stack 6707. The GaN collector stack 6707 comprises a starting N+ SiC 4H substrate 6708, with an N+ SiC sub-collector 6709, then finally an N− GaN collector 6710. There could be many different variations of the GaN collector stack 6707, such as growth on GaN, Si, GaAs, sapphire substrates, or template substrates.

Table 20 shows an exemplary structure top half of the HBT InGaP emitter/GeSiSn base stack 6701.

TABLE 20

Exemplary structure top half of the HBT InGaP emitter/GeSn base stack 6701.

| Layer | Layer Name | Description | Comment |
|---|---|---|---|
| 1 | N⁺ Cap (non-alloyed) | ~1,000 Å InGaAs (Te-doped >$10^{19}$ cm⁻³) | |
| 2 | N− Emitter Cap | ~1500 Å GaAs (Si-doped ~5 × $10^{18}$ cm⁻³) | |
| 3 | N− Emitter | ~500 Å $In_{0.49}Ga_{0.51}P$ (Si-doped ~3 × $10^{17}$ cm⁻³) | Ordered or disordered |
| 4 | P⁺ Base | ~500 Å $Ge_{1-z}(Si_{0.8}Sn_{0.2})_z$ can be B-doped >$10^{19}$ cm⁻³ 0 < Si % ≤ 40% 0 ≤ Sn % ≤ 10% Thickness range 100 Å-5000 Å | Latticed matched or Can be compositionally graded GeSiSn—GeSn |
| 5 | Separation | ~50 Å AlAs | Layer removed |
| 6 | High Purity Buffer | ~500 Å GaAs (un-doped) | |
| 7 | Sacrificial | GaAs Semi-insulating or conducting | Substrate |

Note
the dopants listed are only one of many possible dopants, and does preclude the use of other dopants and doping values are only nominal values but can take on many variations. The thicknesses are all exemplary and can take on many different values.

Table 21 shows an exemplary GaN collector structure 6707. Note that the GaN collector can be grown on Si, SiC, GaAs, Sapphire, GaN, etc., substrates.

Table 22 shows an exemplary GaN collector structure 6707 with a seed adhesion layer which can be GeSiSn, AlN, AlGaN, InGaN or InAlN. An exemplary SiC collector structure could also be used as shown by the Table 23.

TABLE 21

Exemplary GaN Collector Structure 6707.

| Layer | Layer Name | Description | Comment |
|---|---|---|---|
| 1 | N⁻ Collector | ~10,000 Å GaN (Si-doped ~1 × $10^{16}$ cm⁻³) | Wurtzite phase |
| 2 | N⁺ Sub-Collector | ~5,000 Å 4H SiC (N-doped ~5 × $10^{18}$ cm⁻³) | Standard (nitrogen doped) |
| 3 | N⁺ Buffer | ~500 Å 4H SiC | |
| 4 | | 4H SiC (conducting substrate) | N⁺ substrate: other phases of SiC possible |

TABLE 22

Exemplary GaN Collector Structure 6707 with adhesion layers

| Layer | Layer Name | Description | Comment |
|---|---|---|---|
| 1 | Seed adhesion layer or electrical performance enhancement layer | ~50 Å GeSiSn (undoped or p-doped or n-doped Or InAlN Or AlN Or AlGaN Or InGaN Or InN | Thickness range 10-5000 Å |
| 2 | N⁻ Collector | ~10,000 Å GaN (Si-doped ~1 × $10^{16}$ cm⁻³) | Wurtzite phase |
| 3 | N⁺ Sub-Collector | ~5,000 Å 4H SiC (N-doped ~5 × $10^{18}$ cm⁻³) | Standard (nitrogen doped) |
| 4 | N⁺ Buffer | ~500 Å 4H SiC | |
| 4 | | 4H SiC (conducting substrate) | N⁺ substrate: other phases of SiC possible |

TABLE 23

Exemplary SiC Collector Structure.

| Layer | Layer Name | Description | Comment |
|---|---|---|---|
| 1 | Seed adhesion layer or electrical performance enhancement layer | ~50 Å GeSiSn (undoped or p-doped or n-doped) Or InAlN Or AlN Or AlGaN Or InGaN Or InN. | Thickness range 10-5000 Å |
| 2 | N$^-$ Collector | ~10,000 Å SiC (N-doped ~1 × 10$^{16}$ cm$^{-3}$) | nitrogen-doped |
| 3 | N$^+$ Sub-Collector | ~5,000 Å 4H or 6H SiC (N-doped ~5 × 10$^{18}$ cm$^{-3}$) | Standard (nitrogen doped) |
| 4 | N$^+$ Buffer | ~500 Å 4H or 6H SiC | |
| 5 | | 4H or 6H SiC (conducting substrate) | N$^+$ substrate: other phases of SiC possible. |

From this point the device to wafer bonded can be pre-processed or post-processed. For this first exemplary configuration the ELO device demonstrated is pre-processed (device has been partially fabricated). The pre-processed top half of HBT is covered in a "black wax" (Apiezon W) or "white wax" (crystal bond) or other type of adhesive. In some examples, it is useful to place a mechanical holder like an exemplary sapphire mechanical substrate to the wax for rigidity and a mechanical strength. The separation AlAs layer is undercut in hydrofluoric HF acid and deionized water at room temperature at various ratios. After release the etchant is diluted with de-ionized water, the wax-covered ELO structure is moved to the GaN substrate where Van der Waals bonding occurs. In various embodiments, the adhesion process is handled in water to minimize contamination of the surfaces.

FIG. 68 shows a pre-processed top half of the HBT which comprises the N$^+$ GaAs contact 6706; N$^-$ InGaP emitter 6705; P$^+$ GeSiSn base 6704; AlAs separation layer 6703 on GaAs substrate 6702; mesa device structure with emitter contact 6801; and base contact 6802. Next comes the HF etch of AlAs and ELO 6807 step. Before etching the device, an adhesive like wax 6808 is melted on pre-processed fabricated Top Half of HBT 6800 and sometimes it can be useful to have a mechanical substrate 6810 place on the wax for mechanical strength. This can be useful in large wafer devices (2", 3", 4", 6", 12", 18", etc., wafer sizes and not only limited to these sizes). For the ELO process the wax 6808 coated pre-processed fabricated Top Half of HBT 6800 assembly is placed into a solution of anhydrous hydrofluoric (HF) acid and over time the wax coated top half of the HBT 6809 is removed from the sacrificial GaAs substrate 6702. The solution can be heated and temperature controlled, the lift off process time depends on area of the device, and can take from several minutes to many hours. Once the sample is lift off, the wax provides for mechanical strength of the lifted off layer and allows for ease of transport to the GaN substrate.

FIG. 69 shows where the top half of HBT wafer bonded to collector structure 6901, which comprises the wax coated top of the HBT 6809 placed on the GaN collector structure 6707 with van der Waals bonding. Note the GaN collector could have a layer to electrically enhance performance, which can be deposited by PLD any other epitaxial process. There are many other seed layers that could be used for this purpose. The seed layer could be used for adhesion or modifying the electrical interface properties of the heterojunction to improve performance or reliability. Some seed layers that may be used are GeSiSn, AlN, AlGaN, InAlN, InGaN, InN.

Initially, the wax coated top of the HBT 6809 placed on the GaN collector structure 6707 with van der Waals bonding results in the adhesion of these layers. The structure can be put into trichloroethylene or acetone or some solvent to remove the wax, which then forms the wafer bonded HBT 6902. To finalize the device for test, a bottom metal contact 6903 is applied to the N$^+$ SiC 4H substrate 6708. The final wafer bonded structure can then be placed in a wafer bonder, and under heat and pressure, stronger bond formation between the top half of the HBT and the GaN collector structure 6707 should result for a permanent final structure. Finally, bottom metallization of the structure allows for the testing of this heterojunction bipolar structure for DC testing in a standard emitter-base-collector configuration.

Exemplary Inverted Wafer Bonding Configuration 6B: Device Fabrication & Growth of inverted top half of the GeSiSn base HBT for wafer bonding and post-processing. It can be useful to use an inverted top of the HBT for wafer bonding.

Figure 70:
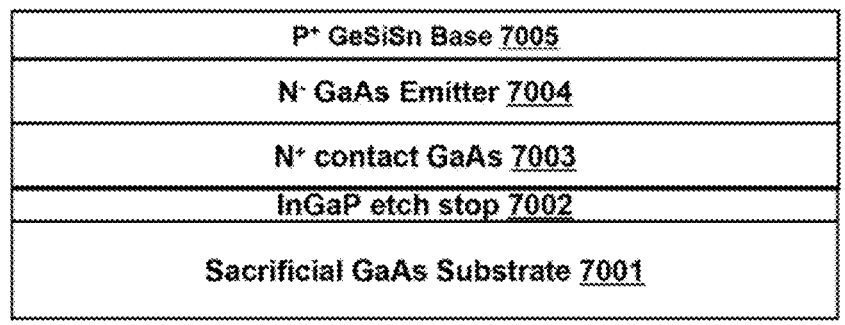
FIG. 70 shows an inverted top half of an HBT with GeSiSn base region.

FIG. 70 shows an inverted top half of HBT 7000. This comprises growth on a sacrificial GaAs substrate 7001; followed by a latticed matched InGaP etch stop 7002; then an N$^+$ contact GaAs 7003; then an N$^-$ GaAs emitter 7004; and then the P$^+$ GeSiSn base 7005. Table 24 shows an exemplary design of the structure.

TABLE 24

Exemplary epitaxial structure of the inverted top half of HBT.

| Layer | Layer Name | Description | Comment |
|---|---|---|---|
| 1 | P$^+$ Base | ~500 Å Ge$_{1-z}$(Si$_{0.8}$Sn$_{0.2}$)$_z$ can be B-doped >10$^{19}$ cm$^{-3}$ 0 < Si % ≤ 40% 0 ≤ Sn % ≤ 10% Thickness range 100 Å-5000 Å | Latticed matched or Can be compositionally graded GeSiSn—GeSn |

TABLE 24-continued

Exemplary epitaxial structure of the inverted top half of HBT.

| Layer | Layer Name | Description | Comment |
|---|---|---|---|
| 2 | N− Emitter | ~500 Å In$_{0.49}$Ga$_{0.51}$P (Si-doped ~3 × 10$^{17}$ cm$^{-3}$) | Ordered or disordered |
| 3 | N− Emitter Cap | ~1500 Å GaAs (Si-doped ~5 × 10$^{18}$ cm$^{-3}$) | |
| 4 | N+ Contact | ~1000 Å GaAs (Si-doped ~5 × 10$^{18}$ cm$^{-3}$) | |
| 5 | | ~50 Å InGaP | Stop Etch |
| 6 | High Purity Buffer | ~500 Å GaAs | UID |
| 7 | Sacrificial | GaAs substrate | Semi-insulating or conducting |

FIG. 71 shows the straightforward wafer bonding 7101 of the inverted top half of HBT 7000 to the GaN collector structure 6707. This step shows the final wafer bonded structure 7102 and removal of the sacrificial GaAs substrate and InGaP stop etch. The wafer bonded junction occurs at the P+ GeSiSn base to the N− GaN collector. The wafer bonding process would occur under heat, pressure, time, current/voltage bias, gaseous environment, etc. The final step is the wafer bonded structure and removal of sacrificial GaAs substrate 7001 and InGaP Stop etch 7002. Thus, after wafer bonding, the sacrificial GaAs substrate 7001 and InGaP etch stop 7002 would be removed by lapping (thinning) and then etching to the InGaP etch stop layer. This leaves the final epitaxial wafer bonded HBT structure 7103.

Figure 72:
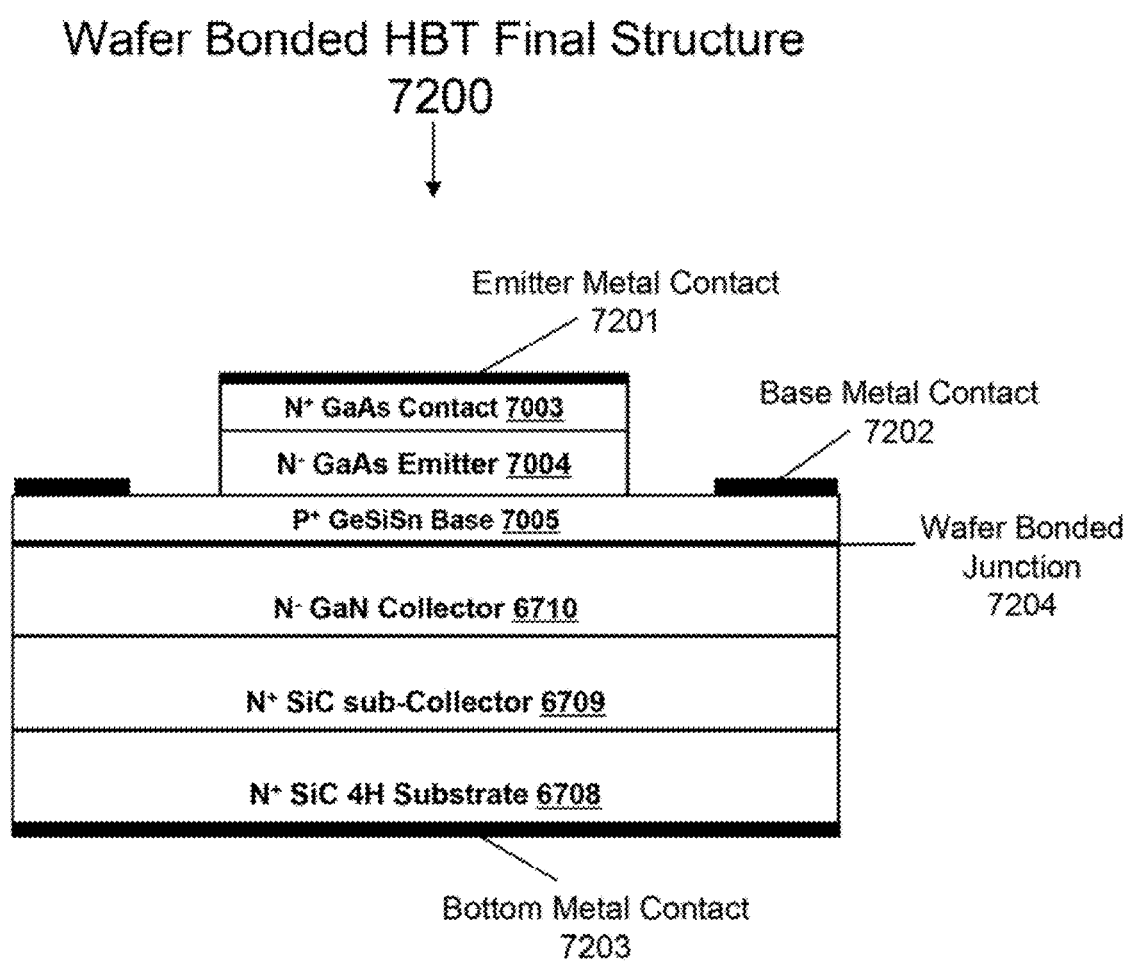
FIG. 72 shows a cross-sectional device depiction of a wafer bonded HBT structure, where the GeSiSn base region is wafer bonded to the GaN collector.

FIG. 72 shows the post-processing of final epitaxial wafer bonded HBT structure 7103, where a standard quick lot HBT device fabrication procedure can be used to test the HBT. The device fabrication of the structure relies on standard GaAs fabrication techniques because the wafer bonded junction 7204 never gets exposed to any of the chemical processes. This standard device processing technology is used for the fabrication of HBTs and can be generally used for all the different configurations previously elucidated. This HBT test mask set provides immediate feedback for fine tuning the growth process HBT device fabricated using a Quick lot mask set. There are many methodologies for the fabrication of the HBT. One possible version is to apply photoresist across the surface of the HBT structure 7103. A photomask is placed on the photoresist surface and exposed with UV light which imprints a pattern of the emitter metal contact 7201 across the surface. Next, the HBT structure 7103 with exposed photoresist is put into a developer solution. The pattern is developed and then metal is blanket coated across the surface using a metal evaporator. The whole structure is put into acetone which dissolves the photoresist leaving only emitter metal contact 7201 pattern across the top of the N+ GaAs contact 7003.

The emitter metal contact 7201 then can act as a metal mask for mesa etching the HBT structure 7103 down to the P+ GeSiSn Base 7005. Here, photoresist is spun all over the mesa etched structure. With a photomask that has base metal contact 7202 pattern is placed on the photoresist. The photomask covering the photoresist is subsequently exposed with UV light and then developed to open a pattern where the base metal contact 7202 can be deposited on the P+ GeSiSn base 7005. Typically a metal evaporator deposits blanket metal all over the surface of the mesa etched structure. The structure is then put in acetone for metal lift off, thus resulting in a pattern of base metal contact 7202 on the P+ GeSiSn Base 7005.

Next, back metallization or the bottom metal contact 7203 is applied to the N+ SiC 4H substrate 6708. FIG. 72 shows the final wafer bonded HBT structure 7200. Sometimes the HBT device needs to be alloyed at elevated temperature to activate the metal contacts. The device is ready for DC testing.

Typical parameters that are measured and used to qualify the HBT materials are sheet resistance of the emitter, base and sub-collector by both TLM and van Der Pauw cross structures. Various sized HBTs (emitter sizes are 40×40, 50×50, 75×75, 100×100 μm$^2$) are used to determine effects of geometry to device parameters such as Gummel, Gain, Output Characteristics and breakdown voltages.

Exemplary Configuration 7: NPN GaAs Emitter-GeSiSn Base-GaN (or SiC) Collector Double heterojunction with all dissimilar materials which may have a small Conduction Band Offset between Emitter-Base-Collector. GaAs—GeSiSn—GaN heterojunction bipolar transistor (HBT), as described herein, embodies RF power output, ruggedness, high bandwidth and good linearity, and when combined with low turn-on voltage is desirable for minimizing power consumption. The arrangement of materials described herein combines high transconductance, enormous breakdown voltage (GaN collector), and a desirable emitter-base heterojunction (wide bandgap GaAs emitter on a narrow bandgap GeSiSn high conductivity p-type base). The huge breakdown field of GaN may allow the use of short collector devices with high bandwidths (cut-off frequency f$_T$ and maximum oscillation frequency f$_{max}$).

A combination of semiconductors for transistors by utilizing a favorable conduction band alignment between the emitter-base-collector junctions, thus forming a possibly enhanced heterojunction bipolar transistor: A small conduction band offset may exist between GaAs (emitter)-GeSiSn (base)-GaN (collector). The P-type GeSiSn base may be lattice matched to N-type GaAs emitter (GeSiSn/GaAs stack). GaN collector can be grown on different N+ substrates. Monolithic integration of materials by wafer bonding of GeSiSn/GaAs stack wafer to the N-type GaN collector (circumvents large lattice mismatched growth).

The monolithic GaAs—GeSiSn—GaN stack may have a small conduction band offset through the device. This property allows for the formation of heterojunction transistor structure that can have large gain (large valence band offset between GaAs emitter and GeSiSn base). These materials allow for a low base sheet resistance, low turn-on voltage, and large breakdown voltage (GaN has large breakdown electric field strength and high saturated velocity). These material characteristics make for a desirable bipolar transistor. The GaAs—GeSiSn—GaN materials stack may be desirable for making NPN HBTs that can significantly outperform standard high power GaN transistors.

Figure 73:
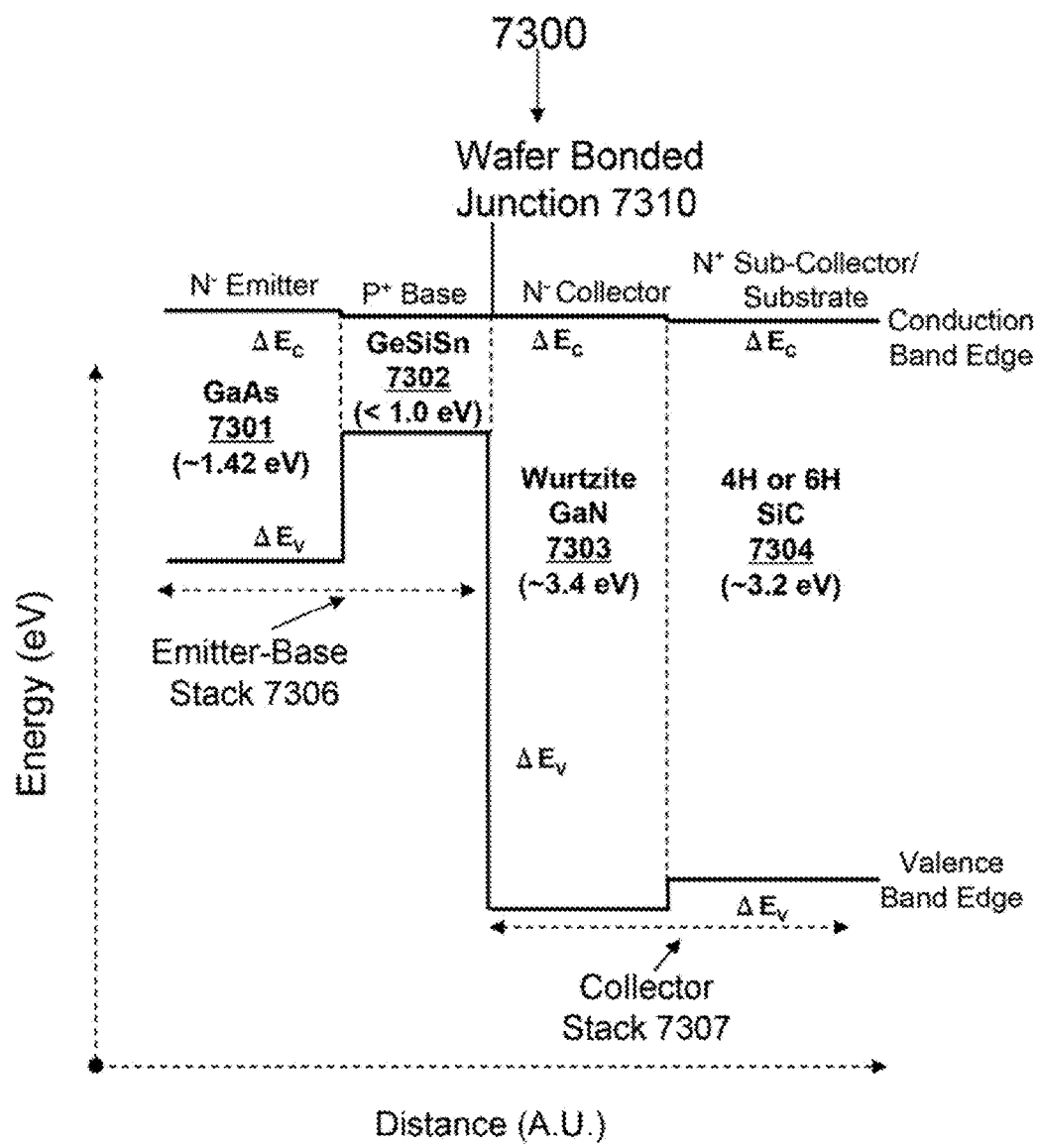
FIG. 73 shows an exemplary flat band energy diagram of an NPN GaAs emitter-GeSiSn base-wurtzite GaN collector.

FIG. 73 shows an exemplary flat band energy diagram of the NPN GaAs Emitter-GeSiSn Base-GaN (or SiC) Collector Double heterojunction with all dissimilar materials having a small conduction band offset between the Emitter-Base-Collector. Here an emitter up emitter-base stack 7306 comprising of N⁻ emitter GaAs 7301 and P⁺ base GeSiSn 7302 structure. The full monolithic structure can be formed using an epitaxial lift off (ELO) procedure. This emitter-base stack 7306 is wafer bonded to collector stack 7307 thus forming a wafer bonded junction 7310 at the base-collector interface. The wurtzite N⁻ collector GaN 7303 can be grown on 4H or 6H (or other variations) N⁺ sub-collector SiC 7304, and comprise the collector stack 7307. Possible methodologies of wafer bonding this emitter-base stack 7306 to the collector stack 7307 is described in Exemplary ELO Wafer Bonding Configuration 6A and in Exemplary Inverted Wafer Bonding Configuration 6B. Note the conduction band offset $\Delta E_C$ may be small through the NPN HBT structure. The band diagram of this new material structure with small conduction band offsets between interfaces and a large valence band offset at the emitter-base heterojunction allows for electrons to be easily injected from the GaAs emitter through the Ge base to the GaN collector. Note a GeSn base can be used in this configuration.

To form such a structure, the interface between the base-emitter stack 7306 and the collector stack 7307 can require wafer bonding, because the lattice constants of the base material and collector material are highly lattice mismatched.

An exemplary structure that could be grown and wafer bonded is illustrated in the following table. Table 25 shows an exemplary epitaxial structure of an NPN GaAs—GeSiSn-Hexagonal GaN wafer bonded HBT. In this structure, the GaN is grown on SiC which is a typical substrate for the growth and one of the many described substrates that can be used. SiC is preferred for high power electronics because it has the highest thermal conductivity between GaN, Si, GaAs and sapphire the other primary substrates for GaN. In this structure, GaN can be grown on wurtzite GaN or 4H SiC, or other SiC polymorphs or GaN or Si or Sapphire or Diamond or GaAs substrates.

Figure 74:
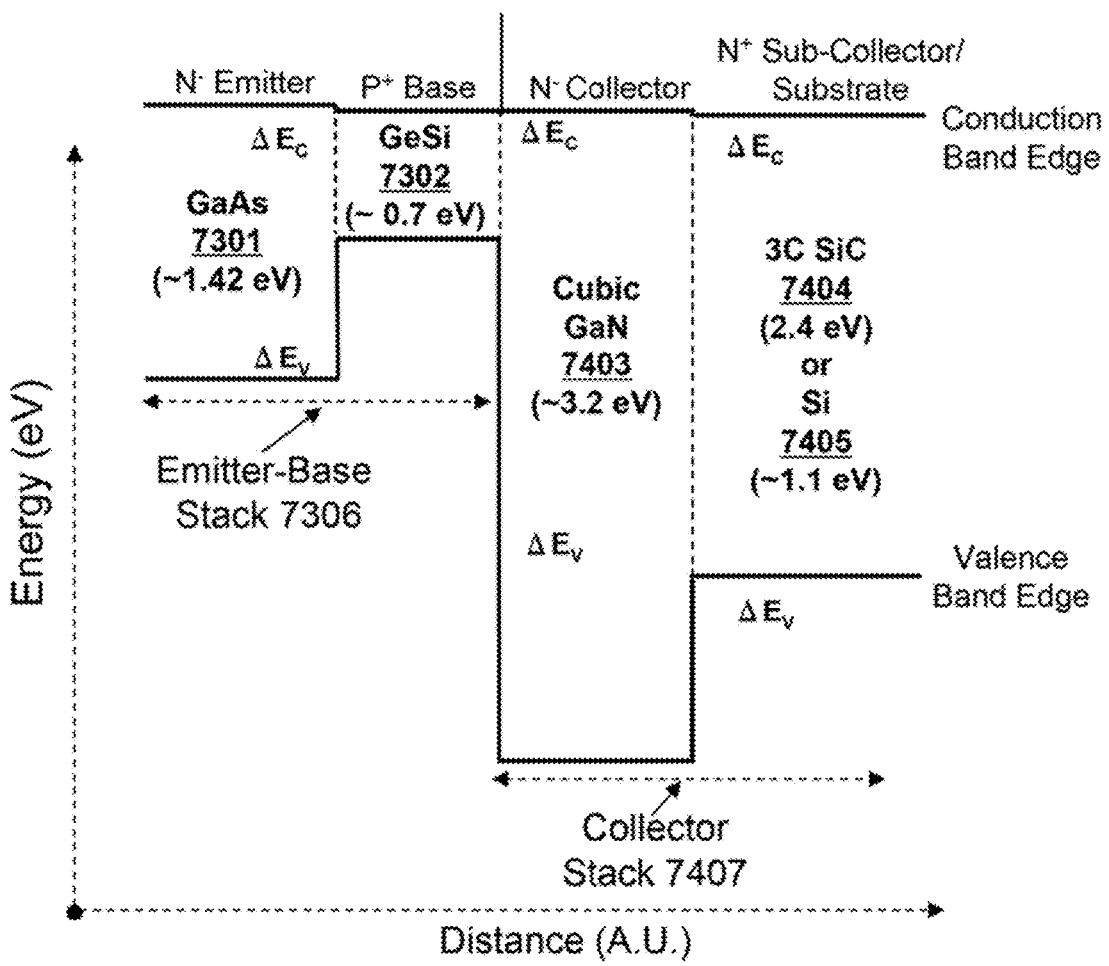
FIG. 74 shows an exemplary flat band energy diagram of an NPN GaAs emitter-GeSi base-cubic GaN collector.

FIG. 74 shows an exemplary flat band energy diagram of the NPN GaAs Emitter-GeSi Base-GaN Collector 7400 (or SiC Collector) Double heterojunction with all dissimilar materials having a small conduction band offset between Emitter-Base-Collector. Here an emitter up emitter-base stack 7306 comprising of N⁻ emitter GaAs 7301 grown on P⁺ base GeSi 7302 structure. The full monolithic structure can be formed using an epitaxial lift off (ELO) procedure. This emitter-base stack 7306 is wafer bonded to collector stack 7407 thus forming a wafer bonded junction 7410 at the base-collector interface. The cubic N⁻ collector GaN 7403 can be grown on 3C (or other variations) N⁺ sub-collector SiC 7404 (or an N⁺ sub-collector Si 7405), and can comprise the collector stack 7407. Possible methodologies of wafer bonding this emitter-base stack 7306 to the collector stack 7407 is described in Exemplary ELO Wafer Bonding Configuration 6A and in Exemplary Inverted Wafer Bonding Configuration 6B. Note the conduction band offset $\Delta E_C$ may be less than 0.1 eV through the NPN HBT structure. The band diagram of this new material structure may have a small conduction band offsets between interfaces and a large valence band offset at the emitter-base heterojunction allows for electrons to be easily injected from the GaAs emitter through the GeSi base to the GaN collector.

To form such a structure the interface between the base-emitter stack 7306 and the collector stack 7407 can require wafer bonding, because the lattice constants of the base material and collector material are highly lattice mismatched.

GaN in the cubic form has no polarization charge that degrades the base-collector performance. GaN (FCC) can also be grown on Si substrates or on template substrates that are commercially available. Table 26 shows an exemplary

TABLE 25

Epitaxial Structure of NPN GaAs—Ge-Hexagonal GaN HBT.

| Layer | Layer Name | Description | Comment |
|---|---|---|---|
| 1 | N⁺ Cap (non-alloyed) | ~1000 Å InGaAs (Te-doped >$10^{19}$ cm⁻³) | Standard |
| 2 | N⁻ Emitter Cap | ~1500 Å GaAs (Si-doped ~5 × $10^{18}$ cm⁻³) | Standard |
| 3 | N⁻ Emitter | ~500 Å GaAs (Si-doped ~3 × $10^{17}$ cm⁻³) | Standard (InGaP can also be used as the emitter) |
| 4 | P⁺ Base | ~500 Å Ge$_{1-z}$(Si$_{0.8}$Sn$_{0.2}$)$_z$ can be B-doped >$10^{19}$ cm⁻³ <br> 0 < Si % ≤ 40% <br> 0 ≤ Sn % ≤ 10% <br> Thickness range 100 Å-5000 Å | Latticed matched or Can be compositionally graded GeSiSn—GeSn |
| 5 | N⁻ Collector | ~10000 Å GaN (Si-doped ~1 × $10^{16}$ cm⁻³) | Wafer bonded to above |
| 6 | N⁺ Sub-Collector | ~5000 Å 4H SiC (N-doped ~5 × $10^{18}$ cm⁻³) | Standard (nitrogen doped) |
| 7 | N⁺ Buffer | ~500 Å 4H SiC | Standard |
| 8 | | 4H or 6H SiC (conducting substrate) | N⁺ Substrate: Excellent thermal conductivity |

Note the dopants listed are only one of many possible dopants, and does preclude the use of other dopants and doping values are only nominal values but can take on many variations. The thicknesses are all exemplary and can take on many different values.

In other examples, there is a cubic form of GaN that can be used in the HBT device structure. The GaN can be grown face centered cubic (FCC) on 3C SiC. GaN in this form can have no polarization charge that degrades the base-collector performance. GaN (FCC) can also be grown on Si substrates or on template substrates that are commercially available. Ge$_{0.98}$Si$_{0.02}$ can be latticed matched to GaAs and may have a bandgap energy of approximately 0.7 eV (ranging from 0.67 eV to 0.72 eV).

epitaxial structure of an NPN GaAs—GeSiSn-Cubic GaN wafer bonded HBT. In this structure, the GaN is grown on SiC which is a typical substrate for the growth and one of the many described substrates that can be used. SiC is preferred for high power electronics because it has the highest thermal conductivity between GaN, Si, GaAs and sapphire the other primary substrates for GaN. In this structure, GaN can be grown on cubic GaN or 3C SiC or Si or other SiC polymorphs or Sapphire or Diamond or GaAs.

TABLE 26

Epitaxial Structure of NPN GaAs—GeSiSn-Cubic GaN HBT.

| Layer | Layer Name | Description | Comment |
|---|---|---|---|
| 1 | N⁺ Cap (non-alloyed) | ~1000 Å InGaAs (Te-doped >$10^{19}$ cm$^{-3}$) | Standard |
| 2 | N⁻ Emitter Cap | ~1500 Å GaAs (Si-doped = 5 × $10^{18}$ cm$^{-3}$) | Standard |
| 3 | N⁻ Emitter | ~500 Å GaAs (Si-doped = 3 × $10^{17}$ cm$^{-3}$) | Standard (InGaP can also be used as the emitter) |
| 4 | P⁺ Base | ~500 Å Ge$_{1-z}$(Si$_{0.8}$Sn$_{0.2}$)$_z$ can be B-doped >$10^{19}$ cm$^{-3}$ 0 < Si % ≤ 40% 0 ≤ Sn % ≤ 10% Thickness range 100 Å-5000 Å | Latticed matched or Can be compositionally graded GeSiSn—GeSn |
| 5 | N⁻ Collector | ~10000 Å GaN (Si-doped ~1 × $10^{16}$ cm$^{-3}$) | Wafer bonded to above |
| 6 | N⁺ Sub-Collector | ~5000 Å 3C SiC (N-doped ~5 × $10^{18}$ cm$^{-3}$) | Standard (nitrogen doped) |
| 7 | N⁺ Buffer | ~500 Å 3C SiC | Standard |
| 8 |  | 3C SiC (conducting substrate) | N⁺ Substrate: Excellent thermal conductivity |

Note
the dopants listed are only one of many possible dopants, and does preclude the use of other dopants and doping values are only nominal values but can take on many variations. The thicknesses are all exemplary and can take on many different values. The substrate may be other SiC polymorphs or other substrates such as GaN or Si or Sapphire or Diamond or GaAs.

In various embodiments, a thin GeSiSn or InAlN, or AlN or AlGaN, or InN, or InGaN layer can be put on the GaN to promote adhesion of the wafer bonding of the GeSiSn to the GaN. This thin film can be grown epitaxially by Metalorganic chemical vapor deposition (MOCVD), molecular beam epitaxy (MBE), pulsed laser deposition (PLD), or other forms of deposition.

The device described herein, a GaAs (emitter)/GeSiSn (base) wafer bonded to four different varieties of GaN collector structures (GaN/GaN, GaN/SiC, GaN/Sapphire, GaN/Si), may result in a possibly a better collector structure. GeSiSn can be an desirable base layer due to its low bandgap energy and the fact it has the highest hole mobility of any semiconductor.

GaAs Emitter Advantages (InGaP can also be used as the emitter with similar advantages): The large valence band offset between GaAs emitter and GeSiSn base stops back injection of holes into the emitter. This allows for low n-type doping of the emitter and high p-type doping of the base, thus lowering base emitter capacitance while still achieving sizable current gain. GeSiSn can be latticed matched to GaAs which enables dislocation free growth. The use of AlGaAs or disordered or ordered InGaP emitter could also be used in this device structure.

GeSiSn Base Advantages: GeSiSn can have a low bandgap which results in low turn-on voltage. GeSiSn can have a high hole mobility and acceptors can be incorporated to high density, thus the base can be made ultra-thin while maintaining a low base sheet resistance which increases current gain and decreases electron transit time. GeSiSn may have shallow acceptors, so the hole concentration is generally equal to the acceptor doping level and independent of temperature. The low base sheet resistance results in a high $f_{max}$. The surface recombination velocity may be low for p-type GeSiSn.

GaN Collector Advantages: GaN has a large lattice mismatch with Ge, thus wafer bonding circumvents the problem of growing strained and incompatible layers. GaN collector can be grown on: (1) lattice matched GaN, (2) 4H SiC, 6H SiC, (3) sapphire, (4) 3C SiC (cubic GaN eliminates the polarization charge that arises in Wurzite GaN), (5) on Si, or (6) other substrates. GaN has high breakdown field which is excellent for the collector breakdown voltage. SiC has many polytypes and only a few have been listed above. GaN has a small conduction band offset with Ge, thus small blocking field at the interface. GaAs—Ge—GaN material structure avoids the use of ternary alloy semiconductors thereby eliminating alloy scattering of electrons. The GeSiSn base at low Si and Sn percents may have all the advantages of the Ge base. GaN collector significantly increases the overall thermal conductivity of the material structure. GaN has a high saturation velocity thus electrons travel without intervalley scattering. GaN power maximum capability may have 572 times greater than that of Si and may have 60 times greater than that of GaAs.

Figure 75:
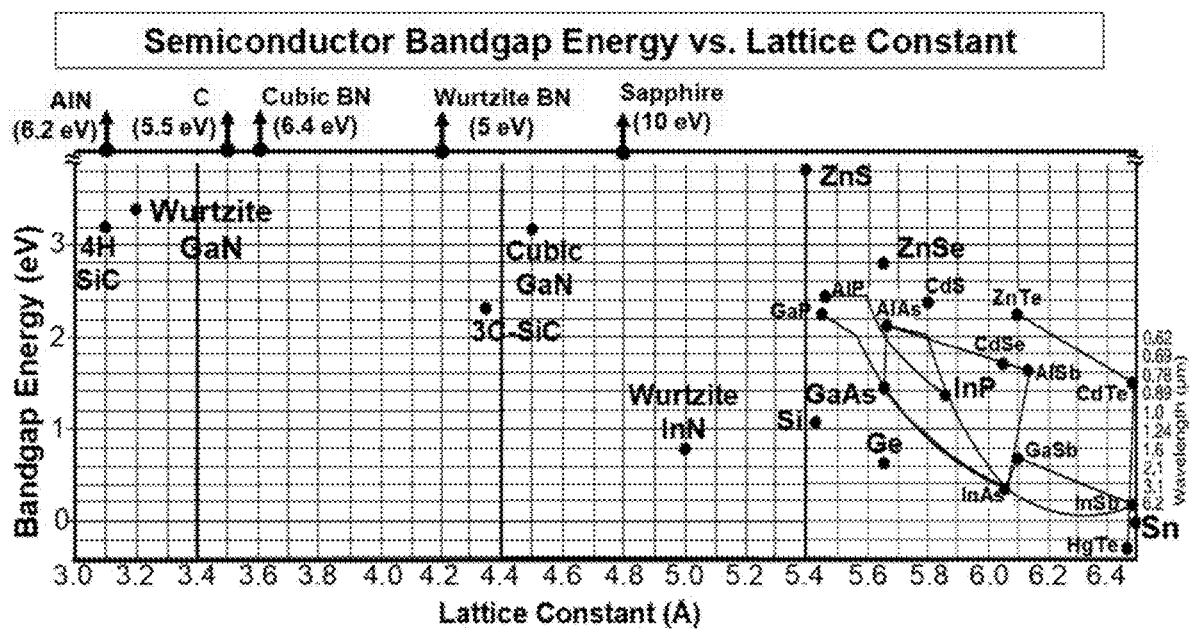
FIG. 75 shows various bandgap energies of semiconductor materials as a function of lattice constant.

FIG. 75 shows bandgap energies of various semiconductors as a function of the lattice constant. It can be readily seen that new types of semiconductor devices could be formed if the lattice matching constraints were eliminated. It would then be possible to fabricate heterojunctions based on the materials characteristics instead of those constrained to near lattice constant materials. It is with this aim that manufacturing wafer bond methodologies can be used to join dissimilar materials to form possibly enhanced state-of-the-art devices.

Ge$_{0.98}$Si$_{0.02}$ can be latticed matched to GaAs and may have a bandgap energy of 0.7 eV (ranging from 0.67 eV to 0.72 eV). GeSi base can significantly decrease transistor turn-on voltage and thereby increase the power added efficiency of the device. The GaAs—GeSi—GaN structure described herein can have the a low turn-on voltage.

Figure 76:
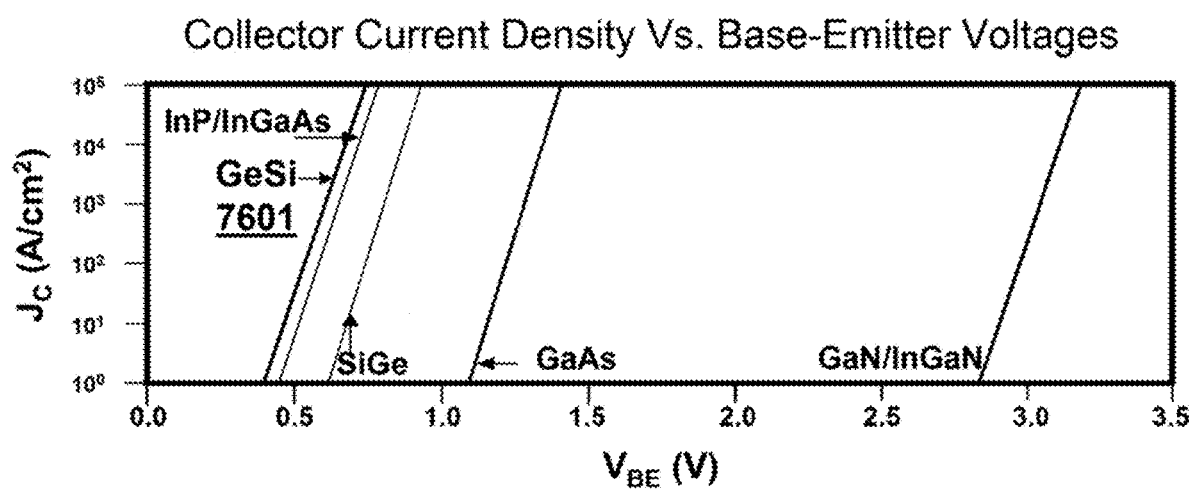
FIG. 76 shows a graph of collector current density $J_C$ vs. base-emitter voltages ($V_{BE}$) of different heterojunction bipolar transistor technologies.

FIG. 76 shows a graph of the collector current density $J_C$ vs. the turn-on voltages $V_{BE}$ of various HBT material systems. The figure shows a plot of the collector current density $J_C$ (A/cm$^2$) vertical scale versus base-emitter voltage $V_{BE}$ (V) horizontal scale. The plotted characteristics for several different heterojunction bipolar transistor (HBT) technologies are shown. The GeSi HBT structure described herein may have a low turn-on voltage 7601 of the technologies shown of InP/InGaAs, SiGe, GaAs, and GaN/InGaN.

Summary of Features of GaAs—GeSiSn—GaN HBT materials. The semiconductor materials stack may form a favorable bipolar transistor: GaAs emitter, GeSiSn base, and GaN collector. The GaAs—GeSiSn—GaN stack may minimize the conduction band offsets which hinder electron transport (ultra fast transistor action). GaAs and GeSiSn can be latticed matched and wafer bonding allows for the integration of GaN without having to perform lattice-mismatch growth. Wafer bonding is desirable for GaAs—GeSiSn—GaN because the thermal expansion coefficients are close to each other. GaN can be grown on GaN, 4H SiC, 6H SiC, 3C SiC, sapphire, or Si substrates, these include the wurtzite and cubic forms.

The GaAs—GeSiSn—GaN NPN heterojunction materials may achieve the following metrics for transistors: (1) Low turn-on voltage; (2) high gain, both large valence band offset and GeSiSn low p-type resistivity; (3) the thin base may enhance the transit time of the electrons across the base (large $f_T$) and high frequency of operation $f_{max}$ (lower base sheet resistance=higher $f_{max}$); and (4) high breakdown voltages improves ruggedness and enables higher power applications.

The GaAs—GeSi—GaN NPN heterojunction materials may achieve the following metrics for next-generation electronic transistors: (1) Low turn-on voltage; (2) high gain, both large valence band offset and GeSi low p-type resistivity, allows the use of a thinner base region; (3) the thin base also enhances the transit time of the electrons across the base (large $f_T$) and high frequency of operation $f_{max}$ (lower base sheet resistance=higher $f_{max}$); and (4) high breakdown voltages improves ruggedness and enables higher power applications.

Different GaN collector structures include the following: (1) N⁻ GaN ($1\times10^{17}$ cm⁻³) on N⁺ GaN (>($1\times10^{19}$ cm⁻³) substrate, there is zero lattice mismatch in this structure; (2) N⁻ GaN ($1\times10^{17}$ cm⁻³) on N⁺ 4H SiC (>($1\times10^{19}$ cm⁻³) substrate, there is about a 4% lattice mismatch between the layers. Presently, SiC is used as the substrate for GaN epitaxy, 6H SiC or various other polytypes may also work; (3) N⁻ GaN ($1\times10^{17}$ cm⁻³) on N⁺ GaN (>($1\times10^{19}$ cm⁻³) grown on sapphire substrates. There may be about a 14% lattice mismatch between the two layers; (4) N⁻ GaN ($1\times10^{17}$ cm⁻³) on N⁺ 3C SiC (>($1\times10^{19}$ cm⁻³) substrate, there is about a 4% lattice mismatch between the layers; (5) Cubic N⁻ GaN ($1\times10^{17}$ cm⁻³) on N⁺ Si (>($1\times10^{19}$ cm⁻³) substrates; and (6) Other substrate combinations with GaN could be used for demonstration of this device. The methods (1), (2), and (3) result in wurtzite GaN. The use of cubic GaN may eliminate the polarization charge effects that occur in the wurtzite GaN phase. The possible substrates to grow the GaN collector on may be other SiC polymorphs or other substrates such as GaN or Si or Sapphire or Diamond or GaAs.

Exemplary Configuration 8: NPN GaAs Emitter-GeSiSn Base-SiC Collector Double heterojunction with all dissimilar materials having a small conduction band offset between Emitter-Base-Collector. This arrangement of materials described herein may combine high transconductance, high breakdown voltage (SiC collector), and a desirable emitter-base heterojunction (wide bandgap GaAs emitter on a narrow bandgap GeSiSn high conductivity P-type base; GeSiSn can be used as the P-type base). The huge breakdown field of SiC may allow the use of short collector devices with high bandwidths (cut-off frequency $f_T$ and maximum oscillation frequency $f_{max}$).

A feature of the device described herein is the formation of a heterojunction bipolar transistor, a desirable combination of semiconductors for transistors by utilizing a favorable conduction band alignment between the emitter-base-collector junctions, thus forming a heterojunction bipolar transistor: (1) small conduction band offset between GaAs (emitter)-GeSiSn (base)-SiC (collector); (2) The P-type GeSiSn base may be lattice matched to N-type GaAs emitter; (3) SiC collector structure; and (4) Monolithic integration of materials by wafer bonding of GaAs/GeSiSn stack to the N-type SiC collector (circumvents large lattice mismatched growth).

The combination of semiconductors GaAs/GeSiSn stack wafer bonded to SiC for high performance transistors may have a small conduction band offset between Emitter-Base-Collector. This property allows for the formation of heterojunction transistor structure that can have large gain (large valence band offset between GaAs and GeSiSn). These materials allow for a low base sheet resistance, low turn-on voltage (GeSiSn has high hole mobility and low bandgap energy), and large breakdown voltage (SiC has large breakdown electric field strength and high saturated velocity). These material characteristics comprise a useful bipolar transistor.

Figure 77:
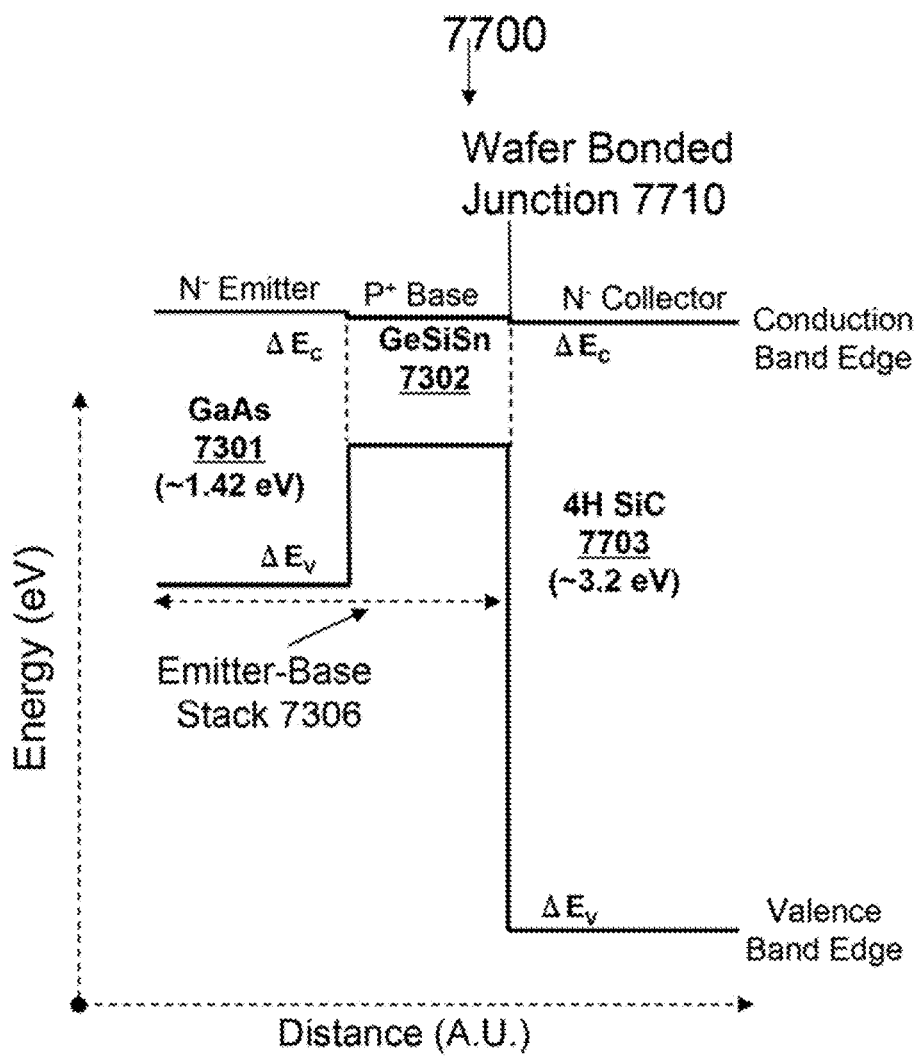
FIG. 77 shows an exemplary flat band energy diagram of an NPN GaAs emitter-GeSiSn base-4H SiC collector.

The GaAs—GeSiSn—SiC stack or GaAs— graded GeSiSn to GeSn—SiC materials stack is useful for making NPN. FIG. 77 shows an exemplary flat band energy diagram of NPN GaAs emitter-GeSiSn base-4H SiC collector 7700 stack grown on 4H SiC substrate (energy bandgaps are in parenthesis), with a small conduction band offsets between interfaces and a large valence band offset at the emitter-base heterojunction. Electrons are easily injected from the GaAs emitter through the GeSiSn base to the SiC collector. FIG. 77 shows the conduction band offsets at emitter-base and base-collector junctions may be less than 0.1 eV, with large valence band offsets between the GaAs—GeSiSn and GeSiSn—SiC heterojunctions. FIG. 77 shows an exemplary flat band energy diagram of the NPN GaAs Emitter-GeSiSn Base-SiC Collector Double heterojunction with all dissimilar materials having a small conduction band offset between Emitter-Base-Collector. Here an emitter up emitter-base stack 7306 comprising of an N⁻ emitter GaAs 7301 and a P⁺ base GeSiSn 7302 structure. The full monolithic structure can be formed using an epitaxial lift off (ELO) procedure. This emitter-base stack 7306 is wafer bonded to collector 7703 thus forming a wafer bonded junction 7710 at the base-collector interface. The wurtzite N⁻ collector 4H SiC 7703 can be grown on 4H or 6H (or other variations) sub-collector/substrates. Possible methodologies of wafer bonding this emitter-base stack 7306 to the collector 7703 is described in Exemplary ELO Wafer Bonding Configuration 6A and in Exemplary Inverted Wafer Bonding Configuration 6B. Note the conduction band offset $\Delta E_C$ may be approximately less than 0.1 eV through the NPN HBT structure. The band diagram of this new material structure with a small conduction band offsets between interfaces and a large valence band offset at the emitter-base heterojunction allows for electrons to be easily injected from the GaAs emitter through the GeSiSn base to the SiC collector.

To form such a structure the interface between the base-emitter stack 7306 and the collector 7703 can require wafer bonding, because the lattice constants of the base material and collector material are highly lattice mismatched.

An exemplary structure that could be grown and wafer bonded is illustrated in Table 27.

TABLE 27

Epitaxial Structure of a NPN GaAs—Ge—SiC HBT.

| Layer | Layer Name | Description | Comment |
|---|---|---|---|
| 1 | N$^+$ Cap (non-alloyed) | 1000 Å InGaAs (Te-doped >10$^{19}$ cm$^{-3}$) | Standard |
| 2 | N$^-$ Emitter Cap | 1500 Å GaAs (Si-doped = 5 × 10$^{18}$ cm$^{-3}$) | Standard |
| 3 | N$^-$ Emitter | 500 Å GaAs (Si-doped = 3 × 10$^{17}$ cm$^{-3}$) | Standard |
| 4 | Base | ~500 Å Ge$_{1-z}$(Si$_{0.8}$Sn$_{0.2}$)$_z$<br>can be B-doped >10$^{19}$ cm$^{-3}$<br>0 < Si % ≤ 40%<br>0 ≤ Sn % ≤ 10%<br>Thickness range 100 Å-5000 Å | Latticed matched<br>or<br>Can be compositionally<br>graded GeSiSn—GeSn |
| 5 | N$^-$ Collector | 10000 Å SiC (nitrogen-doped = 1 × 10$^{16}$ cm$^{-3}$) | Wafer bonded to above |
| 6 | N$^+$ Sub-Collector | 5000 Å 4H SiC (5 × 10$^{18}$ cm$^{-3}$) | Standard (nitrogen doped) |
| 7 |  | 4H SiC (conducting substrate) | N+ Substrate: Excellent thermal conductivity |

Note
the dopants listed are only one of many possible dopants, and does preclude the use of other dopants and doping values are only nominal values but can take on many variations. The thicknesses are all exemplary and can take on many different values.

Figure 78:
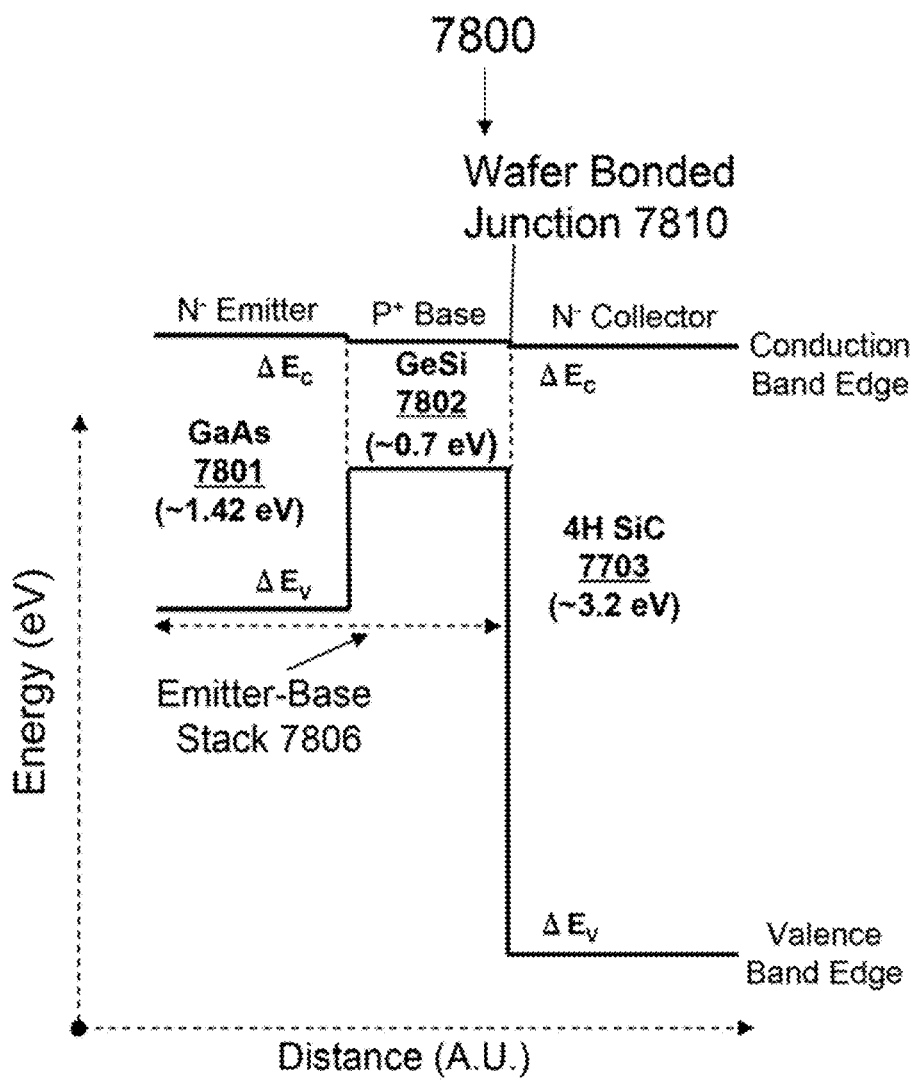
FIG. 78 shows an exemplary flat band energy diagram of an NPN GaAs emitter-GeSi base-4H SiC collector.

FIG. 78 shows an exemplary flat band energy diagram of the NPN GaAs Emitter-GeSi Base-SiC Collector 7800 double HBT with all dissimilar materials having a small conduction band offset between Emitter-Base-Collector (energy bandgaps are in parenthesis). With small conduction band offsets between interfaces and a large valence band offset at the emitter-base heterojunction electrons can be easily injected from the GaAs emitter through the GeSi base to the SiC collector. Ge$_{0.98}$Si$_{0.02}$ can be latticed matched to GaAs and may have a bandgap energy of 0.7 eV (ranging from 0.67 eV to 0.72 eV). FIG. 78 shows conduction band offsets at emitter-base and base-collector junctions may be less than 0.1 eV, with large valence band offsets between the GaAs—GeSi and GeSi—SiC heterojunctions. Here an emitter up emitter-base stack 7806 comprising of an N$^-$ emitter GaAs 7801 and a P$^+$ base GeSi 7802 structure. The full monolithic structure can be formed using an epitaxial lift off (ELO) procedure. This emitter-base stack 7806 is wafer bonded to collector 7703 thus forming a wafer bonded junction 7810 at the base-collector interface. The wurtzite N$^-$ collector 4H SiC 7703 can be grown on 4H or 6H (or other variations) sub-collector/substrates. Possible methodologies of wafer bonding this emitter-base stack 7806 to the collector 7703 is described in Exemplary ELO Wafer Bonding Configuration 6A and in Exemplary Inverted Wafer Bonding Configuration 6B. Note the conduction band offset $\Delta E_C$ can be less than 0.1 eV through the NPN HBT structure.

To form such a structure the interface between the base-emitter stack 7806 and the collector 7703 can require wafer bonding, because the lattice constants of the base material and collector material are highly lattice mismatched.

In other examples, there is a cubic form of SiC that can be used in the HBT device structure. The SiC can be grown face centered cubic (FCC) on 3C SiC. SiC in this form can have no polarization charge that degrades the base-collector performance. SiC (FCC) may also be grown on Si substrates or on template substrates that are commercially available.

Figure 79:
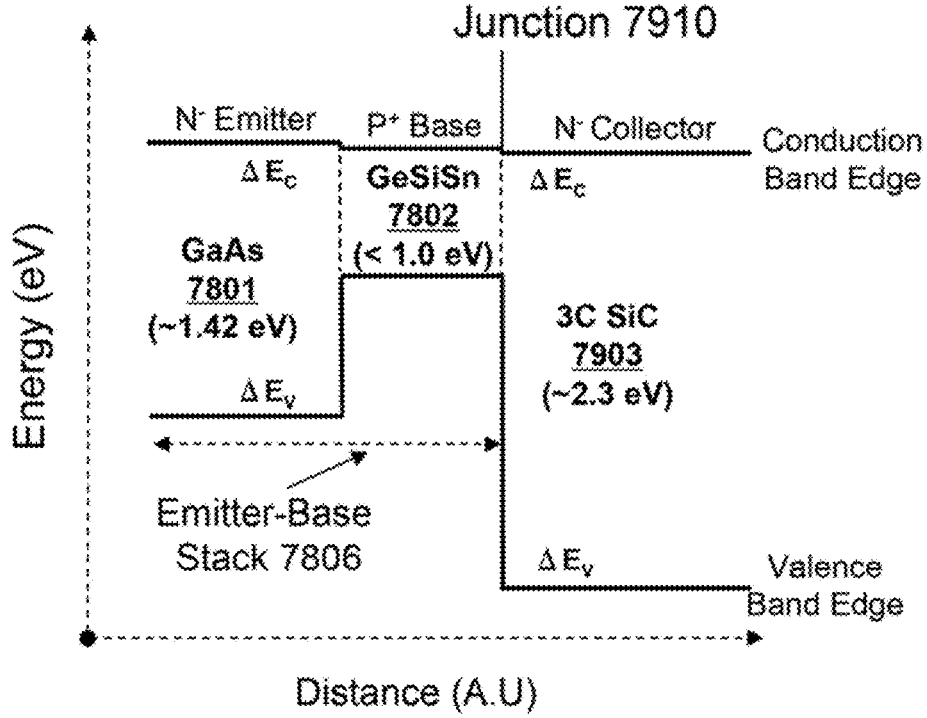
FIG. 79 shows an exemplary flat band energy diagram of an NPN GaAs emitter-GeSiSn base-3C SiC collector.

FIG. 79, shows an exemplary flat band energy diagram of NPN GaAs Emitter-GeSiSn Base-3C SiC collector 7900 stack grown on 3C SiC substrate, where the energy bandgaps are in parenthesis. Conduction band offsets at emitter-base and base-collector junctions are small, with large valence band offsets between the GaAs—GeSiSn and GeSiSn—SiC heterojunctions. Here an emitter up emitter-base stack 7806 comprising of an N$^-$ emitter GaAs 7801 grown on a P$^+$ Base GeSiSn 7802 structure. The full monolithic structure can be formed using an epitaxial lift off (ELO) procedure. This emitter-base stack 7806 is wafer bonded to SiC collector 7903 thus forming a wafer bonded junction 7910 at the base-collector interface. Possible methodologies of wafer bonding this emitter-base stack 7806 to the collector 7903 is described in Exemplary ELO Wafer Bonding Configuration 6A and in Exemplary Inverted Wafer Bonding Configuration 6B. Note the conduction band offset $\Delta E_C$ may be <0.1 eV through the NPN HBT structure. The band diagram of this new material structure with small conduction band offsets between interfaces and a large valence band offset at the emitter-base heterojunction allows for electrons to be easily injected from the GaAs emitter through the GeSiSn base to the SiC collector.

To form such a structure the interface between the base-emitter stack 7806 and the collector 7903 can require wafer bonding, because the lattice constants of the base material and collector material are highly lattice mismatched.

It can be useful to put a thin GeSiSn or AlN, AlGaN, InAlN, InN, InGaN layer down on the SiC to promote adhesion of the wafer bonding of the GeSiSn base. This thin film can be done epitaxially by MOCVD, MBE or PLD.

The base can be linearly or other possible grading, compositionally graded from GeSiSn to GeSn to have electric field enhancement of the charge carriers (electrons). Such structure creates an electric field that accelerates the electrons across the base to the collector.

Figure 80:
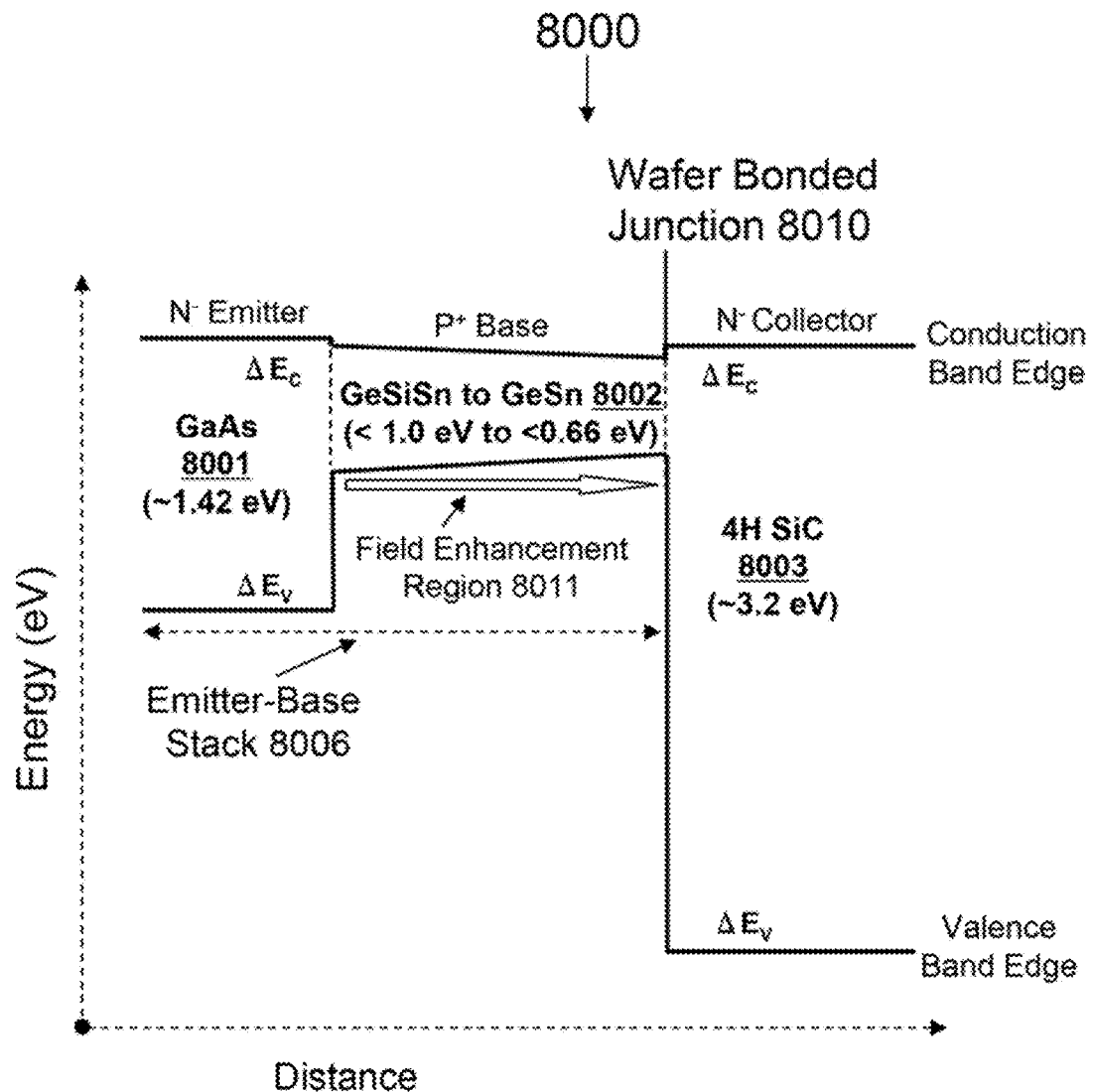
FIG. 80 shows an exemplary flat band energy diagram of an NPN GaAs emitter-graded GeSiSn to GeSn base-4H SiC collector. The compositionally graded GeSiSn—GeSn base layer can comprise at the emitter-base interface may be lattice matched or near latticed matched or coherently strained $Ge_{1-z}(Si_{0.8}Sn_{0.2})_z$ to GaAs, where the GeSiSn may be compositionally graded by reducing the Si content and increasing Ge content to GeSn at the collector interface. The grading range can go from GeSiSn at the emitter-base junction to GeSn at the base-collector junction at various compositions.

FIG. 80 shows an exemplary flat band energy diagram of the NPN GaAs emitter-graded GeSiSn to GeSn base-SiC collector 8000 HBT. Here a variation of the base up emitter-base stack 8006 comprising a P$^+$ base compositionally graded GeSiSn—GeSn 8002 grown on an N$^-$ emitter GaAs 8001 layer. The compositionally graded GeSiSn—GeSn 8002 layer can comprise at the emitter-base interface a lattice matched or near latticed matched or strained Ge$_{1-z}$(Si$_{0.8}$Sn$_{0.2}$)$_z$ to GaAs, where the GeSiSn may be compositionally graded by reducing the Si content and increasing Ge content to GeSn at the collector interface. The grading range can go from GeSiSn at the emitter-base junction to GeSn at the base-collector junction various compositions. This emitter-base stack 8006 is then wafer bonded with the P$^+$ base next to the N$^-$ collector SiC 8003 thus forming a wafer bonded junction 8010 at the base-collector interface. Due to the compositional grading of the GeSiSn—GeSn 8002 in the P$^+$ base, there is a field enhancement region 8011 that accelerates the carriers toward the collector. The methodology of wafer bonding the emitter-base stack to the SiC is described in Exemplary Inverted Wafer Bonding Configuration 6B. Note the conduction band offset $\Delta E_C$ is small through the NPN HBT structure. Note the grade can be linear, stepped, parabolic, or any reasonable variation. Also the graded layer can be grown by one technique such as MOCVD or can comprise of multiple growth deposition such as but not limited to the MOCVD growth of the GeSiSn.

GaAs Emitter Advantages: (1) The large valence band offset between GaAs emitter and GeSiSn base stops back injection of holes into the emitter. This allows for low n-type doping of the emitter and high p-type doping of the base, thus lowering base emitter capacitance while still achieving sizable current gain; (2) GeSiSn may be latticed matched to GaAs which enables dislocation free growth; and (3) The use of AlGaAs or disordered or ordered InGaP emitter could also be used in this device structure.

GeSiSn base may have similar properties to Ge: (1) Ge has a low bandgap which results in low turn-on voltage; (2) Ge hole mobility is high and acceptors can be incorporated to high density, thus the base can be made ultra-thin while maintaining a low base sheet resistance which increases current gain and decreases electron transit time; (3) Ge has shallow acceptors, so the hole concentration is generally equal to the acceptor doping level and independent of temperature; (4) The low base sheet resistance results in a high $f_{max}$; (5) The surface recombination velocity is low for p-type Ge; and (6) Low resistance ohmic contacts can be formed on p-type Ge.

SiC Collector Advantages: (1) SiC has many crystalline polymorths. The common ones are hexagonal 4H SiC, 6H SiC, and cubic 3C SiC; (2) 3C cubic SiC has no polarization charge; (3) SiC has high breakdown field which is excellent for the collector breakdown voltage. SiC may have a small conduction band offset with GeSiSn, thus no blocking field at the interface; (4) SiC collector significantly increases the overall thermal conductivity of the material structure; (5) SiC has a high saturation velocity thus electrons travel without intervalley scattering; and (6) 4H SiC power maximum capability is 286 times greater than that of Si.

Exemplary Wafer Bonding of GeSiSn to SiC: The method of wafer bonding is chosen as the most direct means of forming the GeSn to the SiC structure. Using the method described here, the bonder allows gradual pressure application for the delicate bonding of GeSiSn and SiC. The large size heaters in the plates provide fast temperature ramp up for the bonding process. The bonder has a self-leveling action to the surface mechanism and ensures that it is flat with the surface. Also the wafer bonder can be current and voltage biased for anodic wafer bonding or in situ monitoring the current and voltage during the bonding process. Table 28 shows basic exemplary wafer bonding process. Also in the wafer bonding process the top and bottom plates can be biased for voltage and current to monitor the wafer bonding process to enhance the wafer bonding process (anodic wafer bonding).

TABLE 28

Wafer Bonding Procedure

| Step | Description |
|---|---|
| 1 | The wafer is cleaved to appropriate size. |
| 2 | Semiconductor materials are thoroughly cleaned. |
| 3 | Oxides are removed by wet etch. HCl is used for GeSiSn. HF is used for SiC. Then put into methanol. |
| 4 | GeSiSn stack material and the SiC material are placed on top of each other and kept in methanol until transferred to the wafer bonder. |

TABLE 28-continued

Wafer Bonding Procedure

| Step | Description |
|---|---|
| 5 | GeSiSn stack and SiC materials are placed in wafer bonder, which holds the materials together at possible temperatures of room temperature up to 600° C. for 15 to 60 minutes (but these can be changed at a pressure between 1 to 10 psi). Typical ambient gas is nitrogen or hydrogen or air or vacuum. |
| 6 | The composite structure is slowly cooled and then removed. |
| 7 | The composite unit acts as a monolithic structure and is ready for testing. |

The wafer bonding allows for independent enhancement of materials without regard to lattice matching. It should be noted that GeSiSn lattice constant may be near 5.65 Å and 4H SiC lattice constant is 3.1 Å, which is a huge mismatch.

A commonly used metric for comparing various semiconductors is the Johnson's figure of merit (FOM), which compares different semiconductors for suitability for high frequency power transistor applications. Table 29 shows a comparison of possible Johnson FOM for Si, GaAs, and GaN.

TABLE 29

Comparison of Energy Bandgap, Electron Saturation Velocities and Johnson Figure of Merit for Si, GaAs, and GaN.

|  | Si | GaAs | GaN |
|---|---|---|---|
| Energy Bandgap (eV) $E_{gap}$ | 1.1 | 1.4 | 3.4 |
| Peak Electron Saturation Velocity (cm/s) $V_{sat\,peak}$ | $1 \times 10^7$ | $1.9 \times 10^7$ | $2.5 \times 10^7$ |
| Normalized Johnson FOM | 1 | 9.5 | 572 |

Johnson Figure of Merit = Maximum power × frequency = $P_{max} \times f \approx (E_{gap}^4 \times V_{sat\,peak}^2)$ Table 30 shows a comparison of possible Johnson FOM for 3C SiC, 4H SiC, and 6H SiC.

TABLE 30

Comparison of Energy Bandgap, Electron Saturation Velocities and Johnson Figure of Merit for 3C SiC, 4H SiC and 6H SiC.

|  | 3C SiC | 4H SiC | 6H SiC |
|---|---|---|---|
| Energy Bandgap (eV) $E_{gap}$ | 2.4 | 3.2 | 3.0 |
| Peak Electron Saturation Velocity (cm/s) $V_{sat\,peak}$ | $2 \times 10^7$ | $2 \times 10^7$ | $2 \times 10^7$ |
| Normalized Johnson Figure of Merit | 91 | 286 | 221 |

Johnson Figure of Merit = Maximum power × frequency = $P_{max} \times f \approx (E_{gap}^4 \times V_{sat\,peak}^2)$ Interface defect formation: Thermal expansion coefficients of exemplary materials are shown in Table 31. Due to the fact thermal expansion coefficients of all the materials are similar, the thermal stress generated during low temperature wafer bonding should be minimal.

TABLE 31

Thermal Expansion Coefficients.

| Material | Thermal Expansion Coefficient ($10^{-6}$ K$^{-1}$) @ 300 K |
|---|---|
| GaAs | 6.0 |
| Ge | 5.9 |
| GaN | 5.6 |
| 3C SiC | 3.8 |
| 4H SiC | 4.3 |
| 6H SiC | 4.3 |

Table 32 shows thermal conductivities of the various semiconductors. SiC has high thermal conductivities.

TABLE 32

Thermal Conductivities of Semiconductors.

| Material | Thermal Conductivity (Wcm$^{-1}$ K$^{-1}$) @ 300 K |
|---|---|
| GaAs | 0.55 |
| Ge | 0.58 |
| GaN | 1.3 |
| 3C SiC | 3.6 |
| 4H SiC | 3.7 |
| 6H SiC | 4.9 |
| Diamond | 8.9-13.5 |

Figure 81:
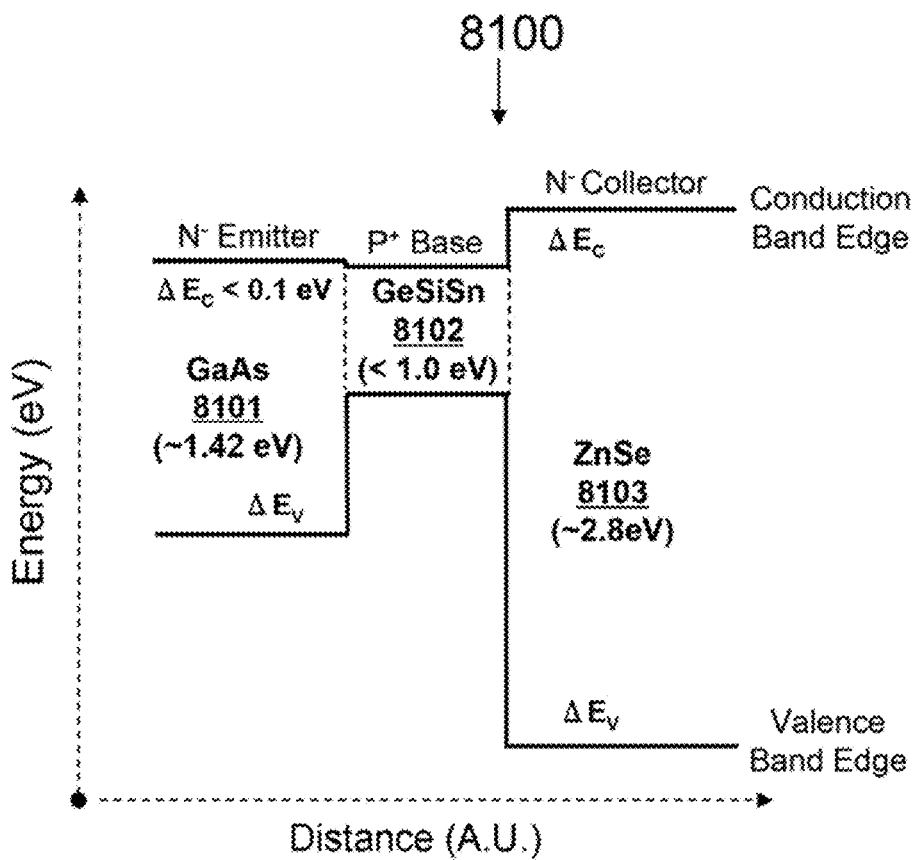
FIG. 81 shows an exemplary flat band energy diagram of an NPN GaAs emitter-GeSiSn base-ZnSe collector.

Exemplary Configuration 9: NPN GaAs Emitter-GeSiSn Base-ZnSe Collector Double heterojunction with all dissimilar materials. The device elucidated in this example can include a asymmetric double heterojunction GaAs—GeSiSn—ZnSe HBT device. This device can have desirable base characteristics with a low voltage base turn-on (<1.0 V) region and a symmetric heterojunction thus eliminating the offset voltage in the transistor output characteristic that reduces power added efficiency. FIG. 81 illustrates an exemplary flat band energy diagram of the material structure. This device can be desirable for high speed and RF (radio frequency) power amplification. This material is near latticed matched thus making it a useful structure for crystal growth techniques.

The monolithic GaAs—GeSiSn—ZnSe double HBT may have a favorable conduction band alignment. This transistor structure can have large gain (large valence band offset between GaAs and GeSiSn). These materials allow for a low base sheet resistance, low turn-on voltage (GeSiSn has high hole mobility and low bandgap energy), and large breakdown voltage (ZnSe has large breakdown electric field strength and high saturated velocity). These material characteristics make for a useful bipolar transistor.

FIG. 81 shows an exemplary flat band energy diagram of the NPN GaAs Emitter-GeSiSn Base-ZnSe Collector 8100 HBT with possibly favorable electron transport conduction band offsets between interfaces and a large valence band offset at the emitter-base heterojunction. Electrons may be injected from the GaAs emitter through the GeSiSn base to the ZnSe collector. FIG. 81 shows the conduction band offsets at emitter-base junction are small, with large valence band offsets between the GaAs—GeSiSn and GeSn—ZnSe heterojunctions. Here the emitter comprising of an N$^-$ GaAs 8101 and a P$^+$ base GeSn 8102 structure, with a large bandgap energy N$^-$ collector ZnSe 8103

Figure 82:
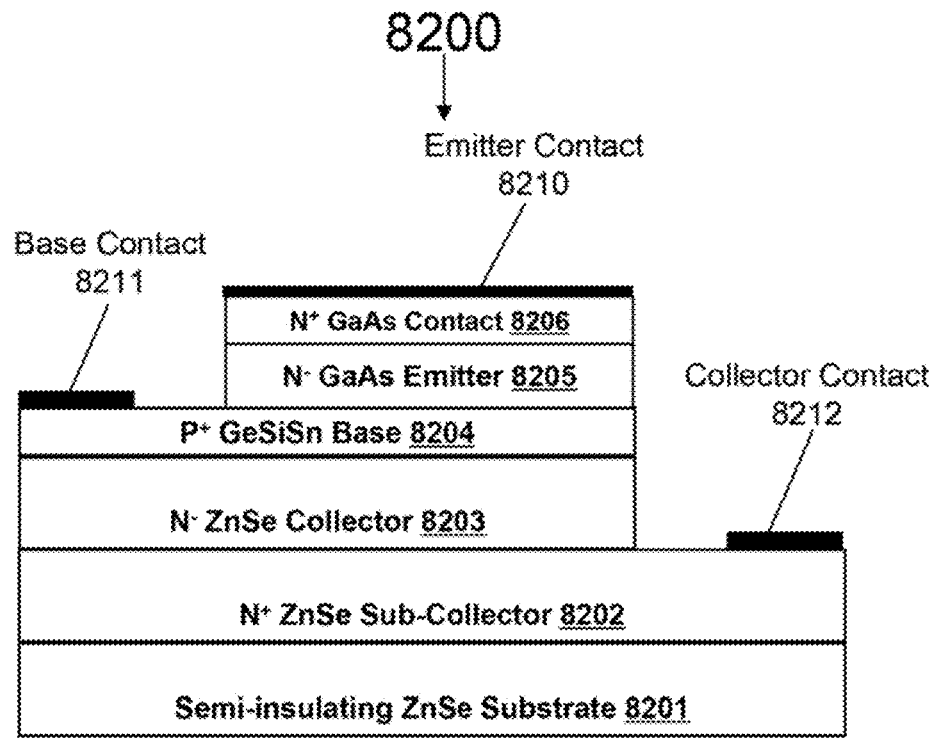
FIG. 82 shows an exemplary schematic embodiment of an NPN GaAs—GeSiSn—ZnSe double heterojunction bipolar transistor in a mesa configuration.

FIG. 82 shows an exemplary schematic embodiment of an NPN GaAs—GeSiSn—ZnSe double HBT 8200 in a mesa configuration. Note this structure could be grown inverted thus one could start the growth using GaAs substrates and finish with the ZnSe collector and sub-collector. Note that this can be a vertical device, which can be desirable for power applications because the lateral area can be minimized. FIG. 82 shows a general configuration of a GaAs—GeSiSn—ZnSe heterojunction bipolar transistor as a vertical stack geometry. Typically the structure can be grown epitaxially or by various means. For a vertical heterojunction bipolar transistor, typically a semi-insulating ZnSe substrate 8201 is used as the seed crystal to start the growth of the structure. A highly conducting N$^+$ ZnSe sub-collector 8202 is then grown, followed by a low doped N$^-$ ZnSe collector 8203. A P$^+$ GeSiSn base 8204 is then grown, followed by a GaAs emitter 8205, and finally a highly conducting GaAs contact layer 8206. Electrical contact is made to device via the metalized contact pads: emitter contact 8210, base contact 8211, and collector contact 8212. The voltages and currents are applied to the device via the contact pads. Vertical configuration offers some advantages.

The base can be linearly or other possible grading, compositionally graded from GeSiSn to GeSn to have electric field enhancement of the charge carrier electrons. The compositionally graded GeSiSn—GeSn 8302 layer can comprise at the emitter-base interface a lattice matched or near latticed matched or strained Ge$_{1-z}$(Si$_{0.8}$Sn$_{0.2}$)$_z$ to GaAs, where the GeSiSn may be compositionally graded by reducing the Si content and increasing Ge content to GeSn at the collector interface. The grading range can go from GeSiSn at the emitter-base junction to GeSn at the base-collector junction at various compositions.

Figure 83:
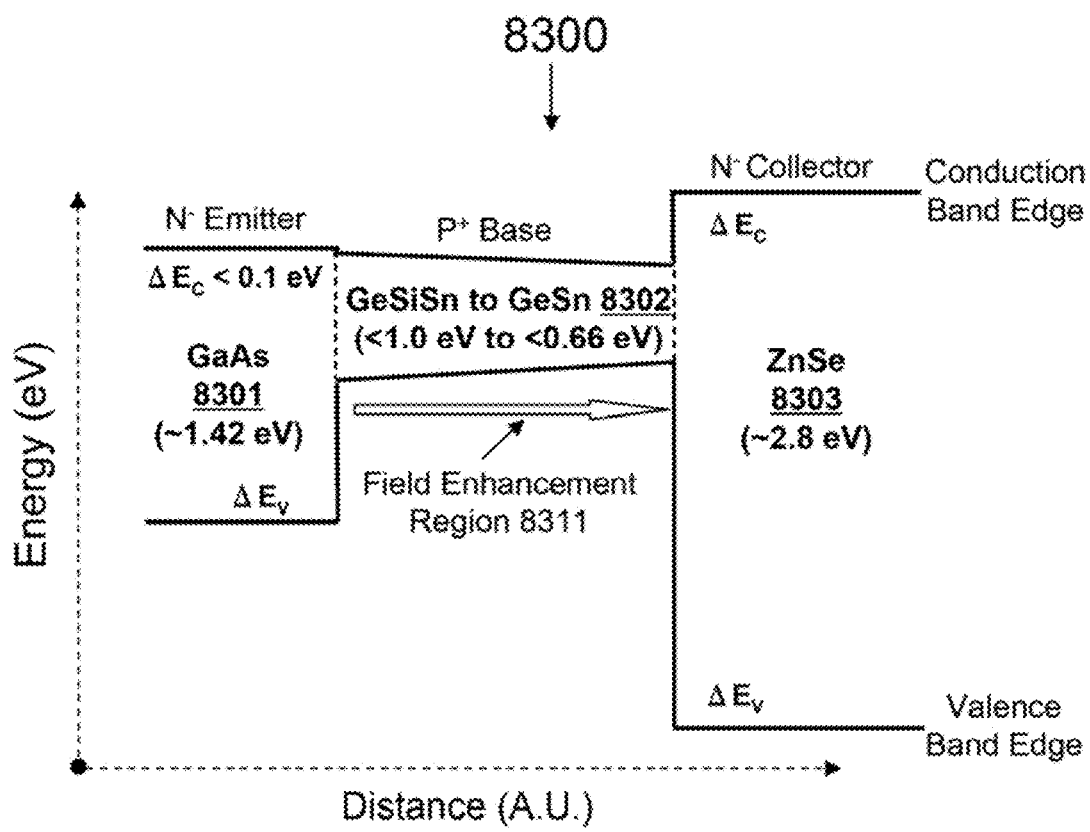
FIG. 83 shows an exemplary flat band energy diagram of an NPN GaAs emitter-graded GeSiSn to GeSn base-ZnSe collector HBT. The compositionally graded GeSiSn—GeSn base layer can comprise at the emitter-base interface may be lattice matched or near latticed matched or strained $Ge_{1-z}(Si_{0.8}Sn_{0.2})_z$ to GaAs, where the GeSiSn may be compositionally graded by reducing the Si content and increasing Ge content to GeSn at the collector interface. The grading range can go from GeSiSn at the emitter-base junction to GeSn at the base-collector junction at various compositions.

FIG. 83 shows an exemplary flat band energy diagram of the NPN GaAs emitter-graded GeSiSn to GeSn base-ZnSe collector HBT 8300. The compositionally graded Ge—GeSn 8302 layer can comprise at the emitter interface starting with Ge or a low Sn % GeSn layer which may be graded adding more Sn % to the GeSn at the collector interface. The compositional grading range can go from Ge at the emitter to GeSn at various compositions up to 20%. Due to the compositional grading of the GeSiSn—GeSn 8302 in the P$^+$ base, there is a field enhancement region 8311 that accelerates the carriers from emitter GaAs 8301 toward the collector ZnSe 8303. Note the grade can be linear, stepped, parabolic, or any reasonable variation. Also the graded layer can be grown by one technique such as MOCVD or can comprise multiple growth deposition such as but not limited to the MOCVD growth of the Ge and the subsequent PLD growth of the GeSn layer.

Table 33 shows an exemplary structure that could be grown.

TABLE 33

Epitaxial Structure of NPN GaAs—GeSiSn—ZnSe HBT.

| Layer | Layer Name | Description | Comment |
|---|---|---|---|
| 1 | N$^+$ Cap (non-alloyed) | ~1000 Å InGaAs (Te-doped >10$^{19}$ cm$^{-3}$) InGaAs layer is relaxed | Te = tellurium |
| 2 | N$^-$ Emitter Cap | ~1500 Å GaAs (Si-doped ~5 × 10$^{18}$ cm$^{-3}$) | Si = silicon |
| 3 | N$^-$ Emitter | ~500 Å GaAs (Si-doped = ~3 × 10$^{17}$ cm$^{-3}$) | |
| 4 | P$^+$ Base | ~500 Å Ge$_{1-z}$(Si$_{0.8}$Sn$_{0.2}$)$_z$ can be B-doped >10$^{19}$ cm$^{-3}$ 0 < Si % ≤ 40% 0 ≤ Sn % ≤ 10% Thickness range 100 Å-5000 Å | Latticed matched or Can be compositionally graded GeSiSn—GeSn |
| 5 | N$^-$ Collector | ~10,000 Å ZnSe (doped ~1 × 10$^{16}$ cm$^{-3}$) | Chlorine doped |
| 6 | N$^+$ Sub-Collector | ~5000 Å ZnSe (doped ~5 × 10$^{18}$ cm$^{-3}$) | Chlorine doped |

TABLE 33-continued

Epitaxial Structure of NPN GaAs—GeSiSn—ZnSe HBT.

| Layer | Layer Name | Description | Comment |
|---|---|---|---|
| 7 | High Purity Buffer | ~500 Å ZnSe (un-doped) | No doping |
| 8 | | ZnSe semi-insulating substrate | |

Note
the dopants listed are only one of many possible dopants, and does preclude the use of other dopants and doping values are only nominal values but can take on many variations. The thicknesses are all exemplary and can take on many different values.

Exemplary Configuration 10: Si Emitter-SiGe base with GeSn quantum well-SiGe Collector-Si sub-collector double light emitting heterojunction transistor laser or LED for Si photonics. The introduction of a GeSn quantum well or quantum dot or Ge quantum dot into a standard SiGe HBT design allows for the novel development of a Si photonic transistor laser. SiGe has a wide range of bandgaps from a starting point of Si with a bandgap energy of 1.1 eV, at $Si_{0.8}Ge_{0.siSn\_Ba2}$ has a bandgap energy of approximately 1 eV, at $Si_{0.6}Ge_{0.4}$ has a bandgap energy of approximately 0ge.93 eV, and at $Si_{0.2}Ge_{0.8}$ has a bandgap energy of approximately 0.87 eV. To fabricate a light emitting bipolar transistor the following flat band diagram is shown for an n-p-n device. Inserted into the SiGe base is a GeSn quantum well or quantum dot or Ge quantum dot.

Figure 84:
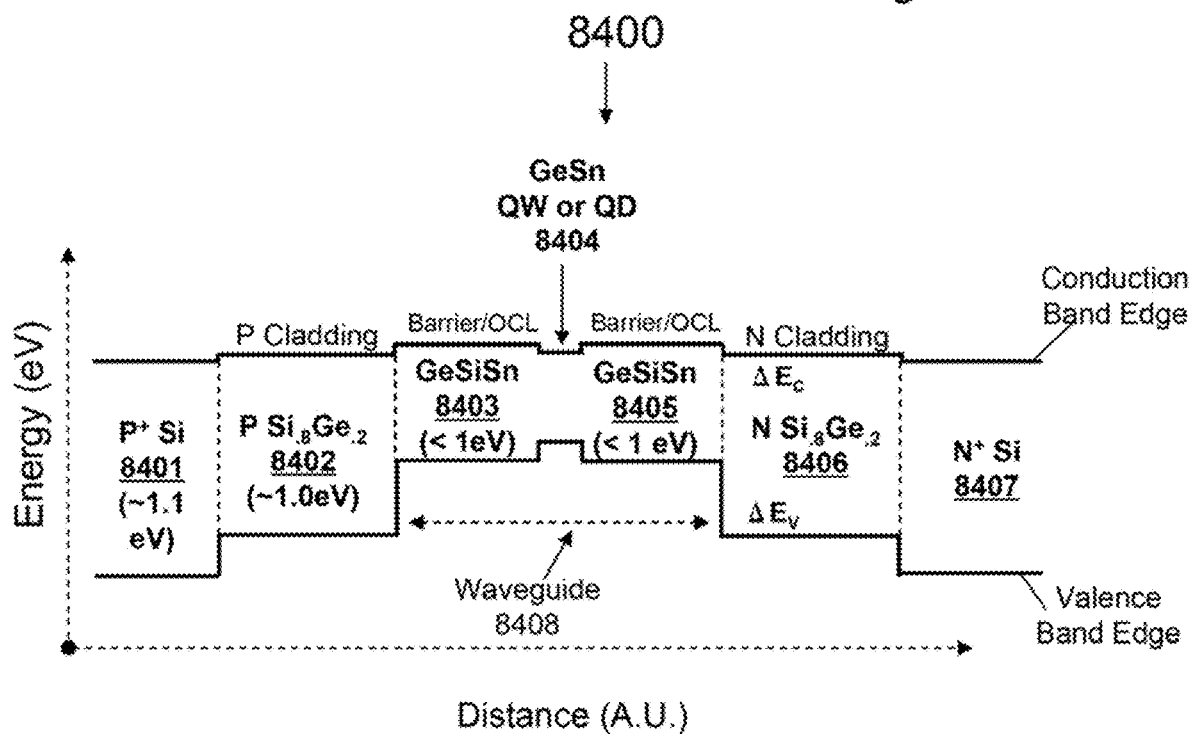
FIG. 84 shows an exemplary flat band energy diagram of a separate confinement heterostructure (SCH) laser utilizing a GeSn QW or QD region located in UID GeSiSn barrier/OCL region with SiGe cladding layers.

FIG. 84 shows an exemplary flat band energy diagram of a separate confinement heterostructure (SCH) laser diode device utilizing a GeSn QW or QD region with UID GeSiSn Barrier/OCL region 8400. The QW or QD are located in UID GeSiSn barrier/OCL layer 8403 & 8405 region with P $Si_{0.8}Ge_{0.2}$ 8402 cladding and N $Si_{0.8}Ge_{0.2}$ 8406 cladding layers. This structure represents a PN junction or diode with an unintentionally doped (UID) active region and optical confinement region between the P $Si_{0.8}Ge_{0.2}$ 8402 cladding and N $Si_{0.8}Ge_{0.2}$ 8406 cladding. The UID Ge 8403 and 8405 forms the barrier material for the GeSn QW or QD 8404 active region. The combination of the barrier and active region forms the waveguide 8408 of the laser. The P⁺ Si 8401 layer serves for injection of the holes into the device. The N⁺ Si 8407 layer serves for injection of the electrons into the device. The carriers are collected in the waveguide region and recombine in the GeSn QW or QD 8404 active region to generate light. Thus it is called an electrical injection laser. Though this depicts a symmetric structure it can be also asymmetric.

A further innovation is to take the SCH laser structure and form a transistor laser structure.

Figure 85:
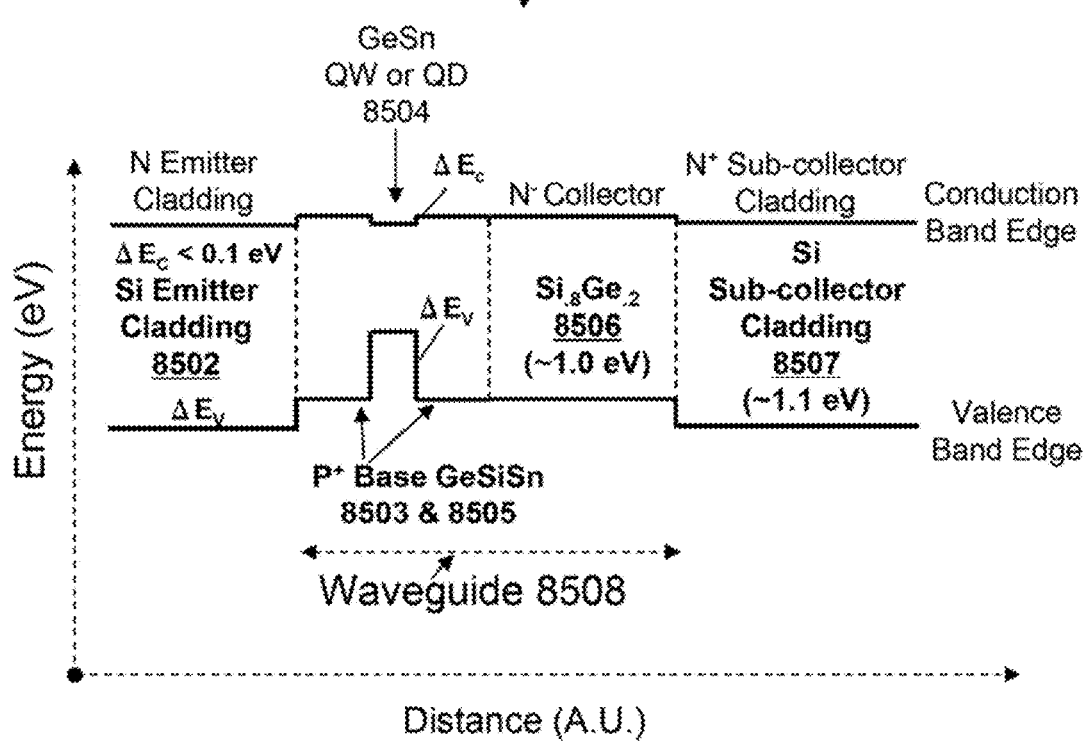
FIG. 85 shows an exemplary flat band energy diagram of a transistor laser or LET structure Si emitter-GeSiSn base/barrier with GeSn QW or QD-SiGe collector.

FIG. 85 shows an exemplary flat band energy diagram of a Si Emitter-GeSiSn Base/Barrier with GeSn QW or QD-SiGe Collector transistor laser 8500. The transistor laser includes a GeSn QW or QD 8504 active region inserted into a SiGeSn P⁺ base/barrier 8503 & 8505. This HBT laser is grown on Si substrates, thus compatible with Si processing. The GeSiSn forms the P⁺ base and also acts as a barrier layer for quantum confinement of the electrons and holes in the GeSn QW or QD 8504. The $Si_{0.8}Ge_{0.2}$ 8506 collector can be part of the waveguide 8508. The GeSn QW or QD 8504 inserted into a base/barrier serves for the collection region for electrons and holes to recombine to generate light. The P⁺ base SiGeSn 8503 & 8505 and the $Si_{0.8}Ge_{0.2}$ N⁻ collector 8506 serve as the optical confinement layer and the waveguide 8508 material. The Si emitter cladding 8502 & Si sub-collector cladding 8507 serve as the cladding layers for this structure. The cladding serves as funneling carriers into the active waveguide 8508 region and traps the emitted light in the waveguide structure.

Table 34 shows an exemplary structure that could be grown for the epitaxial structure of NPN light emitting Si—GeSn—SiGe HBT. Note the base QW well could also be compressively strained.

TABLE 34

Epitaxial Structure of NPN light emitting Si—GeSn—SiGe HBT.

| Layer | Layer Name | Description | Comment |
|---|---|---|---|
| 1 | N⁺ Cap | ~2000 Å Si (As-doped >$10^{19}$ cm⁻³) | As = Arsenic |
| 2 | N⁻ Emitter Contact | ~5000 Å Si (As-doped = $5 \times 10^{18}$ cm⁻³) | Cladding |
| 3 | N⁻ Emitter | ~1000 Å Si (As-doped = $5 \times 10^{17}$ cm⁻³) | Cladding |
| | Undoped-layer | ~50 Å $Si_{0.8}Ge_{0.2}$ | Intrinsic layer |
| 4 | P⁺ Base | ~1000 Å GeSiSn (p-doped: B >$10^{19}$ cm⁻³) B = Boron | |
| | QW | ~10-1000 Å $Ge_{0.9}Sn_{0.1}$ QW | 0 < Sn % < 20 |
| | or QD | or ~10-500 Å GeSn quantum dot | Light emission ~1000-5000 nm |
| | P⁺ Base | ~200 Å GeSiSn (p-doped: B >$10^{19}$ cm⁻³) B = Boron | |
| | Undoped-layer | ~50 Å $Si_{0.8}Ge_{0.2}$ | Intrinsic layer |
| 5 | N⁻ Collector | ~1200 Å $Si_{0.8}Ge_{0.2}$ (As-doped ~$5 \times 10^{15}$ cm⁻³) | |
| 6 | N⁺ Sub-Collector | ~6000 Å Si (As-doped ~$1 \times 10^{19}$ cm⁻³) | Cladding |
| 7 | N⁺ Buffer | ~500 Å Si (As-doped) | |
| 8 | | N⁺ Si conducting substrate | |

Note
for this structure a variety of compositions of the SiGe can be used (0% to 80% Ge %)

The front and back cleaved facets form the mirror of the laser. Anti-reflection coating can be put on the facets to provide for a better resonant cavity. Then metallizing the top and bottom of the transistor structure with an aperture open in the top or bottom metal would allow for the light to leave.

Figure 86:
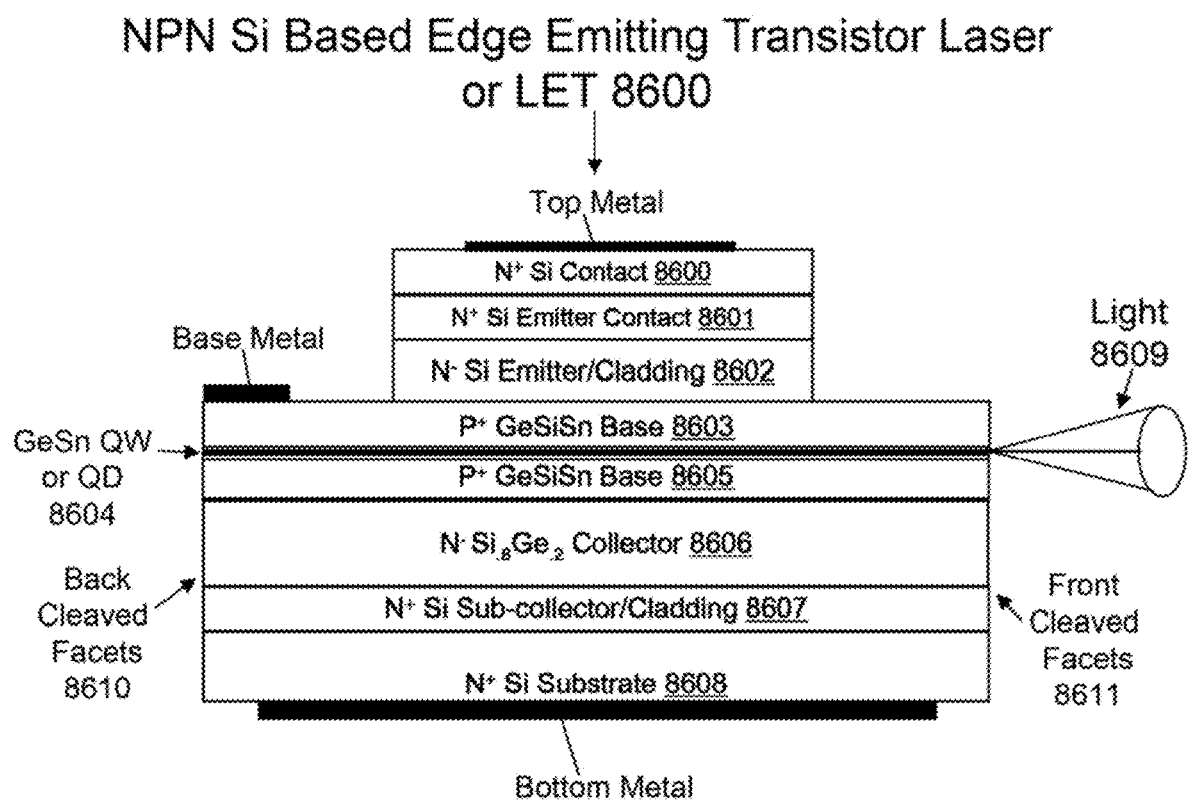
FIG. 86 shows a possible exemplary schematic embodiment of a Si based edge emitting transistor laser or light emitting structure in a mesa configuration. The active region can utilize a GeSiSn QW or QD at low Sn %.

FIG. 86 shows a possible exemplary cross-sectional device depiction of an NPN Si based edge emitting transistor laser or LET 8600. Note in this schematic embodiment the GeSn QW could be replaced by a GeSn quantum dot or Ge quantum dot. Typical quantum dot sizes are 1 to 50 nm. Note the vertical configuration could also be possible by putting dielectric or superlattice mirrors on top of the Si contact layer and the bottom of the Si substrate. The transistor laser includes a GeSn QW 8604 active region inserted into a GeSiSn 8603 & 8605 P$^+$ base/barrier of the HBT. The laser can require a resonant cavity to get optical gain, and typically this can be formed from the front 8611 and back cleaved facets 8610 of the semiconductor crystal wafer. The structure can be grown on N$^+$ Si conducting substrate 8608, which is the seed crystal to grow the full structure. An N$^+$ Si sub-collector/cladding 8607 is grown on the substrate. An N$^-$ Si$_{0.8}$Ge$_{0.2}$ collector 8606 which also forms a part of the waveguide is grown on the sub-collector. The N$^-$ Si emitter/cladding 8602 and the N$^+$ Si sub-collector/cladding 8607 do dual functions of optical confinement of the light 8609 produced from the active region GeSn QW 8604 and controlling the flow of electrons and holes into the active region. The P$^+$ GeSiSn base 8605 & 8603 form the barrier material for the GeSn QW 8604, and also provide the waveguide material. The laser can require a resonant cavity to get optical gain, and typically this can be formed from the front cleaved facets 8611 and back cleaved facets 8610 of the semiconductor crystalline structure. Layer 8600 is the highly conductive N$^+$ Si contact layer. Layer 8601 is the highly conductive N$^+$ Si emitter contact layer.

There are atmospheric transmission windows and this type of transistor laser structure can be useful for developing cost effective Si based photonic devices for telecommunications applications. Such a device can be useful on-chip or chip to chip communications.

Crystal growth modification of interfaces of the materials prior to wafer bonding for enhancing wafer bonding quality. The crystal growing techniques to grow the device structure in the patent are well known in the literature. The various techniques such as Metalorganic Chemical Vapor Depostion (MOCVD), Molecular beam epitaxy (MBE), Vapor Phase Epitaxy (VPE), Liquid Phase Epitaxy (LPE), etc., can grow various epitaxial structures and can be used for interface modification of the wafer bonding procedure. An exemplary description of pulsed laser deposition is used to describe modification of interfaces for wafer bonding of two crystals.

Pulsed laser deposition (PLD) epitaxy is a crystal methodology to form single layers on a suitable substrate. The system comprises of a target holder and a substrate holder housed in a vacuum chamber. A pulsed Nd-YAG laser, eximer laser, etc., beam is directed toward a source target, which vaporizes the source (laser ablation), and creates a beam of source particles (plasma plume) for deposition onto heated substrate.

For an exemplary situation for wafer bonding GeSiSn to GaN or SiC, a thin layer of GeSn may be deposited on the GeSiSn or other materials can be deposited by PLD to promote adhesion and better interface formation on one or both of the layers to be wafer bonded. To promote interface wafer bonding InAlN, InGaN, AlN, AlGaN, InN could be deposited on the GaN or SiC to promote adhesion and electrical junction quality. One could deposit ZnSe to change the band bending or as a method for neutralizing the piezoelectric charge that can occur in wurzite GaN or SiC heterostructures.

Figure 87:
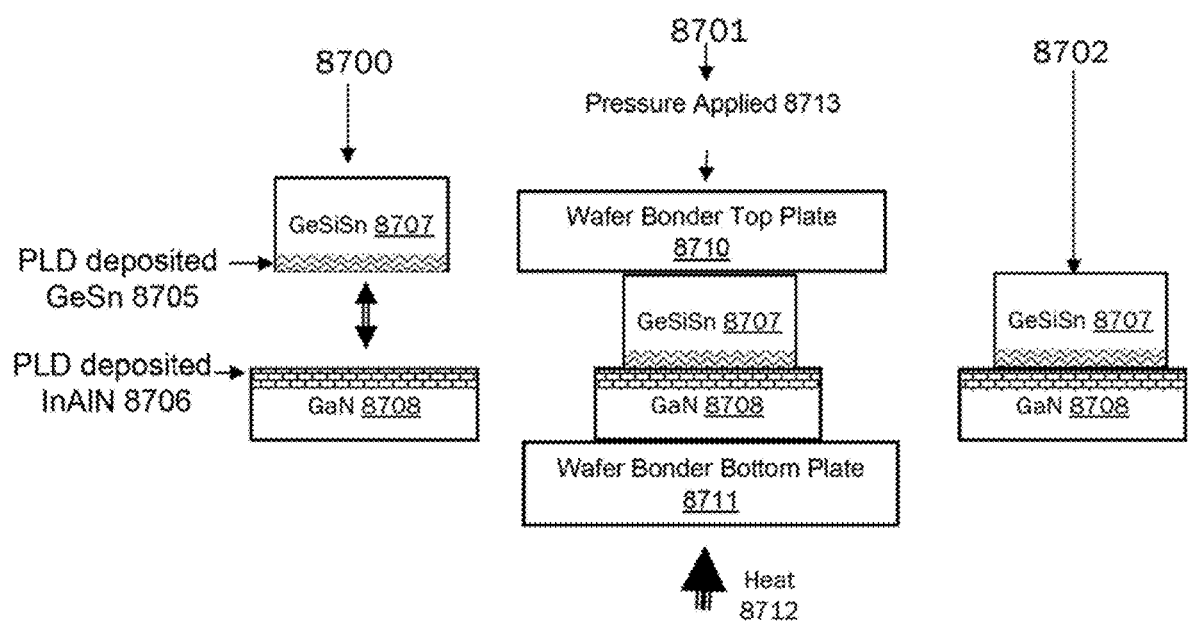
FIG. 87 shows a possible exemplary method of using pulsed laser deposition (PLD) deposited GeSn on GeSiSn and InAlN on GaN to promote adhesion and enhance heterojunction electrical characteristics for wafer bonding. Other compatible materials to promote adhesion and electrical characteristics may be InGaN or InN or AlN or AlGaN to the GaN surface for better wafer bonding.

FIG. 87 shows a possible exemplary method of using epitaxial deposited layer to promote adhesion and the formation of a heterojunction. Possible epitaxial methods may include PLD or MBE or MOCVD or LPE. In this situation thin adhesion layers are applied to both materials but it can also be possible to apply the adhesion layer to only one of the materials. The adhesion layers can be the same or different depending on application. SiC has a strong oxide and adding adhesion layers may form materials with electrical and adhesion properties that promote the heterojunction formation. The epitaxial techniques can also be used to deposit quantum wells, quantum dots and all variety of epitaxial structures on materials that are difficult to grow on.

In this exemplary example, FIG. 87 shows GeSn 8705 could be deposited on GeSiSn 8707 by PLD. In this exemplary case InAlN 8706 could be deposited for example by PLD on the GaN 8708. The GeSiSn 8707 with GeSn at its surface may be the first bonding material. The GaN 8708 with InGaN at its surface may be the second bonding material Step 8700 shows that both materials are oriented with their modified surfaces toward each other. Step 8701 shows that the modified surface GeSiSn 8707 is placed on the modified surface of the GaN 8708, with the modified interfaces in contact. This structure is placed in the wafer bonder with wafer bonder top plate 8710 and wafer bonder bottom plate 8711 clamping the structure. With application of heat 8712 and pressure applied 8713 and over time the two structures 8707 and 8708 can be wafer bonded together. This wafer bonding process can also occur at room temperature. Step 8702 shows the final monolithic structure. The conditions of wafer bonding include the amount of pressure between the top and bottom plates of the bonder or use of gas ambient in the bonding process, and other possible conditions.

Exemplary Configuration 11: Another embodiment represents a possible way of integrating an InGaP emitter (lattice matched or near latticed matched to GaAs)—GaAs base-GaN collector HBT. The InGaP—GaAs stack wafer bonded to the GaN collector makes for an ideal heterojunction bipolar transistor. The InGaP—GaAs—GaN stack may have a near-zero conduction (less than 0.1 eV) band offset throughout the layers from emitter to base to collector, which may be ideal for electron transport in an NPN heterojunction bipolar transistor.

Figure 88:
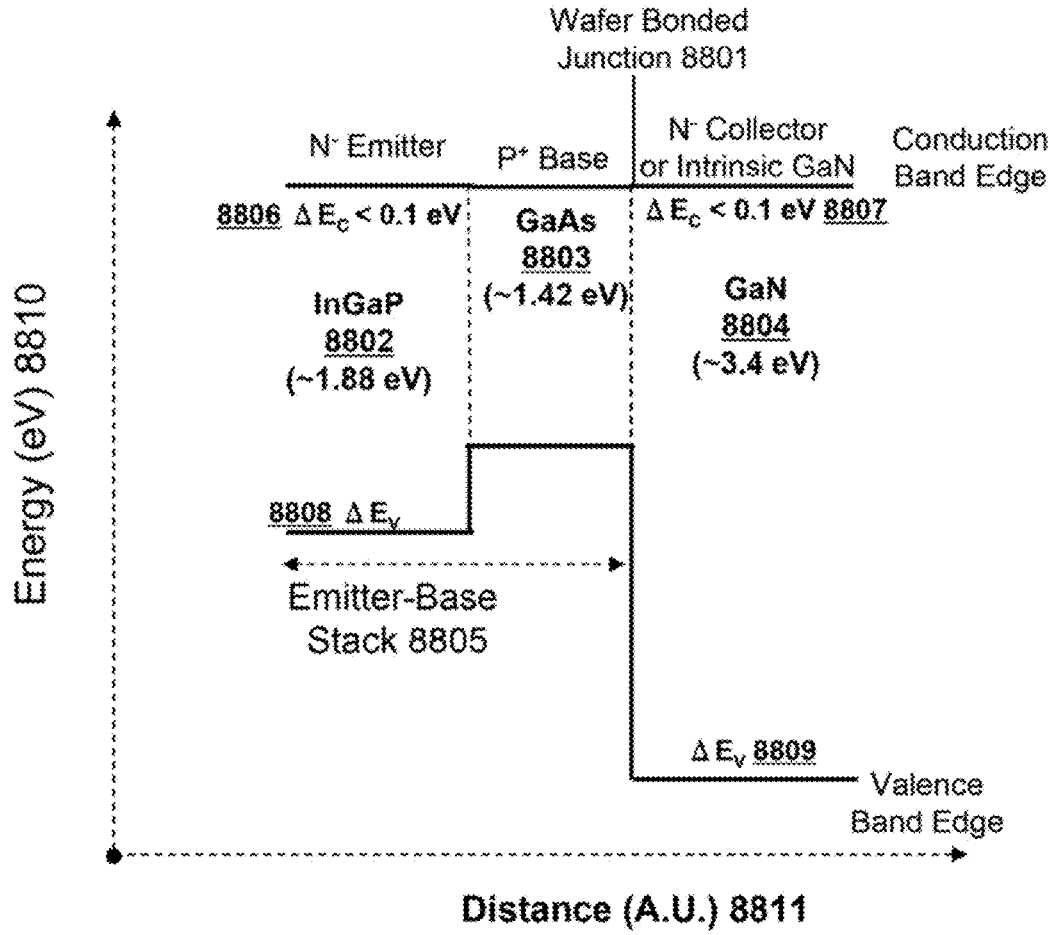
FIG. 88 shows the exemplary flat band energy band diagram showing the energy band alignments of NPN InGaP Emitter-GaAs Base-GaN Collector HBT.

FIG. 88 shows the exemplary flat band energy band diagram showing the energy band alignments of NPN InGaP Emitter-GaAs Base-GaN Collector HBT 8800, where the vertical axis is Energy (eV) 2310 and the horizontal is the Distance (A.U.) 2311. The approximate band gap energies are shown in parenthesis for the corresponding material. This device structure may have a small conduction band offsets between emitter-base-collector interfaces and a large valence band offset at the emitter-base and base collector heterojunction. Electrons can be easily injected from the InGaP 8802 emitter through the GaAs 8803 base to the GaN 8804 collector. Conduction band offset at emitter-base may be $\Delta E_C$<0.1 eV 8806 and the conduction band offset at base-collector junctions may be $\Delta E_C$<0.1 eV 8807, with large valence band offsets between the InGaP—GaAs ($\Delta E_V$ 8808) and GaAs—GaN ($\Delta E_V$ 8809) heterojunctions. The band alignments may be desirable for high performance NPN HBTs. An emitter-base stack 8805 comprising N$^-$ emitter InGaP 8802 on P$^+$ Base GaAs 8803 structure can be wafer bonded to the GaN 8804 collector. The InGaP 8802 should have a small conduction band offset $\Delta E_C$ 8807 with the GaAs 8803. This emitter-base stack 8805 may be wafer bonded to the N⁻ collector GaN 8804 thus forming a wafer bonded junction 8801 at the base-collector interface. The GaN 8804 may have a small conduction band offset $\Delta E_C$ 8808 with the GaAs 8803. Note the conduction band offset $\Delta E_C$ may be small <0.1 eV through the NPN HBT structure.

InGaP semiconductor can be grown epitaxially and latticed matched to GaAs at the composition $In_{0.49}Ga_{0.51}P$. If typically grown at high temperatures, it can grow in an ordered phase where the crystalline structure forms sheets of In—P and Ga—P atoms can alternate in the (001) planes of the FCC unit cell without the intermixing of the Ga and In atoms on the lattice planes. The ordered InGaP results in an almost zero conduction band discontinuity between the InGaP and GaAs and is called the ordered phase (this can be of weakly type I or weakly type II because it is close to zero) which may be approximately <0.1 eV for the ordered phase. With different growth conditions, the In and Ga atoms can intermix and the disordered InGaP phase can form, which has an approximate conduction band offset <0.2 eV. In either case the conduction band offset of InGaP to GaAs may be small.

The exemplary structure is shown in Table 35 of the wafer bonded InGaP—GaAs—GaN HBT.

TABLE 35

Exemplary Structure of Wafer Bonded NPN InGaP—GaAs—GaN HBT.

| Layer | Layer Name | Description | Comment |
|---|---|---|---|
| 1 | N⁺ Cap | ~1000 Å InGaAs (Te-doped >$10^{19}$ cm⁻³) | |
| 2 | N− Emitter Cap | ~1500 Å GaAs (Si-doped ~$5 \times 10^{18}$ cm⁻³) | |
| 3 | N− Emitter | ~500 Å InGaP (Si-doped ~$3 \times 10^{17}$ cm⁻³) | Ordered or disordered or mixed |
| 4 | P⁺ Base | ~1000 Å GaAs Thickness range 100 Å-5000 Å | |
| 5 | N− Collector | ~10000 Å GaN (Si-doped ~$1 \times 10^{16}$ cm⁻³) | Wafer bonded to above |
| 6 | N⁺ Sub-Collector | ~5000 Å GaN (Si-doped ~$5 \times 10^{18}$ cm⁻³) | |
| 7 | Substrate | 4H SiC substrate | Crystalline |

The substrate may be other SiC polymorphs or other substrates such as GaN or Si or Sapphire or Diamond or GaAs.

The InGaP—GaAs—GaN may have a near-zero conduction band offset (less than 0.1 eV) throughout the layers, which may be useful for an NPN bipolar transistor. FIG. 89 shows a possible exemplary cross-section device depiction of the wafer bonded InGaP—GaAs—GaN NPN HBT 8920 in a mesa configuration. Note that this is a vertical device, which may be desirable for power applications because the lateral area can be minimized. The NPN HBT comprises an emitter base stack 8921 with a wafer bond 8931 to the GaN structure 8940 to form the monolithic device. The emitter base stack 8921 consists of a N+ GaAs 8922 on top of N⁻ InGaP 8923 emitter, followed by a P+ GaAs base 8924. The emitter 8926 metal makes ohmic contact with the N+ GaAs 8922 layer. The base 8925 metal makes ohmic contact to the P+ GaAs Base 8924. The GaN structure 8940 can comprise a variety of forms, but for an exemplary case the GaN is grown on a 4H SiC substrate 8927, though a GaN or sapphire or Si or GaAs or diamond substrate could also be used. Starting with an intrinsic 4H SiC substrate 8927 then a N⁺ Conducting GaN 8928 layer is grown to which a N− GaN collector 8929 is grown. The collector 8930 metal makes ohmic contact with N+ Conducting GaN 8928. The GaN structure 8940 is wafer bonded to the Emitter Base Stack 8921.

To summarize, the devices are fabricated using standard semiconductor process techniques. For the PN junction fabrication, a single mask level for the etching of the base and ohmic anneals is used. The process uses mesa wet-etch and metallization lift off techniques common in HBT fabrication. AuGeNiAu or other metals can be used for the N-type GaAs materials and Al to P-type GeSiSn. The junctions of interest are the emitter-base junction and the base-collector junction.

Exemplary Embodiment

Base region with all the above compositional GeSiSn—GeSn grading variations of the base from emitter side to collector side.

Exemplary Embodiment

Base region including all the variations and inclusion of a GeSn quantum well or GeSn quantum dot structure in the base region making a light emitting transistor laser.

Exemplary Summary of HBT Parameters

The embodiments described herein can relate to the following: any bipolar transistor using a Ge base; GeSn base; GeSiSn base; a GeSi base; any bipolar transistor using a compositionally graded GeSiSn—GeSn base; and/or any light emitting bipolar transistor laser using a GeSn active region which can include a GeSn quantum well or GeSn quantum dot in the base region.

Exemplary Summary of transistor laser or LET Parameters: The embodiments described herein can relate to the following: any light emitting bipolar transistor laser using a GeSiSn active region which can include a GeSiSn quantum well or GeSiSn quantum dot in the base region, where the barrier/OCL may be GeSiSn layers.

Note through out the context of the document $Ge_{1-x-y}Si_xSn_y$ may be referred to as GeSiSn. It should be noted where the subscripts are missing GeSiSn refers to $Ge_{1-x-y}Si_xSn_y$, GeSi refers to $Ge_{1-a}Si_a$, GeSn refers to $Ge_{1-b}Sn_b$, and SiSn refers to $Si_{1-c}Sn_c$. $Ge_{1-x-y}Si_xSn_y$. Note that $Ge_{1-x-y}Si_xSn_y$ may at various compositions be lattice matched to the lattice constants of GaAs and Ge semiconductors. Here y can vary from 0≤y≤0.1, and x can vary 0<x≤0.4. $Ge_{1-x-y}Si_xSn_y$ can be comprised materials of Ge, $Ge_{1-a}Si_a$, $Ge_{1-b}Sn_b$, and $Si_{1-c}Sn_c$ at various compositions which may also be latticed matched or near latticed matched or strained to GaAs or Ge. GeSiSn may be also written in the following form $Ge_{1-z}(Si_{1-k}Sn_k)_z$. Where the value of k may be equal to 0.2 or near that value and have a range of values 0.1≤k≤0.4 and where z has a range of 0<z≤0.5. However for the GeSiSn latticed matched or coherently strained to GaAs or Ge there may be a range of values that k can have, which may be close to 0.2. It may be possible to write GeSiSn latticed matched or near latticed matched or strained to GaAs or Ge as $Ge_{1-z}(Si_{0.8}Sn_{0.2})_z$. In this designation the subscripts under the $Si_{0.8}$ and $Sn_{0.2}$ may be empirical values and can have a degree of variation as given by $0.1 \leq k \leq 0.4$ in $Ge_{1-z}(Si_{1-k}Sn_k)_z$. This form may be useful for the following materials composition $Ge_{1-z}(Si_{0.8}Sn_{0.2})_z$ where z is $0<z\leq 0.5$, which may result in that $Ge_{1-z}(Si_{0.8}Sn_{0.2})_z$ may be lattice matched or near latticed matched or pseudomorphic to Ge or GaAs semiconductors. Thus GeSiSn has a range of Si and Sn for the lattice matched condition to GaAs and Ge. Here the lattice constant of GaAs and Ge may be about 5.65 Å. The lattice mismatch between Ge and GaAs may be less than about 0.1% which may be considered near-latticed matched or lattice matched. Also GeSiSn when grown on GaAs or Ge may be tensile or compressively strained, which may be useful in devices. Sometimes for strained GeSiSn the term pseudomorphic may be used. GeSi designated by $Ge_{1-a}Si_a$ may also be latticed matched or near lattice matched or coherently strained to GaAs or Ge. Here the value of a may be about 0.02, with a range of variation of $0.0<a\leq 0.03$. Thus the designation for $Ge_{0.98}Si_{0.02}$ may represent GeSi lattice matched or near latticed matched or coherently strained to GaAs or Ge. In this designation the subscripts under the $Ge_{0.98}$ and $Si_{0.02}$ may be empirical values and can have a degree of variation as given by $0.0<a\leq 0.3$ in $Ge_{1-a}Si_a$. The materials of Ge, $Ge_{1-a}Si_a$, $Ge_{1-b}Sn_b$, and $Si_{1-c}Sn_c$ may be interchanged with $Ge_{1-x-y}Si_xSn_y$ materials system for a variation of the embodiments of the devices elucidated. It should be noted where the subscripts are missing GeSiSn refers to $Ge_{1-x-y}Si_xSn_y$, GeSi refers to $Ge_{1-a}Si_a$, GeSn refers to $Ge_{1-b}Sn_b$, and SiSn refers to $Si_{1-c}Sn_c$. This terminology refers to the fact that alloy semiconductor GeSiSn consists of the following component materials GeSi, GeSn and SiSn at various possible compositions. Also it should be noted for GeSiSn where the Sn content is zero, GeSi can be grown latticed or near latticed matched to GaAs and Ge. This value may be close to the composition $Ge_{0.98}Si_{0.02}$. Throughout the context of the document $Ge_{1-x-y}Si_xSn_y$ may be referred to as GeSiSn. Also the term graded or grading refers to compositional grading of the semiconductor alloy.

It should be noted that the values of the bandgap energies can change due to growth conditions and other factors. The values of the conduction and valence band offsets between dissimilar heterojunction semiconductors are used as guidelines and can be different dependent on the growth conditions, doping levels, and other factors. These parameters are also dependent on the temperature of the materials.

Although the embodiments have been described with reference to specific embodiments, it is understood by those skilled in the art that various changes can be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it is readily apparent that the methods, processes, and activities described herein may be comprised of many different activities, procedures and be performed by many different modules, in many different orders that any element of the figures may be modified and that the foregoing discussion of certain of these embodiments does not necessarily represent a complete description of all possible embodiments.

All elements claimed in any particular claim are essential to the embodiment claimed in that particular claim. Consequently, replacement of one or more claimed elements constitutes reconstruction and not repair. Benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims, unless such benefits, advantages, solutions, or elements are stated in such claim.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

The invention claimed is:

1. A transistor comprising:
a GeSiSn base region;
an emitter region; and
a collector region,
wherein:
the transistor is a heterojunction bipolar transistor; and
the GeSiSn base region comprises a Sn content and a Si content to be latticed matched or coherently strained to GaAs.

2. The transistor of claim 1, wherein the heterojunction bipolar transistor is an NPN device.

3. The transistor of claim 1, wherein the GeSiSn base region comprises a compositionally graded GeSiSn—GeSn.

4. The transistor of claim 1, wherein:
the emitter comprises GaAs; and
the collector comprises GaAs.

5. The transistor of claim 1, wherein:
the emitter comprises InGaP; and
the collector comprising GaAs.

6. The transistor of claim 1, wherein:
the emitter comprises AlGaAs; and
the collector comprises GaAs.

7. The transistor of claim 1, wherein:
the emitter comprises GaAs; and
the collector comprises GaN.

8. The transistor of claim 1, wherein:
the emitter comprises GaAs; and
the collector comprises SiC.

9. The transistor of claim 1, wherein:
the emitter comprises InGaP; and
the collector comprises GaN.

10. The transistor of claim 1, wherein the GeSiSn base region comprises compressively strained GeSiSn.

11. The transistor of claim 1, wherein the GeSiSn base region comprises tensile strained GeSiSn.

12. The transistor of claim 1, wherein the GeSiSn base region comprises relaxed GeSiSn.

13. The transistor of claim 1, wherein the transistor is a heterojunction bipolar transistor and is a wafer bonded heterojunction bipolar transistor.

14. A transistor comprising:
a GeSiSn base region;
an emitter region; and
a collector region,
wherein:
the transistor is a heterojunction bipolar transistor; and
the collector comprises GaN and is wafer bonded to the GeSiSn base region.

15. A transistor comprising:
a GeSiSn base region;
an emitter region; and
a collector region,
wherein:
   the transistor is a heterojunction bipolar transistor; and
   the collector comprises SiC and is wafer bonded to the GeSiSn base region.

* * * * *